US012585187B2

(12) United States Patent
Kojima et al.

(10) Patent No.: US 12,585,187 B2
(45) **Date of Patent: *Mar. 24, 2026**

(54) ACTINIC RAY-SENSITIVE OR RADIATION-SENSITIVE RESIN COMPOSITION, RESIST FILM, PATTERN FORMING METHOD, METHOD FOR MANUFACTURING ELECTRONIC DEVICE, AND COMPOUND

(71) Applicant: FUJIFILM Corporation, Tokyo (JP)

(72) Inventors: Masafumi Kojima, Haibara-gun (JP); Akira Takada, Haibara-gun (JP); Akiyoshi Goto, Haibara-gun (JP); Takeshi Kawabata, Haibara-gun (JP); Aina Ushiyama, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 644 days.

This patent is subject to a terminal disclaimer.

(21) Appl. No.: 18/063,395

(22) Filed: Dec. 8, 2022

(65) Prior Publication Data

US 2023/0139891 A1 May 4, 2023

Related U.S. Application Data

(63) Continuation of application No. PCT/JP2021/018992, filed on May 19, 2021.

(30) Foreign Application Priority Data

Jun. 10, 2020 (JP) ................................ 2020-101009
Dec. 16, 2020 (JP) ................................ 2020-208293

(51) Int. Cl.
*G03F 7/039* (2006.01)
*G03F 7/038* (2006.01)

(52) U.S. Cl.
CPC .......... *G03F 7/0392* (2013.01); *G03F 7/0382* (2013.01)

(58) Field of Classification Search
None
See application file for complete search history.

(56) References Cited

U.S. PATENT DOCUMENTS

| | | | | |
|---|---|---|---|---|
| 2010/0009288 | A1 | 1/2010 | Kato et al. | |
| 2010/0136477 | A1 | 6/2010 | Ng et al. | |
| 2013/0302736 | A1 | 11/2013 | Utsumi et al. | |
| 2015/0331314 | A1 | 11/2015 | Yamaguchi et al. | |
| 2017/0031243 | A1* | 2/2017 | Hatakeyama | G03F 7/0046 |
| 2019/0214648 | A1* | 7/2019 | Kawaguchi | H01M 4/661 |
| 2021/0286264 | A1* | 9/2021 | Kaneko | G03F 7/0388 |
| 2022/0043347 | A1* | 2/2022 | Takada | G03F 7/11 |
| 2022/0334476 | A1* | 10/2022 | Kojima | G03F 7/0045 |
| 2023/0075188 | A1* | 3/2023 | Miyoshi | C08F 212/24 |
| 2024/0152049 | A1* | 5/2024 | Kojima | G03F 7/0046 |

FOREIGN PATENT DOCUMENTS

| | | | | |
|---|---|---|---|---|
| CN | 102227680 A | 10/2011 | | |
| EP | 3 919 528 A1 | 12/2021 | | |
| EP | 3 919 981 A1 | 12/2021 | | |
| EP | 3 988 543 A1 | 4/2022 | | |
| EP | 3 992 179 A1 | 5/2022 | | |
| EP | 4 023 636 A1 | 7/2022 | | |
| EP | 4 129 974 A1 | 2/2023 | | |
| EP | 4 129 975 A1 | 2/2023 | | |
| JP | 63-117077 A | 5/1988 | | |
| JP | 2010-039476 A | 2/2010 | | |
| JP | 2015-024989 A | 2/2015 | | |
| JP | 2018-058824 A | 4/2018 | | |
| JP | 2019-014704 A | 1/2019 | | |
| TW | 201029963 A1 | 8/2010 | | |
| TW | 201435505 A | 9/2014 | | |
| TW | 201619697 A | 6/2016 | | |
| TW | 201835125 A | 10/2018 | | |
| WO | 2019/130866 A1 | 7/2019 | | |
| WO | WO-2020158417 A1 * | 8/2020 | | C08L 33/08 |
| WO | WO-2020255964 A1 * | 12/2020 | | G03F 7/039 |
| WO | WO-2021039244 A1 * | 3/2021 | | G03F 7/039 |

OTHER PUBLICATIONS

Communication dated Sep. 5, 2024, issued in Korean Application No. 10-2022-7042941.
Communication dated Aug. 20, 2024, issued in Taiwanese Application No. 110119605.
Extended European Search Report issued Feb. 14, 2024 in European Application No. 21822341.0.
International Search Report dated Aug. 10, 2021, issued in International Application No. PCT/JP2021/018992.
Written Opinion dated Aug. 10, 2021, issued in International Application No. PCT/JP2021/018992.
International Preliminary Report on Patentability dated Dec. 13, 2022, issued in International Application No. PCT/JP2021/018992.
Partial Supplementary European Search Report issued Nov. 24, 2023 in European Application No. 21822341.0.
Communication dated Mar. 5, 2025 issued by the State Intellectual Property Office of the P.R. China in application No. 202180041834.5.

* cited by examiner

*Primary Examiner* — Anca Eoff
(74) *Attorney, Agent, or Firm* — Sughrue Mion, PLLC

(57) ABSTRACT

Provided is an actinic ray-sensitive or radiation-sensitive resin composition with which a pattern having a good shape can be obtained. Also provided is a resist film, a pattern forming method, and a method for manufacturing an electronic device, each relating to the actinic ray-sensitive or radiation-sensitive resin composition. Also provided is a compound which can be suitably used in the actinic ray-sensitive or radiation-sensitive resin composition. The actinic ray-sensitive or radiation-sensitive resin composition of an embodiment of the present invention includes a compound that generates an acid upon irradiation with actinic rays or radiation, an acid-decomposable resin having a weight-average molecular weight of 30,000 or less, and a solvent, and the compound that generates an acid upon irradiation with actinic rays or radiation includes a compound (I).

20 Claims, No Drawings

ACTINIC RAY-SENSITIVE OR RADIATION-SENSITIVE RESIN COMPOSITION, RESIST FILM, PATTERN FORMING METHOD, METHOD FOR MANUFACTURING ELECTRONIC DEVICE, AND COMPOUND

CROSS-REFERENCE TO RELATED APPLICATIONS

This application is a Continuation of PCT International Application No. PCT/JP2021/018992 filed on May 19, 2021, which claims priority under 35 U.S.C. § 119(a) to Japanese Patent Application No. 2020-101009 filed on Jun. 10, 2020 and Japanese Patent Application No. 2020-208293 filed on Dec. 16, 2020. The above applications are hereby expressly incorporated by reference, in its entirety, into the present application.

BACKGROUND OF THE INVENTION

1. Field of the Invention

The present invention relates to an actinic ray-sensitive or radiation-sensitive resin composition, a resist film, a pattern forming method, a method for manufacturing an electronic device, and a compound.

2. Description of the Related Art

Since the advent of a resist for KrF excimer laser (248 nm), a pattern forming method utilizing chemical amplification has been used in order to compensate for a decrease in sensitivity due to light absorption. For example, in a positive tone chemical amplification method, first, a photoacid generator included in the exposed portion decomposes upon irradiation with light to generate an acid. Then, in a post-exposure baking (PEB) step and the like, a solubility in a developer changes by, for example, changing an alkali-insoluble group contained in a resin included in an actinic ray-sensitive or radiation-sensitive resin composition to an alkali-soluble group by the catalytic action of an acid thus generated. Thereafter, development is performed using a basic aqueous solution, for example. As a result, the exposed portion is removed to obtain a desired pattern.

For miniaturization of semiconductor elements, the wavelength of an exposure light source has been shortened and a projection lens with a high numerical aperture (high NA) has been advanced, and currently, an exposure machine using an ArF excimer laser having a wavelength of 193 nm as a light source is under development. In addition, in recent years, a pattern forming method using extreme ultraviolet rays (EUV light) and an electron beam (EB) as a light source has also been studied.

Under these circumstances, various configurations have been proposed as actinic ray-sensitive or radiation-sensitive resin compositions.

For example, JP2019-14704A discloses an acid generator including a salt represented by Formula (I) as a component used in a resist composition.

(I)

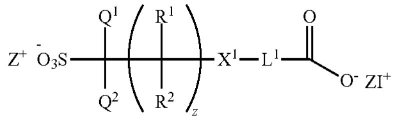

SUMMARY OF THE INVENTION

The present inventors have conducted studies on the resist composition described in JP2019-14704A, and have thus found that a pattern formed using the resist composition easily has a non-rectangular cross-sectional shape (tapered shape). Specifically, in a case where in a pattern after development, a pattern line width at the bottom of the pattern is taken as Lb and a pattern line width at the top of the pattern is taken as La, it was found that a value of La/Lb is excessive in a case of a positive tone development, and Lb/La is excessive in a case of a negative tone development.

That is, it was found that there is room for further improvement (further rectangularization) of the shape of a pattern.

Therefore, an object of the present invention is to provide an actinic ray-sensitive or radiation-sensitive resin composition with which a pattern having a good shape can be obtained.

Moreover, another object of the present invention is to provide a resist film, a pattern forming method, and a method for manufacturing an electronic device, each relating to the actinic ray-sensitive or radiation-sensitive resin composition.

In addition, still another object of the present invention is to provide a compound which can be suitably used in the actinic ray-sensitive or radiation-sensitive resin composition.

The present inventors have found that the objects can be accomplished by the following configurations.

[1] An actinic ray-sensitive or radiation-sensitive resin composition comprising:

a compound that generates an acid upon irradiation with actinic rays or radiation; and a resin of which polarity increases through decomposition by an action of an acid, having a weight-average molecular weight of 30,000 or less, in which the compound that generates an acid upon irradiation with actinic rays or radiation includes a compound (I) which will be described.

[2] The actinic ray-sensitive or radiation-sensitive resin composition as described in [1], in which the compound (I) is a compound having two of structural moieties X and one of structural moiety Y.

[3] The actinic ray-sensitive or radiation-sensitive resin composition as described in [2], in which the compound (I) is a compound represented by any one of Formula (I)-1, (I)-2, or (I)-3 which will be described later.

[4] The actinic ray-sensitive or radiation-sensitive resin composition as described in [3], in which $A_{11}^-$ and $A_{12}^-$ in Formula (I)-1, $A_{13}^-$ in Formula (I)-2, and $A_{15}^-$ and $A_{16}^-$ in Formula (I)-3 each represent a monovalent anionic functional group of any one of Formula (A-1), (A-2), or (A-4) which will be described later, and $A_{14}^-$ in Formula (I)-2 represents a divalent anionic functional group represented by Formula (A-3) which will be described later.

[5] The actinic ray-sensitive or radiation-sensitive resin composition as described in [3] or [4], in which $B_{11}^-$ in Formula (I)-1 represents a divalent anionic functional group of any one of Formula (B-8) to (B-11) which will be described later, and $B_{12}^-$ in Formula (I)-2 and $B_{13}^-$ in Formula (I)-3 each represent a monovalent anionic functional group of any one of Formula (B-1) to (B-7) which will be described later.

[6] The actinic ray-sensitive or radiation-sensitive resin composition as described in [1], in which the anionic moiety $A_1^-$ in the compound (I) represents any one of Formula (AA-1), (AA-2), or (AA-3) which will be described.

[7] The actinic ray-sensitive or radiation-sensitive resin composition as described in [1] or [6], in which the anionic moiety $B_1^-$ in the compound (I) represents any one of Formula (BB-1) to (BB-5) which will be described.

[8] The actinic ray-sensitive or radiation-sensitive resin composition as described in any one of [1] to [7], in which the resin of which polarity increases through decomposition by an action of an acid includes an acid group.

[9] The actinic ray-sensitive or radiation-sensitive resin composition as described in any one of [1] to [8], in which the resin of which polarity increases through decomposition by an action of an acid includes a repeating unit having an acid group.

[10] The actinic ray-sensitive or radiation-sensitive resin composition as described in any one of [1] to [9], further comprising a solvent.

[11] A resist film formed of the actinic ray-sensitive or radiation-sensitive resin composition as described in any one of [1] to [10].

[12] A pattern forming method comprising:

a step of forming a resist film on a substrate using the actinic ray-sensitive or radiation-sensitive resin composition as described in any one of [1] to [10];

a step of exposing the resist film; and a step of developing the exposed resist film, using a developer.

[13] A method for manufacturing an electronic device, comprising the pattern forming method as described in [12].

[14] A compound represented by any one of Formula (I)-1, (I)-2, or (I)-3 which will be described later.

[15] The compound as described in [14], in which $A_{11}^-$ and $A_{12}^-$ in Formula (I)-1, $A_{13}^-$ in Formula (I)-2, and $A_{15}^-$ and $A_{16}^-$ in Formula (I)-3 each represent a monovalent anionic functional group of any one of Formula (A-1), (A-2), or (A-4) which will be described later, and $A_{14}^-$ in Formula (I)-2 represents a divalent anionic functional group represented by Formula (A-3) which will be described later.

[16] The compound as described in [14] or [15], in which $B_{11}^-$ in Formula (I)-1 represents a divalent anionic functional group of any one of Formula (B-8) to (B-11) which will be described later, and $B_{12}^-$ in Formula (I)-2 and $B_{13}^-$ in Formula (I)-3 each represent a monovalent anionic functional group of any one of Formula (B-1) to (B-7) which will be described later.

According to the present invention, it is possible to provide an actinic ray-sensitive or radiation-sensitive resin composition with which a pattern having a good shape can be obtained.

In addition, according to the present invention, it is possible to provide a resist film, a pattern forming method, and a method for manufacturing an electronic device, each relating to the actinic ray-sensitive or radiation-sensitive resin composition.

In addition, according to the present invention, it is possible to provide a compound which can be suitably used in the actinic ray-sensitive or radiation-sensitive resin composition.

DESCRIPTION OF THE PREFERRED EMBODIMENTS

Hereinafter, the present invention will be described in detail.

Description of configuration requirements described below may be made on the basis of representative embodiments of the present invention in some cases, but the present invention is not limited to such embodiments.

In notations for a group (atomic group) in the present specification, in a case where the group is noted without specifying whether it is substituted or unsubstituted, the group includes both a group having no substituent and a group having a substituent as long as this does not impair the spirit of the present invention. For example, an "alkyl group" includes not only an alkyl group having no substituent (unsubstituted alkyl group), but also an alkyl group having a substituent (substituted alkyl group). In addition, an "organic group" in the present specification refers to a group including at least one carbon atom.

The substituent is preferably a monovalent substituent unless otherwise specified.

"Actinic rays" or "radiation" in the present specification means, for example, a bright line spectrum of a mercury lamp, far ultraviolet rays typified by an excimer laser, extreme ultraviolet rays (EUV light), X-rays, an electron beam (EB), or the like. "Light" in the present specification means actinic rays or radiation.

Unless otherwise specified, "exposure" in the present specification encompasses not only exposure by a bright line spectrum of a mercury lamp, far ultraviolet rays typified by an excimer laser, extreme ultraviolet rays (EUV light), X-rays, or the like, but also lithography by particle beams such as electron beams and ion beams.

In the present specification, a numerical range expressed using "to" is used in a meaning of a range that includes the preceding and succeeding numerical values of "to" as the lower limit value and the upper limit value, respectively.

The bonding direction of divalent groups noted in the present specification is not limited unless otherwise specified. For example, in a case where Y in a compound represented by Formula "X—Y—Z" is —COO—, Y may be —CO—O— or —O—CO—. In addition, the compound may be "X—CO—O—Z" or "X—O—CO—Z".

In the present specification, (meth)acrylate represents acrylate and methacrylate, and (meth)acryl represents acryl and methacryl.

In the present specification, a weight-average molecular weight (Mw), a number-average molecular weight (Mn), and a dispersity (also referred to as a molecular weight distribution) (Mw/Mn) of a resin are defined as values expressed in terms of polystyrene by means of gel permeation chromatography (GPC) measurement (solvent: tetrahydrofuran, flow amount (amount of a sample injected): 10 μL, columns: TSK gel Multipore HXL-M manufactured by Tosoh Corporation, column temperature: 40° C., flow rate: 1.0 mL/min, and detector: differential refractive index detector) using a GPC apparatus (HLC-8120GPC manufactured by Tosoh Corporation).

In the present specification, an acid dissociation constant (pKa) represents a pKa in an aqueous solution, and is specifically a value determined by computation from a value based on a Hammett's substituent constant and database of publicly known literature values, using the following software package 1. Any of the pKa values described in the present specification indicate values determined by computation using the software package.

Software Package 1: Advanced Chemistry Development (ACD/Labs) Software V 8.14 for Solaris (1994-2007 ACD/Labs).

On the other hand, the pKa can also be determined by a molecular orbital computation method. Examples of a specific method therefor include a method for performing calculation by computing $H^+$ dissociation free energy in an aqueous solution based on a thermodynamic cycle. With regard to a computation method for $H^+$ dissociation free energy, the $H^+$ dissociation free energy can be computed by, for example, density functional theory (DFT), but various other methods have been reported in literature and the like, and are not limited thereto. Furthermore, there are a plurality of software applications capable of performing DFT, and examples thereof include Gaussian 16.

As described above, the pKa in the present specification refers to a value determined by computation from a value based on a Hammett's substituent constant and database of publicly known literature values, using the software package 1, but in a case where the pKa cannot be calculated by the method, a value obtained by Gaussian 16 based on density functional theory (DFT) shall be adopted.

In addition, the pKa in the present specification refers to a "pKa in an aqueous solution" as described above, but in a case where the pKa in an aqueous solution cannot be calculated, a "pKa in a dimethyl sulfoxide (DMSO) solution" shall be adopted.

In the present specification, examples of the halogen atom include a fluorine atom, a chlorine atom, a bromine atom, and an iodine atom.

[Actinic Ray-Sensitive or Radiation-Sensitive Resin Composition]

As a feature point of the actinic ray-sensitive or radiation-sensitive resin composition (hereinafter also referred to as the "resist composition") of an embodiment of the present invention, mention be made of a point that the composition includes a resin of which polarity increases through decomposition by the action of an acid, having a weight-average molecular weight of 30,000 or less (hereinafter an "acid-decomposable resin" or a "resin (A)"), and a compound (I) which will be described later as a compound that generates an acid upon irradiation with actinic rays or radiation (hereinafter also simply referred to as a "photoacid generator").

With the configuration, the resist composition of the embodiment of the present invention can form a pattern having an excellent pattern shape (in other words, having a rectangular shape).

A reason thereof is not specifically clear, but is presumed to be as follows by the present inventors.

The compound (I) is composed of a pair of an anionic moiety and a cationic moiety, and have three or more structural moieties that form an acidic moieties by exposure (two or more structural moieties X and one structural moiety Y) present therein. For this reason, an acid generated from the compound (I) through decomposition of any of the cationic moieties by exposure has a structure in which three or more acidic moieties (proton donor moieties) are present, and has excellent interaction properties (hydrogen-bonding properties) with an acid-decomposable resin (in particular, a proton acceptor moiety such as a carbonyl group, which can be present in an acid-decomposable resin). The acid generated from the compound (I) is less likely to be diffused in a resist film after exposure due to the structure, and as a result, the cross-sectional shape of a pattern thus formed can be rectangularized. Furthermore, it is presumed that even in a case where only a part of the cationic moieties in the compound (I) decomposes upon exposure, leading to generation of a generated acid having a structural moiety composed of a pair of an anionic moiety and a cationic moiety, and an acidic moiety, the generated acid has a bulky structure in which a structural moiety composed of a pair of an anionic moiety and a cationic moiety is present, by which structure the generated acid is less likely to be diffused in a resist film after exposure, and the cross-sectional shape of a pattern thus formed can be rectangularized.

Hereinafter, the resist composition of the embodiment of the present invention will be described in detail.

The resist composition may be either a positive tone resist composition or a negative tone resist composition. In addition, the resist composition may be either a resist composition for alkali development or a resist composition for organic solvent development.

The resist composition is typically a chemically amplified resist composition.

Hereinbelow, various components of the resist composition will first be described in detail.

[Photoacid Generator]

The resist composition includes the following compound (I) as a compound that generates an acid upon irradiation with actinic rays or radiation (photoacid generator).

Furthermore, the resist composition may further include another photoacid generator (hereinafter also referred to as a "photoacid generator (B)") other than the compound (I) as described later.

First, the compound (I) will be described below.

<Compound (I)>

Hereinafter, the compound (I) will be described.

Compound (I): a compound having two or more of the following structural moieties X and one of the following structural moiety Y, the compound generating an acid including the two or more first acidic moieties derived from the structural moieties X and the second acidic moiety derived from the structural moiety Y upon irradiation with actinic rays or radiation.

Structural moiety X: a structural moiety which consists of an anionic moiety $A_1^-$ and a cationic moiety $C_1^+$, and forms a first acidic moiety represented by $HA_1$ upon irradiation with actinic rays or radiation.

Structural moiety Y: a structural moiety which consists of an anionic moiety $B_1^-$ and a cationic moiety $C_2^+$, and forms a second acidic moiety represented by $HB_1$ upon irradiation with actinic rays or radiation It should be noted that the compound (I) satisfies the following condition I.

Condition I: a compound PI formed by substituting the cationic moiety $C_1^+$ in the structural moiety X and the cationic moiety $C_2^+$ in the structural moiety Y with $H^+$ in the compound (I) has an acid dissociation constant a derived from an acidic moiety represented by $HA_1$, formed by substituting the cationic moiety $C_1^+$ in the structural moiety X with $H^+$, and an acid dissociation constant b derived from an acidic moiety represented by $HB_1$, formed by substituting the cationic moiety $C_2^+$ in the structural moiety Y with $H^+$, and the acid dissociation constant b is larger than the acid dissociation constant a.

Hereinafter, the condition I will be described more specifically.

In a case where the compound (I) is, for example, a compound that generates an acid having two of the first acidic moieties derived from the structural moiety X and one of the second acidic moieties derived from the structural moiety Y, the compound PI corresponds to a "compound having two $HA_1$'s and one $HB_1$". In a case where the acid dissociation constant of the compound PI is determined, an acid dissociation constant in a case where the compound PI serves as a "compound having one $A_1^-$, one $HA_1$, and one $HB_1$" and an acid dissociation constant in a case where the "compound having one $A_1^-$, one $HA_1$, and one $HB_1$" serves as a "compound having two $A_1^-$'s and one $HB_1$" correspond to the acid dissociation constant a. In addition, the acid dissociation constant in a case where the "compound having two $A_1^+$'s and one $HB_1$" serves as a "compound having two $A_1^+$'s and $B_1^-$" corresponds to the acid dissociation constant b. That is, in a case where the compound PI has a plurality of acid dissociation constants derived from the acidic moiety represented by $HA_1$, formed by substituting the cationic moiety $C_1^+$ in the structural moiety X with $H^+$, the value of the acid dissociation constant b is larger than the largest value of the plurality of acid dissociation constants a. Furthermore, in a case where the acid dissociation constant in a case where the compound PI serves as a "compound having one $A_1^-$, one $HA_1$, and one $HB_1$" is taken as aa and the acid dissociation constant in a case where the compound having one $A_1^-$, one $HA_1$, and one $HB_1$ serves as a "compound having two $A_1^-$ 's and one $HB_1$" is taken as ab, a relationship between aa and ab satisfies aa<ab.

The acid dissociation constant a and the acid dissociation constant b can be determined by the above-mentioned method for measuring an acid dissociation constant.

In addition, the compound PI corresponds to an acid that is typically generated in a case of irradiating the compound (I) with actinic rays or radiation.

Furthermore, the two or more structural moieties X may be the same as or different from each other. In addition, the two or more $A_1^-$'s and the two or more $C_1^+$'s may be the same as or different from each other. Moreover, $A_1^-$ and $B_{11}^-$ may be the same as or different from each other.

The anionic moiety $A_1^-$ and the anionic moiety $B_1^-$ are structural moieties including negatively charged atoms or atomic groups, and examples thereof include structural moieties selected from the group consisting of Formulae (AA-1) to (AA-3) and Formulae (BB-1) to (BB-6) shown below. As the anionic moiety $A_1^-$, those capable of forming an acidic moiety having a small acid dissociation constant are preferable, and among those, Formulae (AA-1) to (AA-3) are preferable. In addition, the anionic moiety $B_1^-$ is preferably the one capable of forming an acidic moiety having a larger acid dissociation constant than the anionic moiety $A_1^-$, and above all, any one of Formula (BB-1) to (BB-6) is preferable, and from the viewpoint that the shape of a pattern thus formed is further rectangularized, any one of Formula (BB-1) to (BB-5) is more preferable.

Furthermore, in Formulae (AA-1) to (AA-3) and Formulae (BB-1) to (BB-6), * represents a bonding position.

AA-1

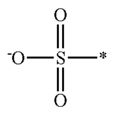

AA-2

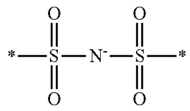

AA-3

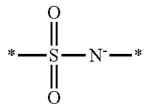

-continued

BB-1

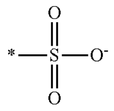

BB-2

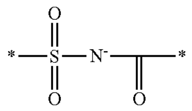

BB-3

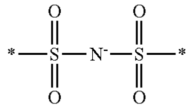

BB-4

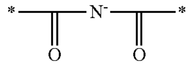

BB-5

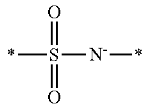

BB-6

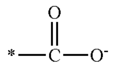

In addition, the cationic moiety $C_1^+$ and the cationic moiety $C_2^+$ are structural moieties including positively charged atoms or atomic groups, and examples thereof include an organic cation having a monovalent charge. Furthermore, the organic cation is not particularly limited, and examples thereof include the same ones as the organic cations represented by $C_{11}^+$, $C_{12}^+$, and $C_{21}^+$ in Formula (I)-1 which will be described later.

From the viewpoint that the LWR performance of a pattern thus formed is more excellent, in the compound PI, the difference between the largest value of a plurality of the acid dissociation constants a and the acid dissociation constant b is preferably 1.0 or more, and more preferably 1.5 or more. Furthermore, the upper limit value of the difference between the largest value of the plurality of the acid dissociation constants a and the acid dissociation constant b is not particularly limited, but is, for example, 21.0 or less.

In addition, from the viewpoint that the LWR performance of a pattern thus formed is more excellent, in the compound PI, the acid dissociation constant b is, for example, 12.0 or less, and preferably 10.0 or less. Furthermore, the lower limit value of the acid dissociation constant b is preferably −4.0 or more.

In addition, from the viewpoint that the LWR performance of a pattern thus formed is more excellent, the acid dissociation constant a is preferably 2.0 or less, and more preferably 0.5 or less in the compound PI. Furthermore, a lower limit value of the acid dissociation constant a is preferably −15.0 or more.

The molecular weight of the compound (1) is preferably 10,000 or less, more preferably 8,000 or less, and still more preferably 5,000 or less from the viewpoint that the LWR performance is more excellent. Furthermore, the lower limit value is not particularly limited, but is preferably 500 or more.

From the viewpoint that the shape of a pattern thus formed is further rectangularized, the compound (I) is preferably a compound having two structural moieties X and one structural moiety Y, and more preferably a compound represented by any one of Formula (I)-1, (I)-2, or (I)-3.

(I)-1

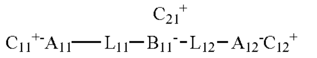

(I)-2

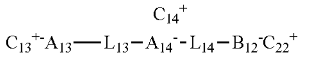

(I)-3

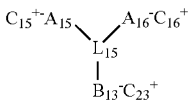

In Formula (I)-1, $A_{11}^-$ and $A_{12}^-$ each independently represent a monovalent anionic functional group. Here, the monovalent anionic functional group represented by each of $A_{11}^-$ and $A_{12}^-$ is intended to be a monovalent group including the above-mentioned anionic moiety $A_1^-$. Examples of the monovalent anionic functional group represented by each of $A_{11}^-$ and $A_{12}^-$ include Formula (A-1), Formulae (A-2), and (A-4) mentioned above. Furthermore, Formula (A-1) which will be described later includes the anionic moiety represented by Formula (AA-1) mentioned above, Formula (A-2) which will be described later includes the anionic moiety represented by Formula (AA-2) mentioned above, and Formula (A-4) which will be described later includes the anionic moiety represented by Formula (AA-3) mentioned above.

$B_{11}^-$ represents a divalent anionic functional group. Here, the divalent anionic functional group represented by $B_{11}^-$ is intended to be a divalent group including the above-mentioned anionic moiety $B_1^-$. Examples of the divalent anionic functional group represented by $B_{11}^-$ include groups represented by Formulae (B-8) to (B-11) which will be described later. Furthermore, Formula (B-8) which will be described later includes the anionic moiety represented by Formula (BB-2) mentioned above, Formula (B-9) which will be described later includes the anionic moiety represented by Formula (BB-3) mentioned above, Formula (B-10) which will be described later includes the anionic moiety represented by Formula (BB-4) mentioned above, and Formula (B-11) which will be described later includes the anionic moiety represented by Formula (BB-5) mentioned above.

$C_{11}^+$, $C_{12}^+$, and $C_{21}^+$ each independently represent an organic cation.

$L_{11}$ and $L_{12}$ each independently represent a divalent organic group.

In addition, in a compound PI-1 formed by substituting organic cations represented by $C_{11}^+$, $C_{12}^+$, and $C_{21}^+$ with $H^+$ in Formula (I)-1, an acid dissociation constant b1 derived from an acidic moiety represented by $B_{11}H$ is larger than an acid dissociation constant a1 derived from an acidic moiety represented by $HA_{11}$ and an acid dissociation constant a2 derived from the acidic moiety represented by $HA_{12}$. Furthermore, the acid dissociation constant a1 and the acid dissociation constant a2 have the same definition as the above-mentioned acid dissociation constant a, and suitable aspects thereof are also the same. In addition, the acid dissociation constant b1 has the same definition as the above-mentioned acid dissociation constant b, and suitable aspects thereof are also the same.

Incidentally, $A_{11}^-$ and $A_{12}^-$ may be the same as or different from each other. In addition, $C_{11}^+$, $C_{12}^+$, and $C_{21}^+$ may be the same as or different from each other.

In Formula (I)-2, $A_{13}^-$ represents a monovalent anionic functional group. Furthermore, the monovalent anionic functional group represented by $A_{13}^-$ has the same definition as $A_{11}^-$ and $A_{12}^-$ in Formula (I)-1 mentioned above.

$B_{12}^-$ represents a monovalent anionic functional group. Here, the monovalent anionic functional group represented by $B_{12}^-$ is intended to be a monovalent group including the above-mentioned anionic moiety $B_1^-$. Furthermore, examples of the monovalent anionic functional group represented by $B_{12}^-$ include the groups represented by Formulae (B-1) to (B-7), and (B-12). Incidentally, Formulae (B-1) and (B-2) which will be described later include an anionic moiety represented by Formula (BB-2) mentioned above, Formula (B-3) which will be described later includes the anionic moiety represented by Formula (BB-3) mentioned above, Formula (B-4) which will be described later includes the anionic moiety represented by Formula (BB-4) mentioned above, Formulae (B-5) and (B-6) which will be described later include the anionic moiety represented by Formula (BB-5) mentioned above, Formula (B-7) which will be described later includes the anionic moiety represented by Formula (BB-1) mentioned above, and Formula (B-12) which will be described later contains the anionic moiety represented by Formula (BB-6) mentioned above.

$A_{14}^-$ represents a divalent anionic functional group. The divalent anionic functional group represented by $A_{14}^-$ is intended to be a divalent group including the above-mentioned anionic moiety $A_1^-$. Incidentally, examples of the divalent anionic functional group represented by $A_{14}^-$ include the group represented by Formula (A-3) mentioned above. Furthermore, Formula (A-3) which will be described later includes the anionic moiety represented by Formula (AA-2) mentioned above.

$C_{13}^+$, $C_{14}^+$, and $C_{22}^+$ each independently represent an organic cation.

$L_{13}$ and $L_{14}$ each independently represent a divalent organic group.

In addition, in a compound PI-2 formed by substituting organic cations represented by $C_{13}^+$, $C_{14}^+$, and $C_{22}^+$ with $H^+$ in Formula (I)-2, an acid dissociation constant b2 derived from an acidic moiety represented by $B_{12}H$ is larger than an acid dissociation constant a3 derived from an acidic moiety represented by $HA_{13}$ and an acid dissociation constant a4 derived from an acidic moiety represented by $HA_{14}$. Furthermore, the acid dissociation constant a3 and the acid dissociation constant a4 have the same definition as the above-mentioned acid dissociation constant a, and suitable aspects thereof are also the same. In addition, the acid dissociation constant b2 has the same definition as the acid dissociation constant b described above, and suitable aspects thereof are also the same.

Incidentally, $A_{13}^-$ and $B_{12}^-$ may be the same as or different from each other. In addition, $C_{13}^+$, $C_{14}^+$, and $C_{22}^+$ may be the same as or different from each other.

In Formula (I)-3, $A_{15}^-$, $A_{16}^-$, and $B_{13}^-$ each independently represent a monovalent anionic functional group. Furthermore, the monovalent anionic functional group represented by each of $A_{15}^-$ and $A_{16}^-$ has the same definition as $A_{11}^-$ and $A_{12}^-$ in Formula (I)-1 mentioned above. In addition, the monovalent anionic functional group represented by $B_{13}^-$ has the same definition as $B_{12}^-$ in Formula (I)-2 mentioned above.

$C_{15}^+$, $C_{16}^+$, and $C_{23}^+$ each independently represent an organic cation.

$L_{15}$ represents a trivalent organic group.

In addition, in a compound PI-3 formed by substituting organic cations represented by $C_{15}^+$, $C_{16}^+$, and $C_{23}^+$ with $H^+$ in Formula (I)-3, an acid dissociation constant b3 derived from an acidic moiety represented by $B_{15}H$ is larger than an acid dissociation constant a5 derived from an acidic moiety represented by $HA_{15}$ and an acid dissociation constant a6 derived from an acidic moiety represented by $HA_{16}$. Furthermore, the acid dissociation constant a5 and the acid dissociation constant a6 have the same definition as the above-mentioned acid dissociation constant a, and suitable aspects thereof are also the same. In addition, the acid dissociation constant b3 has the same definition as the acid dissociation constant b described above, and suitable aspects thereof are also the same.

Incidentally, $A_{15}^-$, $A_{16}^-$, and $B_{13}^-$ may be the same as or different from each other. In addition, $C_{15}^+$, $C_{16}^+$, and $C_{23}^+$ may be the same as or different from each other.

The monovalent anionic functional group represented by each of $A_{11}^-$ and $A_{12}^-$ in Formula (I)-1, $A_{13}^-$ in Formula (I)-2, and $A_{15}^-$ and $A_{16}^+$ in Formula (I)-3 is not particularly limited, but a monovalent anionic functional group of any one of Formula (A-1), Formula (A-2), or Formula (A-4) shown below is preferable from the viewpoint that the shape of a pattern thus formed is further rectangularized.

The divalent anionic functional group represented by $A_{14}^-$ in Formula (I)-2 is not particularly limited, but examples thereof the include a divalent anionic functional group represented by Formula (A-3) shown below.

A-1

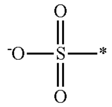

A-2

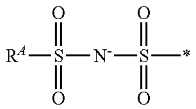

A-3

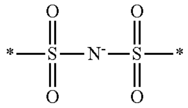

A-4

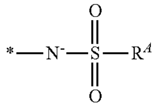

In Formulae (A-2) and (A-4), $R^A$ represents a monovalent organic group. In Formulae (A-1) to (A-4), * represents a bonding position.

As the monovalent organic group represented by $R^A$, a linear, branched, or cyclic alkyl group, or an aryl group is preferable.

The alkyl group preferably has 1 to 15 carbon atoms, more preferably has 1 to 10 carbon atoms, and still more preferably has 1 to 6 carbon atoms.

The alkyl group may have a substituent. As the substituent, a fluorine atom or a cyano group is preferable. In a case where the alkyl group has a fluorine atom as the substituent, it may be a perfluoroalkyl group.

Furthermore, in Formula (A-4), the atom and/or atomic group linked to the bonding position represented by * is preferably other than $—SO_2—$.

As the aryl group, a phenyl group or a naphthyl group is preferable, and the phenyl group is more preferable.

The aryl group may have a substituent. As the substituent, a fluorine atom, a perfluoroalkyl group (for example, preferably having 1 to 10 carbon atoms, and more preferably having 1 to 6 carbon atoms), or a cyano group is preferable.

The divalent anionic functional group represented by $B_{11}^-$ in Formula (I)-1 is not particularly limited, but from the shape of a pattern formed is further rectangularized, a divalent anionic functional group of any one of Formula (B-8), . . . , or (B-11) shown below is preferable.

The monovalent anionic functional group represented by each of $B_{12}^-$ in Formula (I)-2 and $B_{13}^-$ in Formula (I)-3 is not particularly limited, but examples thereof include monovalent anionic functional groups represented by Formulae (B-1) to (B-7), and Formula (B-12). Among those, the monovalent anionic functional group of any one of Formula (B-1), . . . , or (B-7) shown below is preferable from the viewpoint that the shape of a pattern formed is further rectangularized.

B-1

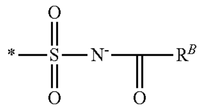

B-2

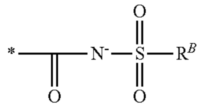

B-3

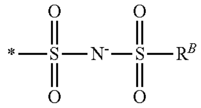

B-4

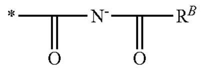

B-5

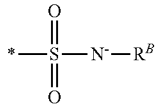

B-6

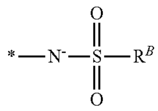

B-7

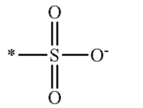

B-8

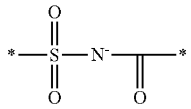

B-9

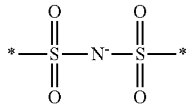

B-10

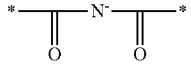

-continued

B-11

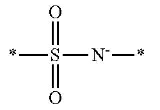

B-12

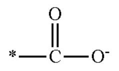

In Formulae (B-1) to (B-6), $R^B$ represents a monovalent organic group. In Formulae (B-1) to (B-12), * represents a bonding position.

As the monovalent organic group represented by $R^B$, a linear, branched, or cyclic alkyl group, or an aryl group is preferable.

The alkyl group preferably has 1 to 15 carbon atoms, more preferably has 1 to 10 carbon atoms, and still more preferably has 1 to 6 carbon atoms.

The alkyl group may have a substituent. The substituent is not particularly limited, but in a case where the carbon atom that serves as a bonding position in the alkyl group (for example, in a case of Formulae (B-1) and (B-4), the carbon atom corresponds to a carbon atom that directly bonds to —CO— specified in the formula in the alkyl group, and in a case of Formulae (B-2), (B-3), and (B-6), the carbon atom corresponds to a carbon atom that directly bonded to —$SO_2$— specified in the formula in the alkyl group, and in a case of Formula (B-5), the carbon atom corresponds to a carbon atom that directly bonded to —$N^-$ specified in the formula in the alkyl group) has a substituent, it is preferable that the carbon atom has a substituent other than a fluorine atom or a cyano group.

As the aryl group, a phenyl group or a naphthyl group is preferable, and the phenyl group is more preferable.

The aryl group may have a substituent. The substituent is preferably an alkyl group (for example, preferably an alkyl group having 1 to 10 carbon atoms, and more preferably an alkyl group having 1 to 6 carbon atoms), an alkoxy group (for example, preferably an alkoxy group having 1 to 10 carbon atoms, and more preferably an alkoxy group having 1 to 6 carbon atoms), or an alkoxycarbonyl group (for example, preferably an alkoxycarbonyl group having 2 to 10 carbon atoms, and more preferably an alkoxycarbonyl group having 2 to 6 carbon atoms).

Furthermore, in Formula (B-5), the atom directly bonded to $N^-$ in $R^B$ is preferably neither a carbon atom in —CO— nor a sulfur atom in —$SO_2$—.

In addition, in Formula (B-6), the atom and/or atomic group linked to the bonding position represented by * is preferably other than —$SO_2$—.

In addition, in Formula (B-11), the atom and/or atomic group to be linked to the bonding position represented by * on the N-side specified in the formula is preferably other than —$SO_2$— and —CO—.

In Formula (I)-1, from the viewpoint that the shape of a pattern thus formed is further rectangularized, it is preferable that $B_{11}^-$ represents a divalent anionic functional group of any one of Formula (B-8) to (B-11) mentioned above, $A_{11}^-$ and $A_{12}^-$ each represent a monovalent anionic functional group of any one of Formula (A-1), (A-2), or (A-4) mentioned above.

In Formula (I)-2, from the viewpoint that the shape of a pattern thus formed is further rectangularized, it is preferable that $B_{12}^-$ represents a monovalent anionic functional group of any one of Formula (B-1) to (B-7) mentioned above, $A_{13}^-$ represents a monovalent anionic functional group of any one of Formula (A-1), (A-2), or (A-4) mentioned above, and $A_{14}^-$ represents a divalent anionic functional group represented by Formula (A-3).

In Formula (I)-3, from the viewpoint that the shape of a pattern thus formed is further rectangularized, it is preferable that $B_{13}^-$ represents a monovalent anionic functional group of any one of Formula (B-1) to (B-7) mentioned above, $A_{15}^-$ and $A_{16}^-$ each represent a monovalent anionic functional group of any one of Formula (A-1), (A-2), or (A-4) mentioned above.

The divalent organic group represented by each of $L_{11}$ and $L_{12}$ in Formula (I)-1, and $L_{13}$ and $L_{14}$ in Formula (I)-2 is not particularly limited, and examples thereof include —CO—, —NR—, —O—, —S—, —SO—, —$SO_2$—, an alkylene group (which preferably has 1 to 6 carbon atoms, and may be linear or branched), a cycloalkylene group (preferably having 3 to 15 carbon atoms), an alkenylene group (preferably having 2 to 6 carbon atoms), a divalent aliphatic heterocyclic group (preferably having a 5- to 10-membered ring, more preferably having a 5- to 7-membered ring, and still more preferably having a 5- or 6-membered ring, each having at least one of an N atom, an O atom, an S atom, or an Se atom in the ring structure), a divalent aromatic heterocyclic group (preferably having a 5- to 10-membered ring, more preferably having a 5- to 7-membered ring, and still more preferably having a 5- or 6-membered ring, each having at least one of an N atom, an O atom, an S atom, or an Se atom in the ring structure), a divalent aromatic hydrocarbon ring group (preferably having a 6- to 10-membered ring, and more preferably having a 6-membered ring), and a divalent organic group formed by combination of a plurality of these groups. Examples of R include a hydrogen atom or a monovalent organic group. The monovalent organic group is not particularly limited, but is preferably, for example, an alkyl group (preferably having 1 to 6 carbon atoms).

In addition, the alkylene group, the cycloalkylene group, the alkenylene group, the divalent aliphatic heterocyclic group, the divalent aromatic heterocyclic group, and the divalent aromatic hydrocarbon ring group may be substituted with a substituent. Examples of the substituent include a halogen atom (preferably a fluorine atom).

In addition, it is also preferable that the divalent organic group represented by each of $L_{11}$ and $L_{12}$ in Formula (I)-1, and $L_{13}$ and $L_{14}$ in Formula (I)-2 has an acid-decomposable group as a substituent. Examples of the acid-decomposable group include the same ones as the acid-decomposable group which can be contained in the acid-decomposable resin which will be described later.

As the divalent organic group represented by each of $L_{11}$ and $L_{12}$ in Formula (I)-1, and $L_{13}$ and $L_{14}$ in Formula (I)-2, for example, a divalent organic group represented by Formula (LX1) is preferable.

(LX1)

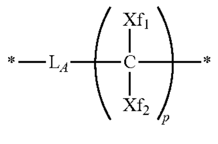

In Formula (LX1), p represents an integer of 1 to 3. * represents a bonding position.

$Xf_1$'s each independently represent a fluorine atom or an alkyl group substituted with at least one fluorine atom. The alkyl group preferably has 1 to 10 carbon atoms, and more preferably has 1 to 4 carbon atoms. In addition, a perfluoroalkyl group is preferable as the alkyl group substituted with at least one fluorine atom. $Xf_1$ is preferably the fluorine atom or a perfluoroalkyl group having 1 to 4 carbon atoms, and more preferably the fluorine atom or $CF_3$.

$Xf_2$'s each independently represent a hydrogen atom, a fluorine atom, or an alkyl group which may be substituted with at least one fluorine atom. The alkyl group preferably has 1 to 10 carbon atoms, and more preferably has 1 to 4 carbon atoms.

$Xf_1$ and $Xf_2$ are each preferably the fluorine atom or a perfluoroalkyl group having 1 to 4 carbon atoms, and more preferably the fluorine atom or $CF_3$. In particular, it is still more preferable that both of $Xf_1$ and $Xf_2$ are fluorine atoms.

$L_A$ represents a single bond or a divalent linking group.

The divalent linking group represented by $L_A$ is not particularly limited, and examples thereof include —CO—, —O—, —SO—, —$SO_2$—, an alkylene group (which preferably has 1 to 6 carbon atoms, and may be linear or branched), a cycloalkylene group (preferably having 3 to 15 carbon atoms), a divalent aromatic hydrocarbon ring group (preferably having a 6 to 10-membered ring, and more preferably having a 6-membered ring), and a divalent linking group formed by combination of a plurality of these groups.

In addition, the alkylene group, the cycloalkylene group, and the divalent aromatic hydrocarbon ring group may be substituted with a substituent. Examples of the substituent include a halogen atom (preferably a fluorine atom).

Examples of the divalent organic group represented by Formula (LX1) include *—$CF_2$—*, *—$CF_2$—$CF_2$—*, *—$CF_2$—$CF_2$—$CF_2$—*, *-Ph-O—$SO_2$—$CF_2$—*, *-Ph-O—$SO_2$—$CF_2$—$CF_2$—*, *-Ph-O—$SO_2$—$CF_2$—$CF_2$—$CF_2$—*, and *—O—$CH_2$—CHF—*. Furthermore, Ph is a phenylene group which may have a substituent, and is preferably a 1,4-phenylene group. The substituent is not particularly limited, but is, for example, preferably an alkyl group (for example, preferably an alkyl group having 1 to 10 carbon atoms, and more preferably an alkyl group having 1 to 6 carbon atoms), an alkoxy group (for example, preferably an alkoxy group having 1 to 10 carbon atoms, and more preferably an alkoxy group having 1 to 6 carbon atoms), or an alkoxycarbonyl group (for example, preferably an alkoxycarbonyl group having 2 to 10 carbon atoms, and more preferably an alkoxycarbonyl group having 2 to 6 carbon atoms).

In a case where $L_{11}$ and $L_{12}$ in Formula (I)-1 represent a divalent organic group represented by Formula (LX1), it is preferable that a bonding site (*) on the $L_A$ side in Formula (LX1) is bonded to $B_{11}^-$ in Formula (I)-1.

In addition, in a case where $L_{14}$ in Formula (I)-2 represent a divalent organic group represented by Formula (LX1), it is preferable that a bonding site (*) on the $L_A$ side in Formula (LX1) is bonded to $B_{12}^-$ in Formula (I)-1.

The trivalent organic group represented by $L_{15}$ in Formula (I)-3 is not particularly limited, and examples thereof include a trivalent organic group represented by Formula (LX2).

(LX2)

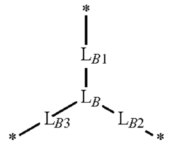

In Formula (LX2), $L_B$ represents a trivalent hydrocarbon ring group or a trivalent heterocyclic group. * represents a bonding position.

The hydrocarbon ring group may be an aromatic hydrocarbon ring group or an aliphatic hydrocarbon ring group. The number of carbon atoms included in the hydrocarbon ring group is preferably 6 to 18, and more preferably 6 to 14.

The heterocyclic group may be either an aromatic heterocyclic group or an aliphatic heterocyclic group. The heterocyclic ring is preferably a 5- to 10-membered ring, more preferably a 5- to 7-membered ring, and still more preferably a 5- or 6-membered ring, each of which has at least one N atom, 0 atom, S atom, or Se atom in the ring structure.

As $L_B$, above all, the trivalent hydrocarbon ring group is preferable, and a benzene ring group or an adamantane ring group is more preferable. Incidentally, $L_B$ may further have a substituent.

In addition, in Formula (LX2), $L_{B1}$ to $L_{B3}$ each independently represent a single bond or a divalent linking group. The divalent linking group represented by each of $L_{B1}$ to $L_{B3}$ is not particularly limited, and examples thereof include —CO—, —NR—, —O—, —S—, —SO—, —$SO_2$—, an alkylene group (which preferably has 1 to 6 carbon atoms, and may be linear or branched), a cycloalkylene group (preferably having 3 to 15 carbon atoms), an alkenylene group (preferably having 2 to 6 carbon atoms), a divalent aliphatic heterocyclic group (preferably having a 5- to 10-membered ring, more preferably having a 5- to 7-membered ring, and still more preferably having a 5- or 6-membered ring, each having at least one of an N atom, an O atom, an S atom, or an Se atom in the ring structure), a divalent aromatic heterocyclic group (preferably having a 5- to 10-membered ring, more preferably having a 5- to 7-membered ring, and still more preferably having a 5- or 6-membered ring, each having at least one of an N atom, an O atom, an S atom, or an Se atom in the ring structure), a divalent aromatic hydrocarbon ring group (preferably having a 6- to 10-membered ring, and more preferably having a 6-membered ring), and a divalent linking group formed by combination of a plurality of these groups. Examples of R include a hydrogen atom or a monovalent organic group. The monovalent organic group is not particularly limited, but is preferably, for example, an alkyl group (preferably having 1 to 6 carbon atoms).

In addition, the alkylene group, the cycloalkylene group, the alkenylene group, the divalent aliphatic heterocyclic group, the divalent aromatic heterocyclic group, and the divalent aromatic hydrocarbon ring group may be substituted with a substituent. Examples of the substituent include a halogen atom (preferably a fluorine atom).

As the divalent linking group represented by each of $L_{B1}$ to $L_{B3}$, among those, —CO—, —NR—, —O—, —S—, —SO—, —$SO_2$—, the alkylene group which may have a substituent, and the divalent linking group formed by combination of these groups are preferable.

As the divalent linking group represented by each of $L_{B1}$ to $L_{B3}$, the divalent linking group represented by Formula (LX2-1) is more preferable.

(LX2-1)

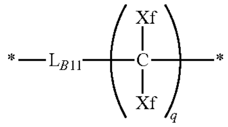

In Formula (LX2-1), $L_{B11}$ represents a single bond or a divalent linking group.

The divalent linking group represented by $L_{B11}$ is not particularly limited, and examples thereof include —CO—, —O—, —SO—, —$SO_2$—, an alkylene group (which preferably has 1 to 6 carbon atoms, and may be linear or branched) which may have a substituent, and a divalent linking group formed by combination of a plurality of these groups. The substituent is not particularly limited, and examples thereof include a halogen atom.

q represents an integer of 1 to 3.

Xf has the same definition as $Xf_1$ in Formula (LX1) mentioned above, and suitable aspects thereof are also the same.

* represents a bonding position.

Examples of the divalent linking groups represented by each of $L_{B1}$ to $L_{B3}$ include *—O—*, *—O—$SO_2$—$CF_2$—*, *—O—$SO_2$—$CF_2$—$CF_2$—*, *—O—$SO_2$—$CF_2$—$CF_2$—$CF_2$—*, and *—COO—$CH_2$—$CH_2$—*.

In a case where $L_{15}$ in Formula (I)-3 includes a divalent organic group represented by Formula (LX2-1), and the divalent organic group represented by Formula (LX2-1) and $B_{13}^-$ are bonded to each other, it is preferable that the bonding site (*) on the carbon atom side specified in Formula (LX2-1) is bonded to $B_{13}^-$ in Formula (I)-3.

In addition, it is also preferable that the trivalent organic group represented by $L_{15}$ in Formula (I)-3 has an acid-decomposable group as a substituent. Examples of the acid-decomposable group include the same ones as the acid-decomposable group which can be contained in the acid-decomposable resin which will be described later.

In Formulae (I)-1 to (I)-3, preferred forms of the organic cations represented by $C_{21}^+$, $C_{22}^+$, and $C_{23}^+$ will be described in detail.

The organic cations represented by $C_{21}^+$, $C_{22}^+$, and $C_{23}^+$ are each independently preferably an organic cation represented by Formula (ZaI) (cation (ZaI)) or an organic cation represented by Formula (ZaII) (cation (ZaII)).

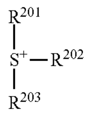

(ZaI)

$R^{204}—I^+—R^{205}$ (ZaII)

In Formula (ZaI), $R^{201}$, $R^{202}$, and $R^{203}$ each independently represent an organic group.

The organic group as each of $R^{201}$, $R^{202}$, and $R^{203}$ usually has 1 to 30 carbon atoms, and preferably has 1 to 20 carbon atoms. In addition, two of $R^{201}$ to $R^{203}$ may be bonded to each other to form a ring structure, and the ring may include an oxygen atom, a sulfur atom, an ester group, an amide group, or a carbonyl group. Examples of the group formed by the bonding of two of $R^{201}$ to $R^{203}$ include an alkylene group (for example, a butylene group and a pentylene group), and —$CH_2$—$CH_2$—O—$CH_2$—$CH_2$—.

Suitable aspects of the organic cation as Formula (ZaI) include a cation (ZaI-1), a cation (ZaI-2), an organic cation represented by Formula (ZaI-3b) (cation (ZaI-3b)), and an organic cation represented by Formula (ZaI-4b) (cation (ZaI-4b)), each of which will be described later.

First, the cation (ZaI-1) will be described.

The cation (ZaI-1) is an arylsulfonium cation in which at least one of $R^{201}$, $R^{202}$, or $R^{203}$ of Formula (ZaI) is an aryl group.

In the arylsulfonium cation, all of $R^{20}1$ to $R^{203}$ may be aryl groups, or some of $R^{201}$ to $R^{203}$ may be an aryl group, and the rest may be an alkyl group or a cycloalkyl group.

In addition, one of $R^{201}$ to $R^{203}$ may be an aryl group, two of $R^{201}$ to $R^{203}$ may be bonded to each other to form a ring structure, and an oxygen atom, a sulfur atom, an ester group, an amide group, or a carbonyl group may be included in the ring. Examples of the group formed by the bonding of two of $R^{201}$ to $R^{203}$ include an alkylene group (for example, a butylene group, a pentylene group, or —$CH_2$—$CH_2$—O—$CH_2$—$CH_2$—) in which one or more methylene groups may be substituted with an oxygen atom, a sulfur atom, an ester group, an amide group, and/or a carbonyl group.

Examples of the arylsulfonium cation include a triarylsulfonium cation, a diarylalkylsulfonium cation, an aryldialkylsulfonium cation, a diarylcycloalkylsulfonium cation, and an aryldicycloalkylsulfonium cation.

As the aryl group included in the arylsulfonium cation, a phenyl group or a naphthyl group is preferable, and the phenyl group is more preferable. The aryl group may be an aryl group which has a heterocyclic structure having an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium cation has two or more aryl groups, the two or more aryl groups may be the same as or different from each other.

The alkyl group or the cycloalkyl group contained in the arylsulfonium cation as necessary is preferably a linear alkyl group having 1 to 15 carbon atoms, a branched alkyl group having 3 to 15 carbon atoms, or a cycloalkyl group having 3 to 15 carbon atoms, and more preferably, for example, a methyl group, an ethyl group, a propyl group, an n-butyl group, a sec-butyl group, a t-butyl group, a cyclopropyl group, a cyclobutyl group, a cyclohexyl group, or the like.

The substituents which may be contained in each of the aryl group, the alkyl group, and the cycloalkyl group of each of $R^{20}1$ to $R^{203}$ are each independently preferably an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a cycloalkylalkoxy group (for example, having 1 to 15 carbon atoms), a halogen atom (for example, fluorine and iodine), a hydroxyl group, a carboxyl group, an ester group, a sulfinyl group, a sulfonyl group, an alkylthio group, a phenylthio group, or the like.

The substituent may further have a substituent as possible and is also preferably in the form of an alkyl halide group such as a trifluoromethyl group, for example, in which the alkyl group has a halogen atom as a substituent.

In addition, it is also preferable that the substituents form an acid-decomposable group by any combination.

Furthermore, the acid-decomposable group is intended to be a group that decomposes by the action of an acid to produce a polar group, and preferably has a structure in which a polar group is protected by a leaving group that leaves by the action of an acid. The polar group and the leaving group are as described above.

Next, the cation (ZaI-2) will be described.

The cation (ZaI-2) is a cation in which $R^{201}$ to $R^{203}$ in Formula (ZaI) are each independently a cation representing an organic group having no aromatic ring. Here, the aromatic ring also includes an aromatic ring including a heteroatom.

The organic group having no aromatic ring as each of $R^{201}$ to $R^{203}$ generally has 1 to 30 carbon atoms, and preferably 1 to 20 carbon atoms.

$R^{201}$ to $R^{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and still more preferably the linear or branched 2-oxoalkyl group.

Examples of the alkyl group and the cycloalkyl group of each of $R^{201}$ to $R^{203}$ include a linear alkyl group having 1 to 10 carbon atoms or branched alkyl group having 3 to 10 carbon atoms (for example, a methyl group, an ethyl group, a propyl group, a butyl group, and a pentyl group), and a cycloalkyl group having 3 to 10 carbon atoms (for example, a cyclopentyl group, a cyclohexyl group, and a norbornyl group).

$R^{20}1$ to $R^{203}$ may further be substituted with a halogen atom, an alkoxy group (for example, having 1 to 5 carbon atoms), a hydroxyl group, a cyano group, or a nitro group. In addition, it is also preferable that the substituents of $R^{201}$ to $R^{203}$ each independently form an acid-decomposable group by any combination of the substituents.

Next, the cation (ZaI-3b) will be described.

The cation (ZaI-3b) is a cation represented by Formula (ZaI-3b).

(ZaI-3b)

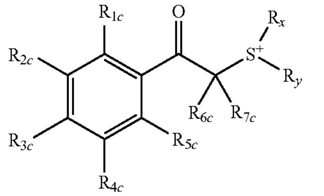

In Formula (ZaI-3b), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R_{6c}$ and $R_{7c}$ each independently represent a hydrogen atom, an alkyl group (a t-butyl group or the like), a cycloalkyl group, a halogen atom, a cyano group, or an aryl group.

$R_x$ and $R_y$ each independently represent an alkyl group, a cycloalkyl group, a 2-oxoalkyl group, a 2-oxocycloalkyl group, an alkoxycarbonylalkyl group, an allyl group, or a vinyl group.

In addition, it is also preferable that the substituents of $R_{1c}$ to $R_{7c}$, $R_x$, and $R_y$ each independently form an acid-decomposable group by any combination of substituents.

Any two or more of $R_{1c}$ to $R_{5c}$, $R_{5c}$ and $R_{6c}$, $R_{6c}$ and $R_{7c}$, $R_{5c}$ and $R_x$, and $R_x$ and $R_y$ may each be bonded to each other to form a ring, and the ring may each independently include an oxygen atom, a sulfur atom, a ketone group, an ester bond, or an amide bond.

Examples of the ring include an aromatic or non-aromatic hydrocarbon ring, an aromatic or non-aromatic heterocyclic ring, and a polycyclic fused ring formed by combination of two or more of these rings. Examples of the ring include a 3- to 10-membered ring, and the ring is preferably a 4- to 8-membered ring, and more preferably a 5- or 6-membered ring.

Examples of the group formed by the bonding of any two or more of $R_{1c}$, to $R_{5c}$, $R_{6c}$ and $R_{7c}$, and $R_x$ and $R_y$ include an alkylene group such as a butylene group and a pentylene group. The methylene group in this alkylene group may be substituted with a heteroatom such as an oxygen atom.

As the group formed by the bonding of $R_{5c}$ and $R_{6c}$, and $R_{5c}$ and $R_x$, a single bond or an alkylene group is preferable. Examples of the alkylene group include a methylene group and an ethylene group.

Next, the cation (ZaI-4b) will be described.

The cation (ZaI-4b) is a cation represented by Formula (ZaI-4b).

(ZaI-4b)

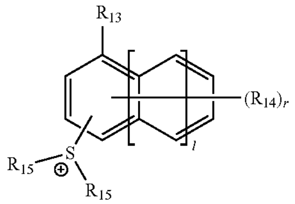

In Formula (ZaI-4b), 1 represents an integer of 0 to 2.

r represents an integer of 0 to 8.

$R_{13}$ represents a hydrogen atom, a halogen atom (for example, a fluorine atom and an iodine atom), a fluorine atom, a hydroxyl group, an alkyl group, an alkyl halide group, an alkoxy group, a carboxyl group, an alkoxycarbonyl group, or a group having a cycloalkyl group (which may be the cycloalkyl group itself or a group including the cycloalkyl group in a part thereof). These groups may have a substituent.

$R_{14}$ represents a hydroxyl group, a halogen atom (for example, a fluorine atom and an iodine atom), an alkyl group, an alkyl halide group, an alkoxy group, an alkoxycarbonyl group, an alkylcarbonyl group, an alkylsulfonyl group, a cycloalkylsulfonyl group, or a group having a cycloalkyl group (which may be the cycloalkyl group itself or a group including the cycloalkyl group in a part thereof). These groups may have a substituent. In a case where $R_{14}$'s are present in a plural number, $R_{14}$'s each independently represent the group such as a hydroxyl group.

$R_{15}$'s each independently represent an alkyl group, a cycloalkyl group, or a naphthyl group. These groups may have a substituent. Two $R_{15}$'s may be bonded to each other to form a ring. In a case where two $R_{15}$'s are bonded to each other to form a ring, the ring skeleton may include a heteroatom such as an oxygen atom and a nitrogen atom. In one aspect, it is preferable that two $R_{15}$'s are alkylene groups and are bonded to each other to form a ring structure.

In Formula (ZaI-4b), the alkyl group of each of $R_{13}$, $R_{14}$, and $R_{15}$ is linear or branched. The alkyl group preferably has 1 to 10 carbon atoms. As the alkyl group, a methyl group, an ethyl group, an n-butyl group, a t-butyl group, or the like is more preferable.

In addition, it is also preferable that the respective substituents of $R_{13}$ to $R_{15}$, $R_x$, and $R_y$ each independently form an acid-decomposable group by any combination of substituents.

Next, Formula (ZaII) will be described.

In Formula (ZaII), $R^{204}$ and $R^{205}$ each independently represent an aryl group, an alkyl group, or a cycloalkyl group.

As the aryl group of each of $R^{204}$ and $R^{205}$, a phenyl group or a naphthyl group is preferable, and the phenyl group is more preferable. The aryl group of each of $R^{204}$ and $R^{205}$ may be an aryl group which has a heterocyclic ring having an oxygen atom, a nitrogen atom, a sulfur atom, or the like. Examples of the skeleton of the aryl group having a heterocyclic ring include pyrrole, furan, thiophene, indole, benzofuran, and benzothiophene.

As the alkyl group and the cycloalkyl group of each of $R^{204}$ and $R^{205}$, a linear alkyl group having 1 to 10 carbon atoms or a branched alkyl group having 3 to 10 carbon atoms (for example, a methyl group, an ethyl group, a propyl group, a butyl group, and a pentyl group), or a cycloalkyl group having 3 to 10 carbon atoms (for example, a cyclopentyl group, a cyclohexyl group, and a norbornyl group) is preferable.

The aryl group, the alkyl group, and the cycloalkyl group of each of $R^{204}$ and $R^{205}$ may each independently have a substituent. Examples of the substituent which may be contained in each of the aryl group, the alkyl group, and the cycloalkyl group of each of $R^{204}$ and $R^{205}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group. In addition, it is also preferable that the substituents of $R^{204}$ and $R^{205}$ each independently form an acid-decomposable group by any combination of the substituents.

Specific examples of the organic cation represented by each of $C_{21}^+$, $C_{22}^+$, and $C_{23}^+$ are shown below, but the present invention is not limited thereto.

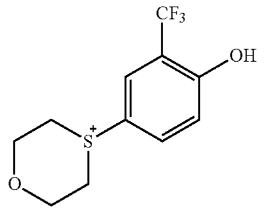

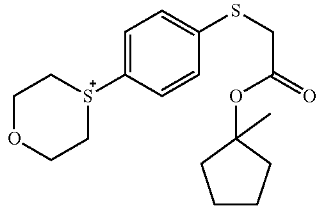

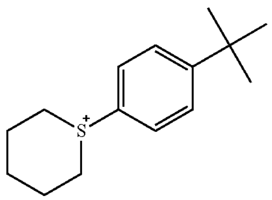

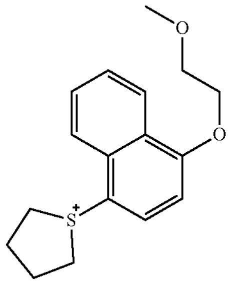

-continued

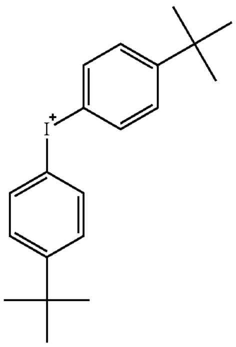

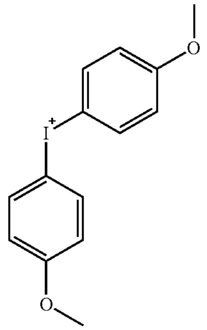

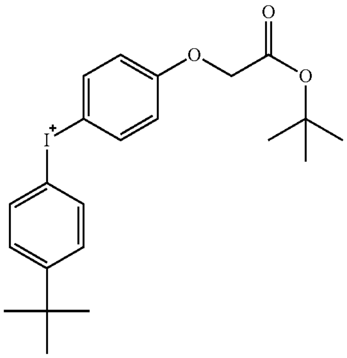

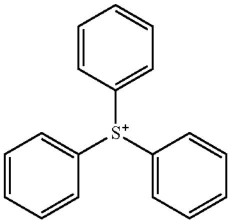

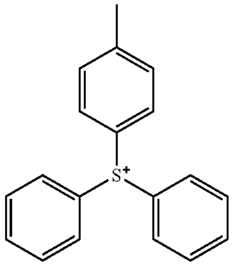

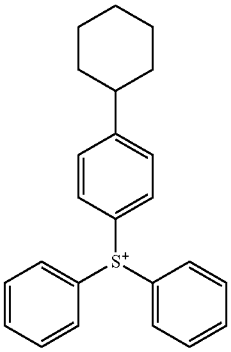

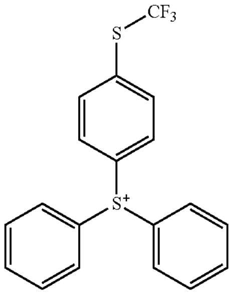

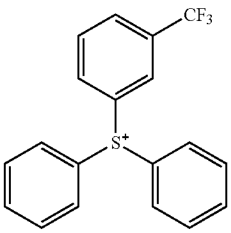

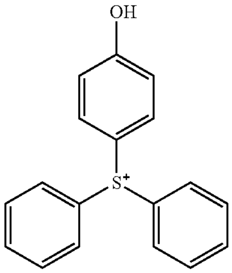

-continued
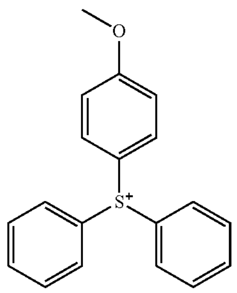
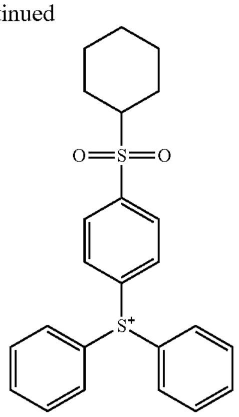
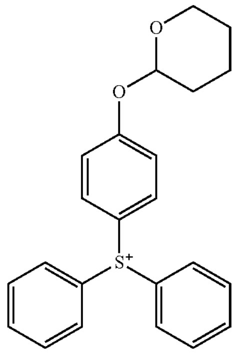
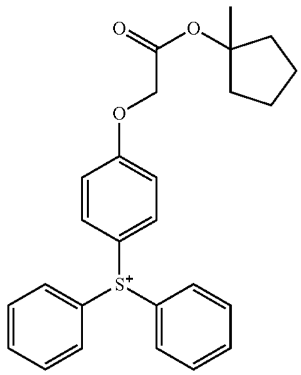
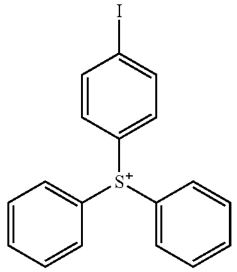
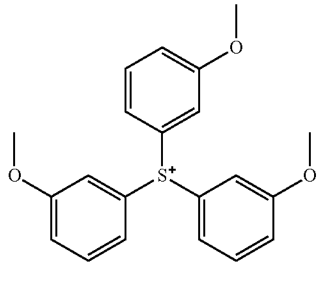
-continued
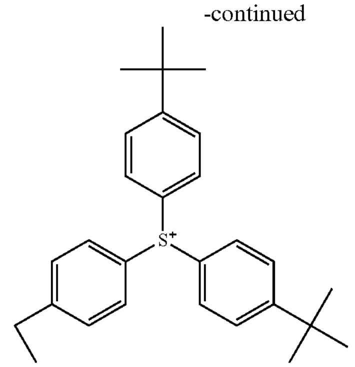
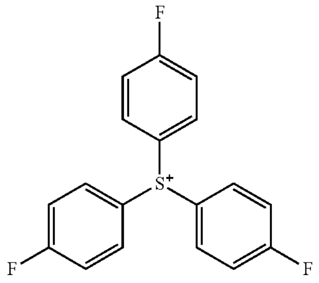
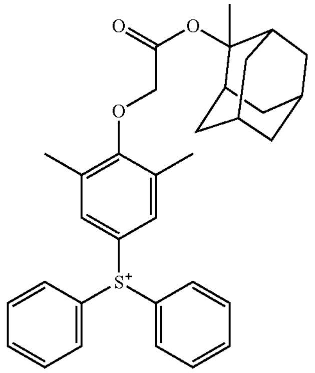
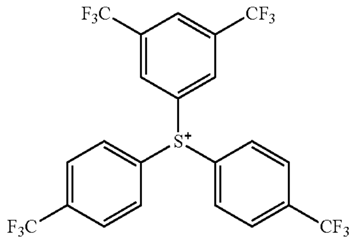
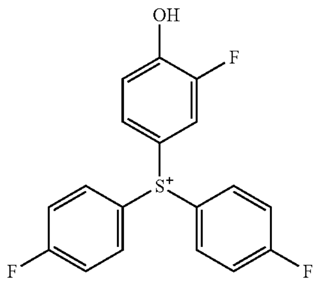

-continued

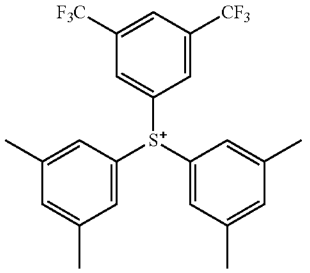

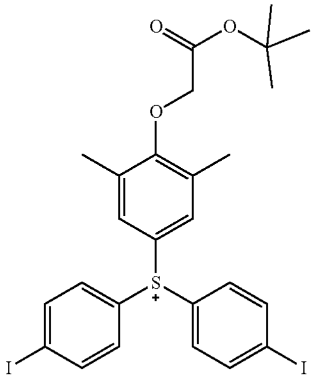

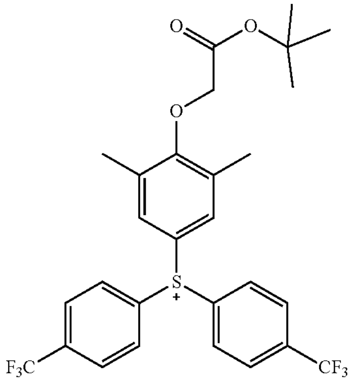

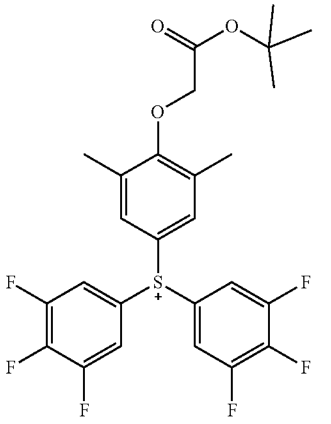

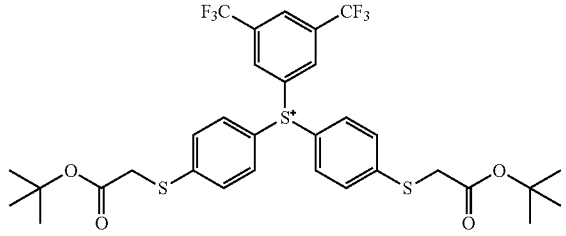

-continued

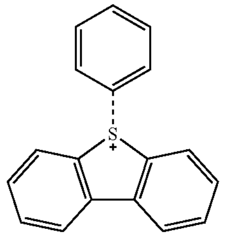
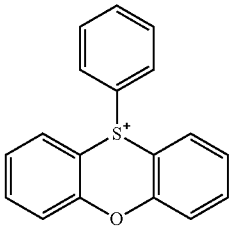

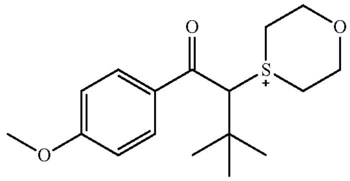

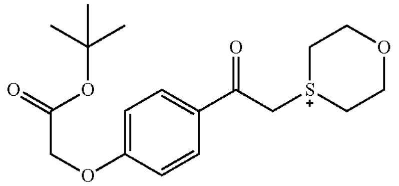

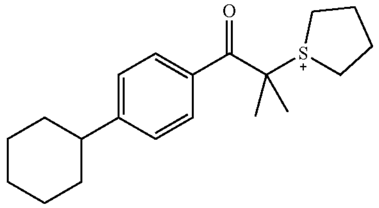

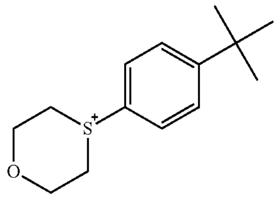

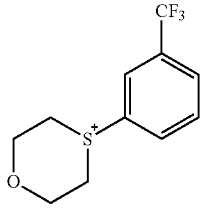
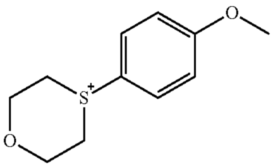

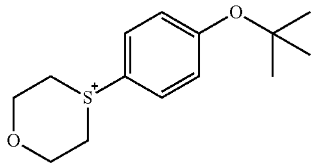

Moreover, from the viewpoint that the cross-sectional shape of a pattern thus formed is easily further rectangularized, it is also preferable that the anionic moiety $A_1^-$ constituting the structural moiety X in the compound (I) represents an anionic moiety of any one of Formula (AA-1), (AA-2), or (AA-3) mentioned above. In addition, from the viewpoint that the cross-sectional shape of a pattern thus formed is easily further rectangularized, it is also preferable that the anionic moiety $B_1^-$ constituting the structural moiety Y in the compound (I) represents an anionic moiety of any one of Formula (BB-1) to (BB-5) mentioned above. Among those, it is more preferable that the anionic moiety $A_1^-$ constituting the structural moiety X in the compound (I)

represents an anionic moiety of any one of Formulae ((AA-1) to (AA-3)), and the anionic moiety $B_1^-$ constituting the structural moiety Y represents an anionic moiety of any one of Formula (BB-1) to (BB-5) mentioned above.

The content of the compound (I) is preferably 2.0% to 70.0% by mass, more preferably 5.0% to 70.0% by mass, still more preferably 20.0% to 70.0% by mass, and particularly preferably 20.0% to 60.0% by mass with respect to the total solid content of the composition.

Furthermore, the solid content is intended to mean a component forming a resist film, and does not include a solvent. In addition, any of components that form a resist film are regarded as a solid content even in a case where they have a property and a state of a liquid.

The compound (I) may be used alone or in combination of two or more kinds thereof. In a case where two or more kinds of such other photoacid generators are used, a total content thereof is preferably within the suitable content range.

<Photoacid Generator (B)>

The resist composition may include a photoacid generator (B). The photoacid generator (B) corresponds to a photoacid generator other than the above-mentioned compound (I).

The photoacid generator (B) may be in a form of a low-molecular-weight compound or a form incorporated into a part of a polymer. Furthermore, a combination of the form of a low-molecular-weight compound and the form incorporated into a part of a polymer may also be used.

In a case where the photoacid generator (B) is in the form of a low-molecular-weight compound, the molecular weight is preferably 3,000 or less, more preferably 2,000 or less, and still more preferably 1,000 or less.

In a case where the photoacid generator (B) is in the form incorporated into a part of a polymer, it may be incorporated into the part of the resin (A) or into a resin that is different from the resin (A).

In the present invention, the photoacid generator (B) is preferably in the form of a low-molecular-weight compound.

Examples of the photoacid generator (B) include a compound (onium salt) represented by "$M^+X^-$", and a compound that generates an organic acid by exposure is preferable.

Examples of the organic acid include sulfonic acids (an aliphatic sulfonic acid, an aromatic sulfonic acid, and a camphor sulfonic acid), carboxylic acids (an aliphatic carboxylic acid, an aromatic carboxylic acid, and an aralkylcarboxylic acid), a carbonylsulfonylimide acid, a bis(alkylsulfonyl)imide acid, and a tris(alkylsulfonyl)methide acid.

In the compound represented by "$M^+X^-$", $M^+$ represents an organic cation.

The organic cation is preferably a cation represented by Formula (ZaI) (cation (ZaI)) or a cation represented by Formula (ZaII) (cation (ZaII)).

In one aspect, it is also preferable that the organic cation represented by $M^+$ has an acid-decomposable group. Examples of the acid-decomposable group include the same ones as the acid-decomposable group contained in the acid-decomposable resin which will be described later.

In the compound represented by "$M^+X^-$", $X^-$ represents an organic anion.

The organic anion is not particularly limited, and is preferably a non-nucleophilic anion (anion having a significantly low ability to cause a nucleophilic reaction).

Examples of the non-nucleophilic anion include a sulfonate anion (an aliphatic sulfonate anion, an aromatic sulfonate anion, a camphor sulfonate anion, and the like), a carboxylate anion (an aliphatic carboxylate anion, an aromatic carboxylate anion, an aralkyl carboxylate anion, and the like), a sulfonylimide anion, a bis(alkylsulfonyl)imide anion, and a tris(alkylsulfonyl)methide anion.

The aliphatic moiety in the aliphatic sulfonate anion and the aliphatic carboxylate anion may be an alkyl group or a cycloalkyl group, and has a linear or branched alkyl group having 1 to 30 carbon atoms, or is preferably a cycloalkyl group having 3 to 30 carbon atoms.

The alkyl group may be, for example, a fluoroalkyl group (which may or may not have a substituent other than a fluorine atom, and may be a perfluoroalkyl group).

The aryl group in the aromatic sulfonate anion and the aromatic carboxylate anion is preferably an aryl group having 6 to 14 carbon atoms, and examples thereof include a phenyl group, a tolyl group, and a naphthyl group.

The alkyl group, the cycloalkyl group, and the aryl group exemplified above may have a substituent. The substituent is not particularly limited, but specific examples of the substituent include a nitro group, a halogen atom such as fluorine atom or a chlorine atom, a carboxy group, a hydroxyl group, an amino group, a cyano group, an alkoxy group (preferably having 1 to 15 carbon atoms), an alkyl group (preferably having 1 to 10 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), and an aryloxysulfonyl group (preferably having 6 to 20 carbon atoms).

The aralkyl group in the aralkyl carboxylate anion is preferably an aralkyl group having 7 to 14 carbon atoms, and examples thereof include a benzyl group, a phenethyl group, a naphthylmethyl group, a naphthylethyl group, and a naphthylbutyl group.

Examples of the sulfonylimide anion include a saccharin anion.

The alkyl group in the bis(alkylsulfonyl)imide anion and the tris(alkylsulfonyl)methide anion is preferably an alkyl group having 1 to 5 carbon atoms. Examples of the substituent of such an alkyl group include a halogen atom, an alkyl group substituted with a halogen atom, an alkoxy group, an alkylthio group, an alkyloxysulfonyl group, an aryloxysulfonyl group, and a cycloalkylaryloxysulfonyl group, and a fluorine atom or an alkyl group substituted with the fluorine atom is preferable.

In addition, the alkyl groups in the bis(alkylsulfonyl)imide anion may be bonded to each other to form a ring structure. Thus, the acid strength increases.

As the non-nucleophilic anion, an aliphatic sulfonate anion in which at least α-position of sulfonic acid is substituted with a fluorine atom, an aromatic sulfonate anion substituted with a fluorine atom or a group having a fluorine atom, a bis(alkylsulfonyl)imide anion in which an alkyl group is substituted with a fluorine atom, or a tris(alkylsulfonyl)methide anion in which an alkyl group is substituted with a fluorine atom is preferable.

As the photoacid generator (B), the photoacid generators disclosed in paragraphs [0135] to [0171] of WO2018/193954A, paragraphs [0077] to [0116] of WO2020/

066824A, and paragraphs [0018] to [0075] and [0334] to [0335] of WO2017/154345A, and the like are preferably used.

In a case where the resist composition includes the photoacid generator (B), the content thereof is not particularly limited, but from the viewpoint that the shape of a pattern thus formed is further rectangularized, the content is preferably 0.5% by mass or more, and more preferably 1.0% by mass or more with respect to a total solid content of the composition. In addition, the content is preferably 35.0% by mass or less, more preferably 30.0% by mass or less, and still more preferably 25.0% by mass or less.

The photoacid generator (B) may be used alone or in combination of two or more kinds thereof.

[Acid-Decomposable Resin (Resin (A))]

The resist composition includes a resin of which polarity increases through decomposition by the action of an acid, having a weight-average molecular weight of 30,000 or less (also referred to as an "acid-decomposable resin" or a "resin (A)" as described above). That is, in the pattern forming method of an embodiment of the present invention, typically, in a case where an alkali developer is adopted as the developer, a positive tone pattern is suitably formed, and in a case where an organic developer is adopted as the developer, a negative tone pattern is suitably formed.

The resin (A) usually includes a repeating unit having a group (hereinafter also referred to as an "acid-decomposable group") of which polarity increases through decomposition by the action of an acid, and preferably includes a repeating unit having an acid-decomposable group.

As the repeating unit having an acid-decomposable group, in addition to a (repeating unit having an acid-decomposable group) which will be described later, a (repeating unit having an acid-decomposable group including an unsaturated bond) is preferable.

<Repeating Unit Having Acid-Decomposable Group>

(Repeating Unit Having Acid-Decomposable Group)

The acid-decomposable group refers to a group that decomposes by the action of an acid to generate a polar group. The acid-decomposable group preferably has a structure in which the polar group is protected by a leaving group that leaves by the action of an acid. That is, the resin (A) has a repeating unit having a group that decomposes by the action of an acid to generate a polar group. A resin having this repeating unit has an increased polarity by the action of an acid, and thus has an increased solubility in an alkali developer, and a decreased solubility in an organic solvent.

As the polar group, an alkali-soluble group is preferable, and examples thereof include an acidic group such as a carboxyl group, a phenolic hydroxyl group, a fluorinated alcohol group, a sulfonic acid group, a phosphoric acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris (alkylsulfonyl)methylene group, and an alcoholic hydroxyl group.

Among those, as the polar group, the carboxyl group, the phenolic hydroxyl group, the fluorinated alcohol group (preferably a hexafluoroisopropanol group), or the sulfonic acid group is preferable.

Examples of the leaving group that leaves by the action of an acid include groups represented by Formulae (Y1) to (Y4).

$$—C(Rx_1)(Rx_2)(Rx_{33}) \quad \text{Formula (Y1):}$$

$$—C({=}O)OC(Rx_1)(Rx_2)(Rx_3) \quad \text{Formula (Y2):}$$

$$—C(R_{36})(R_{37})(OR_{38}) \quad \text{Formula (Y3):}$$

$$—C(Rn)(H)(Ar) \quad \text{Formula (Y4):}$$

In Formulae (Y1) and (Y2), $Rx_1$ to $Rx_{33}$ each independently represent an (linear or branched) alkyl group or (monocyclic or polycyclic) cycloalkyl group, an (linear or branched) alkenyl group, or an (monocyclic or polycyclic) aryl group. Furthermore, in a case where all of $Rx_1$ to $Rx_3$ are (linear or branched) alkyl groups, it is preferable that at least two of $Rx_1$, $Rx_2$, or $Rx_{33}$ are methyl groups.

Above all, it is preferable that $Rx_1$ to $Rx_{33}$ each independently represent a linear or branched alkyl group, and it is more preferable that $Rx_1$ to $Rx_{33}$ each independently represent a linear alkyl group.

Two of $Rx_1$ to $Rx_{33}$ may be bonded to each other to form a monocycle or a polycycle.

As the alkyl group of each of $Rx_1$ to $Rx_{33}$, an alkyl group having 1 to 5 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_{33}$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the aryl group as each of $Rx_1$ to $Rx_{33}$, an aryl group having 6 to 10 carbon atoms is preferable, and examples thereof include a phenyl group, a naphthyl group, and an anthryl group.

As the alkenyl group of each of $Rx_1$ to $Rx_{33}$, a vinyl group is preferable.

As a ring formed by the bonding of two of $Rx_1$ to $Rx_{33}$, a cycloalkyl group is preferable. As the cycloalkyl group formed by the bonding of two of $Rx_1$ to $Rx_3$, a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group is preferable, and a monocyclic cycloalkyl group having 5 or 6 carbon atoms is more preferable.

In the cycloalkyl group formed by the bonding of two of $Rx_1$ to $Rx_{33}$, for example, one of the methylene groups constituting the ring may be substituted with a heteroatom such as an oxygen atom, a group having a heteroatom, such as a carbonyl group, or a vinylidene group. In addition, in the cycloalkyl group, one or more of the ethylene groups constituting the cycloalkane ring may be substituted with a vinylene group.

With regard to the group represented by Formula (Y1) or Formula (Y2), for example, an aspect in which $Rx_1$ is a methyl group or an ethyl group, and $Rx_2$ and $Rx_3$ are bonded to each other to form a cycloalkyl group is preferable.

In a case where the resist composition is, for example, a resist composition for EUV exposure, it is preferable that an alkyl group, a cycloalkyl group, an alkenyl group, or an aryl group represented by each of $Rx_1$ to $Rx_{33}$, and a ring formed by the bonding of two of $Rx_1$ to $Rx_{33}$ further has a fluorine atom or an iodine atom as a substituent.

In Formula (Y3), $R_{36}$ to $R_{38}$ each independently represent a hydrogen atom or a monovalent organic group. $R_{37}$ and $R_{38}$ may be bonded to each other to form a ring. Examples of the monovalent organic group include an alkyl group, a cycloalkyl group, an aryl group, an aralkyl group, and an alkenyl group. It is also preferable that $R_{36}$ is the hydrogen atom.

Furthermore, the alkyl group, the cycloalkyl group, the aryl group, and the aralkyl group may include a heteroatom such as an oxygen atom, and/or a group having a heteroatom, such as a carbonyl group. For example, in the alkyl group, the cycloalkyl group, the aryl group, and the aralkyl group, one or more of the methylene groups may be substituted with a heteroatom such as an oxygen atom, and/or a group having a heteroatom, such as a carbonyl group.

In addition, $R_{38}$ and another substituent contained in the main chain of the repeating unit may be bonded to each other to form a ring. A group formed by the mutual bonding of $R_{38}$ and another substituent in the main chain of the repeating unit is preferably an alkylene group such as a methylene group.

In a case where the resist composition is, for example, a resist composition for EUV exposure, it is preferable that the monovalent organic group represented by each of $R_{36}$ to $R_{38}$ and the ring formed by the mutual bonding of $R_{37}$ and $R_{38}$ further have a fluorine atom or an iodine atom as a substituent.

As Formula (Y3), a group represented by Formula (Y3-1) is preferable.

(Y3-1)

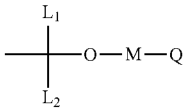

Here, $L_1$ and $L_2$ each independently represent a hydrogen atom, an alkyl group, a cycloalkyl group, an aryl group, or a group formed by combination thereof (for example, a group formed by combination of an alkyl group and an aryl group).

M represents a single bond or a divalent linking group.

Q represents an alkyl group which may include a heteroatom, a cycloalkyl group which may include a heteroatom, an aryl group which may include a heteroatom, an amino group, an ammonium group, a mercapto group, a cyano group, an aldehyde group, or a group formed by combination thereof (for example, a group formed by combination of an alkyl group and a cycloalkyl group).

In the alkyl group and the cycloalkyl group, for example, one of the methylene groups may be substituted with a heteroatom such as an oxygen atom or a group having a heteroatom, such as a carbonyl group.

In addition, it is preferable that one of $L_1$ or $L_2$ is a hydrogen atom, and the other is an alkyl group, a cycloalkyl group, an aryl group, or a group formed by combination of an alkylene group and an aryl group.

At least two of Q, M, or $L_1$ may be bonded to each other to form a ring (preferably a 5- or 6-membered ring).

From the viewpoint of pattern miniaturization, $L_2$ is preferably a secondary or tertiary alkyl group, and more preferably the tertiary alkyl group. Examples of the secondary alkyl group include an isopropyl group, a cyclohexyl group, and a norbornyl group, and examples of the tertiary alkyl group include a tert-butyl group and an adamantane group. In these aspects, since the glass transition temperature (Tg) and the activation energy are increased, it is possible to suppress fogging in addition to ensuring film hardness.

In a case where the resist composition is, for example, a resist composition for EUV exposure, it is also preferable that an alkyl group, a cycloalkyl group, an aryl group, or a group formed by combination of these groups, represented by each of $L_1$ and $L_2$, further has a fluorine atom or an iodine atom as a substituent. In addition, it is also preferable that the alkyl group, the cycloalkyl group, the aryl group, and the aralkyl group include a heteroatom such as an oxygen atom, in addition to the fluorine atom and the iodine atom (that is, in the alkyl group, the cycloalkyl group, the aryl group, and the aralkyl group, for example, one of the methylene groups is substituted with a heteroatom such as an oxygen atom or a group having a heteroatom, such as a carbonyl group).

In addition, in a case where the resist composition is, for example, a resist composition for EUV exposure, it is preferable that in an alkyl group which may include a heteroatom, a cycloalkyl group which may include a heteroatom, an aryl group which may include a heteroatom, an amino group, an ammonium group, a mercapto group, a cyano group, an aldehyde group, or a group formed by combination of these groups, represented by Q, the heteroatom is a heteroatom selected from the group consisting of a fluorine atom, an iodine atom, and an oxygen atom.

In Formula (Y4), Ar represents an aromatic ring group. Rn represents an alkyl group, a cycloalkyl group, or an aryl group. Rn and Ar may be bonded to each other to form a non-aromatic ring. Ar is more preferably the aryl group.

In a case where the resist composition is, for example, a resist composition for EUV exposure, it is also preferable that the aromatic ring group represented by Ar, and the alkyl group, the cycloalkyl group, and the aryl group, represented by Rn, have a fluorine atom and an iodine atom as a substituent.

From the viewpoint that the acid decomposability of the repeating unit is excellent, in a case where a non-aromatic ring is directly bonded to a polar group (or a residue thereof) in a leaving group that protects the polar group, it is also preferable that a ring member atom adjacent to the ring member atom directly bonded to the polar group (or a residue thereof) in the non-aromatic ring has no halogen atom such as a fluorine atom as a substituent.

In addition, the leaving group that leaves by the action of an acid may be a 2-cyclopentenyl group having a substituent (an alkyl group and the like), such as a 3-methyl-2-cyclopentenyl group, and a cyclohexyl group having a substituent (an alkyl group and the like), such as a 1,1,4,4-tetramethylcyclohexyl group.

As the repeating unit having an acid-decomposable group, a repeating unit represented by Formula (A) is also preferable.

(A)

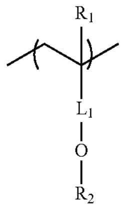

$L_1$ represents a divalent linking group which may have a fluorine atom or an iodine atom, $R_1$ represents a hydrogen atom, a fluorine atom, an iodine atom, a fluorine atom, an alkyl group which may have an iodine atom, or an aryl group which may have a fluorine atom or an iodine atom, and $R_2$ represents a leaving group that leaves by the action of an acid and may have a fluorine atom or an iodine atom. Furthermore, it is preferable that at least one of $L_1$, $R_1$, or $R_2$ has a fluorine atom or an iodine atom.

$L_1$ represents a divalent linking group which may have a fluorine atom or an iodine atom. Examples of the divalent linking group which may have a fluorine atom or an iodine atom include —CO—, —O—, —S—, —SO—, —$SO_2$—, a hydrocarbon group which may have a fluorine atom or an iodine atom (for example, an alkylene group, a cycloalkylene group, an alkenylene group, and an arylene group), and a linking group formed by the linking of a plurality of these groups. Among those, as $L_1$, —CO—, an arylene group, or -arylene group-alkylene group having a fluorine atom or an iodine atom—is preferable, and —CO— or -arylene group-alkylene group having a fluorine atom or an iodine atom—is more preferable.

As the arylene group, a phenylene group is preferable.

The alkylene group may be linear or branched. The number of carbon atoms of the alkylene group is not particularly limited, but is preferably 1 to 10, and more preferably 1 to 3.

The total number of fluorine atoms and iodine atoms included in the alkylene group having a fluorine atom or an iodine atom is not particularly limited, but is preferably 2 or more, more preferably 2 to 10, and still more preferably 3 to 6.

$R_1$ represents a hydrogen atom, a fluorine atom, an iodine atom, an alkyl group which may have a fluorine atom or an iodine atom, or an aryl group which may have a fluorine atom or an iodine atom.

The alkyl group may be linear or branched. The number of carbon atoms of the alkyl group is not particularly limited, but is preferably 1 to 10, and more preferably 1 to 3.

The total number of fluorine atoms and iodine atoms included in the alkyl group having a fluorine atom or an iodine atom is not particularly limited, but is preferably 1 or more, more preferably 1 to 5, and still more preferably 1 to 3.

The alkyl group may include a heteroatom such as an oxygen atom, other than a halogen atom.

$R_2$ represents a leaving group that leaves by the action of an acid and may have a fluorine atom or an iodine atom. Examples of the leaving group which may have a fluorine atom or an iodine atom include a leaving group represented by any of Formulae (Y1) to (Y4), having a fluorine atom or an iodine atom.

As the repeating unit having an acid-decomposable group, a repeating unit represented by Formula (AI) is also preferable.

(AI)

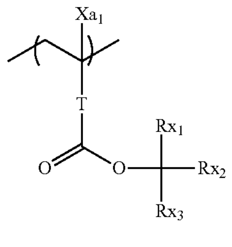

In Formula (AI), $Xa_1$ represents a hydrogen atom, or an alkyl group which may have a substituent.

T represents a single bond or a divalent linking group.

$Rx_1$ to $Rx_3$ each independently represent an (linear or branched) alkyl group, a (monocyclic or polycyclic) cycloalkyl group, an (linear or branched) alkenyl group, or an (monocyclic or polycyclic) aryl group. It should be noted that in a case where all of $Rx_1$ to $Rx_{33}$ are (linear or branched) alkyl groups, it is preferable that at least two of $Rx_1$, $Rx_2$, or $Rx_3$ are methyl groups.

Two of $Rx_1$ to $Rx_3$ may be bonded to each other to form a monocycle or polycycle (a monocyclic or polycyclic cycloalkyl group and the like).

Examples of the alkyl group which may have a substituent, represented by $Xa_1$, include a methyl group and a group represented by —$CH_2$—$R_{11}$. $R_{11}$ represents a halogen atom (a fluorine atom or the like), a hydroxyl group, or a monovalent organic group, examples thereof include an alkyl group having 5 or less carbon atoms, which may be substituted with a halogen atom, an acyl group having 5 or less carbon atoms, which may be substituted with a halogen atom, and an alkoxy group having 5 or less carbon atoms, which may be substituted with a halogen atom; and an alkyl group having 3 or less carbon atoms is preferable, and a methyl group is more preferable. $Xa_1$ is preferably a hydrogen atom, a methyl group, a trifluoromethyl group, or a hydroxymethyl group.

Examples of the divalent linking group of T include an alkylene group, an aromatic ring group, a —COO-Rt- group, and an —O-Rt- group. In the formulae, Rt represents an alkylene group or a cycloalkylene group.

T is preferably the single bond or the —COO-Rt- group. In a case where T represents the —COO-Rt- group, Rt is preferably an alkylene group having 1 to 5 carbon atoms, and more preferably a —$CH_2$— group, a —$(CH_2)_2$— group, or a —$(CH_2)_3$— group.

As the alkyl group of each of $Rx_1$ to $Rx_{33}$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_{33}$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the aryl group as each of $Rx_1$ to $Rx_{33}$, an aryl group having 6 to 10 carbon atoms is preferable, and examples thereof include a phenyl group, a naphthyl group, and an anthryl group.

As the alkenyl group of each of $Rx_1$ to $Rx_{33}$, a vinyl group is preferable.

As the cycloalkyl group formed by the bonding of two of $Rx_1$ to $Rx_3$, a monocyclic cycloalkyl group such as a cyclopentyl group and a cyclohexyl group is preferable, and in addition, a polycyclic cycloalkyl group such as a norbornyl group, a tetracyclodecanyl group, a tetracyclododecanyl group, and an adamantyl group is also preferable. Among those, a monocyclic cycloalkyl group having 5 or 6 carbon atoms is preferable.

In the cycloalkyl group formed by the bonding of two of $Rx_1$ to $Rx_{33}$, for example, one of the methylene groups constituting the ring may be substituted with a heteroatom such as an oxygen atom, a group having a heteroatom, such as a carbonyl group, or a vinylidene group. In addition, in the cycloalkyl group, one or more of the ethylene groups constituting the cycloalkane ring may be substituted with a vinylene group.

With regard to the repeating unit represented by Formula (AI), for example, an aspect in which $Rx_1$ is a methyl group or an ethyl group, and $Rx_2$ and $Rx_{33}$ are bonded to each other to form the above-mentioned cycloalkyl group is preferable.

In a case where each of the groups has a substituent, examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms). The substituent preferably has 8 or less carbon atoms.

The repeating unit represented by Formula (AI) is preferably an acid-decomposable tertiary alkyl (meth)acrylate ester-based repeating unit (the repeating unit in which $Xa_1$ represents a hydrogen atom or a methyl group, and T represents a single bond).

The content of the repeating unit having an acid-decomposable group is preferably 15% by mole or more, more preferably 20% by mole or more, and still more preferably 30% by mole or more with respect to all repeating units in the resin (A). In addition, an upper limit value thereof is preferably 90% by mole or less, more preferably 80% by mole or less, still more preferably 70% by mole or less, and particularly preferably 60% by mole or less.

Specific examples of the repeating unit having an acid-decomposable group are shown below, but the present invention is not limited thereto. Furthermore, in the formulae, $Xa_1$ represents H, $CH_3$, $CF_3$, or $CH_2OH$, and Rxa and Rxb each represent a linear or branched alkyl group having 1 to 5 carbon atoms.

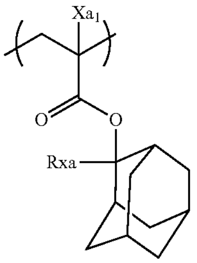
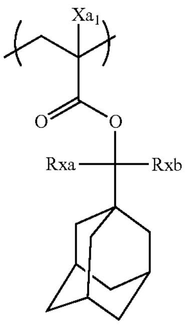
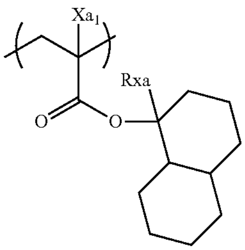
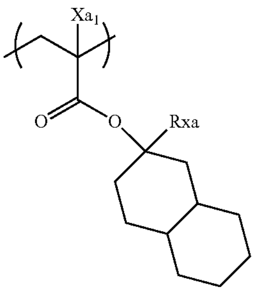

-continued

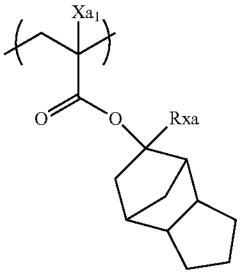
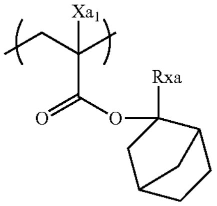
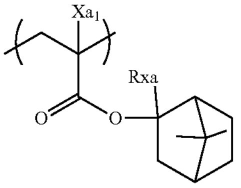
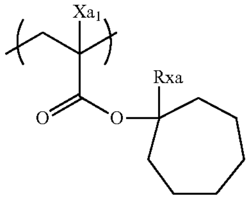
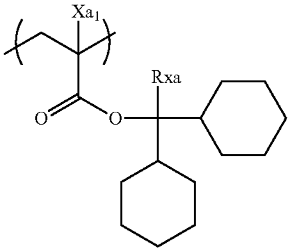
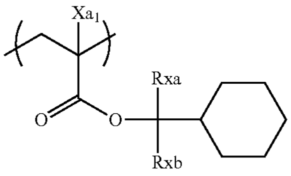
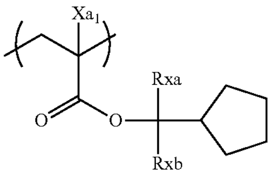
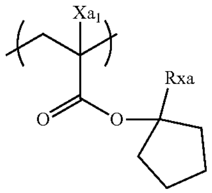
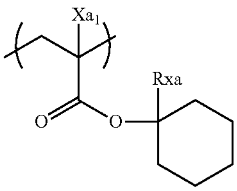
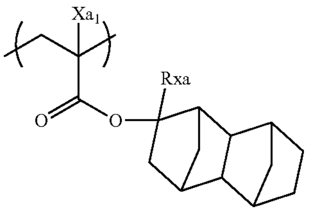
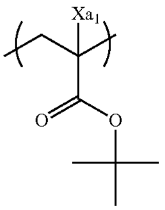
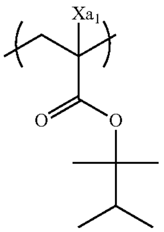
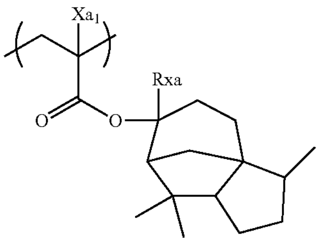

-continued
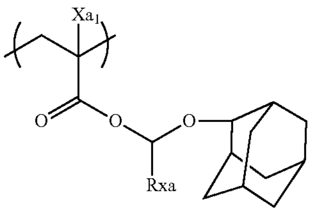
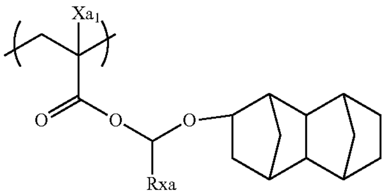
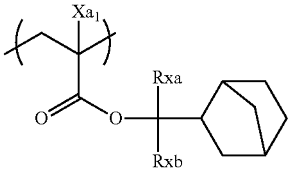
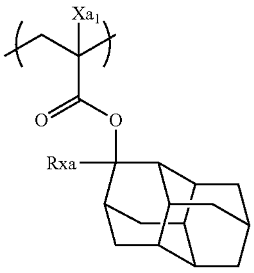
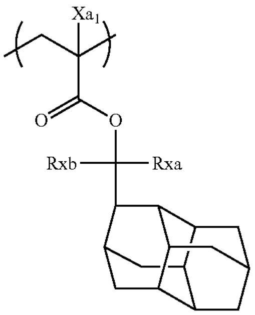
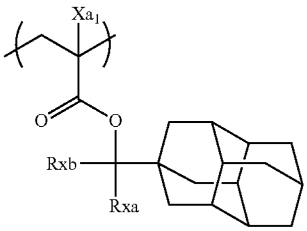
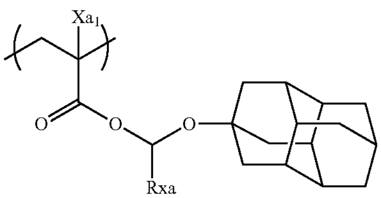
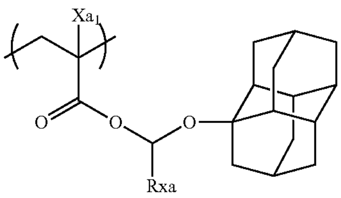
-continued
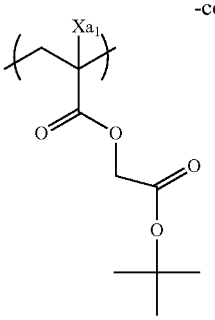
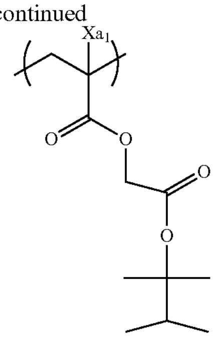
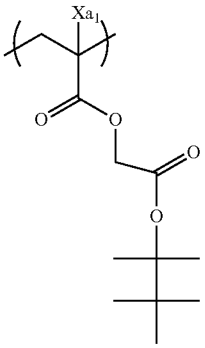
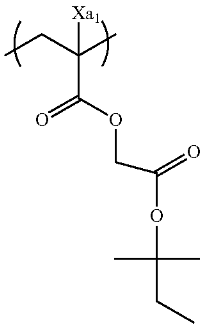
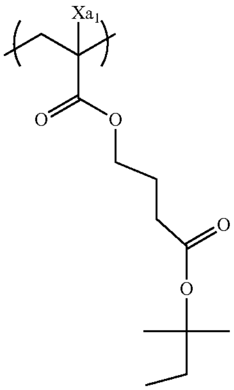
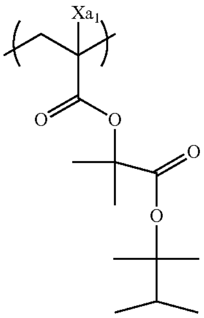
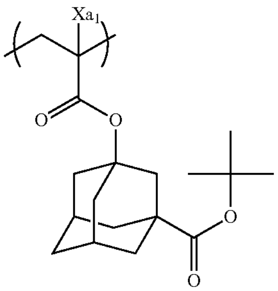
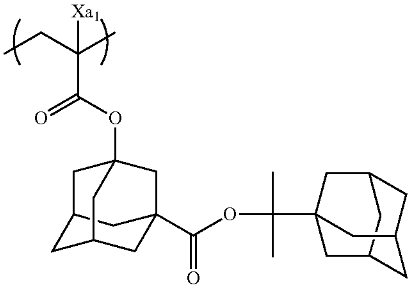

-continued
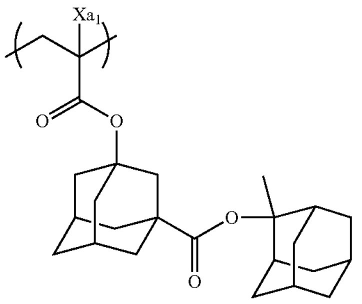
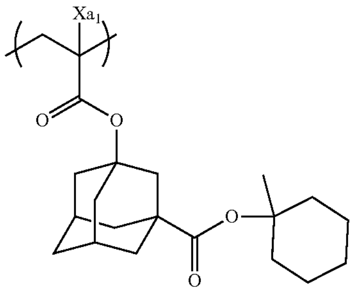
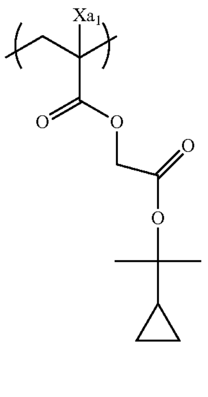
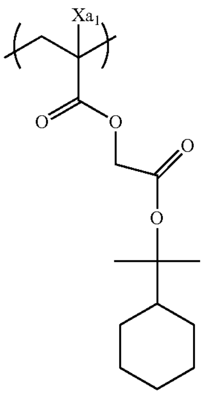
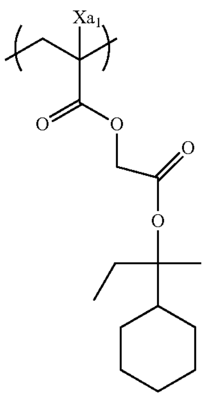
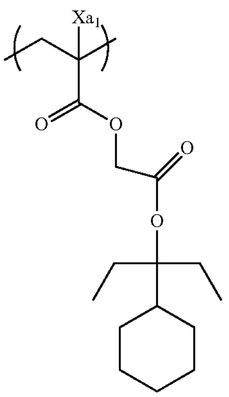
-continued
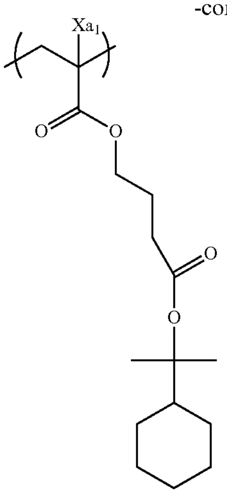
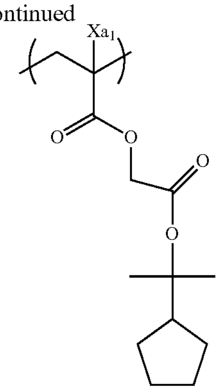
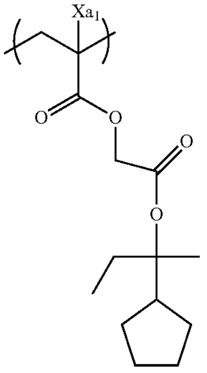
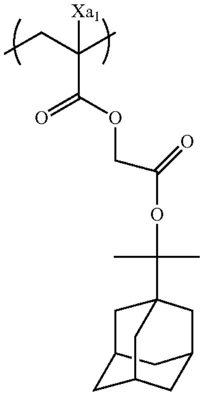
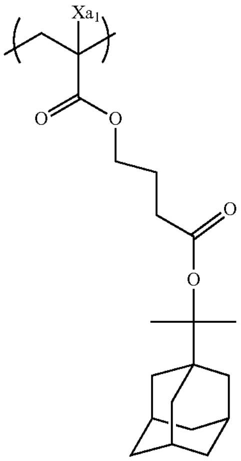
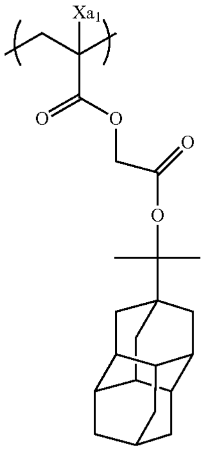
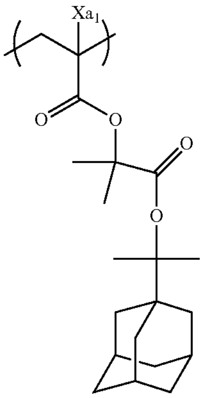
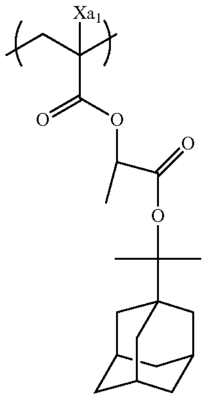

-continued
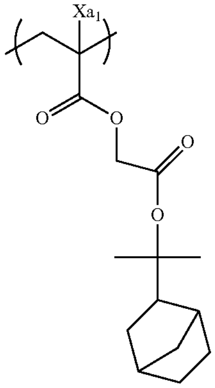
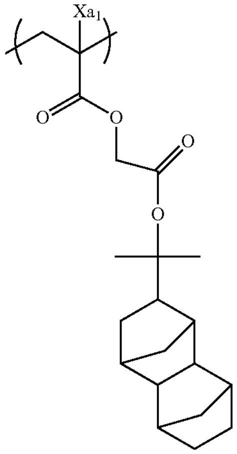
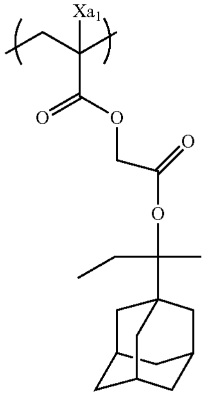
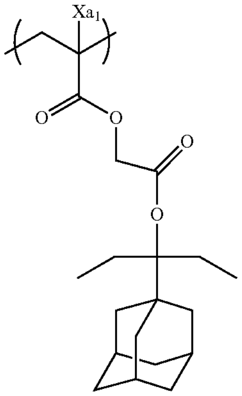
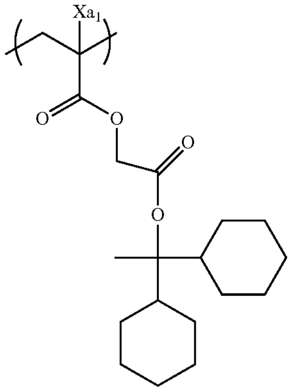
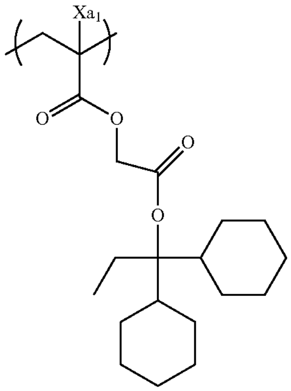
-continued
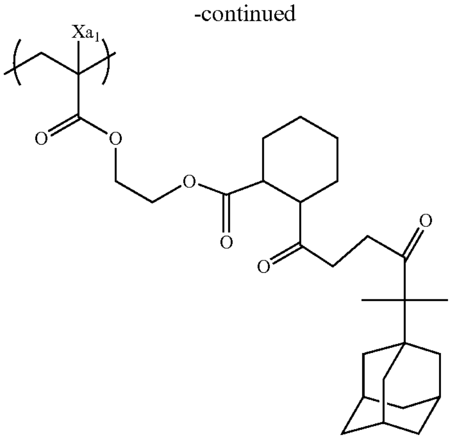
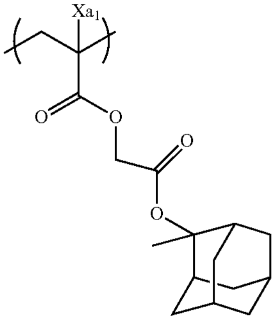
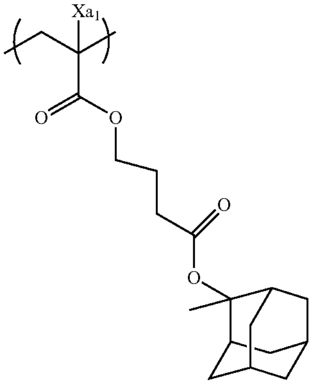
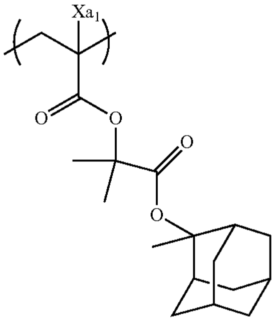

-continued
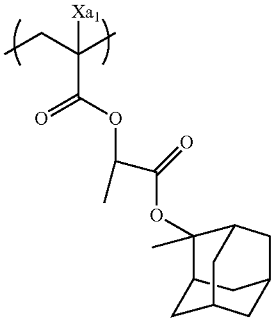
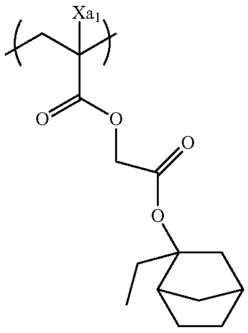
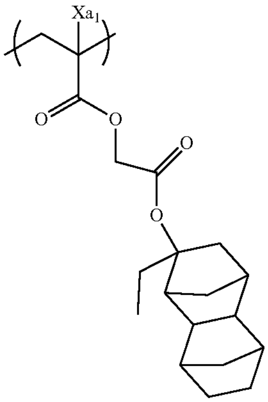
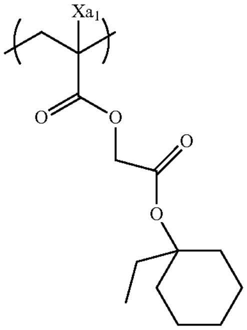
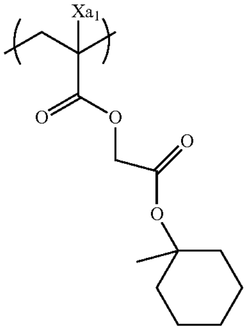
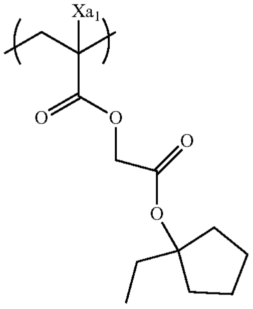
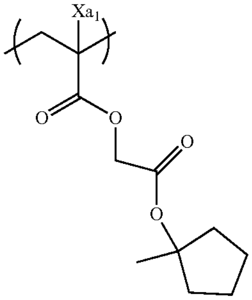
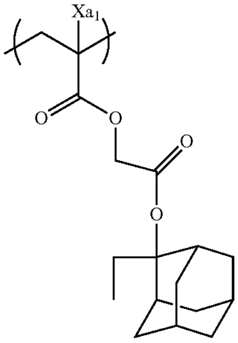
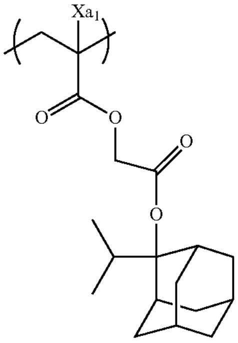
-continued
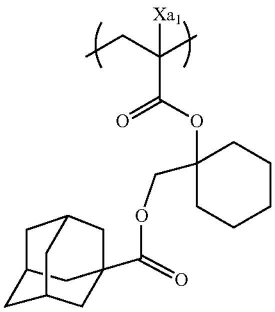
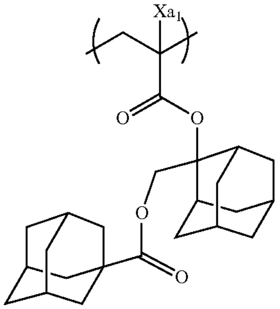
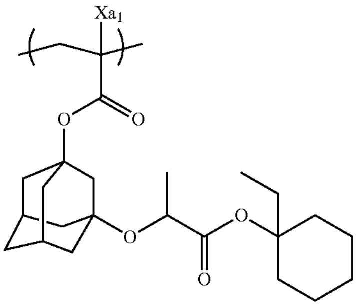
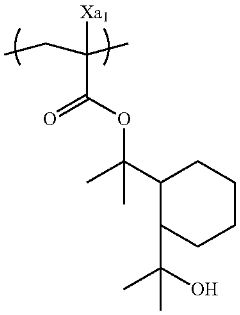
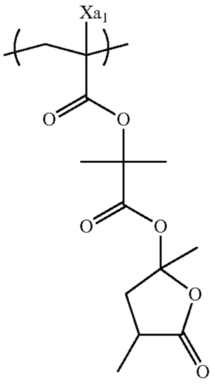
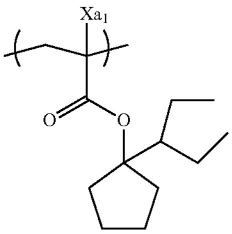
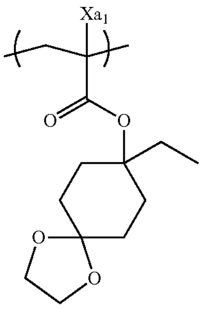

-continued

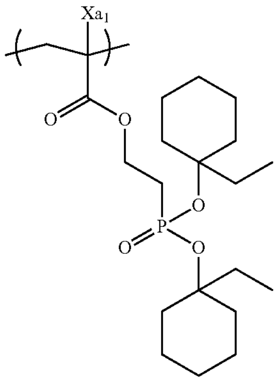

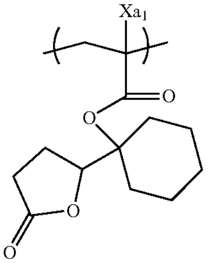

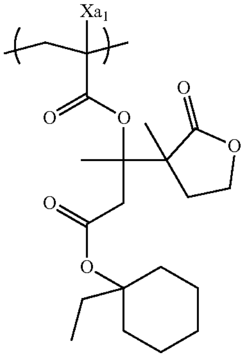

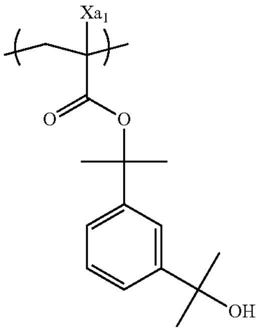

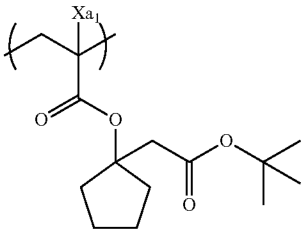

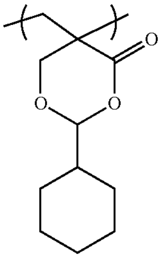

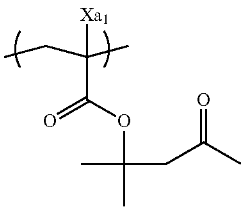

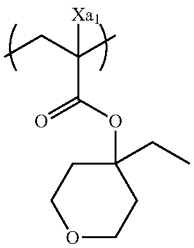

-continued

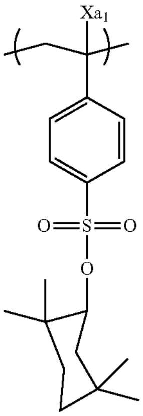

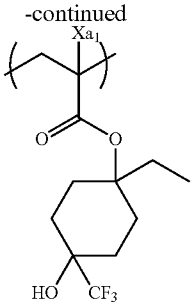

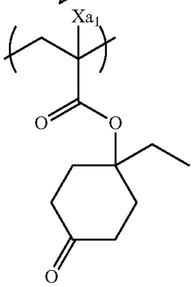

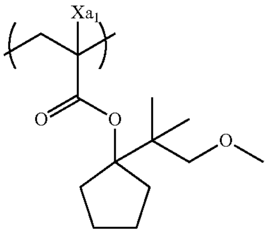

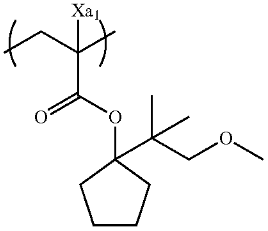

<Repeating Unit Having Acid-Decomposable Group Including Unsaturated Bond>

In an aspect of the resin (A), the resin (A) preferably includes a repeating unit having an acid-decomposable group including an unsaturated bond.

The repeating unit having an acid-decomposable group including an unsaturated bond is preferably a repeating unit represented by Formula (B).

(B)

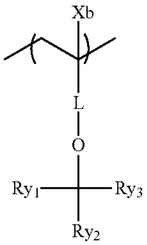

In Formula (B),

Xb represents a hydrogen atom, a halogen atom, or an alkyl group which may have a substituent.

L represents a single bond, or a divalent linking group which may have a substituent.

$Ry_1$ to $Ry_3$ each independently represent a hydrogen atom, a linear or branched alkyl group, a monocyclic or polycyclic cycloalkyl group, an alkenyl group, an alkynyl group, or a monocyclic or polycyclic aryl group. In addition, any two of $Ry_1$, $Ry_2$, or $Ry_3$ may be bonded to each other to form a monocycle or polycycle (for example, a monocyclic or polycyclic cycloalkyl group, and a cycloalkenyl group).

It should be noted that at least one of $Ry_1$, $Ry_2$, or $Ry_3$ represents an alkenyl group, an alkynyl group, a monocyclic or polycyclic cycloalkenyl group, or a monocyclic or polycyclic aryl group, or any two of $Ry_1$, $Ry_2$, or $Ry_3$ are bonded to each other to form a monocyclic or polycyclic alicyclic ring (for example, a monocyclic or polycyclic cycloalkyl group, or a cycloalkenyl group). In addition, there is no case where two or more of $Ry_1$ to $Ry_3$ are hydrogen atoms, and in a case where any one of $Ry_1$, $Ry_2$, or $Ry_3$ represents a hydrogen atom, the other two of $Ry_1$ to $Ry_3$ are bonded to each other to form a ring having one or more vinylene groups in the ring structure, and at least one of the vinylene groups is present adjacent to a carbon atom to which a hydrogen atom represented by any one of $Ry_1$, $Ry_2$, or $Ry_3$ is bonded.

As the alkyl group of each of $Ry_1$ to $Ry_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Ry_1$ to $Ry_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the aryl group of each of $Ry_1$ to $Ry_3$, an aryl group having 6 to 15 carbon atoms is preferable, an aryl group having 6 to 10 carbon atoms is more preferable, and examples thereof include a phenyl group, a naphthyl group, and an anthryl group.

As the alkenyl group of each of $Ry_1$ to $Ry_3$, a vinyl group is preferable.

As the alkynyl group of each of $Ry_1$ to $Ry_3$, an ethynyl group is preferable.

As the cycloalkenyl group of each of $Ry_1$ to $Ry_3$, a structure including a double bond in a part of a monocyclic cycloalkyl group such as a cyclopentyl group and a cyclohexyl group is preferable.

As the cycloalkyl group formed by the bonding of two of $Ry_1$ to $Ry_3$, a monocyclic cycloalkyl group such as a cyclopentyl group and a cyclohexyl group is preferable, and in addition, a polycyclic cycloalkyl group such as a norbornyl group, a tetracyclodecanyl group, a tetracyclododecanyl group, and an adamantyl group is also preferable. Among those, a monocyclic cycloalkyl group having 5 or 6 carbon atoms is preferable.

In the cycloalkyl group and cycloalkenyl group formed by the bonding of two of $Ry_1$ to $Ry_3$, for example, one of the methylene groups constituting the ring may be substituted with a heteroatom such as an oxygen atom, a group having a heteroatom, such as a carbonyl group, an $—SO_2—$ group, and an $—SO_3—$ group, a vinylidene group, or a combination thereof. In addition, in such the cycloalkyl group and cycloalkenyl group, one or more of the ethylene groups constituting the cycloalkane ring and the cycloalkene ring may be substituted with a vinylene group.

Examples of a suitable aspect of the combination of $Ry_1$ to $Ry_3$ include an aspect in which $Ry_1$ is a methyl group, an ethyl group, a vinyl group, an allyl group, or an aryl group, and $Ry_2$ and $Rx_{33}$ are bonded to each other to form a cycloalkyl group or a cycloalkenyl group, and an aspect in which $Ry_1$ is a hydrogen atom, $Ry_2$ and $Ry_3$ are bonded to each other to form a ring having one or more vinylene groups in the ring structure, and at least one of the vinylene groups is present adjacent to a carbon atom to which a hydrogen atom represented by $Ry_1$ is bonded.

In a case where $Ry_1$ to $Ry_3$ further have a substituent, examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms). The substituent preferably has 8 or less carbon atoms.

Examples of the alkyl group which may have a substituent, represented by Xb, include a methyl group and a group represented by $—CH_2—R_{11}$. $R_{11}$ represents a halogen atom (a fluorine atom or the like), a hydroxyl group, or a monovalent organic group, examples thereof include an alkyl group having 5 or less carbon atoms, which may be substituted with a halogen atom, an acyl group having 5 or less carbon atoms, which may be substituted with a halogen atom, and an alkoxy group having 5 or less carbon atoms, which may be substituted with a halogen atom; and an alkyl group having 3 or less carbon atoms is preferable, and a methyl group is more preferable. As Xb, a hydrogen atom, a fluorine atom, a methyl group, a trifluoromethyl group, or a hydroxymethyl group is preferable.

Examples of the divalent linking group of L include an —Rt- group, a —CO— group, a —COO-Rt- group, a —COO-Rt-CO— group, an -Rt-CO— group, and an —O-Rt- group. In the formulae, Rt represents an alkylene group, a cycloalkylene group, or an aromatic ring group, and is preferably the aromatic ring group.

As L, the -Rt- group, the —CO— group, the —COO-Rt-CO— group, or the -Rt-CO— group is preferable. Rt may have a substituent such as, for example, a halogen atom, a hydroxyl group, or an alkoxy group. The aromatic group is preferable.

Furthermore, in a case where each of the groups in Formula (B) has a substituent, examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms). The substituent preferably has 8 or less carbon atoms.

As the repeating unit represented by Formula (B), an acid-decomposable (meth)acrylic acid tertiary ester-based repeating unit (a repeating unit in which Xb represents a hydrogen atom or a methyl group, and L represents a —CO— group), an acid-decomposable hydroxystyrene tertiary alkyl ether-based repeating unit (a repeating unit in which Xb represents a hydrogen atom or a methyl group and L represents a phenyl group), or an acid-decomposable styrenecarboxylic acid tertiary ester-based repeating unit (a repeating unit in which Xb represents a hydrogen atom or a methyl group, and L represents a -Rt-CO— group (Rt is an aromatic group)) is preferable.

The content of the repeating unit having an acid-decomposable group including an unsaturated bond is preferably 15% by mole or more, more preferably 20% by mole or more, and still more preferably 30% by mole or more with respect to all repeating units in the resin (A). In addition, an upper limit value thereof is preferably 80% by mole or less, more preferably 70% by mole or less, and particularly preferably 60% by mole or less.

Specific examples of the repeating unit having an acid-decomposable group including an unsaturated bond are shown below, but the present invention is not limited thereto. Furthermore, in the formula, Xb and $L_1$ each represent any of the substituents or linking groups described above, Ar represents an aromatic group, R represents a hydrogen atom, an alkyl group, a cycloalkyl group, an aryl group, an aralkyl group, an alkenyl group, a hydroxyl group, an alkoxy group, an acyloxy group, a cyano group, a nitro group, an amino group, a halogen atom, an ester group (—OCOR''' or —COOR''': R''' is an alkyl group having 1 to 20 carbon atoms or a fluorinated alkyl group) or a substituent such as a carboxyl group, R' represents a linear or branched alkyl group, a monocyclic or polycyclic cycloalkyl group, an alkenyl group, an alkynyl group, a monocyclic group, or a polycyclic aryl group, Q represents a heteroatom such as an oxygen atom, a group having a heteroatom, such as a carbonyl group, an $—SO_2—$ group, and an $—SO_3—$ group, or a vinylidene group, or a combination thereof. l, n, and m each represent an integer of 0 or more. The upper limit value is not limited, and is, for example, 6 or less, and preferably 4 or less.

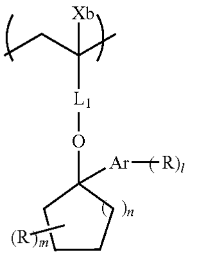
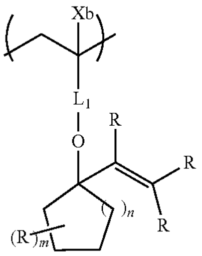
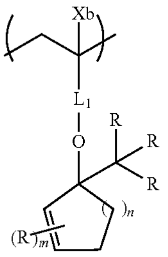
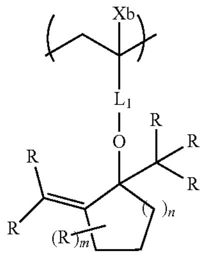
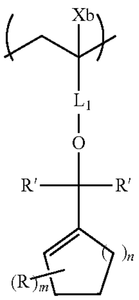
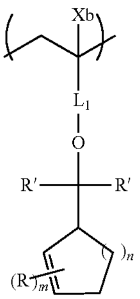
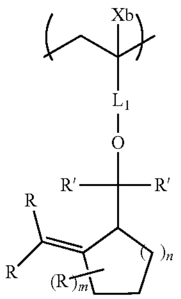
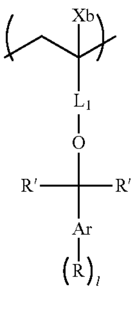
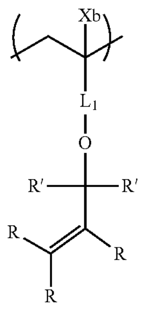
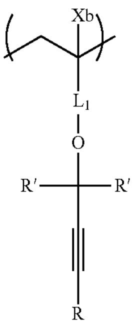

-continued

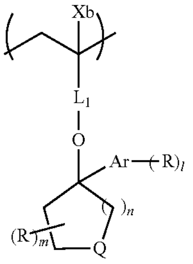
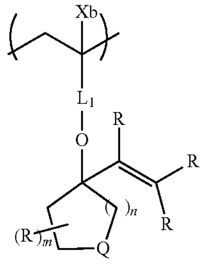
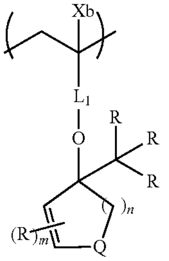
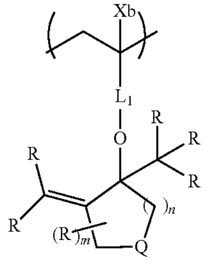
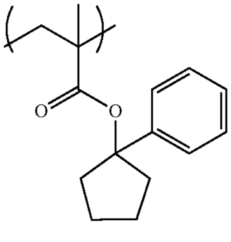
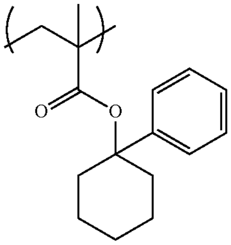
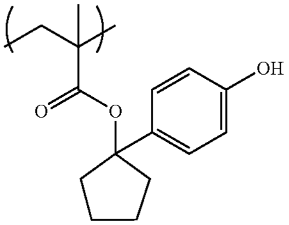
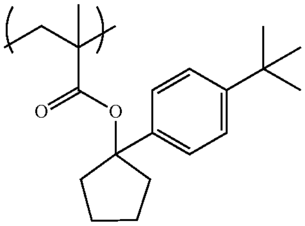
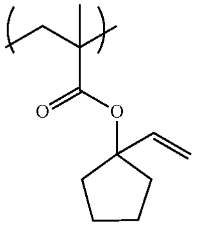
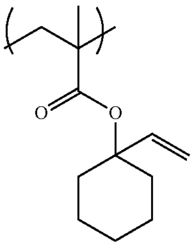
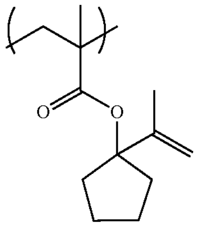
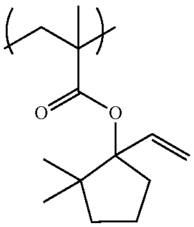
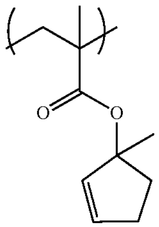

-continued
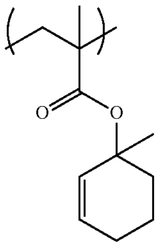
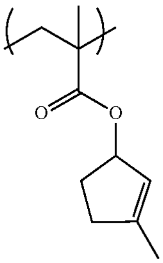
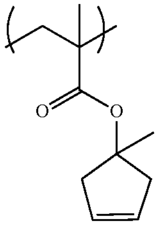
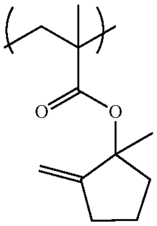
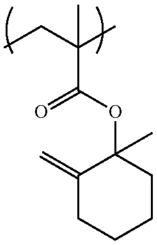
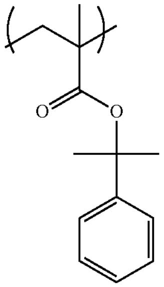
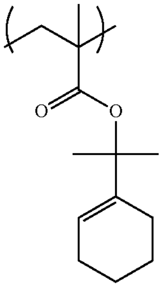
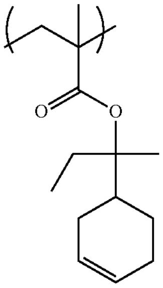
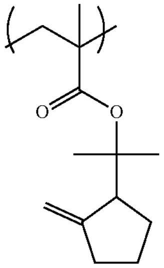
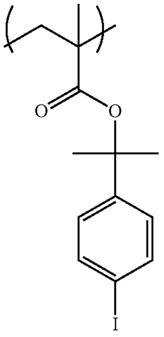
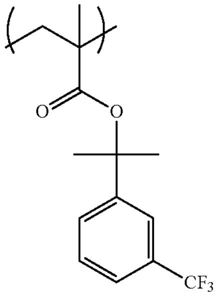
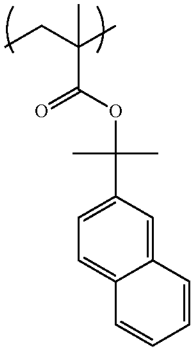
-continued
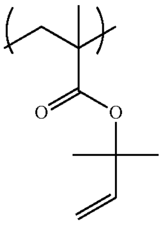
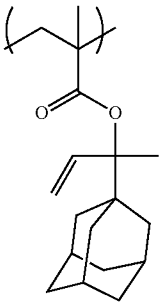
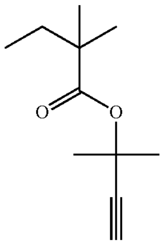
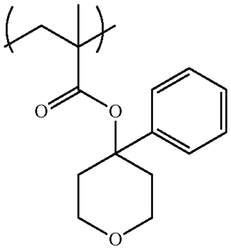
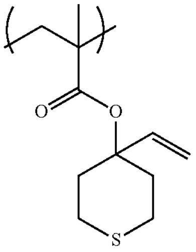
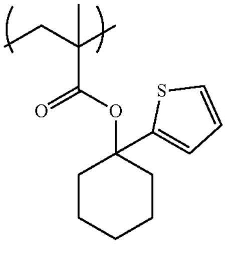
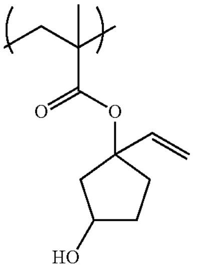
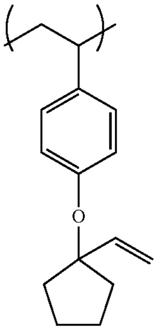
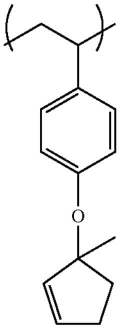
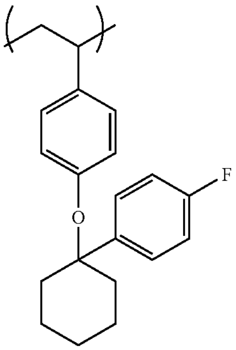
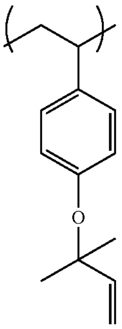

-continued
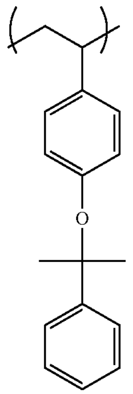
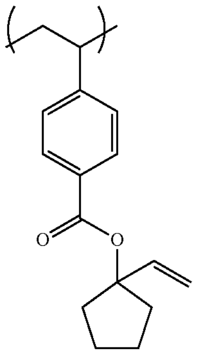
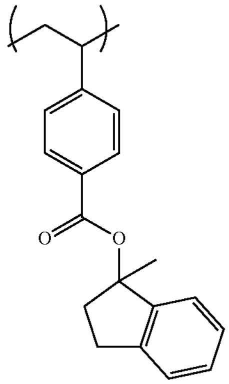
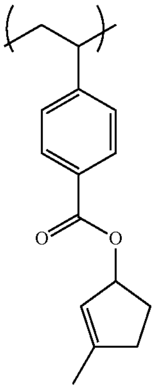
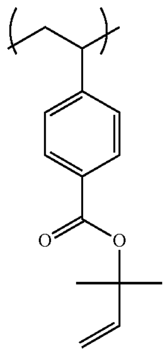
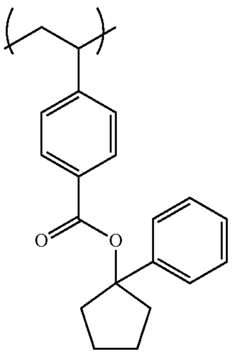
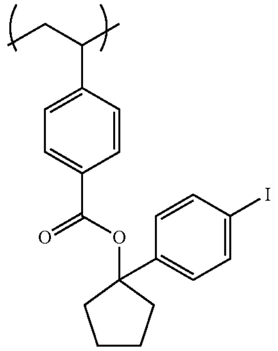
-continued
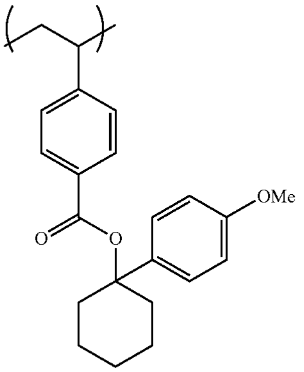
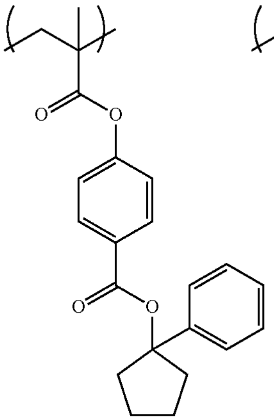
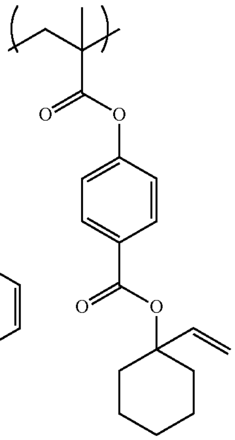
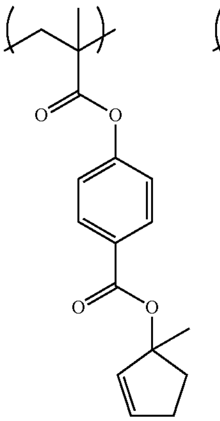
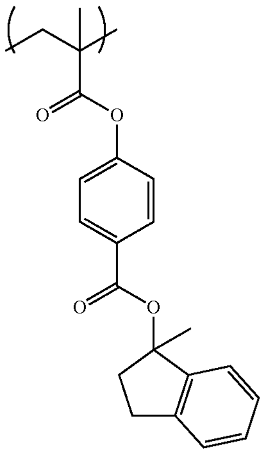

-continued

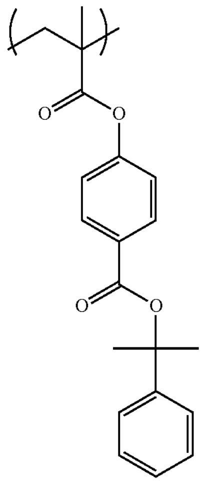

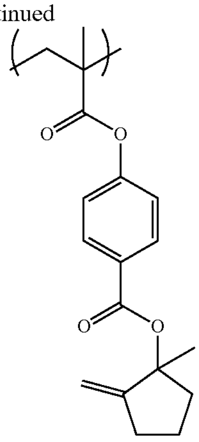

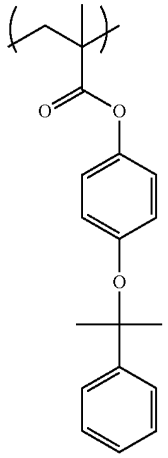

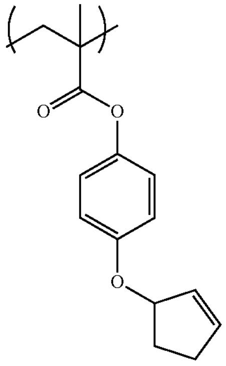

The resin (A) may include a repeating unit other than the above-mentioned repeating units.

For example, the resin (A) may include at least one repeating unit selected from the group consisting of the following group A and/or at least one repeating unit selected from the group consisting of the following group B.

Group A: A group consisting of the following repeating units (20) to (29).

(20) A repeating unit having an acid group, which will be described later

(21) A repeating unit having a fluorine atom or an iodine atom, which will be described later

(22) A repeating unit having a lactone group, a sultone group, or a carbonate group, which will be described later

(23) A repeating unit having a photoacid generating group, which will be described later

(24) A repeating unit represented by Formula (V-1) or Formula (V-2), which will be described later

(25) A repeating unit represented by Formula (A), which will be described later

(26) A repeating unit represented by Formula (B), which will be described later

(27) A repeating unit represented by Formula (C), which will be described later

(28) A repeating unit represented by Formula (D), which will be described later

(29) A repeating unit represented by Formula (E), which will be described later

Group B: A group consisting of the following repeating units (30) to (32)

(30) A repeating unit having at least one group selected from a lactone group, a sultone group, a carbonate group, a hydroxyl group, a cyano group, or an alkali-soluble group, which will be described later.

(31) A repeating unit having an alicyclic hydrocarbon structure and not exhibiting acid decomposability described later

(32) A repeating unit represented by Formula (III) having neither a hydroxyl group nor a cyano group, which will be described later The resin (A) preferably has an acid group, and preferably includes a repeating unit having an acid group, as will be described later. Incidentally, the definition of the acid group will be described later together with a suitable aspect of the repeating unit having an acid group. In a case where the resin (A) has an acid group, the interaction between the resin (A) and an acid generated from the compound (I) is more excellent. As a result, the diffusion of the acid is further suppressed, and the cross-sectional shape of a pattern thus formed can be further rectangularized.

In a case where the resist composition is used as an actinic ray-sensitive or radiation-sensitive resin composition for EUV, it is preferable that the resin (A) has at least one repeating unit selected from the group consisting of the group A.

In addition, in a case where the resist composition is used as the actinic ray-sensitive or radiation-sensitive resin composition for EUV, it is preferable that the resin (A) includes at least one of a fluorine atom or an iodine atom. In a case where the resin (A) includes both a fluorine atom and an iodine atom, the resin (A) may have one repeating unit including both a fluorine atom and an iodine atom, and the resin (A) may include two kinds of repeating units, that is, a repeating unit having a fluorine atom and a repeating unit having an iodine atom.

In addition, in a case where the resist composition is used as an actinic ray-sensitive or radiation-sensitive resin composition for EUV, it is also preferable that the resin (A) has a repeating unit having an aromatic group.

In a case where the resist composition is used as an actinic ray-sensitive or radiation-sensitive resin composition for ArF, it is preferable that the resin (A) has at least one repeating unit selected from the group consisting of the group B.

Furthermore, in a case where the resist composition is used as the actinic ray-sensitive or radiation-sensitive resin composition for ArF, it is preferable that the resin (A) includes neither a fluorine atom nor a silicon atom.

In addition, in a case where the resist composition is used as the actinic ray-sensitive or radiation-sensitive resin composition for ArF, it is preferable that the resin (A) does not have an aromatic group.

<Repeating Unit Having Acid Group>

The resin (A) preferably has a repeating unit having an acid group.

As the acid group, an acid group having a pKa of 13 or less is preferable. The acid dissociation constant of the acid group is preferably 13 or less, more preferably 3 to 13, and still more preferably 5 to 10, as described above.

In a case where the resin (A) has an acid group having a pKa of 13 or less, the content of the acid group in the resin (A) is not particularly limited, but is 0.2 to 6.0 mmol/g in many cases. Among those, the content of the acid group is preferably 0.8 to 6.0 mmol/g, more preferably 1.2 to 5.0 mmol/g, and still more preferably 1.6 to 4.0 mmol/g. In a case where the content of the acid group is within the range, the progress of development is improved, and thus, the shape of a pattern thus formed is excellent and the resolution is also excellent.

As the acid group, for example, a carboxyl group, a phenolic hydroxyl group, a fluorinated alcohol group (preferably a hexafluoroisopropanol group), a sulfonic acid group, a sulfonamide group, or an isopropanol group is preferable.

In addition, in the hexafluoroisopropanol group, one or more (preferably one or two) fluorine atoms may be substituted with a group (an alkoxycarbonyl group and the like) other than a fluorine atom. —$C(CF_3)(OH)$—$CF_2$— formed as above is also preferable as the acid group. In addition, one or more fluorine atoms may be substituted with a group other than a fluorine atom to form a ring including —$C(CF_3)(OH)$—$CF_2$—.

The repeating unit having an acid group is preferably a repeating unit different from a repeating unit having the structure in which a polar group is protected by the leaving group that leaves by the action of an acid as described above, and a repeating unit having a lactone group, a sultone group, or a carbonate group which will be described later.

A repeating unit having an acid group may have a fluorine atom or an iodine atom.

As the repeating unit having an acid group, a repeating unit represented by Formula (B) is preferable.

(B)

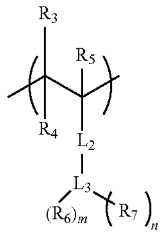

$R_3$ represents a hydrogen atom or a monovalent organic group which may have a fluorine atom or an iodine atom.

The monovalent organic group which may have a fluorine atom or an iodine atom is preferably a group represented by $-L_4-R_8$. $L_4$ represents a single bond or an ester group. $R_8$ is an alkyl group which may have a fluorine atom or an iodine atom, a cycloalkyl group which may have a fluorine atom or an iodine atom, an aryl group which may have a fluorine atom or an iodine atom, or a group formed by combination thereof.

$R_4$ and $R_5$ each independently represent a hydrogen atom, a fluorine atom, an iodine atom, or an alkyl group which may have a fluorine atom or an iodine atom.

$L_2$ represents a single bond, an ester group, or a divalent group formed by combination of —CO—, —O—, and an alkylene group (which preferably has 1 to 6 carbon atoms, and may be linear or branched; —$CH_2$— may be substituted with a halogen atom.

$L_3$ represents an (n+m+1)-valent aromatic hydrocarbon ring group or an (n+m+1)-valent alicyclic hydrocarbon ring group. Examples of the aromatic hydrocarbon ring group include a benzene ring group and a naphthalene ring group. The alicyclic hydrocarbon ring group may be either a monocycle or a polycycle, and examples thereof include a cycloalkyl ring group, a norbornene ring group, and an adamantane ring group.

$R_6$ represents a hydroxyl group or a fluorinated alcohol group. The fluorinated alcohol group is preferably a monovalent group represented by Formula (3L).

$$*-L_{6X}-R_{6X} \quad (3L)$$

$L_{6X}$ represents a single bond or a divalent linking group. The divalent linking group is not particularly limited, but examples thereof include-CO—, —O—, —SO—, —$SO_2$—, —$NR^A$—, an alkylene group (which preferably has 1 to 6 carbon atoms, and may be linear or branched) which may have a substituent, and a divalent linking group formed by combination of a plurality of these groups. Examples of $R^A$ include a hydrogen atom or an alkyl group having 1 to 6 carbon atoms. In addition, the alkylene group may have a substituent. Examples of the substituent include a halogen atom (preferably a fluorine atom) and a hydroxyl group. $R_{6X}$ represents a hexafluoroisopropanol group. Furthermore, in a case where $R_6$ is a hydroxyl group, it is also preferable that $L_3$ is an (n+m+1)-valent aromatic hydrocarbon ring group.

$R_7$ represents a halogen atom. Examples of the halogen atom include a fluorine atom, a chlorine atom, a bromine atom, or an iodine atom.

m represents an integer of 1 or more. m is preferably an integer of 1 to 3, and more preferably an integer of 1 or 2.

n represents 0 or an integer of 1 or more. n is preferably an integer of 1 to 4.

Furthermore, (n+m+1) is preferably an integer of 1 to 5.

Examples of the repeating unit having an acid group include the following repeating units.

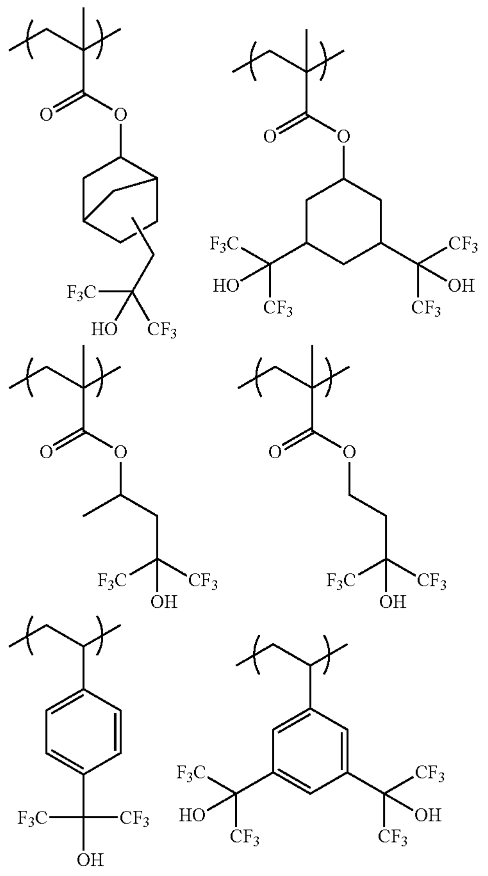

-continued

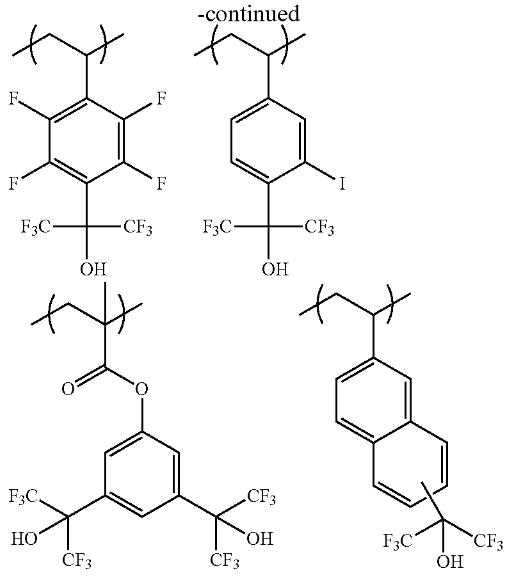

As the repeating unit having an acid group, a repeating unit represented by Formula (I) is also preferable.

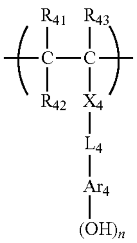

(I)

In Formula (I), $R_{41}$, $R_{42}$, and $R_{43}$ each independently represent a hydrogen atom, an alkyl group, a cycloalkyl group, a halogen atom, a cyano group, or an alkoxycarbonyl group. It should be noted that $R_{42}$ may be bonded to $Ar_4$ to form a ring, in which case $R_{42}$ represents a single bond or an alkylene group.

$X_4$ represents a single bond, —COO—, or —$CONR_{64}$—, and $R_{64}$ represents a hydrogen atom or an alkyl group.

$L_4$ represents a single bond or an alkylene group.

$Ar_4$ represents an (n+1)-valent aromatic ring group, and in a case where $Ar_4$ is bonded to $R_{42}$ to form a ring, $Ar_4$ represents an (n+2)-valent aromatic ring group. n represents an integer of 1 to 5.

As the alkyl group represented by each of $R_{41}$, $R_{42}$, and $R_{43}$ in Formula (I), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group is preferable, an alkyl group having 8 or less carbon atoms is more preferable, and an alkyl group having 3 or less carbon atoms is still more preferable.

The cycloalkyl group of each of $R_{41}$, $R_{42}$, and $R_{43}$ in Formula (I) may be monocyclic or polycyclic. Among those, a monocyclic cycloalkyl group having 3 to 8 carbon atoms, such as a cyclopropyl group, a cyclopentyl group, and a cyclohexyl group, is preferable.

Examples of the halogen atom of each of $R_{41}$, $R_{42}$, and $R_{43}$ in Formula (I) include a fluorine atom, a chlorine atom, a bromine atom, and an iodine atom, and the fluorine atom is preferable.

As the alkyl group included in the alkoxycarbonyl group of each of $R_{41}$, $R_{42}$, and $R_{43}$ in Formula (I), the same ones as the alkyl group in each of $R_{41}$, $R_{42}$, and $R_{43}$ are preferable.

Preferred examples of the substituent in each of the groups include an alkyl group, a cycloalkyl group, an aryl group, an amino group, an amide group, a ureide group, a urethane group, a hydroxyl group, a carboxyl group, a halogen atom, an alkoxy group, a thioether group, an acyl group, an acyloxy group, an alkoxycarbonyl group, a cyano group, and a nitro group. The substituent preferably has 8 or less carbon atoms.

$Ar_4$ represents an (n+1)-valent aromatic ring group. The divalent aromatic ring group in a case where n is 1 is preferably for example, an arylene group having 6 to 18 carbon atoms, such as a phenylene group, a tolylene group, a naphthylene group, and an anthracenylene group, or a divalent aromatic ring group including a heterocyclic ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring. Furthermore, the aromatic ring group may have a substituent.

Specific examples of the (n+1)-valent aromatic ring group in a case where n is an integer of 2 or more include groups formed by removing any (n−1) hydrogen atoms from the above-described specific examples of the divalent aromatic ring group.

The (n+1)-valent aromatic ring group may further have a substituent.

Examples of the substituent which can be contained in the alkyl group, the cycloalkyl group, the alkoxycarbonyl group, the alkylene group, and the (n+1)-valent aromatic ring group, each mentioned above, include the alkyl groups; the alkoxy groups such as a methoxy group, an ethoxy group, a hydroxyethoxy group, a propoxy group, a hydroxypropoxy group, and a butoxy group; the aryl groups such as a phenyl group; and the like, as mentioned for each of $R_{41}$, $R_{42}$, and $R_{43}$ in Formula (I).

Examples of the alkyl group of $R_{64}$ in —$CONR_{64}$— represented by $X_4$ ($R_{64}$ represents a hydrogen atom or an alkyl group) include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, and an alkyl group having 8 or less carbon atoms, is preferable.

As $X_4$, a single bond, —COO—, or —CONH— is preferable, and the single bond or —COO— is more preferable.

As the alkylene group in $L_4$, an alkylene group having 1 to 8 carbon atoms, such as a methylene group, an ethylene group, a propylene group, a butylene group, a hexylene group, and an octylene group, is preferable.

As $Ar_4$, an aromatic ring group having 6 to 18 carbon atoms is preferable, and a benzene ring group, a naphthalene ring group, and a biphenylene ring group are more preferable.

The repeating unit represented by Formula (I) preferably comprises a hydroxystyrene structure. That is, $Ar_4$ is preferably the benzene ring group.

As the repeating unit represented by Formula (I), a repeating unit represented by Formula (I) is preferable.

(1)

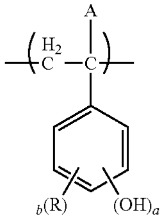

In Formula (I),

A represents a hydrogen atom, an alkyl group, a cycloalkyl group, a halogen atom, or a cyano group.

R represents a halogen atom, an alkyl group, a cycloalkyl group, an aryl group, an alkenyl group, an aralkyl group, an alkoxy group, an alkylcarbonyloxy group, an alkylsulfonyloxy group, an alkyloxycarbonyl group, or an aryloxycarbonyl group, and in a case where a plurality of R's are present, R's may be the same as or different from each other. In a case where there are a plurality of R's, R's may be bonded to each other to form a ring. As R, the hydrogen atom is preferable.

a represents an integer of 1 to 3.

b represents an integer of 0 to (5-a).

The repeating unit having an acid group is exemplified below. In the formulae, a represents 1 or 2.

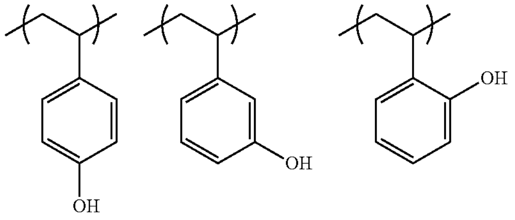

(B-1)

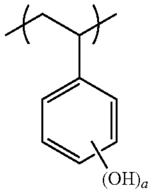

(B-2)

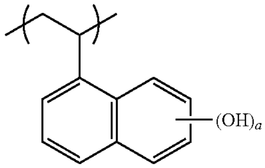

(B-3)

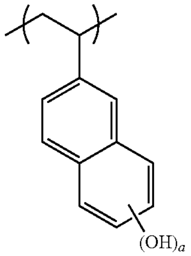

-continued (B-4)

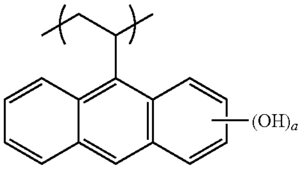

(B-5)

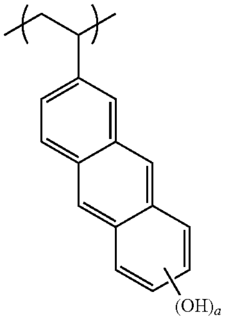

(B-6)

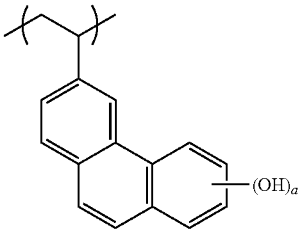

(B-7)

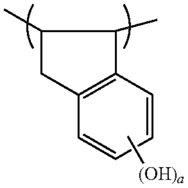

(B-8)

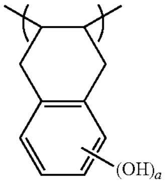

(B-9)

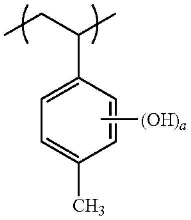

(B-10)

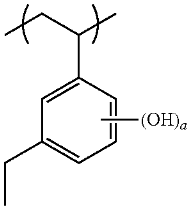

-continued
(B-11)
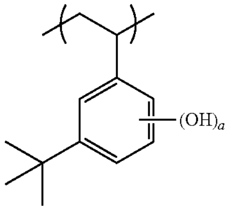
(B-12)
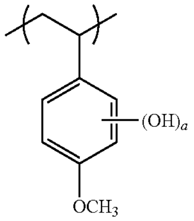
(B-13)
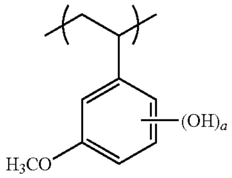
(B-14)
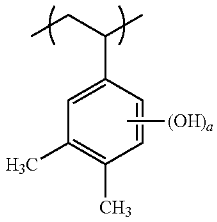
(B-15)
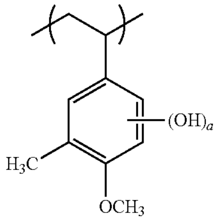
(B-16)
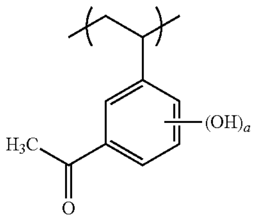
(B-17)
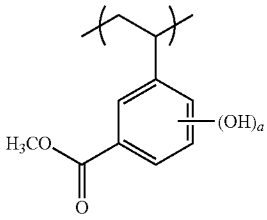
-continued
(B-18)
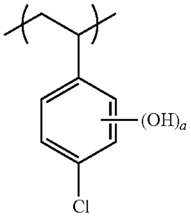
(B-19)
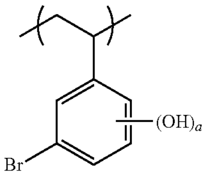
(B-20)
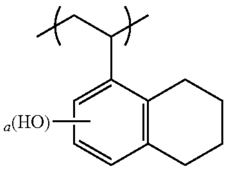
(B-21)
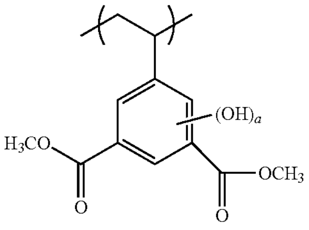
(B-22)
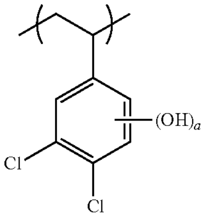
(B-23)
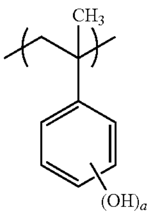
(B-24)
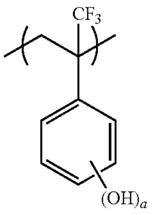

-continued
(B-25)
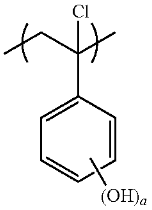
(B-26)
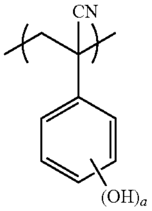
(B-27)
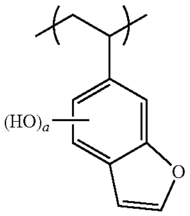
(B-28)
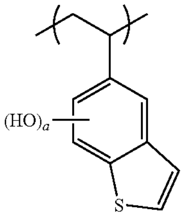
(B-29)
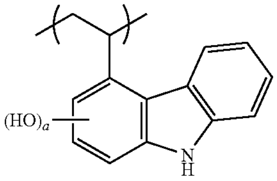
(B-30)
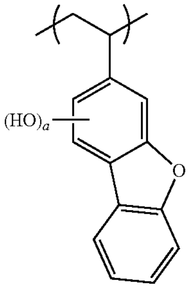
(B-31)
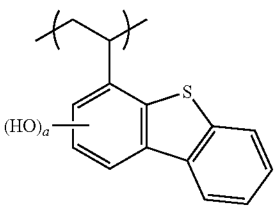
-continued
(B-32)
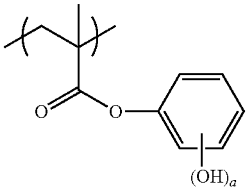
(B-33)
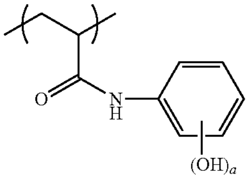
(B-34)
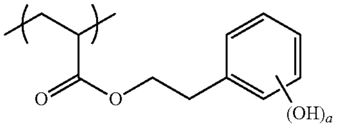
(B-35)
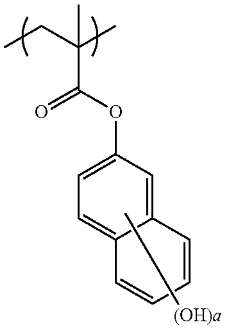
(B-36)
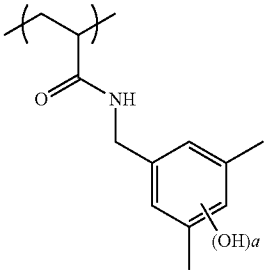
(B-37)
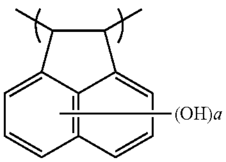
(B-38)
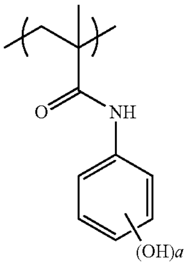

Moreover, among the repeating units, the repeating units specifically described below are preferable. In the formula, R represents a hydrogen atom or a methyl group, and a represents 2 or 3.
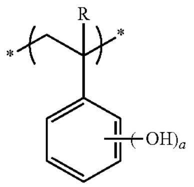
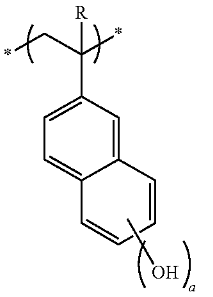
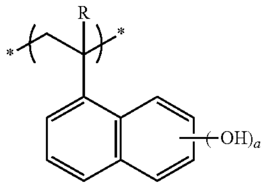
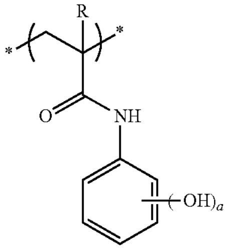
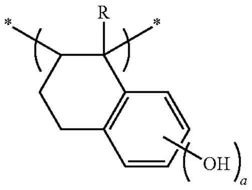
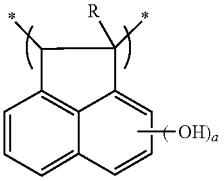
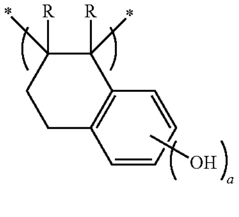
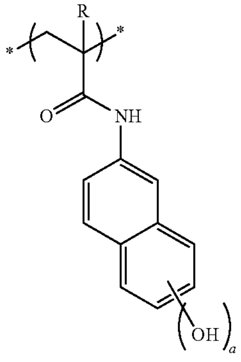
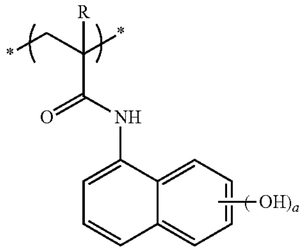
-continued
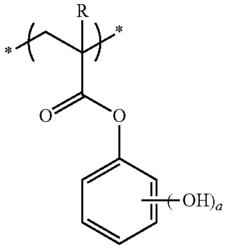
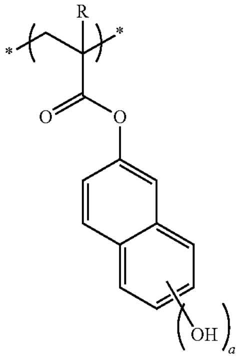
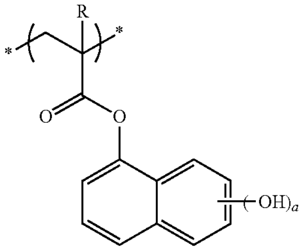
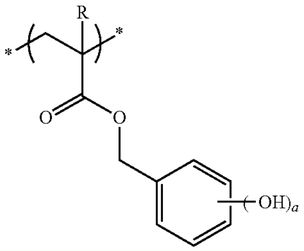
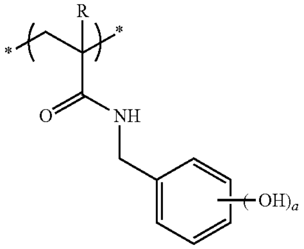
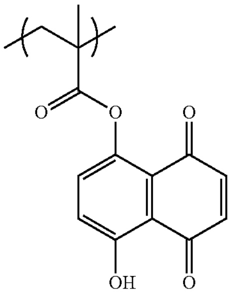
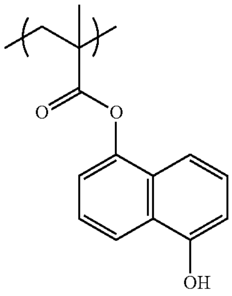

-continued

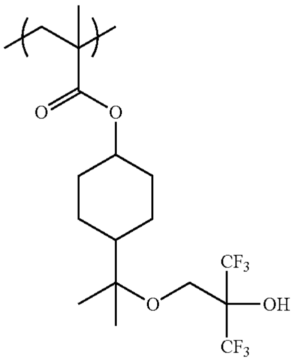

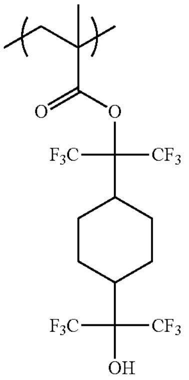

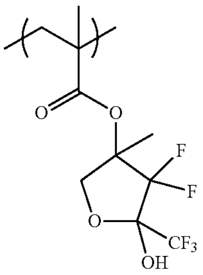

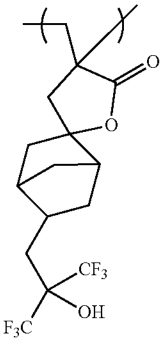

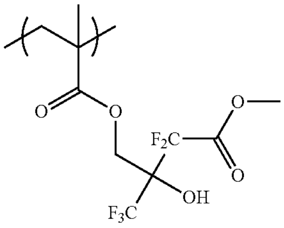

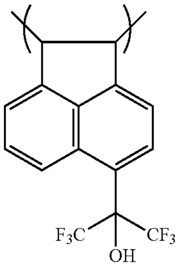

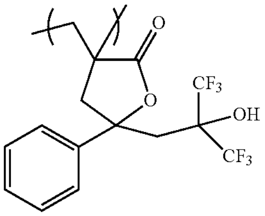

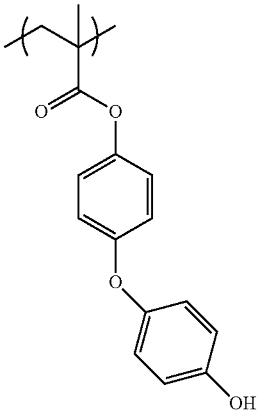

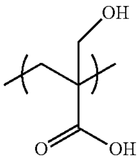

-continued

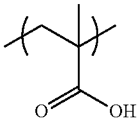

The content of the repeating unit having an acid group is preferably 10% by mole or more, and more preferably 15% by mole or more with respect to all repeating units in the resin (A). In addition, an upper limit value thereof is preferably 70% by mole or less, more preferably 65% by mole or less, and still more preferably 60% by mole or less.

<Repeating Unit Having Fluorine Atom or Iodine Atom>

The resin (A) may have a repeating unit having a fluorine atom or an iodine atom in addition to <Repeating Unit Having Acid-Decomposable Group> and <Repeating Unit Having Acid Group> mentioned above. In addition, <Repeating Unit Having Fluorine Atom or Iodine Atom> mentioned herein is preferably different from other kinds of repeating units belonging to the group A, such as <Repeating Unit Having Lactone Group, Sultone Group, or Carbonate Group> and <Repeating Unit Having Photoacid Generating Group>, which will be described later.

As the repeating unit having a fluorine atom or an iodine atom, a repeating unit represented by Formula (C) is preferable.

(C)

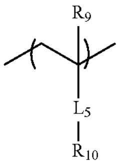

$L_5$ represents a single bond or an ester group.

$R_9$ represents a hydrogen atom, or an alkyl group which may have a fluorine atom or an iodine atom.

$R_{10}$ represents a hydrogen atom, an alkyl group which may have a fluorine atom or an iodine atom, a cycloalkyl group which may have a fluorine atom or an iodine atom, an aryl group which may have a fluorine atom or an iodine atom, or a group formed by combination thereof.

The repeating unit having a fluorine atom or an iodine atom will be exemplified below.

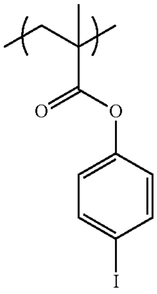

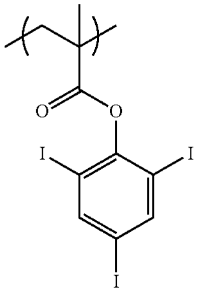

-continued

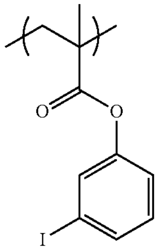

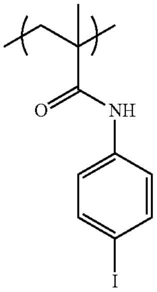

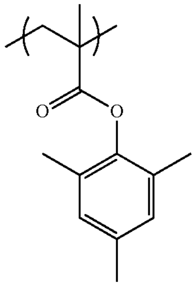

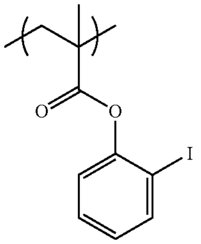

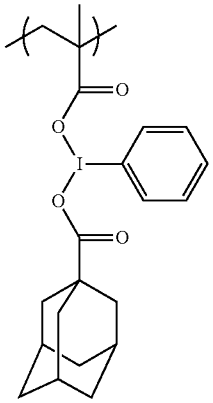

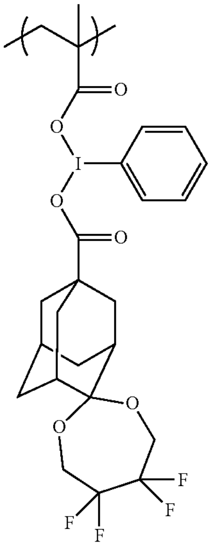

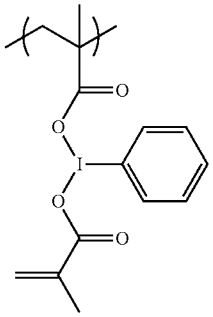

The content of the repeating unit having a fluorine atom or an iodine atom is preferably 0% by mole or more, more preferably 5% by mole or more, and still more preferably 10% by mole or more with respect to all repeating units in the resin (A). In addition, an upper limit value thereof is preferably 50% by mole or less, more preferably 45% by mole or less, and still more preferably 40% by mole or less.

Furthermore, since the repeating unit having a fluorine atom or an iodine atom does not include <Repeating Unit Having Acid-Decomposable Group> and <Repeating Unit Having Acid Group> as described above, the content of the repeating unit having a fluorine atom or an iodine atom is also intended to be the content of the repeating unit having a fluorine atom or an iodine atom excluding <Repeating Unit Having Acid-Decomposable Group> and <Repeating Unit Having Acid Group>.

The total content of the repeating units including at least one of a fluorine atom or an iodine atom in the repeating units of the resin (A) is preferably 10% by mole or more, more preferably 20% by mole or more, still more preferably 30% by mole or more, and particularly preferably 40% by mole or more with respect to all repeating units of the resin (A). An upper limit value thereof is not particularly limited, but is, for example, 100% by mole or less. In addition, examples of the repeating unit including at least one of a fluorine atom or an iodine atom include a repeating unit which has a fluorine atom or an iodine atom, and has an acid-decomposable group, a repeating unit which has a fluorine atom or an iodine atom, and has an acid group, and a repeating unit having a fluorine atom or an iodine atom.

<Repeating Unit Having Lactone Group, Sultone Group, or Carbonate Group>

The resin (A) may have a repeating unit having at least one selected from the group consisting of a lactone group, a sultone group, and a carbonate group (hereinafter also collectively referred to as a "repeating unit having a lactone group, a sultone group, or a carbonate group").

It is also preferable that the repeating unit having a lactone group, a sultone group, or a carbonate group has no acid group such as a hydroxyl group and a hexafluoropropanol group.

The lactone group or the sultone group may have a lactone structure or a sultone structure. The lactone structure or the sultone structure is preferably a 5- to 7-membered ring lactone structure or a 5- to 7-membered ring sultone structure. Among those, the structure is more preferably a 5- to 7-membered ring lactone structure with which another ring structure is fused so as to form a bicyclo structure or a spiro structure, or a 5- to 7-membered ring sultone structure with which another ring structure is fused so as to form a bicyclo structure or a spiro structure.

The resin (A) preferably has a repeating unit having a lactone group or a sultone group, formed by extracting one or more hydrogen atoms from a ring member atom of a lactone structure represented by any one of Formula (LC1-1), . . . , or (LC1-21) or a sultone structure represented by any one of Formula (SL1-1), (SL1-2), or (SL1-3).

In addition, the lactone group or the sultone group may be bonded directly to the main chain. For example, a ring member atom of the lactone group or the sultone group may constitute the main chain of the resin (A).

LC1-1

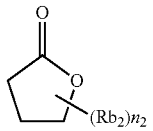

LC1-2

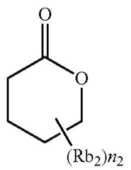

-continued
LC1-3
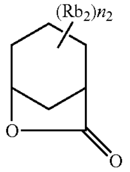
LC1-4
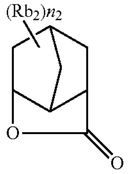
LC1-5
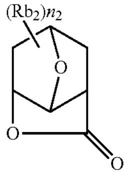
LC1-6
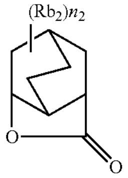
LC1-7
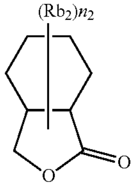
LC1-8
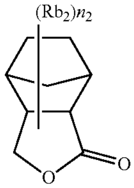
LC1-9
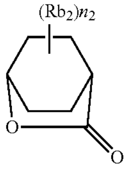
LC1-10
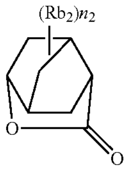
-continued
LC1-11
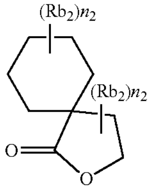
LC1-12
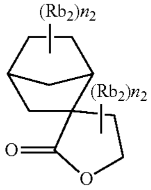
LC1-13
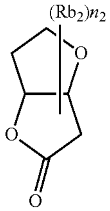
LC1-14
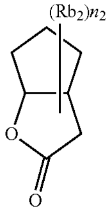
LC1-15
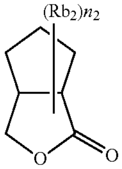
LC1-16
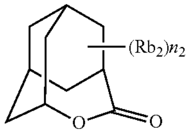
LC1-17
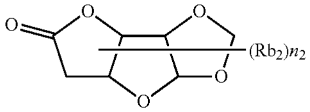
LC1-18
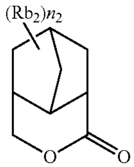

-continued

LC1-19

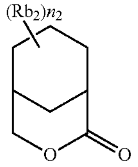

LC1-20

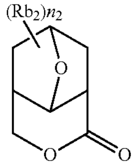

LC1-21

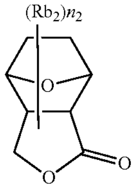

SL1-1

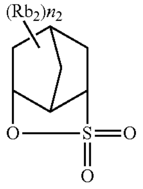

SL1-2

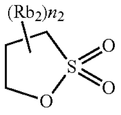

SL1-3

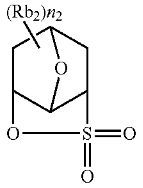

The moiety of the lactone structure or the sultone structure may have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a cyano group, and an acid-decomposable group. n2 represents an integer of 0 to 4. In a case where n2 is 2 or more, $Rb_2$'s which are present in a plural number may be different from each other, and $Rb_2$'s which are present in a plural number may be bonded to each other to form a ring.

Examples of the repeating unit having a group having the lactone structure represented by any one of Formula (LC1-1), . . . , or (LC1-21) or the sultone structure represented by any one of Formula (SL1-1), (SL1-2), or (SL1-3) include a repeating unit represented by Formula (AI).

(AI)

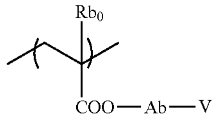

In Formula (AI), $Rb_0$ represents a hydrogen atom, a halogen atom, or an alkyl group having 1 to 4 carbon atoms.

Preferred examples of the substituent which may be contained in the alkyl group of $Rb_0$ include a hydroxyl group and a halogen atom.

Examples of the halogen atom of $Rb_0$ include a fluorine atom, a chlorine atom, a bromine atom, and an iodine atom. $Rb_0$ is preferably the hydrogen atom or a methyl group.

Ab represents a single bond, an alkylene group, a divalent linking group having a monocyclic or polycyclic alicyclic hydrocarbon structure, an ether group, an ester group, a carbonyl group, a carboxyl group, or a divalent group formed by combination thereof. Among those, the single bond or a linking group represented by $-Ab_1-CO_2-$ is preferable. $Ab_1$ is a linear or branched alkylene group, or a monocyclic or polycyclic cycloalkylene group, and is preferably a methylene group, an ethylene group, a cyclohexylene group, an adamantylene group, or a norbornylene group.

V represents a group formed by extracting one hydrogen atom from a ring member atom of the lactone structure represented by any one of Formula (LC1-1), . . . , or (LC1-21) or a group formed by extracting one hydrogen atom from a ring member atom of the sultone structure represented by any one of Formula (SL1-1), (SL1-2), or (SL1-3).

In a case where an optical isomer is present in the repeating unit having a lactone group or a sultone group, any of the optical isomers may be used. In addition, one kind of optical isomers may be used alone or a plurality of kinds of optical isomers may be mixed and used. In a case where one kind of optical isomers is mainly used, an optical purity (ee) thereof is preferably 90 or more, and more preferably 95 or more.

As the carbonate group, a cyclic carbonate group is preferable.

As the repeating unit having a cyclic carbonic acid ester group, a repeating unit represented by Formula (A-1) is preferable.

(A-1)

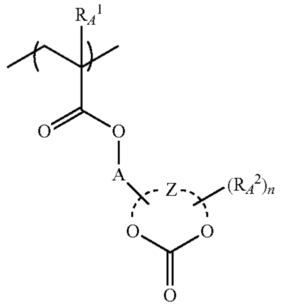

In Formula (A-1), $R_A^1$ represents a hydrogen atom, a halogen atom, or a monovalent organic group (preferably a methyl group).

n represents an integer of 0 or more.

$R_A^2$ represents a substituent. In a case where n is 2 or more, $R_A^2$ which are present in a plural number may be the same as or different from each other.

A represents a single bond or a divalent linking group. As the divalent linking group, an alkylene group, a divalent linking group having a monocyclic or polycyclic alicyclic hydrocarbon structure, an ether group, an ester group, a carbonyl group, a carboxyl group, or a divalent group formed by combination thereof is preferable.

Z represents an atomic group that forms a monocycle or polycycle with a group represented by —O—CO—O— in the formula.

The repeating unit having a lactone group, a sultone group, or a carbonate group will be exemplified below.

(in the formulae, Rx represents H, $CH_3$, $CH_2OH$, or $CF_3$)

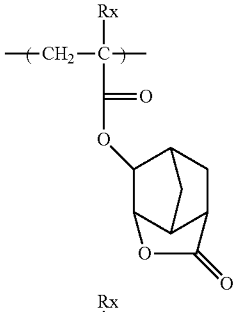
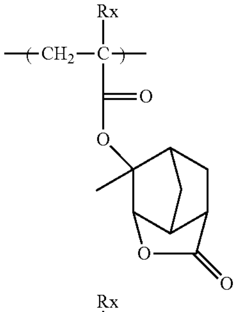
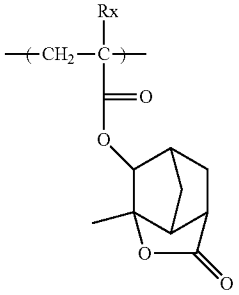
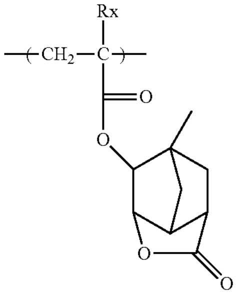
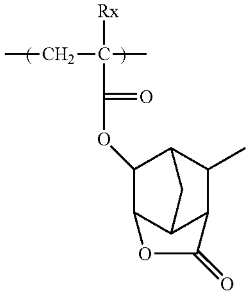
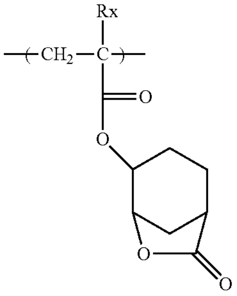
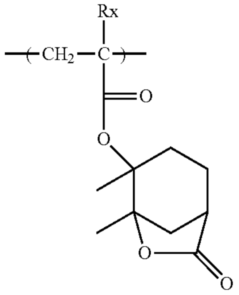
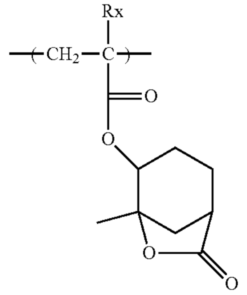

-continued

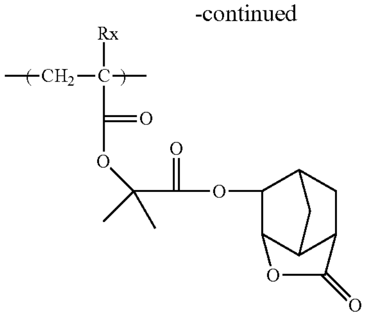
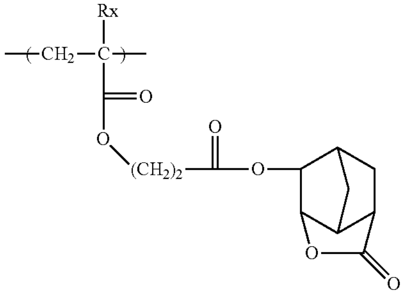
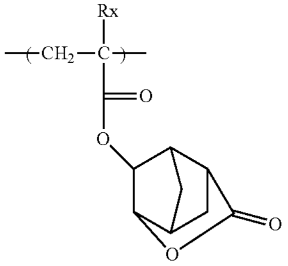
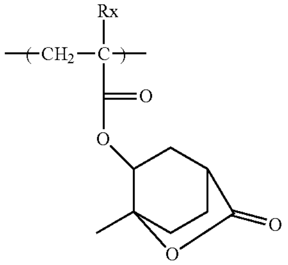
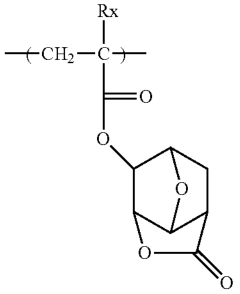
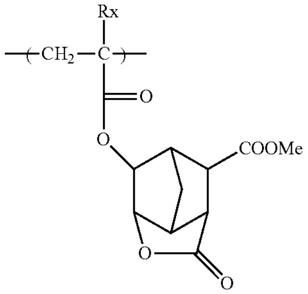

-continued
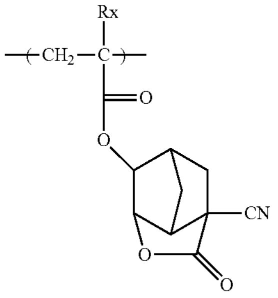
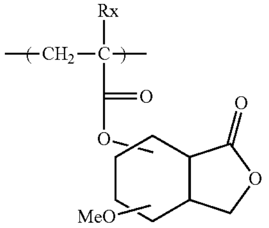
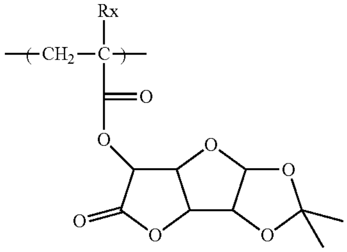
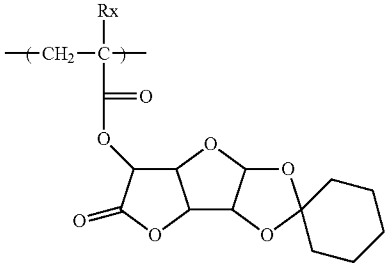
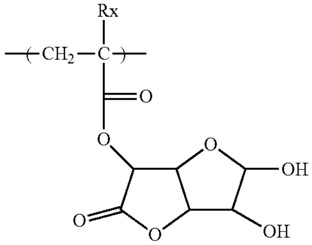
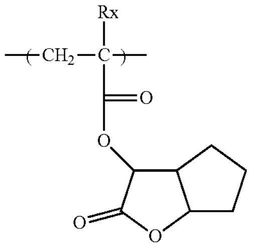
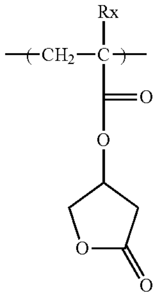
-continued
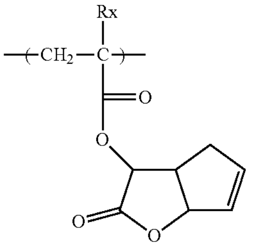
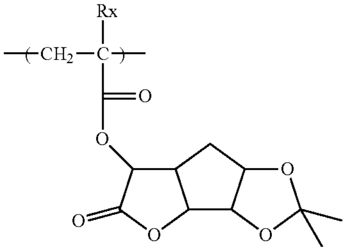
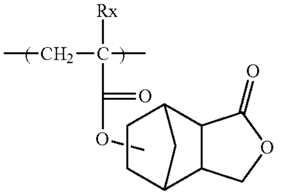
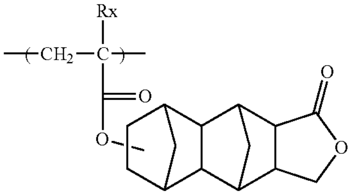
(in the formulae, Rx represents H, $CH_3$, $CH_2OH$, or $CF_3$)
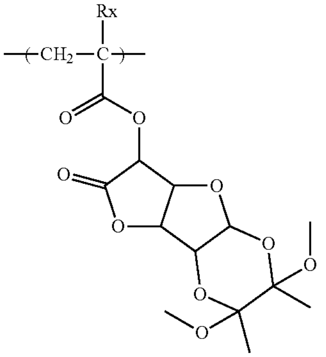
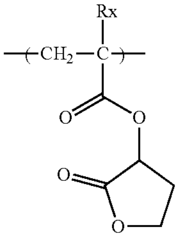
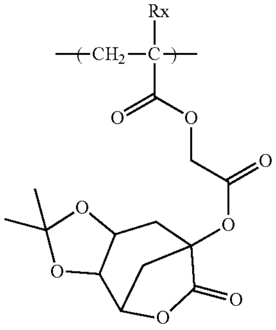

-continued
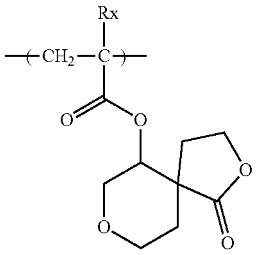
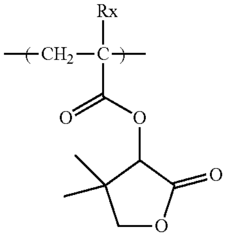
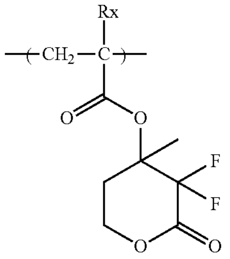
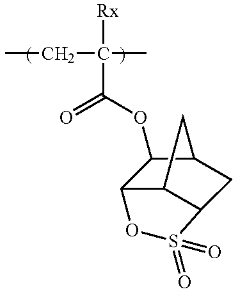
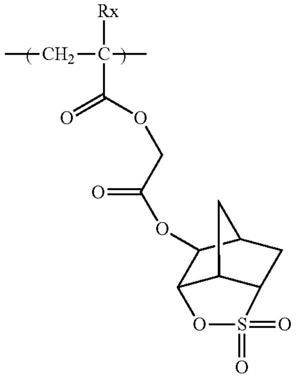
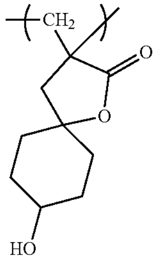
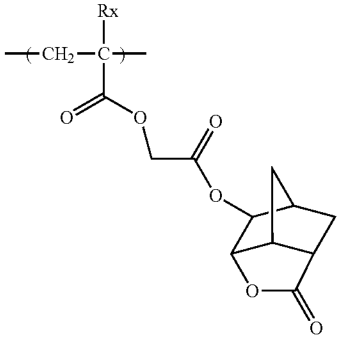
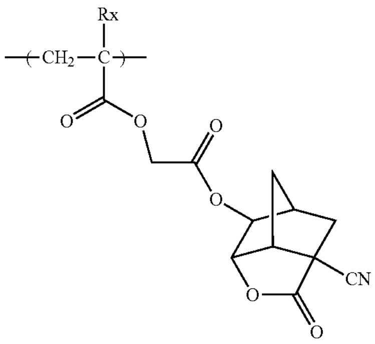
-continued
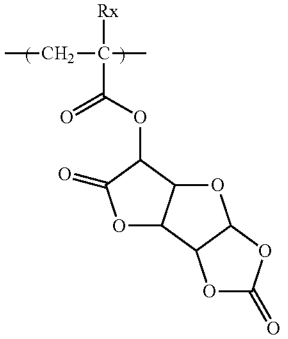
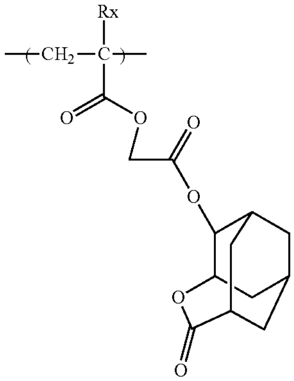
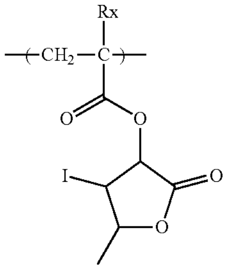
(in the formulae, Rx represents H, $CH_3$, $CH_2OH$, or $CF_3$)
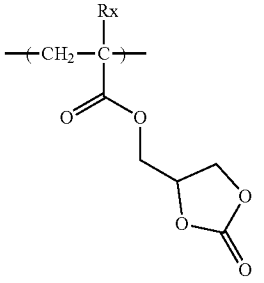

-continued

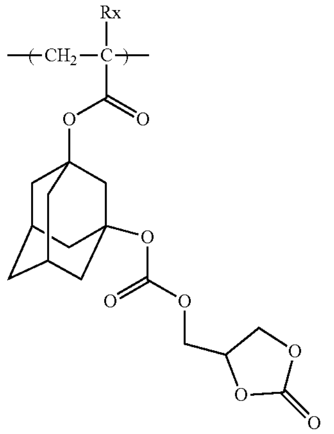

The content of the repeating unit having a lactone group, a sultone group, or a carbonate group is preferably 1% by mole or more, and more preferably 10% by mole or more with respect to all repeating units in the resin (A). In addition, an upper limit value thereof is preferably 85% by mole or less, more preferably 80% by mole or less, still more preferably 70% by mole or less, and particularly preferably 60% by mole or less.

<Repeating Unit Having Photoacid Generating Group>

The resin (A) may have, as a repeating unit other than those above, a repeating unit having a group that generates an acid upon irradiation with actinic rays or radiation (hereinafter also referred to as a "photoacid generating group").

In this case, it can be considered that the repeating unit having the photoacid generating group corresponds to the above-mentioned photoacid generator (B).

Examples of such the repeating unit include a repeating unit represented by Formula (4).

(4)

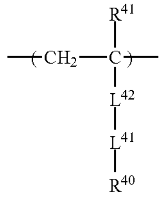

$R^{41}$ represents a hydrogen atom or a methyl group. $L^{41}$ represents a single bond or a divalent linking group. $L^{42}$ represents a divalent linking group. $R^{40}$ represents a structural moiety that decomposes upon irradiation with actinic rays or radiation to generate an acid in a side chain.

The repeating unit having a photoacid generating group is exemplified below.

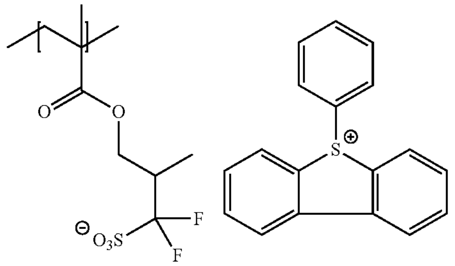

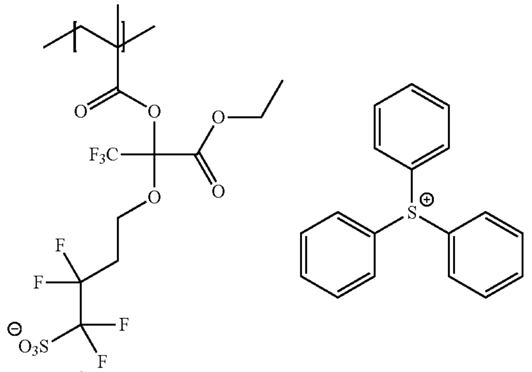

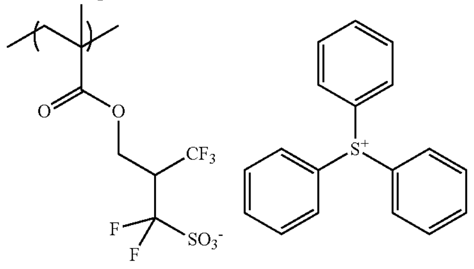

In addition, examples of the repeating unit represented by Formula (4) include the repeating units described in paragraphs [0094~] to [0105] of JP2014-041327A and the repeating units described in paragraph [0094] of WO2018/193954A.

The content of the repeating unit having a photoacid generating group is preferably 1% by mole or more, and more preferably 5% by mole or more with respect to all repeating units in the resin (A). In addition, an upper limit value thereof is preferably 40% by mole or less, more preferably 35% by mole or less, and still more preferably 30% by mole or less.

<Repeating Unit Represented by Formula (V-1) or Formula (V-2)>

The resin (A) may have a repeating unit represented by Formula (V-1) or Formula (V-2).

The repeating unit represented by Formulae (V-1) and (V-2) is preferably a repeating unit different from the above-mentioned repeating units.

(V-1)

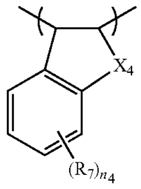

-continued (V-2)

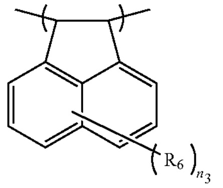

In the formulae, $R_6$ and $R_7$ each independently represent a hydrogen atom, a hydroxyl group, an alkyl group, an alkoxy group, an acyloxy group, a cyano group, a nitro group, an amino group, a halogen atom, an ester group (—OCOR or —COOR: R is an alkyl group or fluorinated alkyl group having 1 to 6 carbon atoms), or a carboxyl group. As the alkyl group, a linear, branched, or cyclic alkyl group having 1 to 10 carbon atoms is preferable.

$n_3$ represents an integer of 0 to 6.

$n_4$ represents an integer of 0 to 4.

$X_4$ is a methylene group, an oxygen atom, or a sulfur atom.

The repeating unit represented by Formula (V-1) or (V-2) will be exemplified below. Examples of the repeating unit represented by Formula (V-1) or (V-2) include the repeating unit described in paragraph [0100] of WO2018/193954A.

<Repeating Unit for Reducing Motility of Main Chain>

The resin (A) preferably has a high glass transition temperature (Tg) from the viewpoint that excessive diffusion of an acid generated or pattern collapse during development can be suppressed. Tg is preferably higher than 90° C., more preferably higher than 100° C., still more preferably higher than 110° C., and particularly preferably higher than 125° C. In addition, since an excessive increase in Tg causes a decrease in the dissolution rate in a developer, Tg is preferably 400° C. or lower, and more preferably 350° C. or lower.

Furthermore, in the present specification, the glass transition temperature (Tg) of a polymer such as the resin (A) is calculated by the following method. First, the Tg of a homopolymer consisting only of each repeating unit included in the polymer is calculated by a Bicerano method. Hereinafter, the calculated Tg is referred to as the "Tg of the repeating unit". Next, the mass proportion (%) of each repeating unit to all repeating units in the polymer is calculated. Then, the Tg at each mass proportion is calculated using a Fox's equation (described in Materials Letters 62 (2008) 3152, and the like), and these are summed to obtain the Tg (° C.) of the polymer.

The Bicerano method is described in Prediction of polymer properties, Marcel Dekker Inc., New York (1993), and the like. The calculation of a Tg by the Bicerano method can be carried out using MDL Polymer (MDL Information Systems, Inc.), which is software for estimating physical properties of a polymer.

In order to raise the Tg of the resin (A) (preferably to raise the Tg to higher than 90° C.), it is preferable to reduce the motility of the main chain of the resin (A). Examples of a method for reducing the motility of the main chain of the resin (A) include the following (a) to (e) methods.

(a) Introduction of a bulky substituent into the main chain (b) Introduction of a plurality of substituents into the main chain (c) Introduction of a substituent that induces an interaction between the resins (A) near the main chain (d) Formation of the main chain in a cyclic structure (e) Linking of a cyclic structure to the main chain Furthermore, the resin (A) preferably has a repeating unit having a Tg of a homopolymer exhibiting 130° C. or higher.

In addition, the type of the repeating unit having a Tg of the homopolymer exhibiting 130° C. or higher is not particularly limited, and may be any of repeating units having a Tg of a homopolymer of 130° C. or higher calculated by the Bicerano method. Moreover, it corresponds to a repeating unit having a Tg of a homopolymer exhibiting 130° C. or higher, depending on the type of a functional group in the repeating units represented by Formula (A) to Formula (E) which will be described later.

(Repeating Unit Represented by Formula (A))

As an example of a specific unit for accomplishing (a) above, a method of introducing a repeating unit represented by Formula (A) into the resin (A) may be mentioned.

(A)

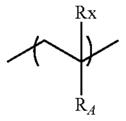

In Formula (A), $R_A$ represents a group having a polycyclic structure. $R_x$ represents a hydrogen atom, a methyl group, or an ethyl group. The group having a polycyclic structure is a group having a plurality of ring structures, and the plurality of ring structures may or may not be fused.

Specific examples of the repeating unit represented by Formula (A) include those described in paragraphs [0107] to [0119] of WO2018/193954A.

(Repeating Unit Represented by Formula (B))

As an example of a specific unit for accomplishing (b) above, a method of introducing a repeating unit represented by Formula (B) into the resin (A) may be mentioned.

(B)

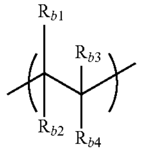

In Formula (B), $R_{b1}$ to $R_{b4}$ each independently represent a hydrogen atom or an organic group, and at least two or more of $R_{b1}$ to $R_{b4}$ represent an organic group.

Furthermore, in a case where at least one of the organic groups is a group in which a ring structure is directly linked to the main chain in the repeating unit, the types of the other organic groups are not particularly limited.

In addition, in a case where none of the organic groups is a group in which a ring structure is directly linked to the main chain in the repeating unit, at least two or more of the organic groups are substituents having three or more constituent atoms excluding hydrogen atoms.

Specific examples of the repeating unit represented by Formula (B) include those described in paragraphs [0113] to [0115] of WO2018/193954A.

(Repeating Unit Represented by Formula (C))

As an example of a specific unit for accomplishing (c) above, a method of introducing a repeating unit represented by Formula (C) into the resin (A) may be mentioned.

(C)

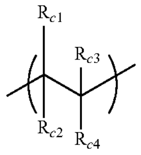

In Formula (C), $R_{c1}$ to $R_{c4}$ each independently represent a hydrogen atom or an organic group, and at least one of $R_{1c}$, to $R_{c4}$ is a group having a hydrogen-bonding hydrogen atom with a number of atoms of 3 or less from the main chain carbon. Above all, it is preferable that the group has hydrogen-bonding hydrogen atoms with a number of atoms of 2 or less (on a side closer to the vicinity of the main chain) to induce an interaction between the main chains of the resin (A).

Specific examples of the repeating unit represented by Formula (C) include those described in paragraphs [0119] to [0121] of WO2018/193954A.

(Repeating Unit Represented by Formula (D))

As an example of a specific unit for accomplishing (d) above, a method of introducing a repeating unit represented by Formula (D) into the resin (A) may be mentioned.

(D)

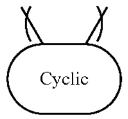

In Formula (D), “Cyclic” is a group that forms a main chain with a cyclic structure. The number of the ring-constituting atoms is not particularly limited.

Specific examples of the repeating unit represented by Formula (D) include those described in paragraphs [0126] and [0127] of WO2018/193954A.

(Repeating Unit Represented by Formula (E))

As an example of a specific unit for accomplishing (e) above, a method of introducing a repeating unit represented by Formula (E) into the resin (A) may be mentioned.

(E)

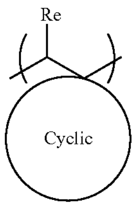

In Formula (F), Re’s each independently represent a hydrogen atom or an organic group. Examples of the organic group include an alkyl group, a cycloalkyl group, an aryl group, an aralkyl group, and an alkenyl group, which may have a substituent.

“Cyclic” is a cyclic group including a carbon atom of the main chain. The number of atoms included in the cyclic group is not particularly limited.

Specific examples of the repeating unit represented by Formula (E) include those described in paragraphs [0131] to [0133] of WO2018/193954A.

<Repeating Unit Having at Least One Group Selected from Lactone Group, Sultone Group, Carbonate Group, Hydroxyl Group, Cyano Group, or Alkali-Soluble Group>

The resin (A) may have a repeating unit having at least one group selected from a lactone group, a sultone group, a carbonate group, a hydroxyl group, a cyano group, or an alkali-soluble group.

Examples of the repeating unit having a lactone group, a sultone group, or a carbonate group contained in the resin (A) include the repeating units described in <Repeating Unit Having Lactone Group, Sultone Group, or Carbonate Group> mentioned above. A preferred content thereof is also the same as described in <Repeating Unit Having Lactone Group, Sultone Group, or Carbonate Group> mentioned above.

The resin (A) may have a repeating unit having a hydroxyl group or a cyano group. As a result, the adhesiveness to a substrate and the affinity for a developer are improved.

The repeating unit having a hydroxyl group or a cyano group is preferably a repeating unit having an alicyclic hydrocarbon structure substituted with a hydroxyl group or a cyano group.

The repeating unit having a hydroxyl group or a cyano group preferably has no acid-decomposable group. Examples of the repeating unit having a hydroxyl group or a cyano group include those described in paragraphs [0081] to [0084] of JP2014-98921A.

The resin (A) may have a repeating unit having an alkali-soluble group.

Examples of the alkali-soluble group include a carboxyl group, a sulfonamide group, a sulfonylimide group, a bis-sulfonylimide group, or an aliphatic alcohol group (for example, a hexafluoroisopropanol group) in which the α-position is substituted with an electron-withdrawing group, and the carboxyl group is preferable. In a case where the resin (A) includes a repeating unit having an alkali-soluble group, the resolution for use in contact holes increases. Examples of the repeating unit having an alkali-soluble group include those described in paragraphs [0085] and [0086] of JP2014-98921A.

<Repeating Unit Having Alicyclic Hydrocarbon Structure and not Exhibiting Acid Decomposability>

The resin (A) may have a repeating unit having an alicyclic hydrocarbon structure and not exhibiting acid decomposability. This can reduce the elution of low-molecular-weight components from the resist film into an immersion liquid during liquid immersion exposure. Examples of such the repeating unit include repeating units derived from 1-adamantyl (meth)acrylate, diamantyl (meth) acrylate, tricyclodecanyl (meth)acrylate, and cyclohexyl (meth)acrylate.

<Repeating Unit Represented by Formula (III) Having Neither Hydroxyl Group Nor Cyano Group>

The resin (A) may have a repeating unit represented by Formula (III), which has neither a hydroxyl group nor a cyano group.

(III)

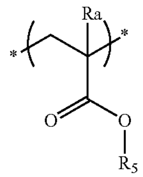

In Formula (III), $R_5$ represents a hydrocarbon group having at least one cyclic structure and having neither a hydroxyl group nor a cyano group.

Ra represents a hydrogen atom, an alkyl group, or a $—CH_2—O-Ra_2$ group. In the formula, $Ra_2$ represents a hydrogen atom, an alkyl group, or an acyl group.

Examples of the repeating unit represented by Formula (III) having neither a hydroxyl group nor a cyano group include those described in paragraphs [0087] to [0094] of JP2014-98921A.

<Other Repeating Units>

Furthermore, the resin (A) may have repeating units other than the repeating units described above.

For example, the resin (A) may have a repeating unit selected from the group consisting of a repeating unit having an oxathiane ring group, a repeating unit having an oxazolone ring group, a repeating unit having a dioxane ring group, and a repeating unit having a hydantoin ring group.

Such repeating units will be exemplified below.

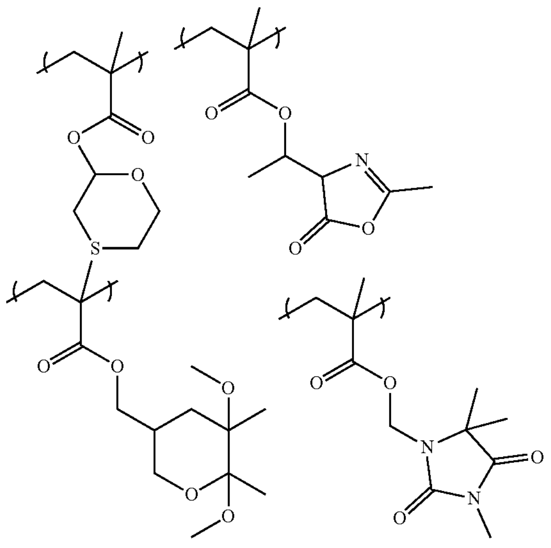

The resin (A) may have a variety of repeating structural units, in addition to the repeating structural units described above, for the purpose of adjusting dry etching resistance, suitability for a standard developer, adhesiveness to a substrate, a resist profile, resolving power, heat resistance, sensitivity, and the like.

As the resin (A), all repeating units is also preferably composed of (meth)acrylate-based repeating units (particularly in a case where the composition is used as an actinic ray-sensitive or radiation-sensitive resin composition for ArF). In this case, any of a resin in which all of the repeating units are methacrylate-based repeating units, a resin in which all of the repeating units are acrylate-based repeating units, and a resin in which all of the repeating units are methacrylate-based repeating units and acrylate-based repeating units can be used, and it is preferable that the amount of the acrylate-based repeating units is 50% by mole or less with respect to all repeating units.

The resin (A) can be synthesized in accordance with an ordinary method (for example, radical polymerization).

The weight-average molecular weight of the resin (A) as a value expressed in terms of polystyrene by a GPC method is 30,000 or less, preferably 1,000 to 30,000, more preferably 3,000 to 30,000, and still more preferably 5,000 to 15,000. By setting the weight-average molecular weight of the resin (A) to 30,000 or less, excellent LWR performance can be obtained. In addition, deterioration of developability and deterioration of film forming property due to high viscosity can also be further suppressed.

The dispersity (molecular weight distribution) of the resin (A) is usually 1 to 5, preferably 1 to 3, more preferably 1.2 or 3.0, and still more preferably 1.2 to 2.0. The smaller the dispersity, the more excellent the resolution and the resist shape, and the smoother the side wall of the resist pattern, the more excellent the roughness.

The content of the resin (A) in the resist composition is preferably 50% to 99.9% by mass, and more preferably 60% to 99.0% by mass with respect to the total solid content of the composition.

In addition, the resin (A) may be used alone or in combination of a plurality thereof.

[Solvent (F)]

The resist composition preferably includes a solvent.

The solvent preferably includes at least one solvent of (M1) propylene glycol monoalkyl ether carboxylate, or (M2) at least one selected from the group consisting of a propylene glycol monoalkyl ether, a lactic acid ester, an acetic acid ester, an alkoxypropionic acid ester, a chain ketone, a cyclic ketone, a lactone, and an alkylene carbonate as a solvent. Furthermore, this solvent may further include components other than the components (M1) and (M2).

The present inventors have found that by using such a solvent and the above-mentioned resin in combination, a pattern having a small number of development defects can be formed while improving the coating property of the composition. A reason therefor is not necessarily clear, but the present inventors have considered that since these solvents have a good balance among the solubility, the boiling point, and the viscosity of the resin, the unevenness of the film thickness of a composition film, the generation of precipitates during spin coating, and the like can be suppressed.

Details of the component (M1) and the component (M2) are described in paragraphs [0218] to [0226] of WO2020/004306A.

In a case where the solvent further includes a component other than the components (M1) and (M2), the content of the component other than the components (M1) and (M2) is preferably 5% to 30% by mass with respect to the total amount of the solvent.

The content of the solvent in the resist composition is preferably set such that the concentration of solid contents is 0.5% to 30% by mass, and more preferably set such that the concentration of solid contents is 1% to 20% by mass. With this content, the coating property of the resist composition can be further improved.

Furthermore, the solid content means all the components excluding the solvent.

[Acid Diffusion Control Agent (C)]

The resist composition may include an acid diffusion control agent.

The acid diffusion control agent acts as a quencher that suppresses a reaction of an acid-decomposable resin in the unexposed portion by excessive generated acids by trapping the acids generated from a photoacid generator and the like upon exposure. For example, a basic compound (CA), a basic compound (CB) of which basicity is reduced or lost upon irradiation with actinic rays or radiation, a low-molecular-weight compound (CD) having a nitrogen atom and a group that leaves by the action of an acid, and an onium salt compound (CE) having a nitrogen atom in the cationic moiety, can be used as the acid diffusion control agent. In the resist composition of the embodiment of the present invention, a known acid diffusion control agent can be appropriately used. For example, the known compounds disclosed in paragraphs [0627] to [0664] of the specification of US2016/0070167A1, paragraphs [0095] to [0187] of the specification of US2015/0004544A1, paragraphs [0403] to [0423] of the specification of US2016/0237190A1, and paragraphs [0259] to [0328] of the specification of US2016/0274458A1 can be suitably used as the acid diffusion control agent.

In addition, for example, specific examples of the basic compound (CA) include those described in paragraphs [0132] to [0136] of WO2020/066824A, specific examples of the basic compound (CB) of which basicity is reduced or lost upon irradiation with actinic rays or radiation include those described in paragraphs [0137] to [0155] of WO2020/066824A, specific examples of the low-molecular-weight compound (CD) having a nitrogen atom and a group that leaves by the action of an acid include those described in paragraphs [0156] to [0163] of WO2020/066824A, and specific examples of the onium salt compound (CE) having a nitrogen atom in the cationic moiety include those described in paragraph [0164] of WO2020/066824A.

In addition, as the acid diffusion control agent, an onium salt which serves as a relatively weak acid with respect to the photoacid generating component can also be used.

In a case where the photoacid generator (the specific photoacid generator and other photoacid generators are collectively also referred to as a photoacid generating component) and the onium salt that generates an acid which is a relatively weak acid with respect to an acid generated from the photoacid generating component are used in combination, an acid generated from the photoacid generating component upon irradiation with actinic rays or radiation produces an onium salt having a strong acid anion by discharging the weak acid through salt exchange in a case where the acid collides with an onium salt having an unreacted weak acid anion. In this process, the strong acid is exchanged with a weak acid having a lower catalytic ability, and thus, the acid is apparently deactivated and the acid diffusion can be controlled.

As the onium salt which serves as a relatively weak acid with respect to the photoacid generating component, compounds represented by Formulae (d1-1) to (d1-3) are preferable.

(d1-1)

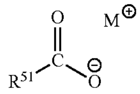

(d1-2)

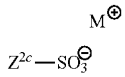

(d1-3)

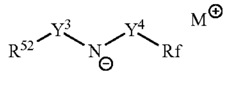

In the formula, $R^{51}$ is an organic group. $R^{51}$ preferably has 1 to 30 carbon atoms.

$Z^{2c}$ is an organic group. The organic group preferably has 1 to 30 carbon atoms. It should be noted that in a case where the organic group represented by $Z^{2c}$ has a carbon atom adjacent to $SO_3^-$ specified in the formula, this carbon atom (α-carbon atom) does not have a fluorine atom and/or a perfluoroalkyl group as a substituent. The α-carbon atom is other than a ring member atom having a cyclic structure, and is preferably a methylene group. In addition, in $Z^{2c}$, in a case where the β-position atom with respect to $SO_3^-$ is a carbon atom (β-carbon atom), the β-carbon atom also does not have a fluorine atom and/or a perfluoroalkyl group as a substituent.

$R^{52}$ is an organic group (an alkyl group and the like), $Y^3$ is $—SO_2—$, a linear, branched, or cyclic alkylene group, or an arylene group, $Y^4$ is —CO— or $—SO_2—$, and Rf is a hydrocarbon group having a fluorine atom (a fluoroalkyl group and the like).

$M^+$'s are each independently an ammonium cation, a sulfonium cation, or an iodonium cation. As $M^+$ in Formulae (d1-1) to (d1-3), the organic cations mentioned in the description of the specific compound (for example, the organic cation represented by $M_{11}^+$ in Formula (Ia-1)) can also be used.

In one aspect, it is also preferable that such the cation has an acid-decomposable group. Examples of the acid-decomposable group include the acid-decomposable group represented by Formula (I) and the acid-decomposable group represented by Formula (2), each mentioned above.

As the acid diffusion control agent, a zwitterion may be used. The acid diffusion control agent which is a zwitterion preferably has a carboxylate anion, and more preferably has a sulfonium cation or an iodonium cation.

In a case where the resist composition includes an acid diffusion control agent, the content of the acid diffusion control agent (a total content of the acid diffusion control agents in a case where a plurality of kinds of the acid diffusion control agents are present) is preferably 0.1% to 11.0% by mass, more preferably 0.1% to 10.0% by mass, and still more preferably 0.1% to 8.0% by mass with respect to the total solid content of the composition.

In the resist composition, the acid diffusion control agents may be used alone or in combination of two or more kinds thereof.

[Hydrophobic Resin (D)]

The resist composition may include a hydrophobic resin different from the resin (A), in addition to the resin (A).

Although it is preferable that the hydrophobic resin is designed to be unevenly distributed on a surface of the resist film, it does not necessarily need to have a hydrophilic group in the molecule as different from the surfactant, and does not need to contribute to uniform mixing of polar materials and non-polar materials.

Examples of the effect caused by the addition of the hydrophobic resin include a control of static and dynamic contact angles of a surface of the resist film with respect to water and suppression of out gas.

The hydrophobic resin preferably has any one or more of a "fluorine atom", a "silicon atom", and a "$CH_3$ partial structure which is contained in a side chain moiety of a resin" from the viewpoint of uneven distribution on the film surface layer, and more preferably has two or more kinds thereof. In addition, the hydrophobic resin preferably has a hydrocarbon group having 5 or more carbon atoms. These groups may be contained in the main chain of the resin or may be substituted in a side chain.

Examples of the hydrophobic resin include the compounds described in paragraphs [0275] to [0279] of WO2020/004306A.

In a case where the resist composition includes a hydrophobic resin, a content of the hydrophobic resin is preferably 0.01% to 20% by mass, and more preferably 0.1% to 15% by mass with respect to the total solid content of the resist composition.

[Surfactant (E)]

The resist composition may include a surfactant. In a case where the surfactant is included, it is possible to form a pattern having more excellent adhesiveness and fewer development defects.

The surfactant is preferably a fluorine-based and/or silicon-based surfactant.

Examples of the fluorine-based and/or silicon-based surfactant include the surfactants disclosed in paragraphs [0218] and [0219] of WO2018/19395A.

The surfactants may be used alone or in combination of two or more kinds thereof.

In a case where the resist composition includes a surfactant, a content of the surfactant is preferably 0.0001% to 2% by mass, and more preferably 0.0005% to 1% by mass with respect to the total solid content of the composition.

[Other Additives]

The resist composition may further include a dissolution inhibiting compound, a dye, a plasticizer, a photosensitizer, a light absorber, and/or a compound accelerating a solubility in a developer (for example, a phenol compound having a molecular weight of 1,000 or less or an alicyclic or aliphatic compound including a carboxylic acid group), or the like.

The resist composition may further include a dissolution inhibiting compound. Here, the "dissolution inhibiting compound" is intended to be a compound having a molecular weight of 3,000 or less, having a solubility in an organic developer decreases by decomposition by the action of an acid.

The resist composition of the embodiment of the present invention is suitably used as a photosensitive composition for EUV light.

EUV light has a wavelength of 13.5 nm, which is a shorter wavelength than that of ArF (wavelength of 193 nm) light or the like, and therefore, the EUV light has a smaller number of incidence photons upon exposure with the same sensitivity. Thus, an effect of "photon shot noise" that the number of photons is statistically non-uniform is significant, and a deterioration in LER and a bridge defect are caused. In order to reduce the photon shot noise, a method in which an exposure amount increases to cause an increase in the number of incidence photons is available, but the method is a trade-off with a demand for a higher sensitivity.

In a case where the A value obtained by Formula (I) is high, the absorption efficiency of EUV light and electron beam of the resist film formed from the resist composition is higher, which is effective in reducing the photon shot noise. The A value represents the absorption efficiency of EUV light and electron beams of the resist film in terms of a mass proportion.

$$A=([H]\times0.04+[C]\times1.0+[N]\times2.1+[O]\times3.6+[F]\times5.6+[S]\times1.5+[I]\times39.5)/([H]\times1+[C]\times12+[N]\times14+[O]\times16+[F]\times19+[S]\times32+[I]\times127) \quad \text{Formula (I):}$$

The A value is preferably 0.120 or more. An upper limit thereof is not particularly limited, but in a case where the A value is extremely high, the transmittance of EUV light and electron beams of the resist film is lowered and the optical image profile in the resist film is deteriorated, which results in difficulty in obtaining a good pattern shape, and therefore, the upper limit is preferably 0.240 or less, and more preferably 0.220 or less.

Moreover, in Formula (I), [H] represents a molar ratio of hydrogen atoms derived from the total solid content with respect to all the atoms of the total solid content in the actinic ray-sensitive or radiation-sensitive resin composition, [C] represents a molar ratio of carbon atoms derived from the total solid content with respect to all the atoms of the total solid content in the actinic ray-sensitive or radiation-sensitive resin composition, [N] represents a molar ratio of nitrogen atoms derived from the total solid content with respect to all the atoms of the total solid content in the actinic ray-sensitive or radiation-sensitive resin composition, [O] represents a molar ratio of oxygen atoms derived from the total solid content with respect to all the atoms of the total solid content in the actinic ray-sensitive or radiation-sensitive resin composition, [F] represents a molar ratio of fluorine atoms derived from the total solid content with respect to all the atoms of the total solid content in the actinic ray-sensitive or radiation-sensitive resin composition, [S] represents a molar ratio of sulfur atoms derived from the total solid content with respect to all the atoms of the total solid content in the actinic ray-sensitive or radiation-sensitive resin composition, and [I] represents a molar ratio of iodine atoms derived from the total solid content with respect to all the atoms of the total solid content in the actinic ray-sensitive or radiation-sensitive resin composition.

For example, in a case where the resist composition includes a resin (acid-decomposable resin) of which polarity increases by the action of an acid, a photoacid generator, an acid diffusion control agent, and a solvent, the resin, the photoacid generator, and the acid diffusion control agent correspond to the solid content. That is, all the atoms of the total solid content correspond to a sum of all the atoms derived from the resin, all the atoms derived from the photoacid generator, and all the atoms derived from the acid diffusion control agent. For example, [H] represents a molar ratio of hydrogen atoms derived from the total solid content with respect to all the atoms in the total solid content, and by way of description based on the example above, [H] represents a molar ratio of a sum of the hydrogen atoms derived from the resin, the hydrogen atoms derived from the photoacid generator, and the hydrogen atoms derived from the acid diffusion control agent with respect to a sum of all the atoms derived from the resin, all the atoms derived from the photoacid generator, and all the atoms derived from the acid diffusion control agent.

The A value can be calculated by computation of the structure of constituent components of the total solid content in the resist composition, and the atomic number ratio contained in a case where the content is already known. In addition, even in a case where the constituent component is not known yet, it is possible to calculate an atomic number ratio by subjecting a resist film obtained after evaporating the solvent components of the resist composition to computation according to an analytic approach such as elemental analysis.

[Resist Film and Pattern Forming Method]

The procedure of the pattern forming method using the resist composition is not particularly limited, but preferably has the following steps.

Step 1: A step of forming a resist film on a substrate using a resist composition Step 2: A step of exposing the resist film Step 3: A step of developing the exposed resist film, using a developer Hereinafter, the procedure of each of the steps will be described in detail.

<Step 1: Resist Film Forming Step>

The step 1 is a step of forming a resist film on a substrate using a resist composition.

The definition of the resist composition is as described above.

Examples of a method in which a resist film is formed on a substrate, using a resist composition include a method in which a resist composition is applied onto a substrate.

Incidentally, it is preferable that the resist composition before the application is filtered through a filter, as necessary. A pore size of the filter is preferably 0.1 μm or less, more preferably 0.05 μm or less, and still more preferably 0.03 μm or less. In addition, the filter is preferably a polytetrafluoroethylene-, polyethylene-, or nylon-made filter.

The resist composition can be applied onto a substrate (for example, silicon and silicon dioxide coating) as used in the manufacture of integrated circuit elements by a suitable application method such as ones using a spinner or a coater. The application method is preferably spin application using a spinner. A rotation speed upon the spin application using a spinner is preferably 1,000 to 3,000 rpm.

After the application of the resist composition, the substrate may be dried to form a resist film. In addition, various underlying films (an inorganic film, an organic film, or an antireflection film) may be formed on the underlayer of the resist film, as desired.

Examples of the drying method include a method of heating and drying. The heating can be carried out using a unit included in an ordinary exposure machine and/or an ordinary development machine, and may also be carried out using a hot plate or the like. A heating temperature is preferably 80° C. to 150° C., more preferably 80° C. to 140° C., and still more preferably 80° C. to 130° C. A heating time is preferably 30 to 1,000 seconds, more preferably 60 to 800 seconds, and still more preferably 60 to 600 seconds.

A film thickness of the resist film is not particularly limited, but is preferably 10 to 120 nm from the viewpoint that a fine pattern having higher accuracy can be formed. Among those, in a case of performing EUV exposure, the film thickness of the resist film is more preferably 10 to 65 nm, and still more preferably 15 to 50 nm. In addition, in a case of performing ArF liquid immersion exposure, the film thickness of the resist film is more preferably 10 to 120 nm, and still more preferably 15 to 90 nm.

Moreover, a topcoat may be formed on the upper layer of the resist film, using the topcoat composition.

It is preferable that the topcoat composition is not mixed with the resist film and can be uniformly applied onto the upper layer of the resist film. The topcoat is not particularly limited, a topcoat known in the related art can be formed by the methods known in the related art, and the topcoat can be formed, based on the description in paragraphs [0072] to [0082] of JP2014-059543A, for example.

It is preferable that a topcoat including a basic compound as described in JP2013-61648A, for example, is formed on a resist film. Specific examples of the basic compound which can be included in the topcoat include a basic compound which may be included in the resist composition.

In addition, it is also preferable that the topcoat includes a compound which includes at least one group or bond selected from the group consisting of an ether bond, a thioether bond, a hydroxyl group, a thiol group, a carbonyl bond, and an ester bond.

<Step 2: Exposing Step>

The step 2 is a step of exposing the resist film.

Examples of the exposing method include a method of irradiating the resist film formed with actinic rays or radiation through a predetermined mask.

Examples of the actinic rays or radiation include infrared light, visible light, ultraviolet light, far ultraviolet light, extreme ultraviolet light, X-rays, and electron beams, preferably a far ultraviolet light having a wavelength of 250 nm or less, more preferably a far ultraviolet light having a wavelength of 220 nm or less, and particularly preferably a far ultraviolet light having a wavelength of 1 to 200 nm, specifically, KrF excimer laser (248 nm), ArF excimer laser (193 nm), $F_2$ excimer laser (157 nm), EUV (13 nm), X-rays, and electron beams.

It is preferable to perform baking (heating) before performing development after the exposure. The baking accelerates a reaction in the exposed portion, and the sensitivity and the pattern shape are improved.

A heating temperature is preferably 80° C. to 150° C., more preferably 80° C. to 140° C., and still more preferably 80° C. to 130° C.

A heating time is preferably 10 to 1,000 seconds, more preferably 10 to 180 seconds, and still more preferably 30 to 120 seconds.

The heating can be carried out using a unit included in an ordinary exposure machine and/or an ordinary development machine, and may also be performed using a hot plate or the like.

This step is also referred to as a post-exposure baking.

<Step 3: Developing Step>

The step 3 is a step of developing the exposed resist film using a developer to form a pattern.

The developer may be either an alkali developer or a developer containing an organic solvent (hereinafter also referred to as an organic developer).

Examples of the developing method include a method in which a substrate is immersed in a tank filled with a developer for a certain period of time (a dip method), a method in which development is performed by heaping a developer up onto the surface of a substrate by surface tension, and then leaving it to stand for a certain period of time (a puddle method), a method in which a developer is sprayed on the surface of a substrate (a spray method), and a method in which a developer is continuously jetted onto a substrate rotating at a constant rate while scanning a developer jetting nozzle at a constant rate (a dynamic dispense method).

In addition, after the step of performing development, a step of stopping the development may be carried out while substituting the solvent with another solvent.

A developing time is not particularly limited as long as it is a period of time where the unexposed portion of a resin is sufficiently dissolved, and is preferably 10 to 300 seconds, and more preferably 20 to 120 seconds.

The temperature of the developer is preferably 0° C. to 50° C., and more preferably 15° C. to 35° C.

As the alkali developer, it is preferable to use an aqueous alkali solution including an alkali. The type of the aqueous alkali solution is not particularly limited, but examples thereof include an aqueous alkali solution including a quaternary ammonium salt typified by tetramethylammonium hydroxide, an inorganic alkali, a primary amine, a secondary amine, a tertiary amine, an alcoholamine, a cyclic amine, or the like. Among those, the aqueous solutions of the quaternary ammonium salts typified by tetramethylammonium hydroxide (TMAH) are preferable as the alkali developer. An appropriate amount of an alcohol, a surfactant, or the like may be added to the alkali developer. The alkali concentration of the alkali developer is usually 0.1% to 20% by mass. Furthermore, the pH of the alkali developer is usually 10.0 to 15.0.

The organic developer is preferably a developer containing at least one organic solvent selected from the group consisting of a ketone-based solvent, an ester-based solvent, an alcohol-based solvent, an amide-based solvent, an ether-based solvent, and a hydrocarbon-based solvent.

A plurality of the solvents may be mixed or the solvent may be used in admixture with a solvent other than those described above or water. The moisture content in the entire developer is preferably less than 50% by mass, more preferably less than 20% by mass, and still more preferably less than 10% by mass, and particularly preferably moisture is not substantially contained.

The content of the organic solvent with respect to the organic developer is preferably from 50% by mass to 100% by mass, more preferably from 80% by mass to 100% by mass, still more preferably from 90% by mass to 100% by mass, and particularly preferably from 95% by mass to 100% by mass with respect to the total amount of the developer.

<Other Steps>

It is preferable that the pattern forming method includes a step of performing washing using a rinsing liquid after the step 3.

Examples of the rinsing liquid used in the rinsing step after the step of performing development using an alkali developer include pure water. Furthermore, an appropriate amount of a surfactant may be added to pure water.

An appropriate amount of a surfactant may be added to the rinsing liquid.

The rinsing liquid used in the rinsing step after the developing step with an organic developer is not particularly limited as long as the rinsing liquid does not dissolve the pattern, and a solution including a common organic solvent can be used. As the rinsing liquid, a rinsing liquid containing at least one organic solvent selected from the group consisting of a hydrocarbon-based solvent, a ketone-based solvent, an ester-based solvent, an alcohol-based solvent, an amide-based solvent, and an ether-based solvent is preferably used.

A method for the rinsing step is not particularly limited, and examples thereof include a method in which a rinsing liquid is continuously jetted on a substrate rotated at a constant rate (a rotation application method), a method in which a substrate is dipped in a tank filled with a rinsing liquid for a certain period of time (a dip method), and a method in which a rinsing liquid is sprayed on a substrate surface (a spray method).

Furthermore, the pattern forming method of the embodiment of the present invention may include a heating step (post bake) after the rinsing step. By the present step, the developer and the rinsing liquid remaining between and inside the patterns are removed by baking. In addition, the present step also has an effect that a resist pattern is annealed and the surface roughness of the pattern is improved. The heating step after the rinsing step is usually performed at 40° C. to 250° C. (preferably 90° C. to 200° C.) for usually 10 seconds to 3 minutes (preferably 30 seconds to 120 seconds).

In addition, an etching treatment on the substrate may be carried out using a pattern thus formed as a mask. That is, the substrate (or the underlayer film and the substrate) may be processed using the pattern thus formed in the step 3 as a mask to form a pattern on the substrate.

A method for processing the substrate (or the underlayer film and the substrate) is not particularly limited, but a method in which a pattern is formed on a substrate by subjecting the substrate (or the underlayer film and the substrate) to dry etching using the pattern thus formed in the step 3 as a mask is preferable. Oxygen plasma etching is preferable as the dry etching.

It is preferable that various materials (for example, a solvent, a developer, a rinsing liquid, a composition for forming an antireflection film, and a composition for forming a topcoat) used in the resist composition and the pattern forming method of the embodiment of the present invention do not include impurities such as metals. The content of the impurities included in these materials is preferably 1 ppm by mass or less, more preferably 10 ppb by mass or less, still more preferably 100 ppt by mass or less, particularly preferably 10 ppt by mass or less, and most preferably 1 ppt by mass or less. Here, examples of the metal impurities include Na, K, Ca, Fe, Cu, Mg, Al, Li, Cr, Ni, Sn, Ag, As, Au, Ba, Cd, Co, Pb, Ti, V, W, and Zn.

Examples of a method for removing impurities such as metals from the various materials include filtration using a filter. Details of filtration using a filter are described in paragraph [0321] of WO2020/004306.

In addition, examples of a method for reducing impurities such as metals included in various materials include a method of selecting raw materials having a low content of metals as raw materials constituting various materials, a method of subjecting raw materials constituting various materials to filter filtration, and a method of performing distillation under the condition for suppressing the contamination as much as possible by, for example, lining the inside of a device with TEFLON (registered trademark).

In addition to the filter filtration, removal of impurities by an adsorbing material may be performed, or a combination of filter filtration and an adsorbing material may be used. As the adsorbing material, known adsorbing materials may be used, and for example, inorganic adsorbing materials such as silica gel and zeolite, and organic adsorbing materials such as activated carbon can be used. It is necessary to prevent the incorporation of impurities such as metals in the production process in order to reduce the metal impurities included in the various materials. Sufficient removal of metal impurities from a production device can be confirmed by measuring a content of metal components included in a cleaning liquid used to wash the production device. The content of the metal components included in the cleaning liquid after the use is preferably 100 parts per trillion (ppt) by mass or less, more preferably 10 ppt by mass or less, and still more preferably 1 ppt by mass or less.

A conductive compound may be added to an organic treatment liquid such as a rinsing liquid in order to prevent breakdown of chemical liquid pipes and various parts (a filter, an O-ring, a tube, or the like) due to electrostatic charging, and subsequently generated electrostatic discharging. The conductive compound is not particularly limited, but examples thereof include methanol. The addition amount is not particularly limited, but from the viewpoint that preferred development characteristics or rinsing characteristics are maintained, the addition amount is preferably 10% by mass or less, and more preferably 5% by mass or less.

For members of the chemical liquid pipe, for example, various pipes coated with stainless steel (SUS), or a polyethylene, polypropylene, or fluorine resin (a polytetrafluoroethylene or perfluoroalkoxy resin, or the like) that has been subjected to an antistatic treatment can be used. In the same manner, for the filter or the O-ring, polyethylene, polypropylene, or a fluorine resin (a polytetrafluoroethylene or perfluoroalkoxy resin, or the like) that has been subjected to an antistatic treatment can be used.

[Method for Manufacturing Electronic Device]

Moreover, the present invention further relates to a method for manufacturing an electronic device, including the pattern forming method, and an electronic device manufactured by the manufacturing method.

The electronic device of an embodiment of the present invention is suitably mounted on electric and electronic equipment (for example, home appliances, office automation (OA)-related equipment, media-related equipment, optical equipment, telecommunication equipment, and the like).

[Compound]

In addition, the present invention also relates to a compound. The compound of an embodiment of the present invention corresponds to the above-mentioned compound (I). The compound of the embodiment of the present invention can be suitably used for a resist composition.

EXAMPLES

Hereinafter, the present invention will be described in more detail with reference to Examples. The materials, the amounts of materials used, the proportions, the treatment details, the treatment procedure, and the like shown in Examples below may be appropriately modified as long as the modifications do not depart from the spirit of the present invention. Therefore, the scope of the present invention should not be construed as being limited to Examples shown below.

[Various Components of Actinic Ray-Sensitive or Radiation-Sensitive Resin Composition]

[Acid-Decomposable Resin (Resin (A)]

The resins A (resins A-1 to A-61) shown in Table 3 and Table 6 are shown below.

As the resins A-1 to A-61, those synthesized in accordance with known methods were used. The compositional ratio (molar ratio; corresponding in order from the left) of the respective repeating units shown below, the weight-average molecular weight (Mw), and the dispersity (Mw/Mn) are shown in Table 1.

Furthermore, the weight-average molecular weight (Mw) and the dispersity (Mw/Mn) of the resins A-1 to A-61 were measured by GPC (carrier: tetrahydrofuran (THF)) (an amount expressed in terms of polystyrene). In addition, the compositional ratio (molar ratio) of the resin was measured by $^{13}$C-nuclear magnetic resonance (NMR).

TABLE 1

| Table 1-1 | Molar ratio of repeating unit | | | | Mw | Mw/Mn |
|---|---|---|---|---|---|---|
| Resin A-1 | 25 | 30 | 45 | — | 6,000 | 1.71 |
| Resin A-2 | 45 | 15 | 40 | — | 10,200 | 1.64 |
| Resin A-3 | 40 | 20 | 40 | — | 7,500 | 1.54 |
| Resin A-4 | 60 | 40 | — | — | 6,800 | 1.52 |
| Resin A-5 | 20 | 30 | 50 | — | 6,500 | 1.63 |
| Resin A-6 | 15 | 40 | 45 | — | 5,900 | 1.59 |
| Resin A-7 | 40 | 20 | 40 | — | 5,100 | 1.51 |
| Resin A-8 | 40 | 60 | — | — | 6,200 | 1.39 |
| Resin A-9 | 25 | 30 | 45 | — | 7,500 | 1.54 |
| Resin A-10 | 30 | 20 | 50 | — | 7,000 | 1.61 |
| Resin A-11 | 20 | 40 | 35 | 5 | 6,500 | 1.63 |
| Resin A-12 | 40 | 20 | 40 | — | 7,000 | 1.73 |
| Resin A-13 | 25 | 25 | 50 | — | 8,200 | 1.58 |
| Resin A-14 | 40 | 10 | 50 | — | 9,000 | 1.68 |
| Resin A-15 | 35 | 10 | 55 | — | 8,400 | 1.58 |

TABLE 1-continued

| Table 1-1 | Molar ratio of repeating unit | | | | Mw | Mw/Mn |
|---|---|---|---|---|---|---|
| Resin A-16 | 50 | 50 | — | — | 7,600 | 1.49 |
| Resin A-17 | 40 | 60 | — | — | 9,500 | 1.68 |
| Resin A-18 | 50 | 50 | — | — | 8,500 | 1.63 |
| Resin A-19 | 15 | 45 | 40 | — | 6,400 | 1.51 |
| Resin A-20 | 40 | 10 | 50 | — | 12,000 | 1.49 |
| Resin A-21 | 50 | 30 | 20 | — | 8,000 | 1.65 |
| Resin A-22 | 25 | 30 | 30 | 15 | 8,500 | 1.61 |
| Resin A-23 | 30 | 50 | 10 | 10 | 5,000 | 1.61 |
| Resin A-24 | 25 | 30 | 30 | 15 | 8,600 | 1.63 |
| Resin A-25 | 40 | 10 | 10 | 40 | 6,500 | 1.63 |
| Resin A-26 | 40 | 30 | 30 | — | 5,900 | 1.59 |
| Resin A-27 | 10 | 30 | 60 | — | 5,200 | 1.53 |
| Resin A-28 | 30 | 20 | 50 | — | 7,600 | 1.56 |
| Resin A-29 | 40 | 10 | 40 | 10 | 7,000 | 1.61 |

TABLE 2

| Table 1-2 | Molar ratio of repeating unit | | | | Mw | Mw/Mn |
|---|---|---|---|---|---|---|
| Resin A-30 | 20 | 30 | 50 | — | 6,500 | 1.73 |
| Resin A-31 | 45 | 15 | 40 | — | 7,300 | 1.62 |
| Resin A-32 | 40 | 10 | 50 | — | 7,000 | 1.64 |
| Resin A-33 | 70 | 30 | — | — | 11,000 | 1.71 |
| Resin A-34 | 30 | 10 | 60 | — | 8,500 | 1.68 |
| Resin A-35 | 25 | 25 | 50 | — | 6,000 | 1.69 |
| Resin A-36 | 30 | 10 | 50 | 10 | 7,100 | 1.59 |
| Resin A-37 | 30 | 30 | 40 | — | 11,000 | 1.71 |
| Resin A-38 | 30 | 20 | 50 | — | 6,000 | 1.68 |
| Resin A-39 | 50 | 5 | 45 | — | 7,000 | 1.53 |
| Resin A-40 | 20 | 40 | 40 | — | 10,000 | 1.57 |
| Resin A-41 | 30 | 15 | 55 | — | 5,500 | 1.55 |
| Resin A-42 | 40 | 30 | 30 | — | 7,500 | 1.63 |
| Resin A-43 | 25 | 35 | 40 | — | 9,200 | 1.71 |
| Resin A-44 | 40 | 10 | 50 | — | 7,000 | 1.65 |
| Resin A-45 | 50 | 50 | — | — | 13,000 | 1.69 |
| Resin A-46 | 65 | 35 | — | — | 8,500 | 1.66 |
| Resin A-47 | 25 | 15 | 60 | — | 6,200 | 1.6 |
| Resin A-48 | 40 | 15 | 45 | — | 6,200 | 1.78 |
| Resin A-49 | 25 | 20 | 55 | — | 7,000 | 1.71 |
| Resin A-50 | 30 | 35 | 35 | — | 6,500 | 1.67 |
| Resin A-51 | 25 | 15 | 60 | — | 6,600 | 1.65 |
| Resin A-52 | 25 | 20 | 55 | — | 7,300 | 1.70 |
| Resin A-53 | 25 | 15 | 60 | — | 6,500 | 1.68 |
| Resin A-54 | 30 | 30 | 40 | — | 8,500 | 1.66 |
| Resin A-55 | 15 | 40 | 45 | — | 7,800 | 1.67 |
| Resin A-56 | 15 | 30 | 55 | — | 7,300 | 1.63 |
| Resin A-57 | 40 | 50 | 10 | — | 15,000 | 1.75 |
| Resin A-58 | 40 | 60 | — | — | 8,500 | 1.63 |
| Resin A-59 | 30 | 20 | 50 | — | 7,500 | 1.55 |
| Resin A-60 | 40 | 50 | 10 | — | 8,000 | 1.58 |
| Resin A-61 | 40 | 50 | 10 | — | 8,600 | 1.63 |

The structural formulae of the resins A-1 to A-61 shown in Table 1 are shown below. In the following structural formulae, in a case where a plurality of resin numbers are assigned to the same structure (for example, A-47 to A-49), it is meant that the respective resins have the same structural formula and have different compositional ratios and/or weight-average molecular weights.

A-1
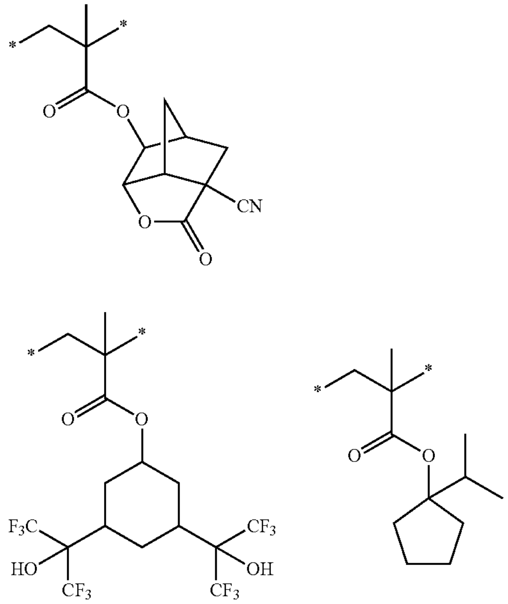
A-2
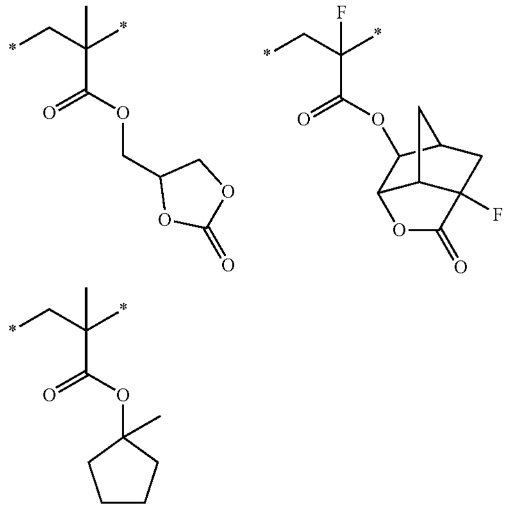
A-3
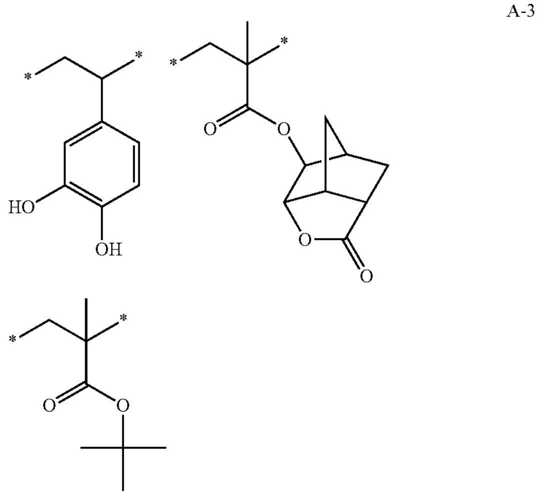
-continued
A-4
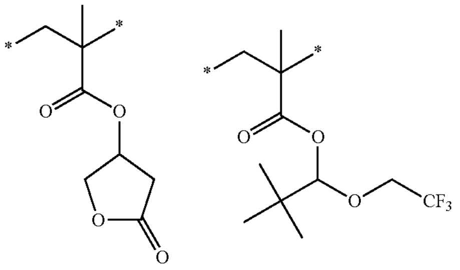
A-5
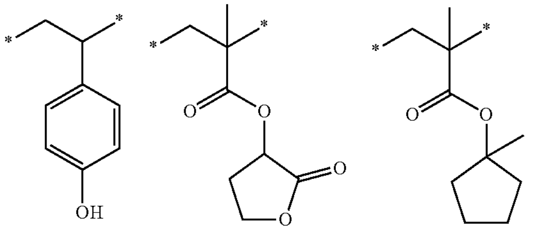
A-6
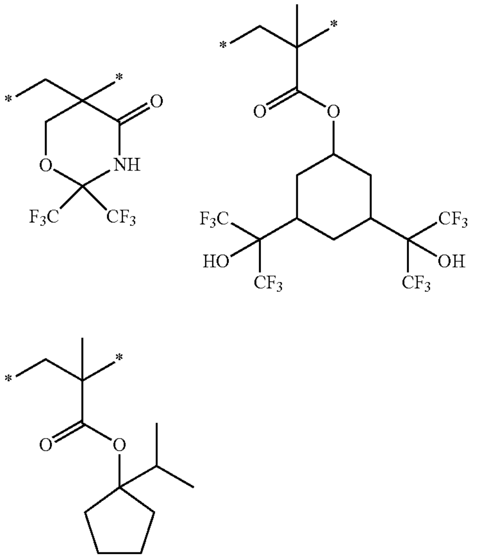
A-7
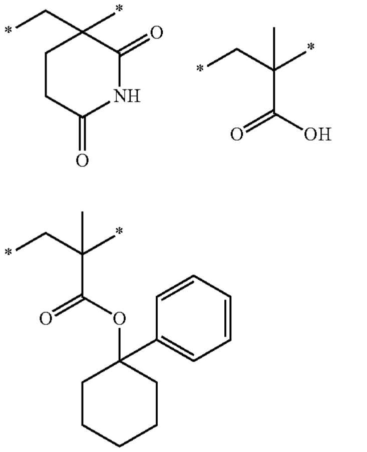

-continued
A-8
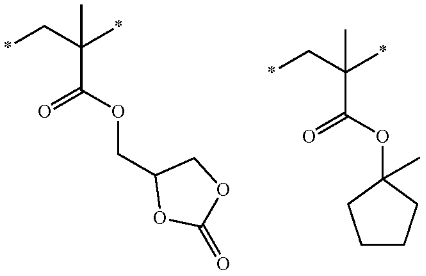
A-9
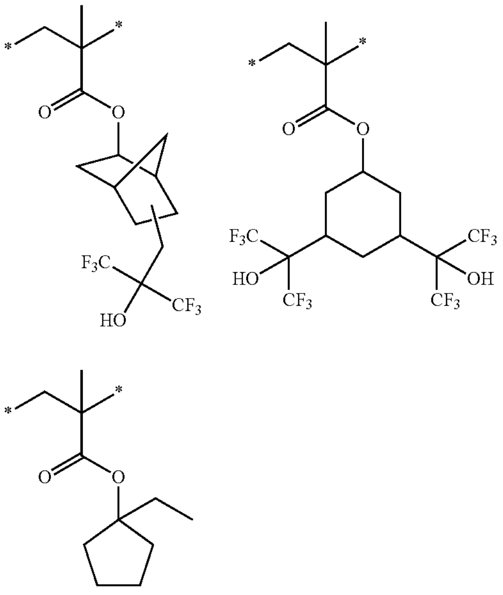
A-10
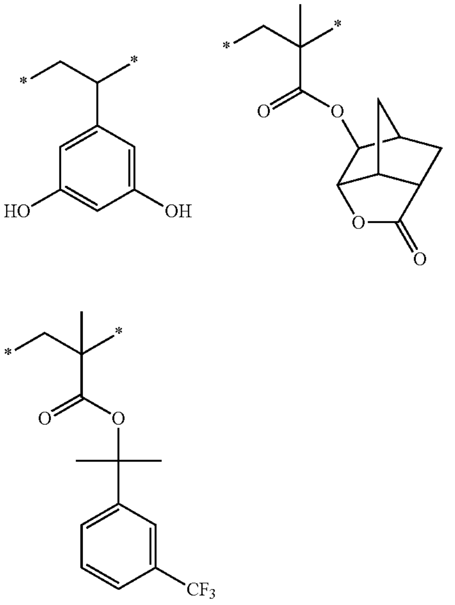
-continued
A-11
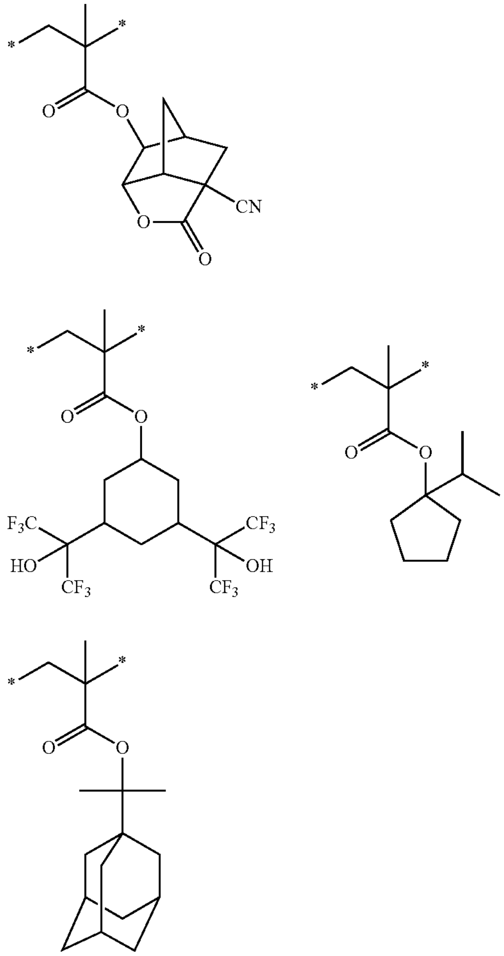
A-12
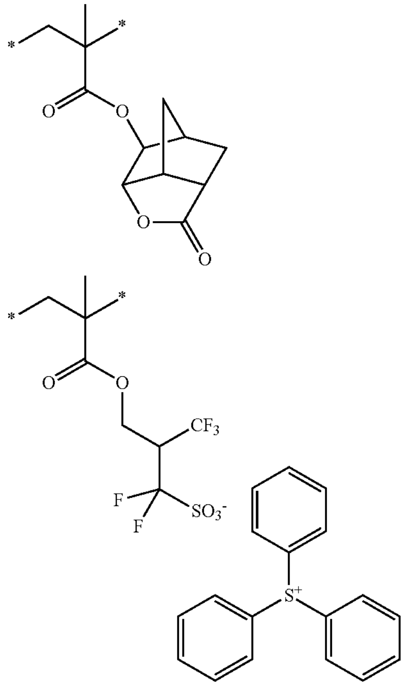

-continued
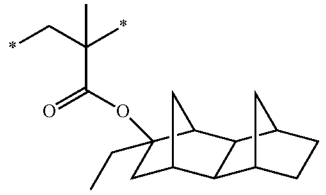
A-13
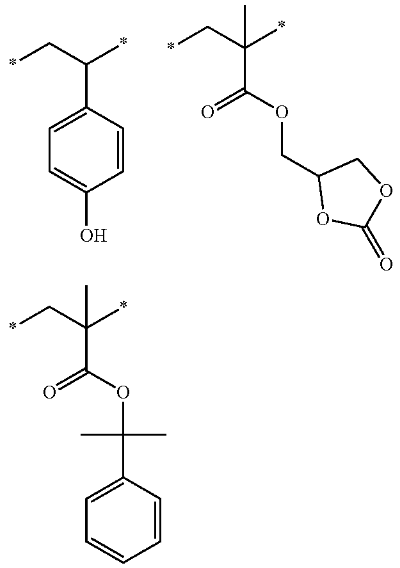
A-14
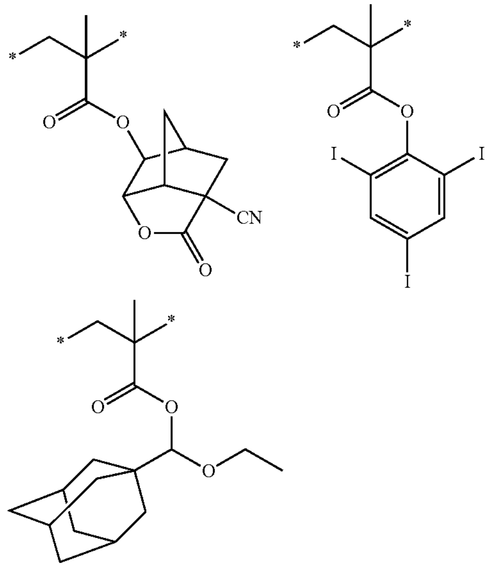
A-15
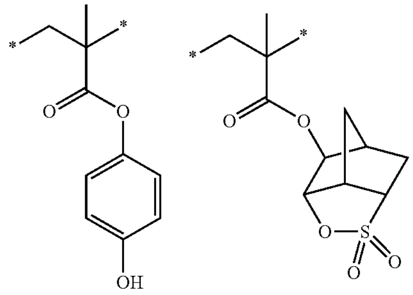
-continued
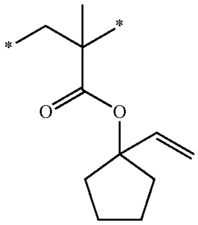
A-16
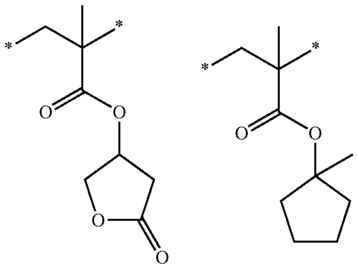
A-17
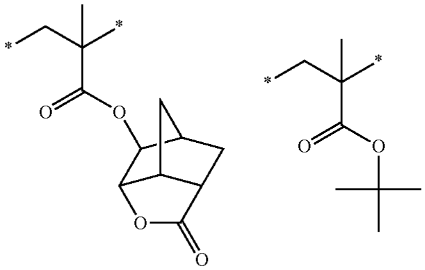
A-18
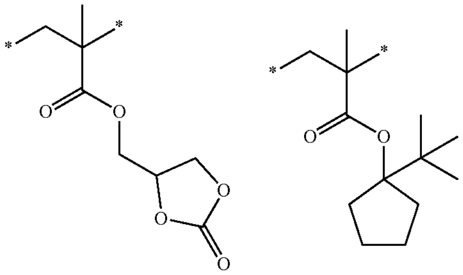
A-19
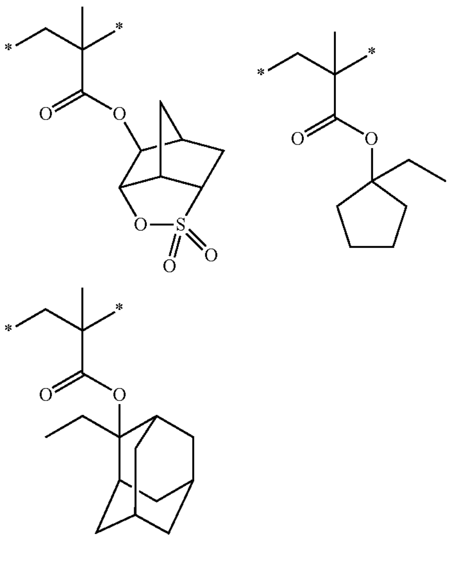

-continued
A-20
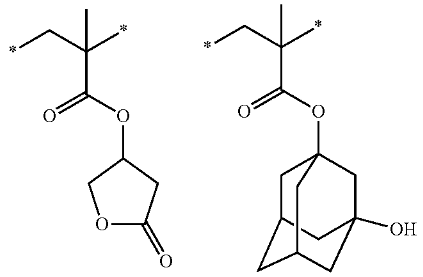
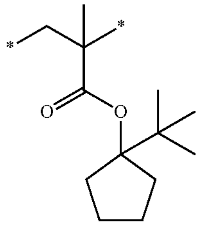
A-21
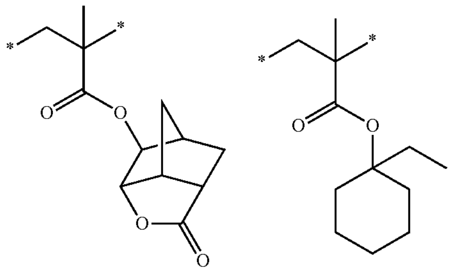
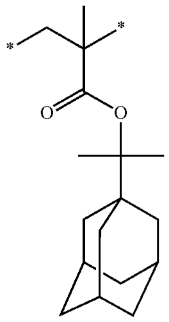
A-22
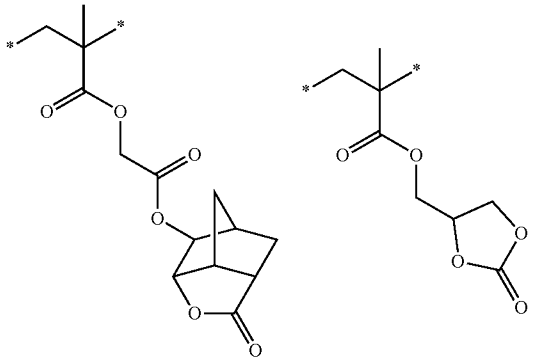
-continued
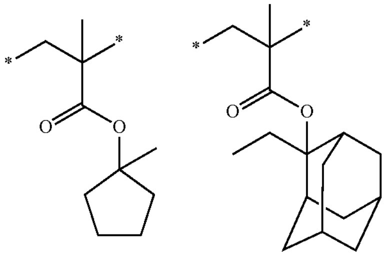
A-23
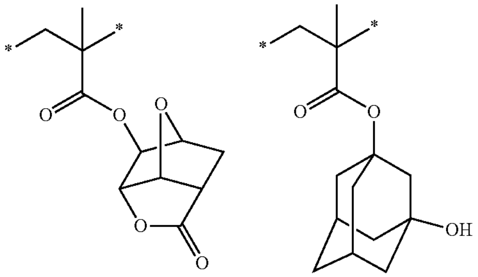
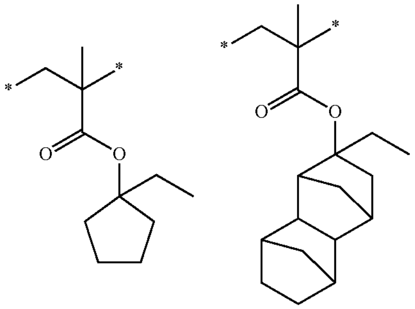
A-24
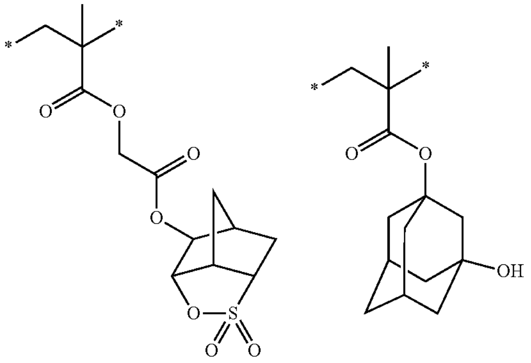
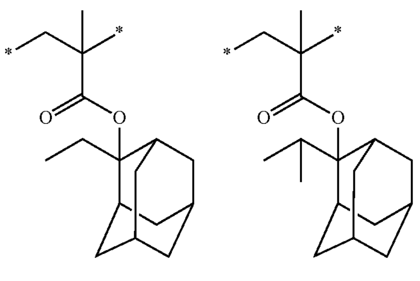

-continued
A-25
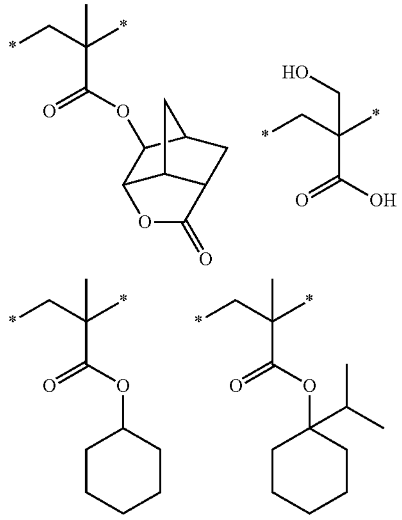
A-26
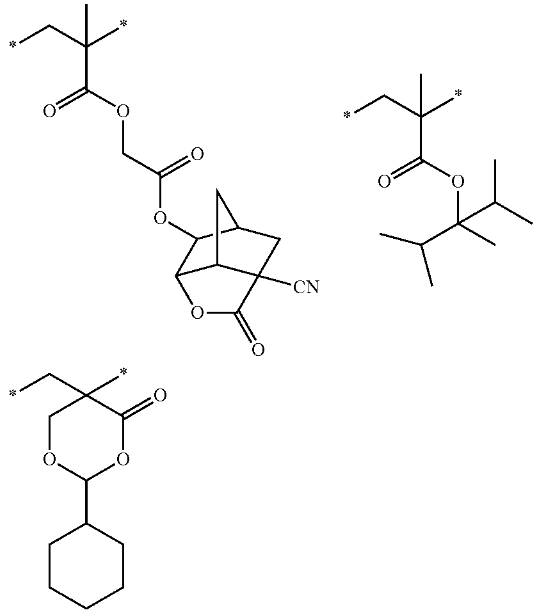
A-27
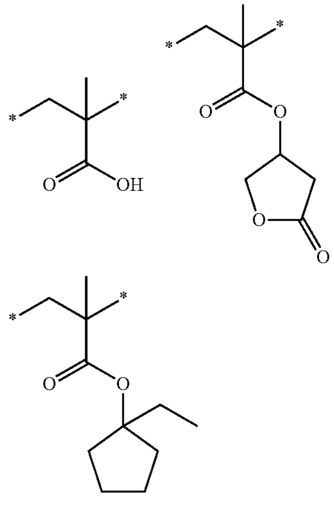
-continued
A-28
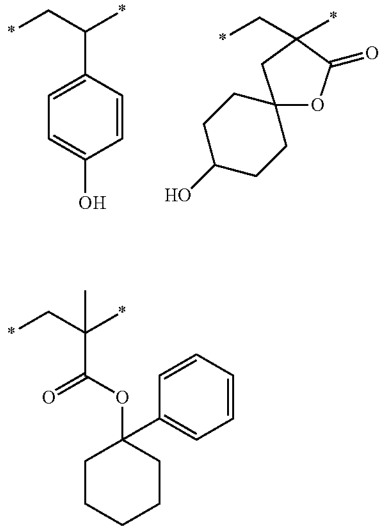
A-29
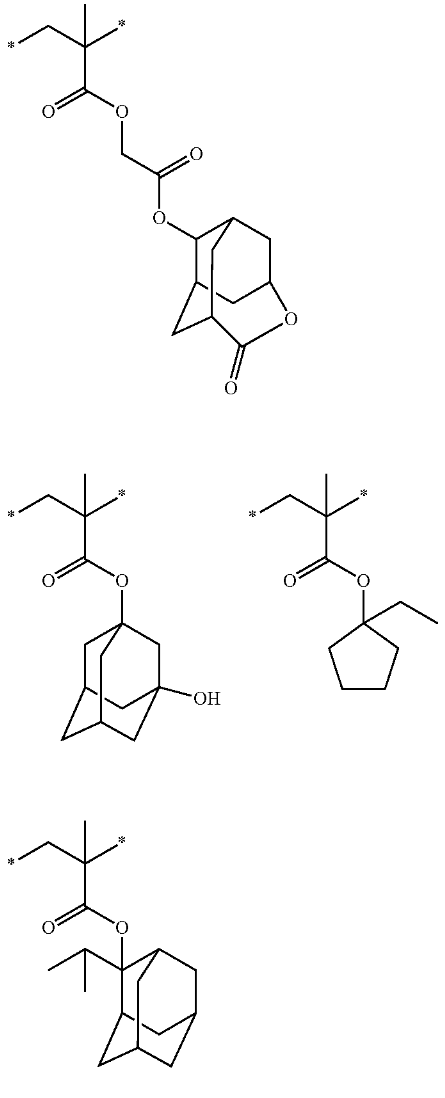

-continued
A-30
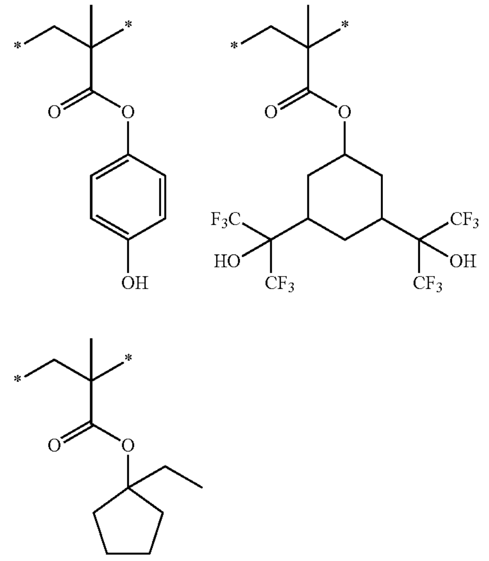
A-31
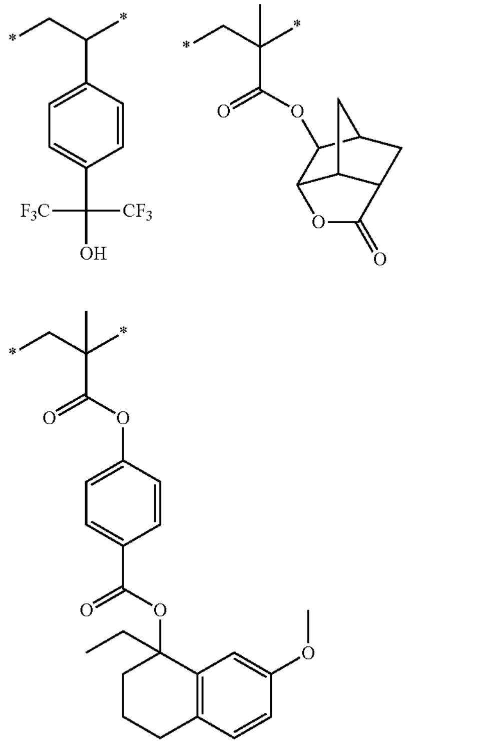
A-32
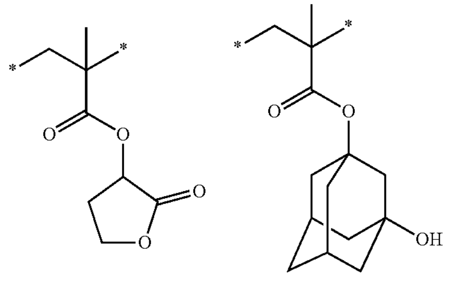
-continued
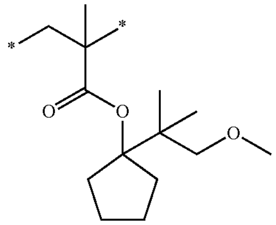
A-33
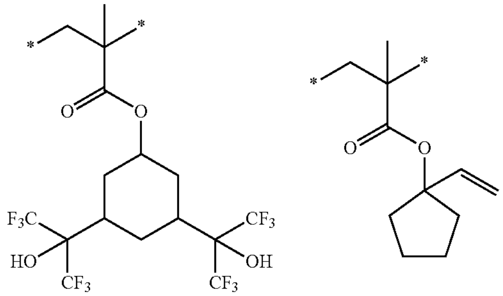
A-34
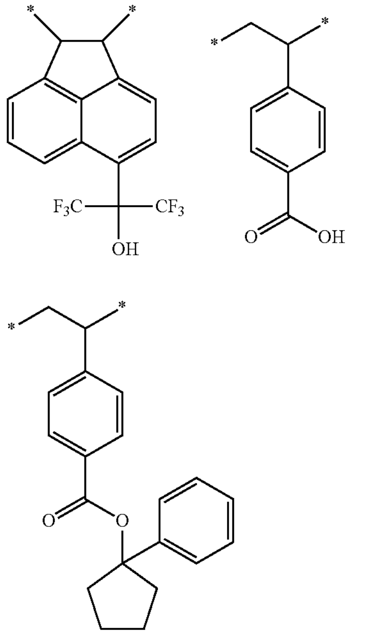
A-35
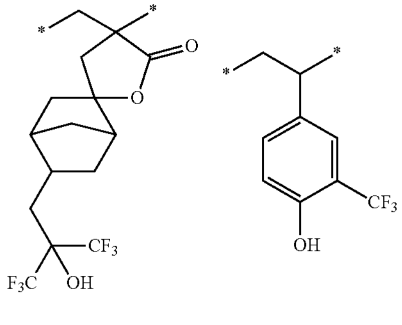

-continued
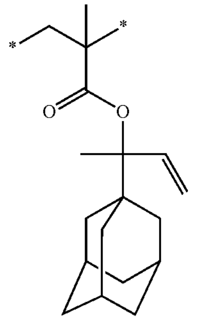
A-36
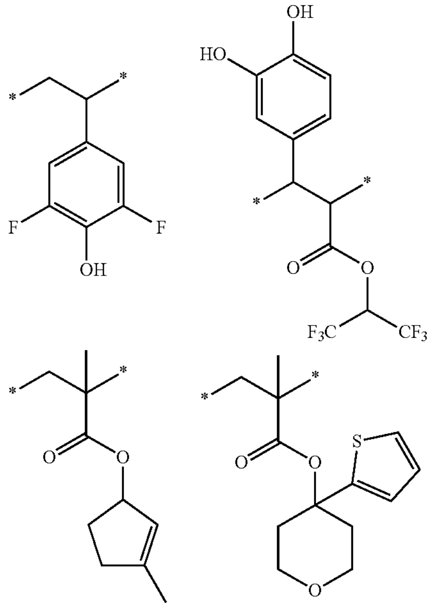
A-37
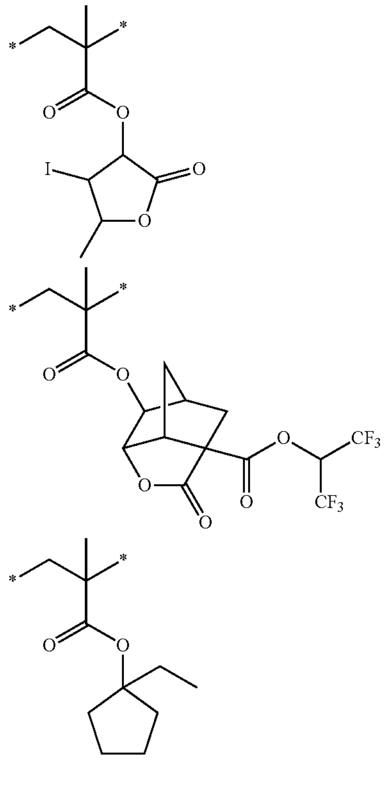
-continued
A-38
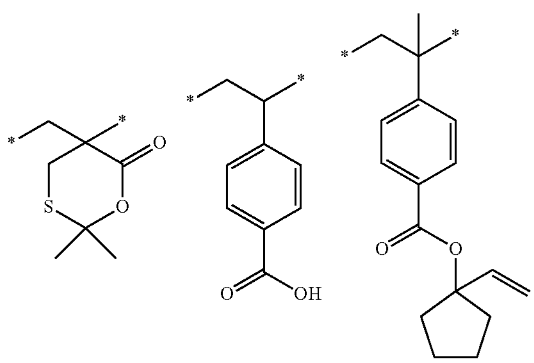
A-39
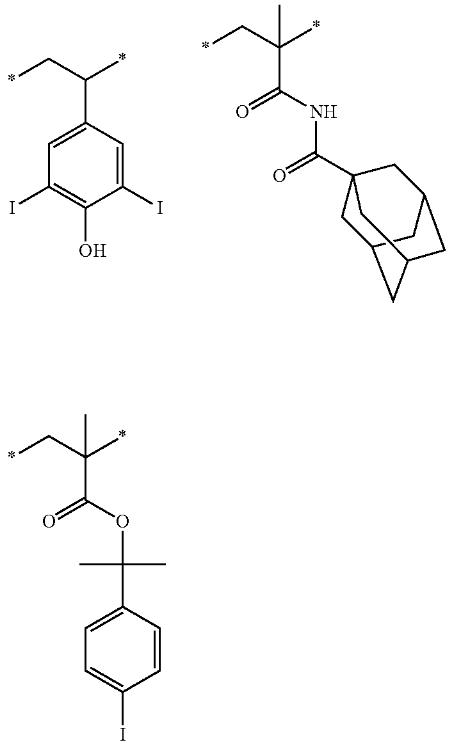
A-40
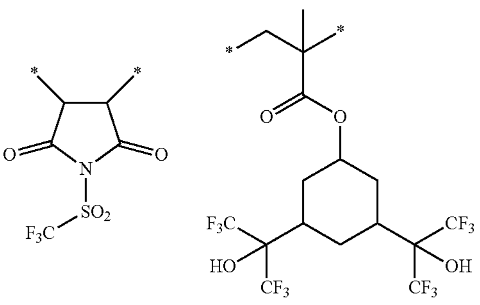

-continued
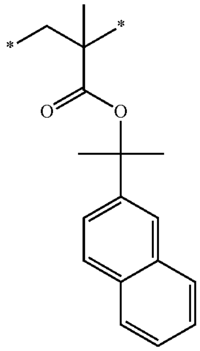
A-41
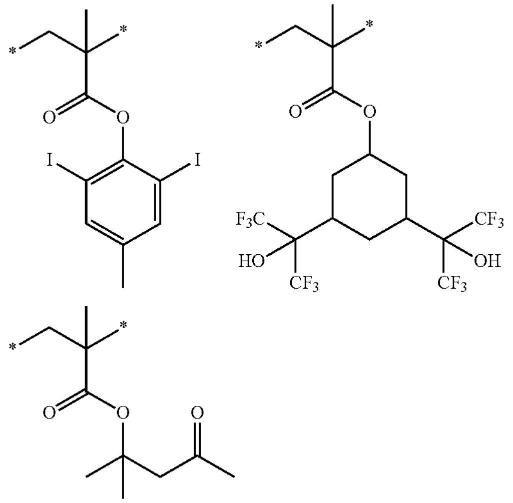
A-42
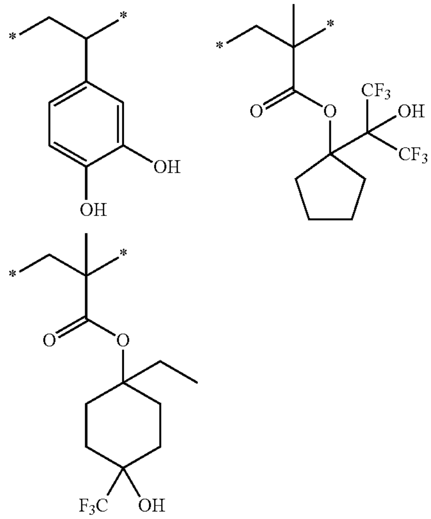
A-43
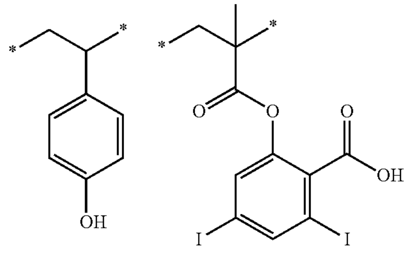
-continued
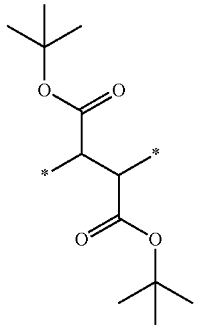
A-44
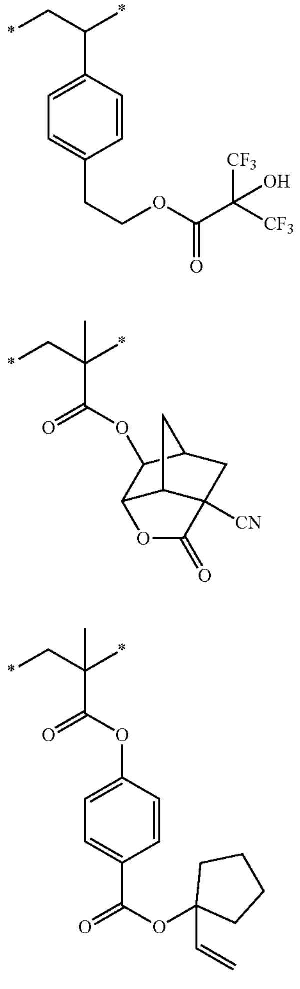
A-45
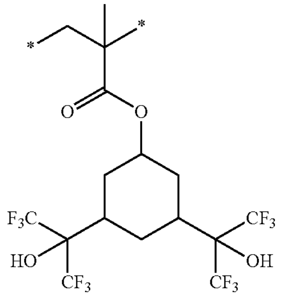

-continued
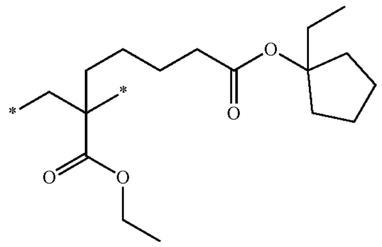
A-46
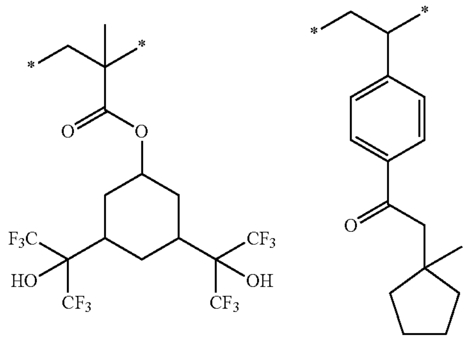
A-47, A-48, A-49
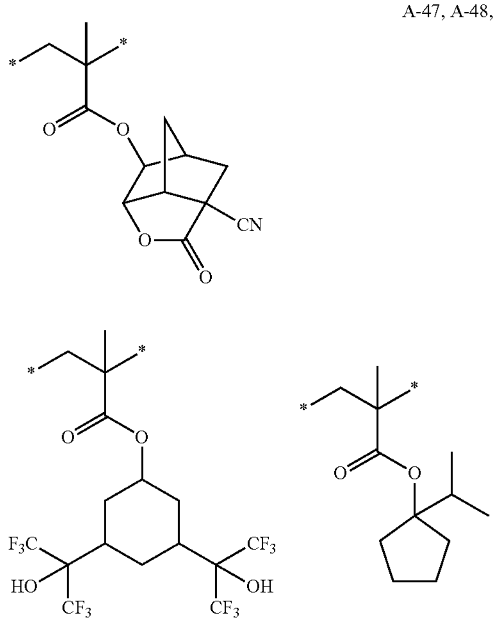
A-50
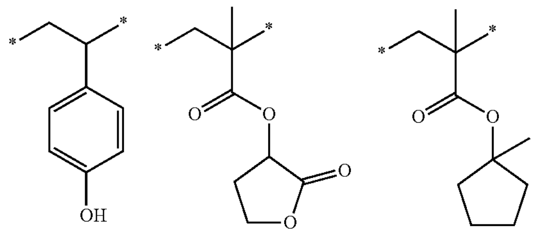
-continued
A-51, A-52
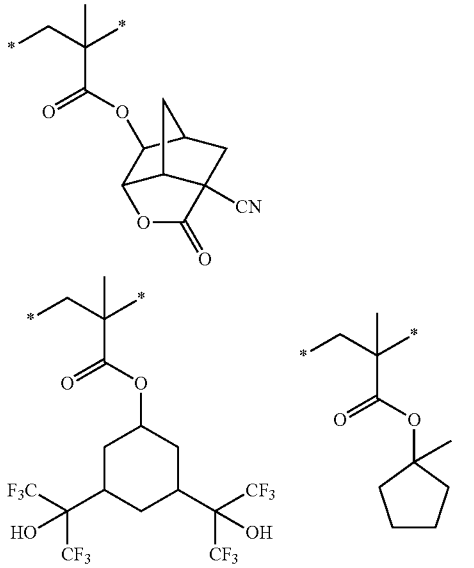
A-53
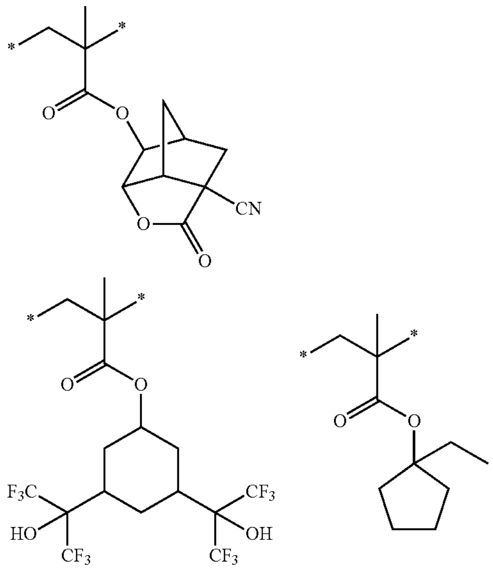
A-54, A-55, A-56
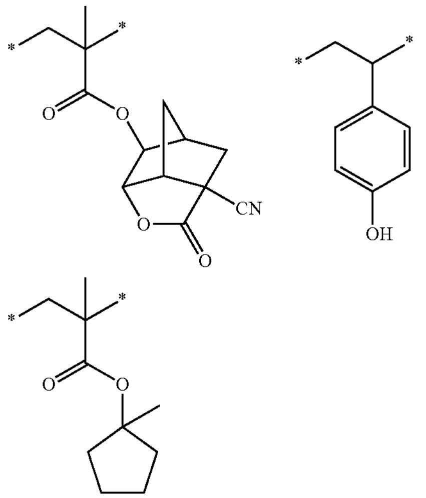

-continued

A-57

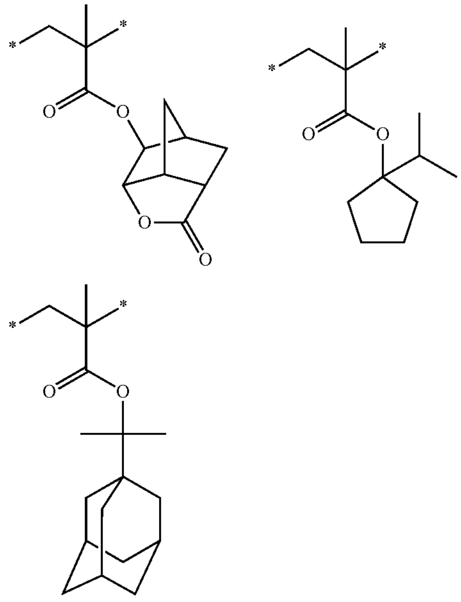

A-58

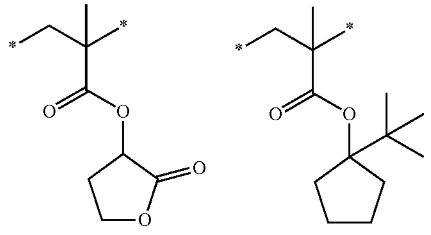

A-59

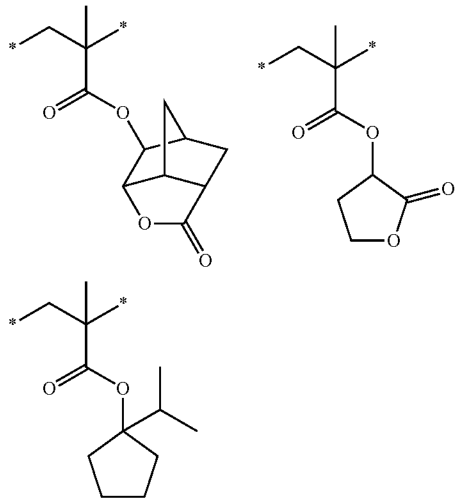

A-60

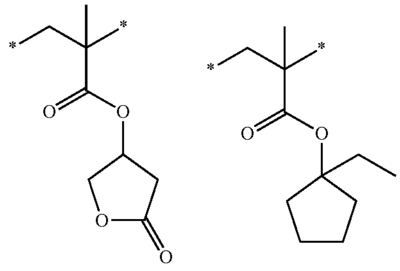

-continued

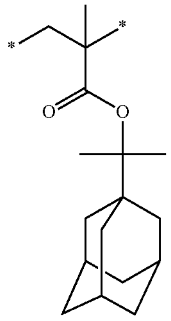

A-61

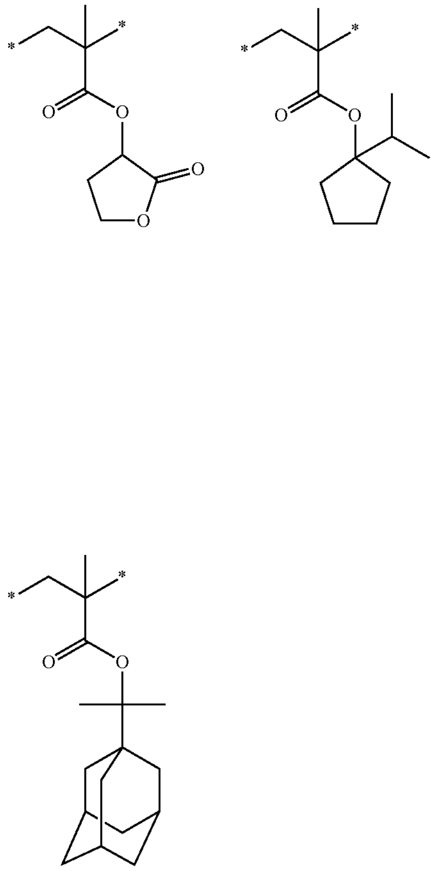

[Photoacid Generator]

<Compound (I) and Comparative Compound>

The structures of compounds (I) (compounds X-1 to X-54) and a comparative compound (compound Z-1) shown in Tables 3 and 6 are shown below. As the compounds X-1 to X-54 and the compound Z-1, those synthesized in accordance with a method for synthesizing the compound X-1 which will be described later were used.

X-1
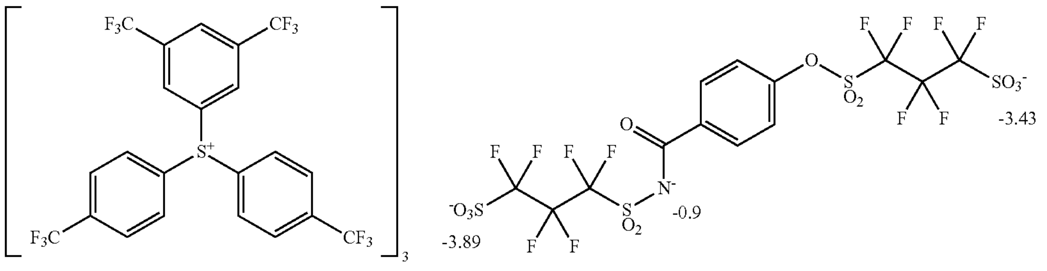
X-2
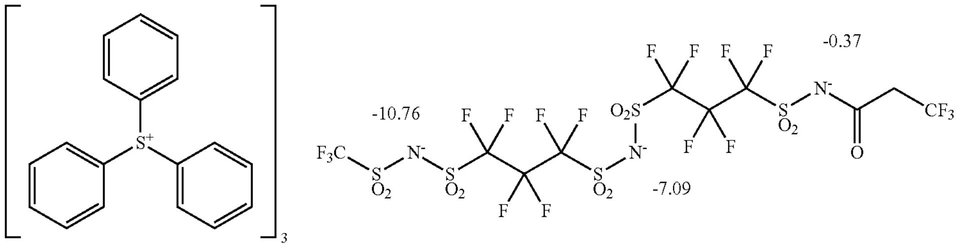
X-3
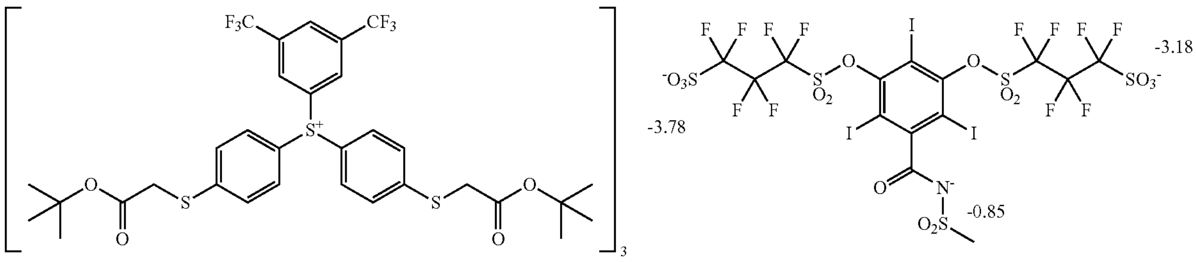
X-4
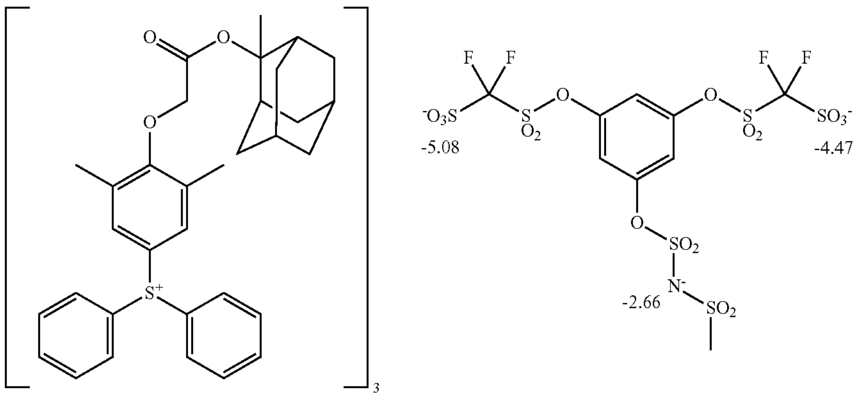
X-5
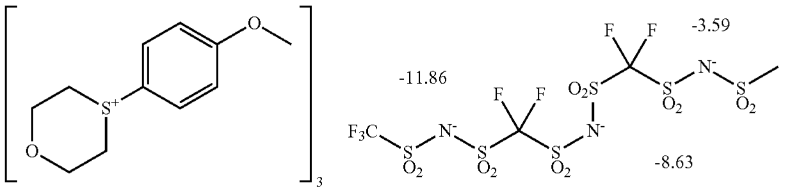

-continued
X-6
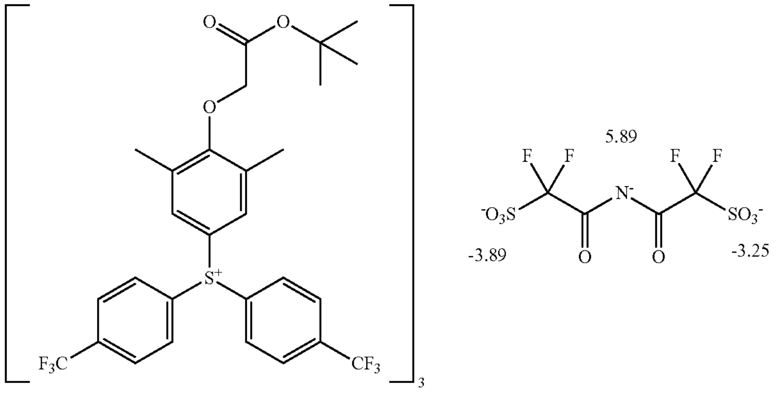
X-7
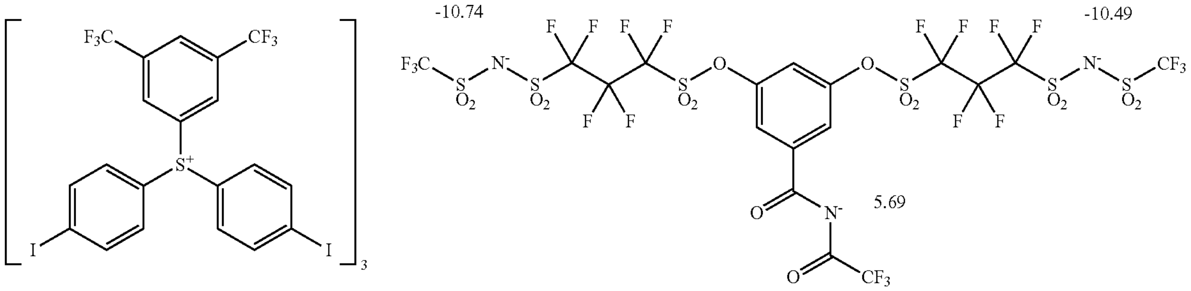
X-8
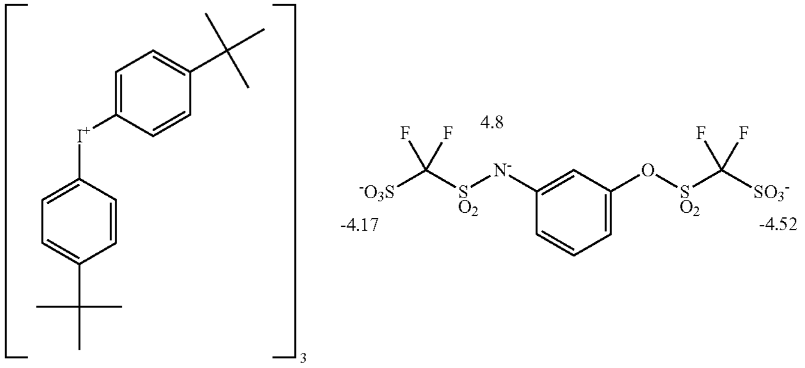
X-9
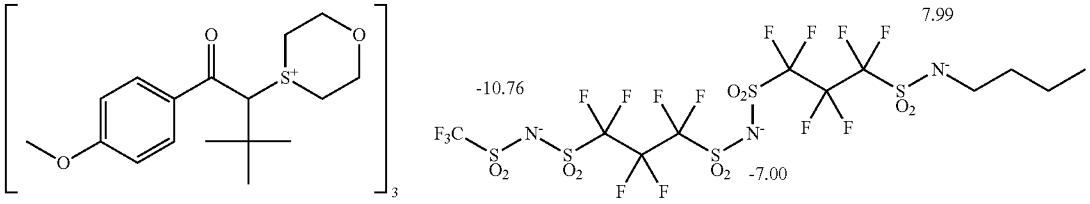
X-10
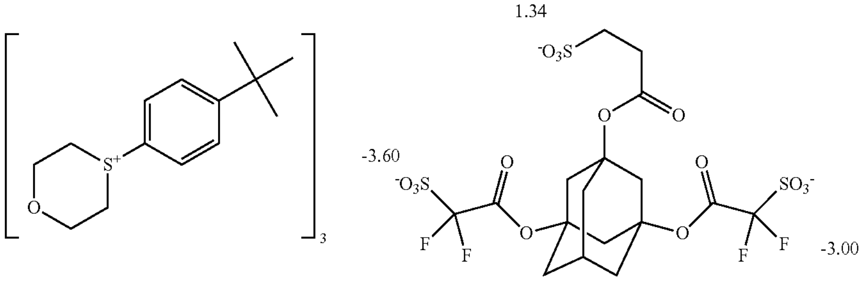

-continued
X-11
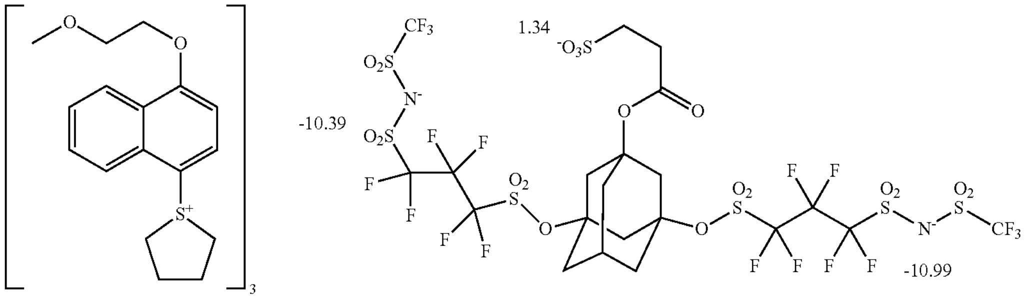
X-12
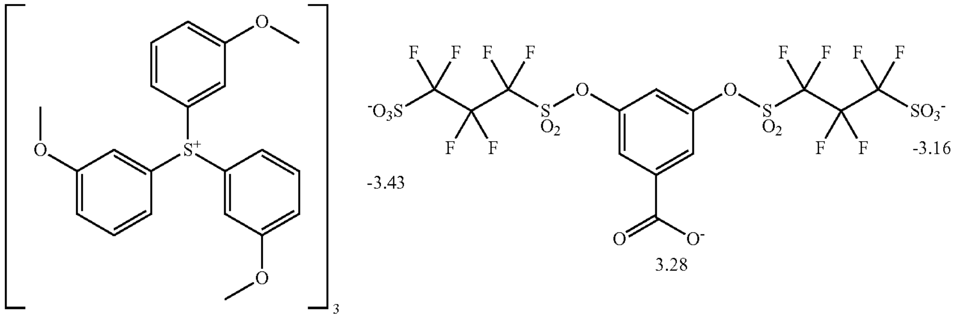
X-13
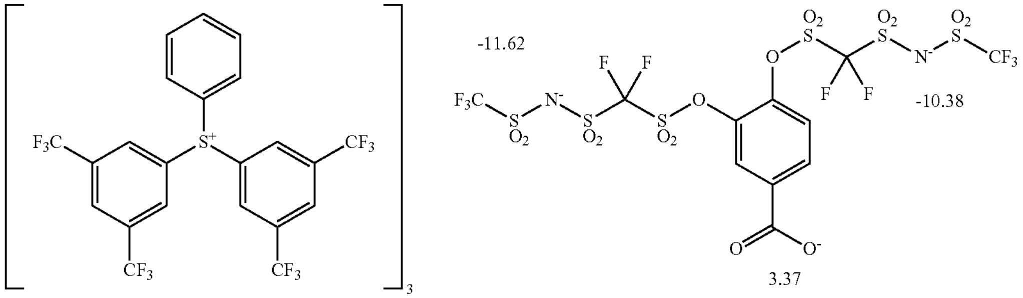
X-14
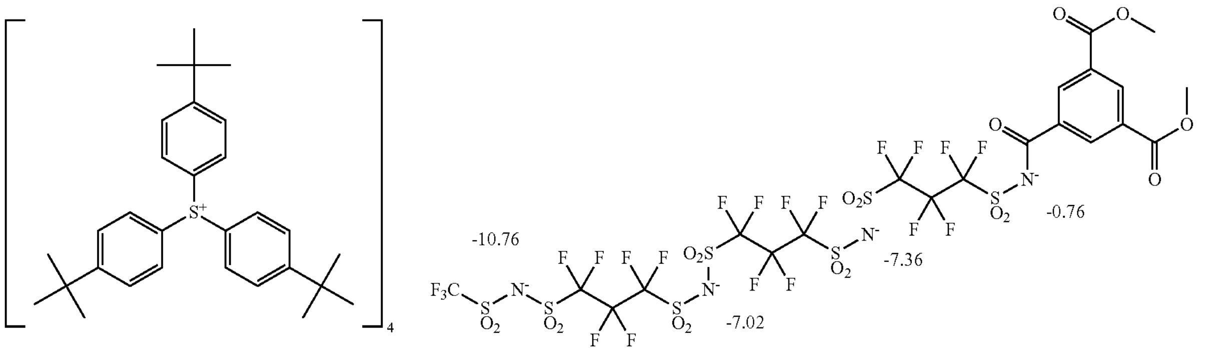
X-15
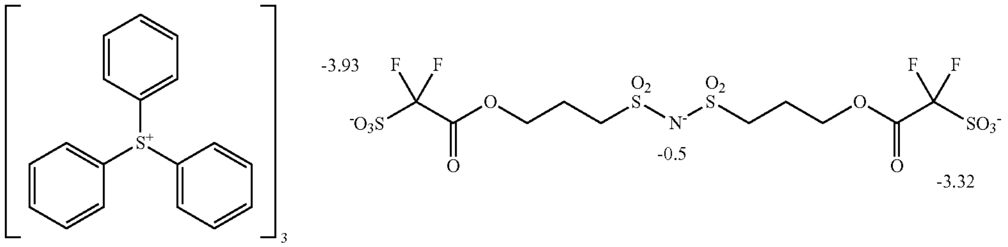

-continued
X-16
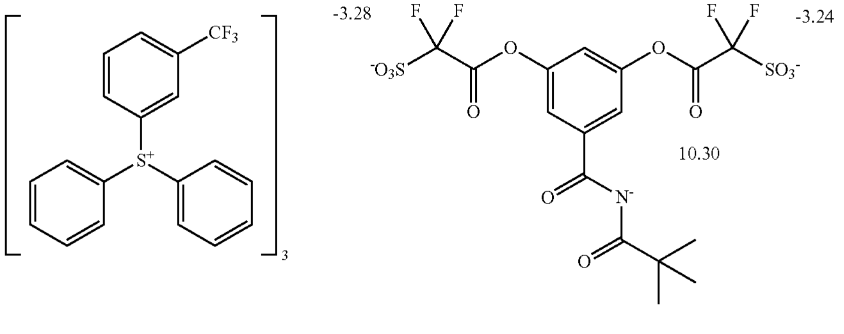
X-17
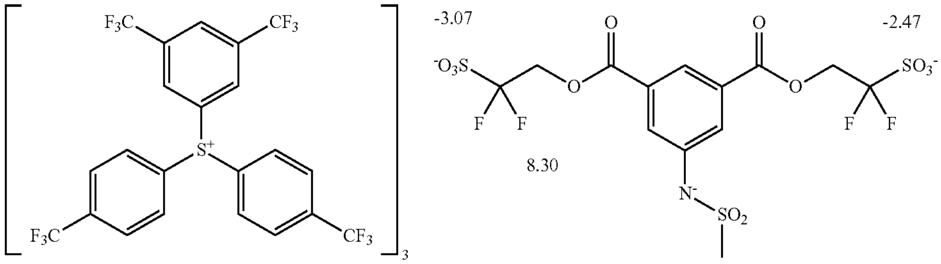
X-18
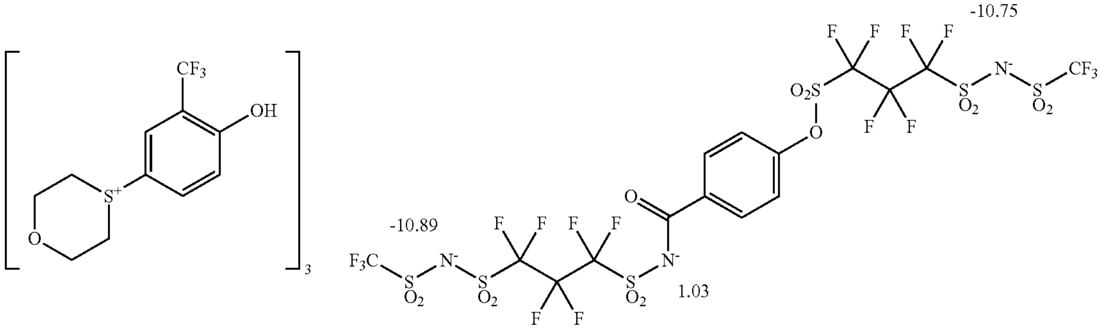
X-19
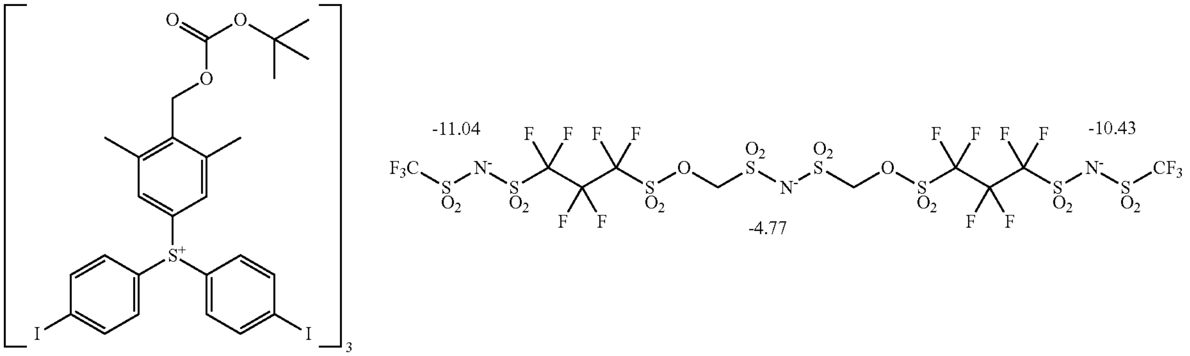
X-20
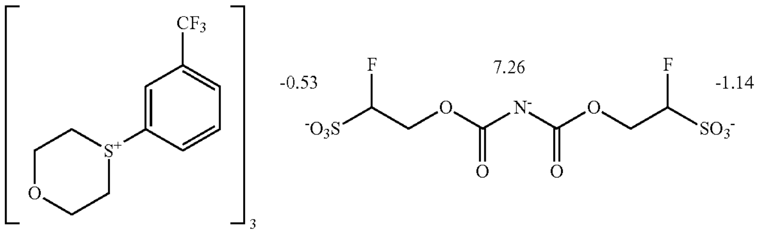

-continued
X-21
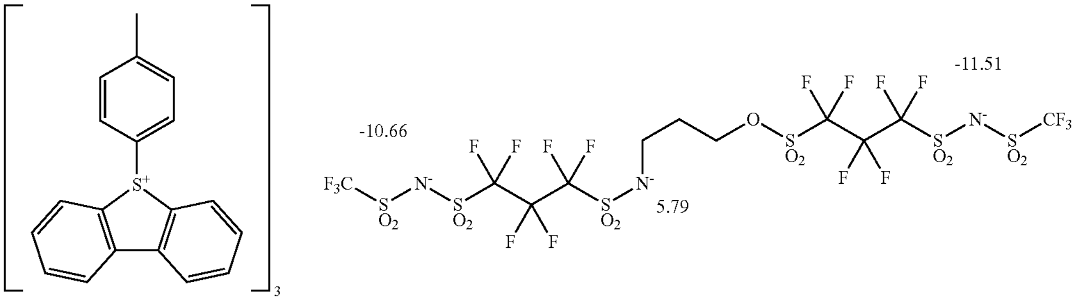
X-22
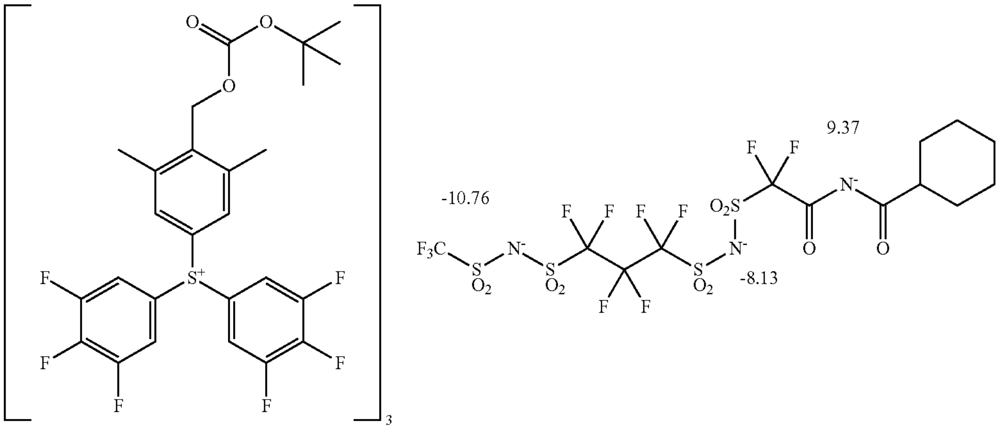
X-23
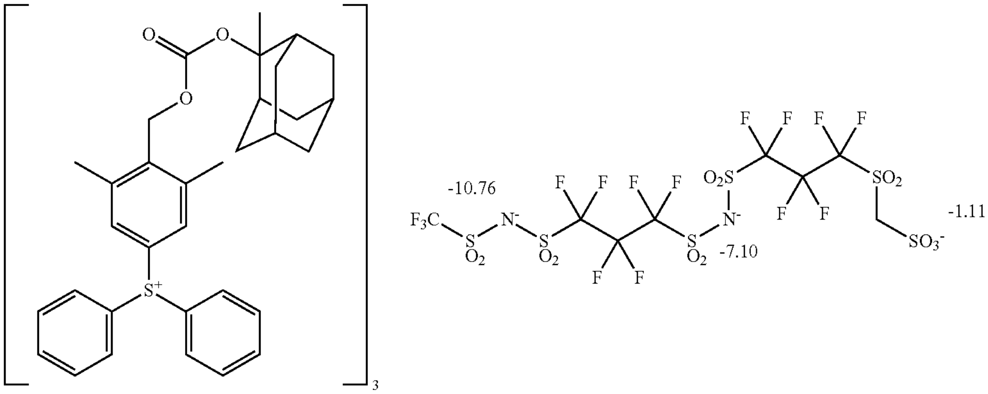
X-24
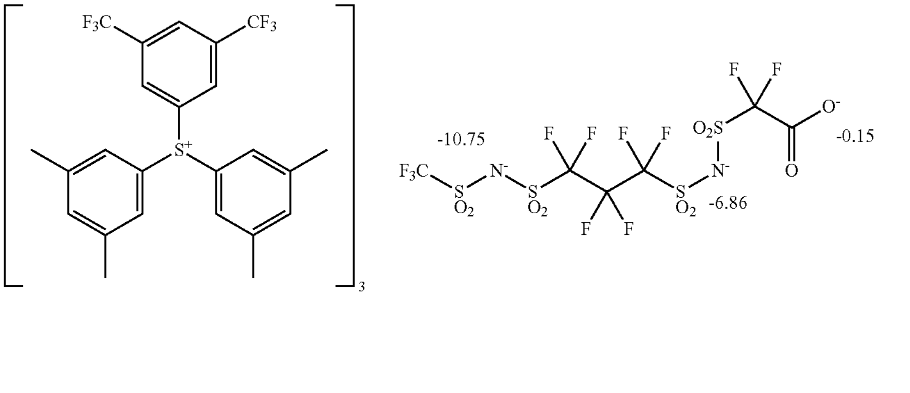

-continued
X-25
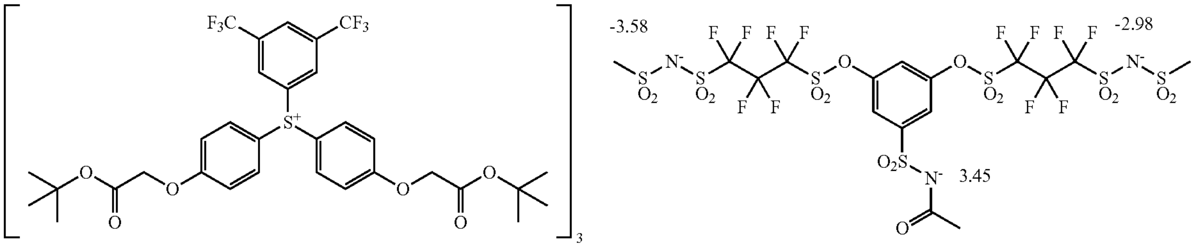
X-26
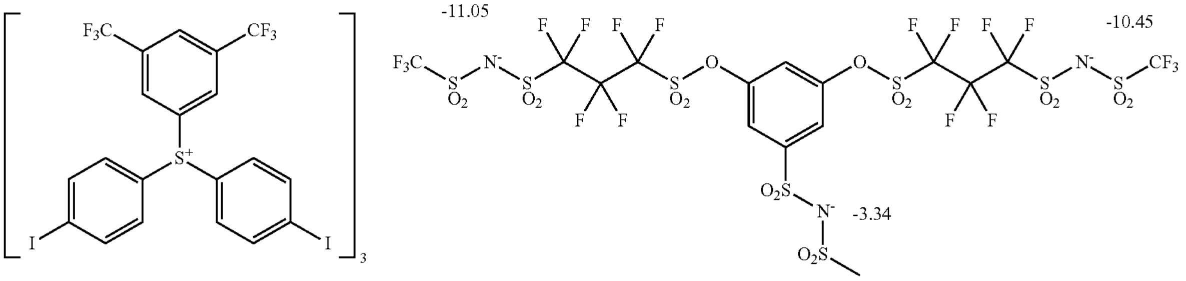
X-27
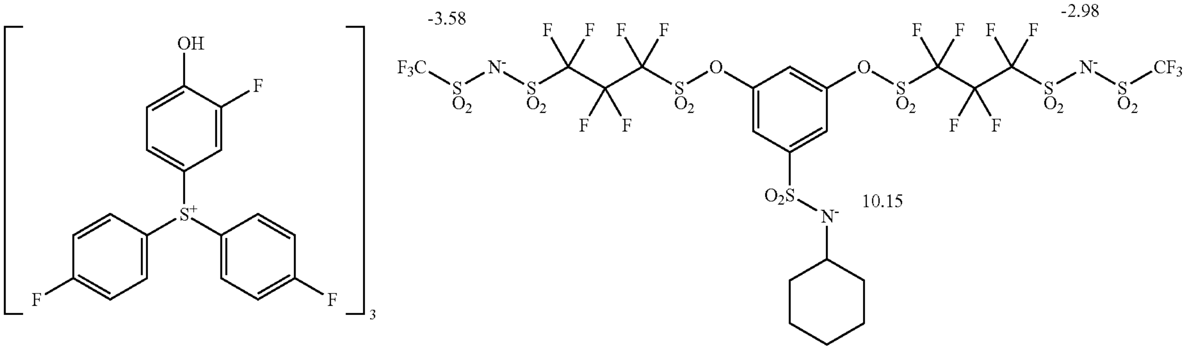
X-28
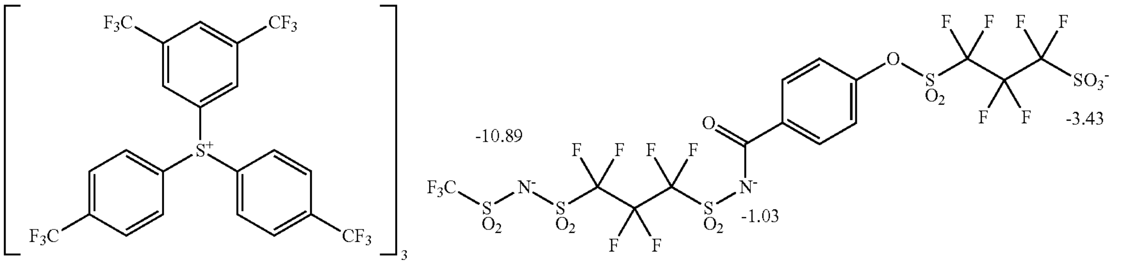
X-29
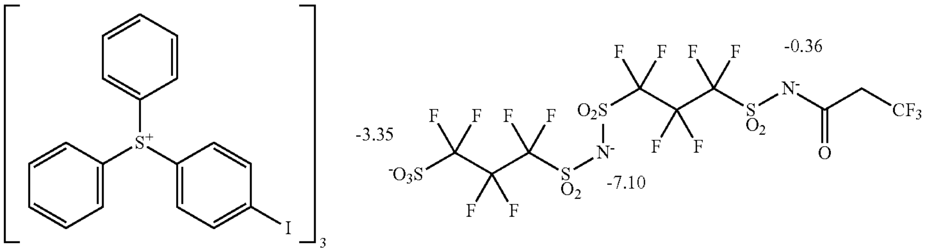

-continued
X-30
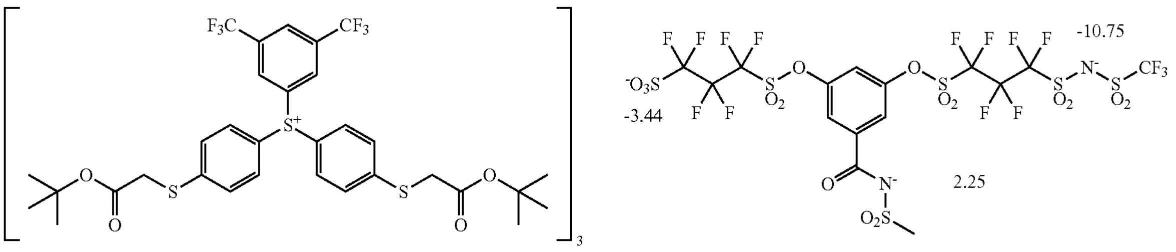
X-31
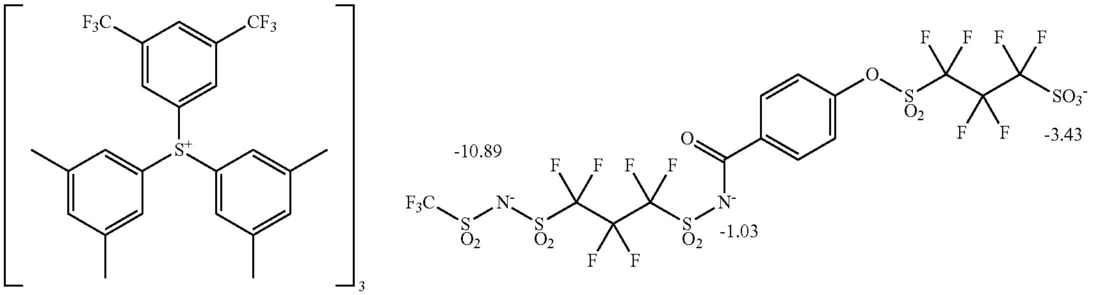
X-32
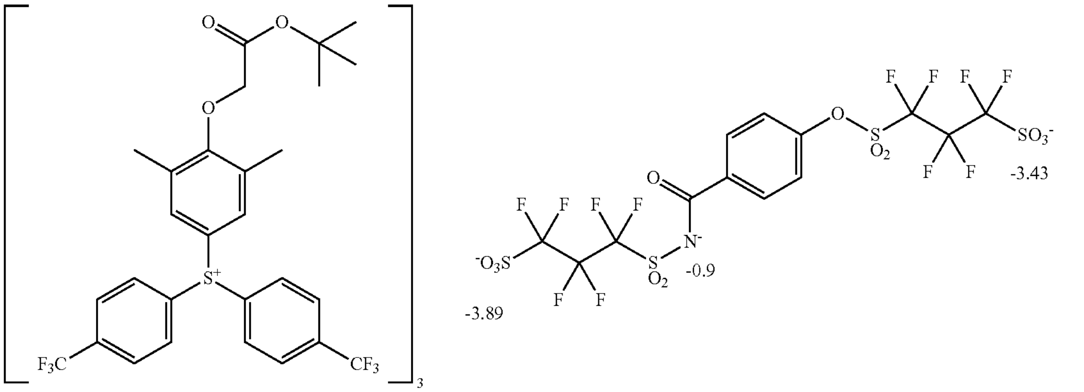
X-33
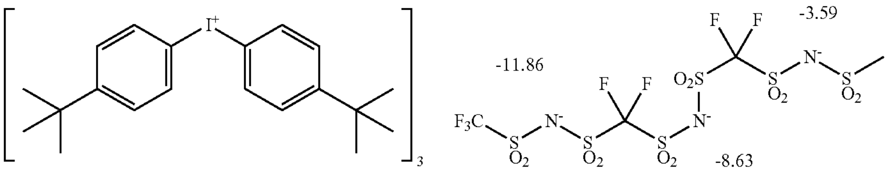
X-34
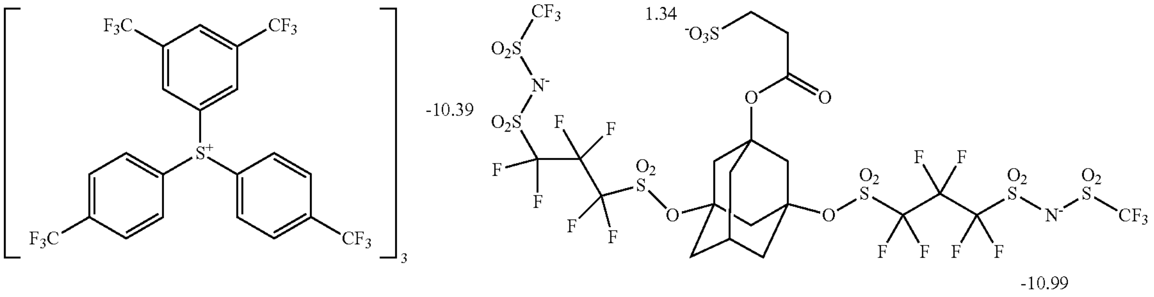

-continued
X-35
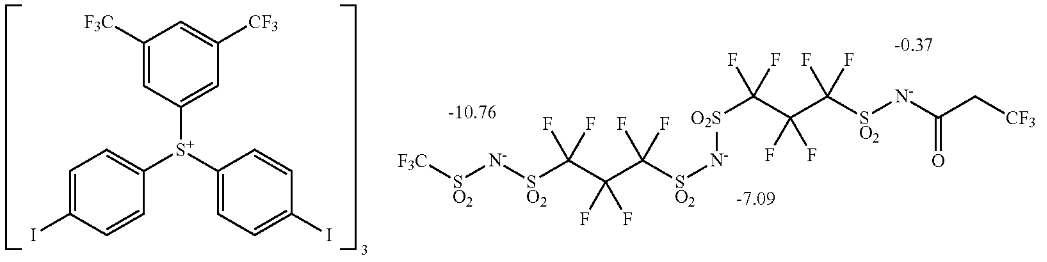
X-36
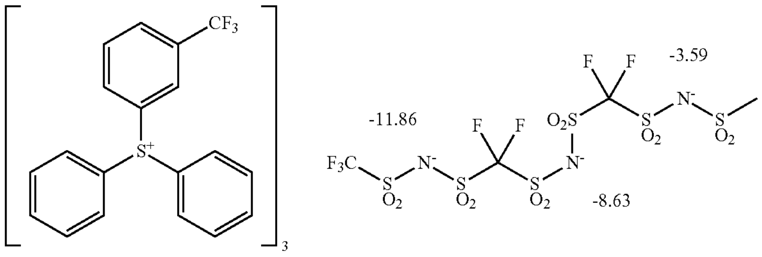
X-37
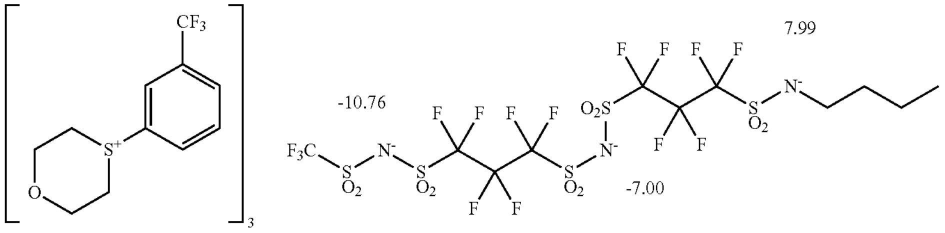
X-38
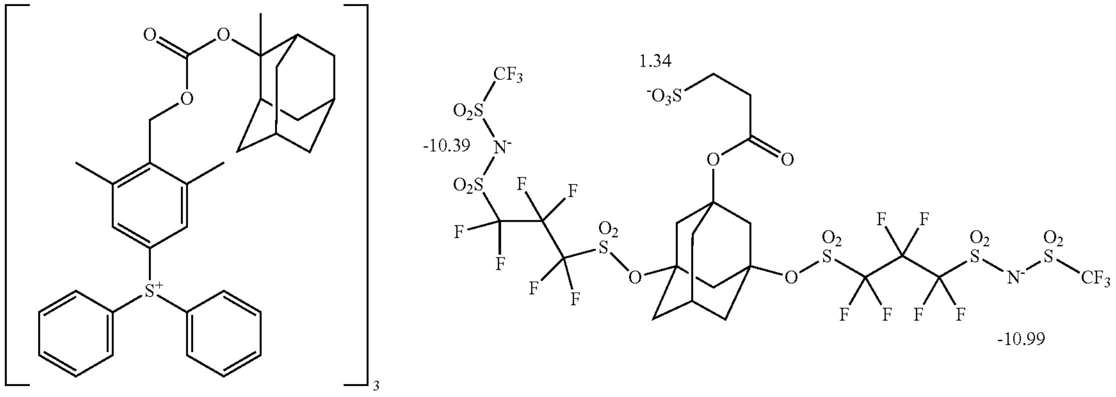
X-39
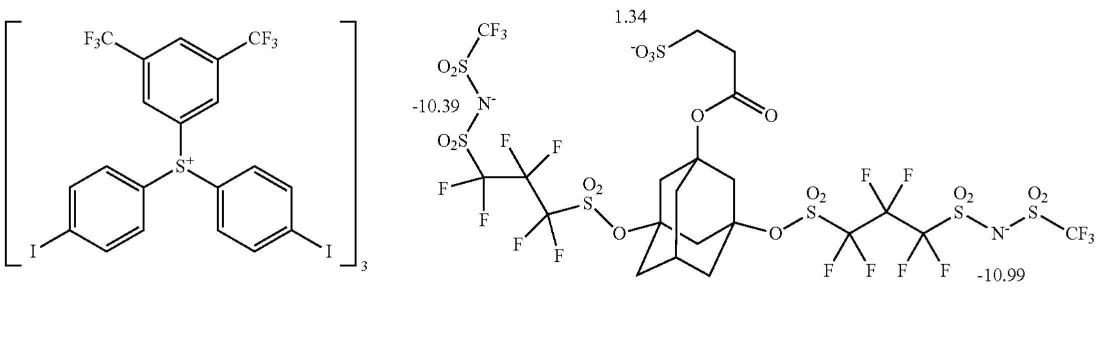

-continued
X-40
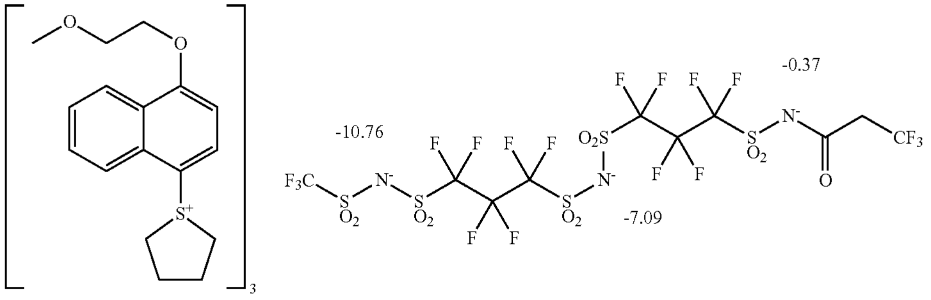
X-41
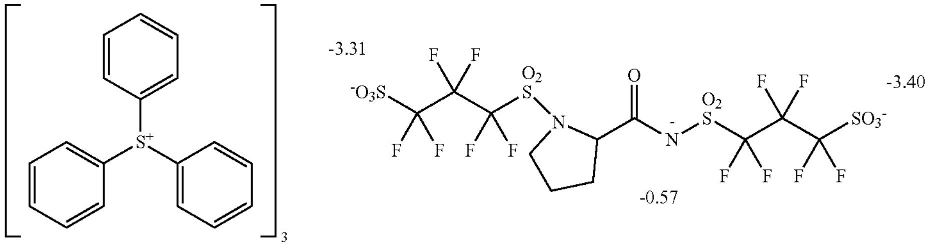
X-42
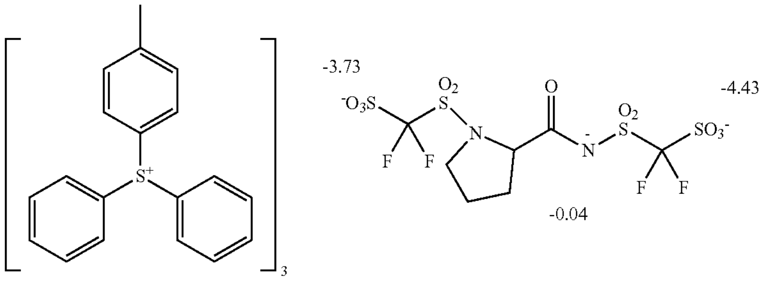
X-43
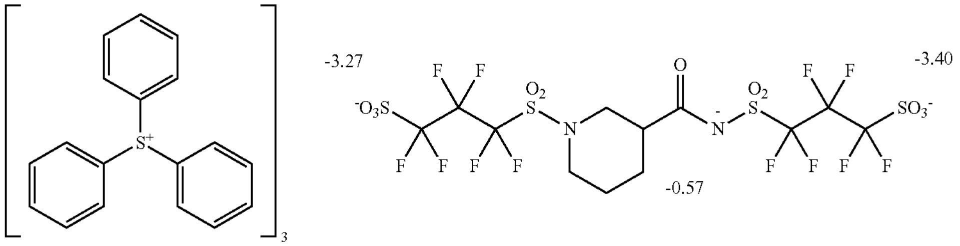
X-44
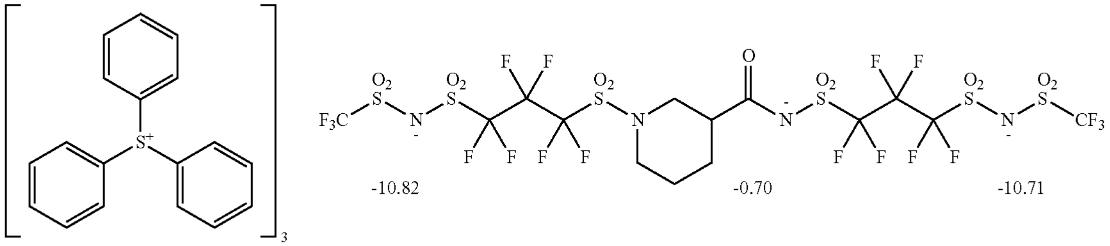

-continued
X-45
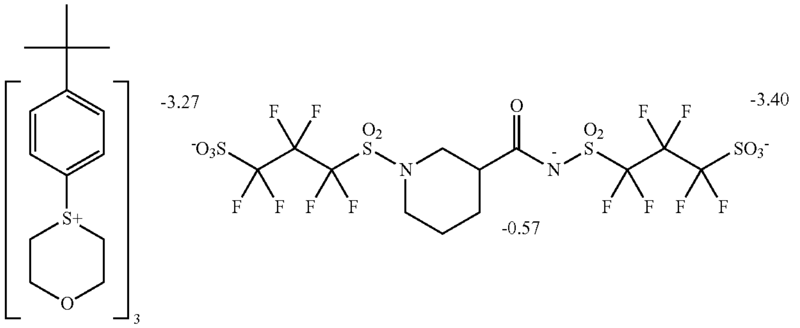
X-46
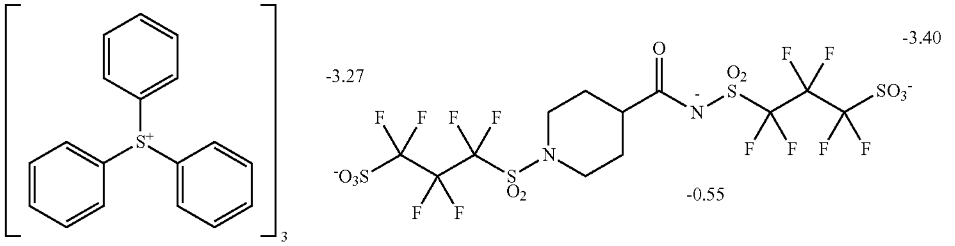
X-47
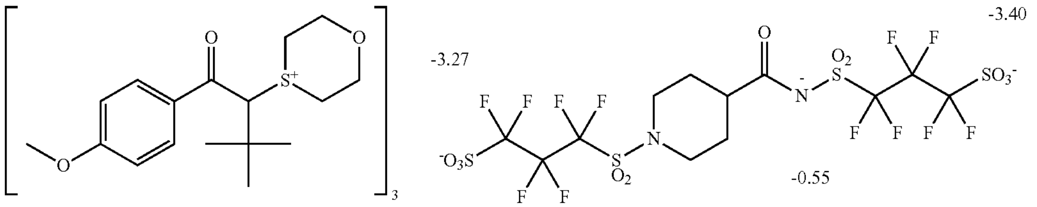
X-48
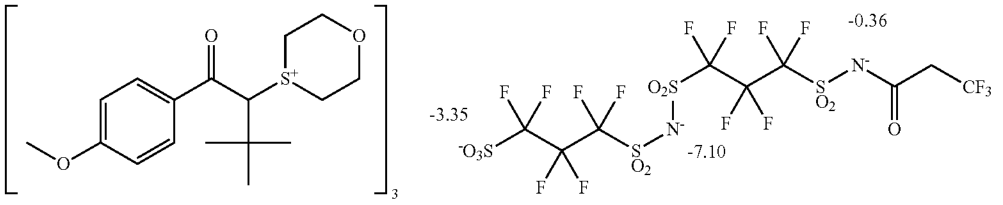
X-49
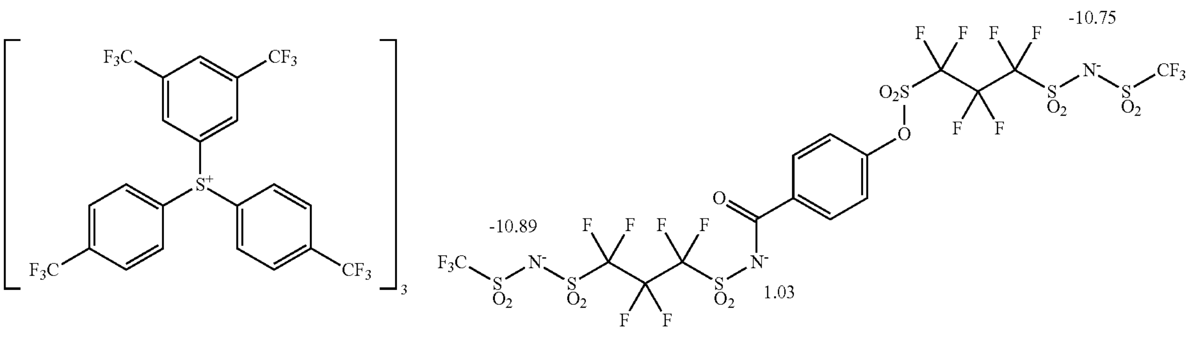

-continued
X-50
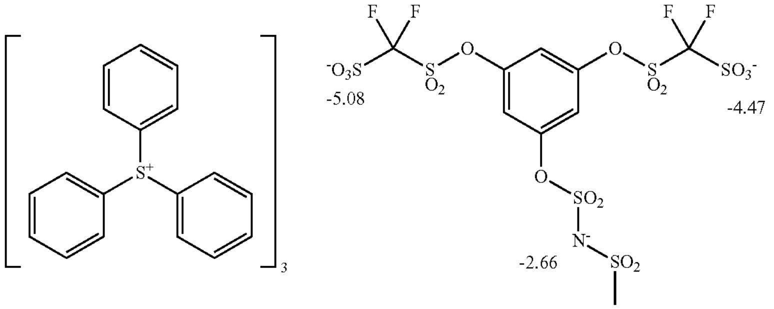
X-51
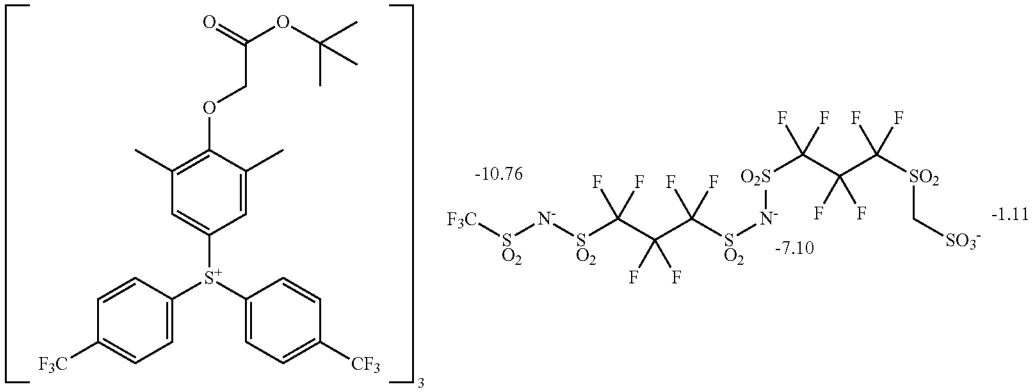
X-52
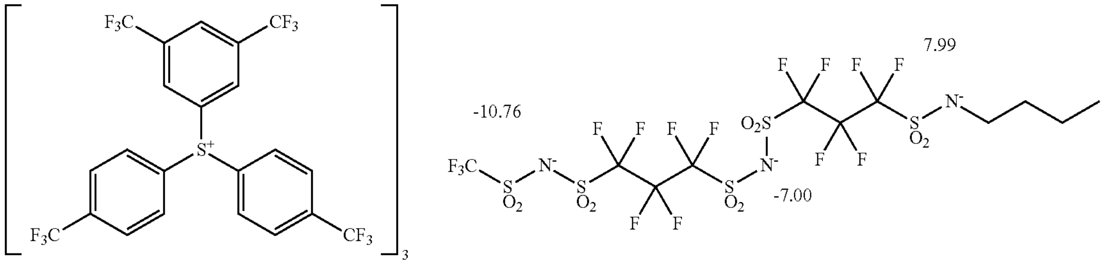
X-53
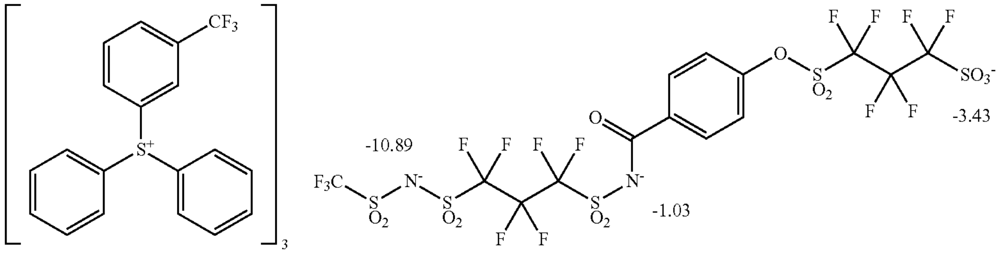
X-54
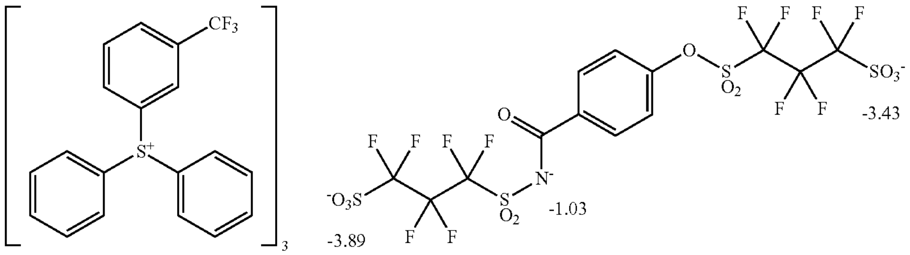

-continued

Z-1

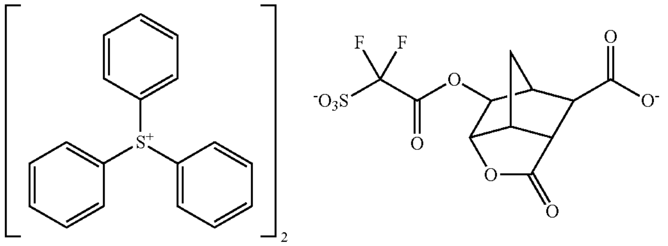

Moreover, the numerical values attached to the respective compounds of the compound (I) (compounds X-1 to X-54) and the comparative compound (compound Z-1) (corresponding to the numerical values of −3.89, −0.9, and −3.43 in order from the left, for example, in a case of the compound X-1) indicate acid dissociation constants pKa of acids (hereinafter also referred to as "generated acids") generated from the respective compounds by exposure. For example, the compound X-1 generates an acid having the following structure in a case where three cations decompose by exposure. The acid generated from the compound X-1 has three acidic moieties (proton donor moieties) of *—$SO_3H$, *—$SO_2$—NH—CO—*, and *—$SO_3H$ in this order from the left, and the acid dissociation constants pKa derived from the respective acidic moieties are −3.89, −0.9, and −3.43. That is, the numerical value attached to each of the compounds indicates an acid dissociation constant pKa derived from each acidic moiety (proton donor moiety) of an acid generated from each compound by exposure.

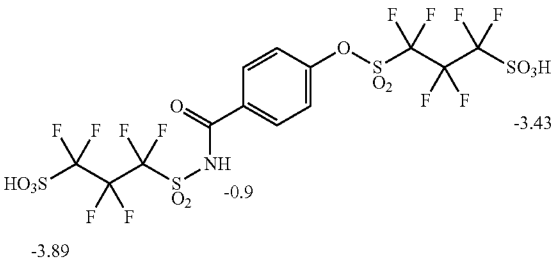

Generated acid of X-1

In the measurement of the acid dissociation constants pKa of acids generated from the compounds (I) (compounds X-1 to X-54) and the comparative compound (compound Z-1), specifically, the pKa is a value determined by subjecting a compound formed by substituting each cationic moiety in each compound with $H^+$ (for example, in a case of the compound X-2, a compound formed by substituting three triphenylsulfonium cations with $H^+$) to computation from a value based on a Hammett's substituent constant and database of publicly known literature values, using Software Package 1 of ACD/Labs, as described above. In addition, in a case where pKa could not be calculated by the method, a value obtained by Gaussian 16 based on density functional theory (DFT) was adopted.

In each compound of the compounds (I) (compounds X-1 to X-54) and the comparative compound (compound Z-1), the highest numerical value attached to each compound corresponds to an acid dissociation constant b derived from the structural moiety Y. Furthermore, any of the numerical values other than the highest numerical value attached to each compound correspond to the acid dissociation constant a derived from the structural moiety X.

Synthesis Example 1: Synthesis of Compound X-1

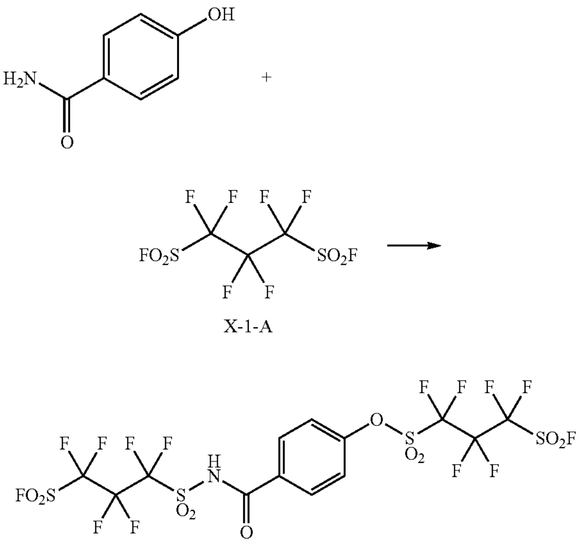

X-1-A

X-1-B

<<Synthesis of Compound X-1-B>>

25.0 g (182.3 mmol) of 4-hydroxybenzamide and 100 mL of tetrahydrofuran (THF) were added to a 500 mL three-necked flask, and 60.9 g (601.6 mmol) of triethylamine was added dropwise thereto. After cooling to 0° C., 172.9 g (546.9 mmol) of a compound (X-1-A) was slowly added dropwise to the mixture. The temperature was raised to 70° C. to perform refluxing for 3 hours, and then the disappearance of 4-hydroxybenzamide was confirmed by $^1$H NMR (nuclear magnetic resonance). After cooling to room temperature, the reaction solution was slowly added dropwise to 1 N hydrochloric acid so that the temperature did not exceed 10° C. After adding 300 mL of ethyl acetate to remove the aqueous layer, the organic layer was washed twice with 300 mL of water, and the solvent was distilled off under reduced pressure. The crude product was purified by silica gel column chromatography (eluted with a mixed solvent of ethyl acetate/hexane) to obtain 66.5 g of a compound (X-1-B) as a white solid (yield: 50%).

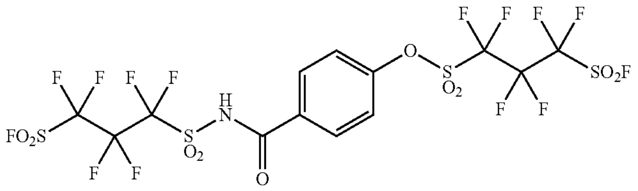

X-1-B

+

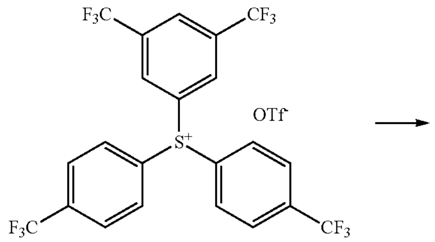

X-1-C

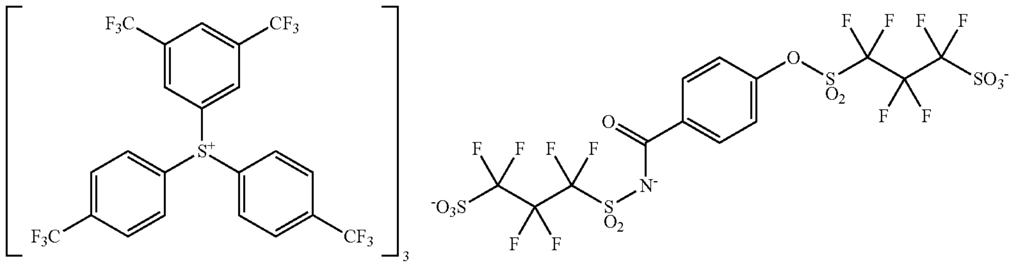

X-1

<<Synthesis of Compound X-1>>

30.0 g (41.2 mmol) of the compound (X-1-B), 350 mL of THF, and 350 mL of a 5% aqueous sodium bicarbonate solution were added to a 1 L eggplant flask, and the mixture was stirred at 60° C. for 1 hour. After distilling off THF under reduced pressure, 350 mL of dichloromethane and 84.6 g (123.6 mmol) of a compound (X-1-C) were added thereto, and the mixture was stirred at room temperature for 30 minutes. The reaction solution was transferred to a liquid separatory funnel to remove the aqueous layer, and then the organic layer was washed twice with 350 mL of water. The solvent was distilled off under reduced pressure, and the mixture was crystallized with diisopropyl ether to obtain 91.1 g of a compound (X-1) as a white solid (yield 95%).

<Photoacid Generator B>

The structures of photoacid generators B (compounds B-1 to B-21) shown in Table 3 and Table 6 are shown below.

B-1

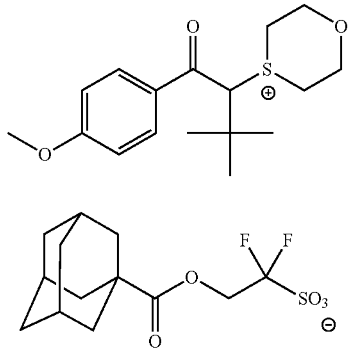

-continued

B-2

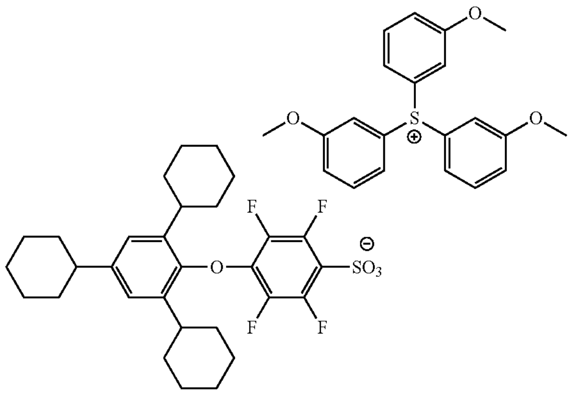

B-3

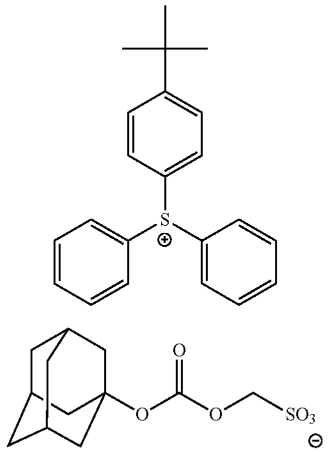

-continued
B-4
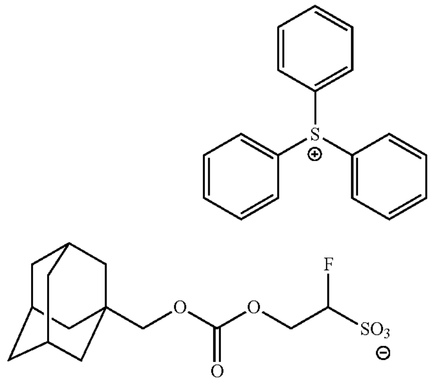
B-5
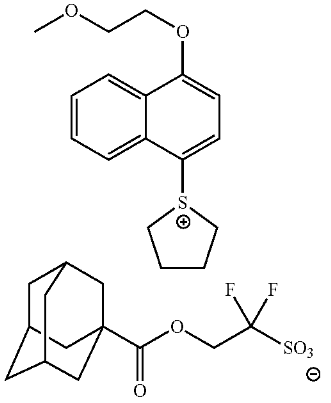
B-6
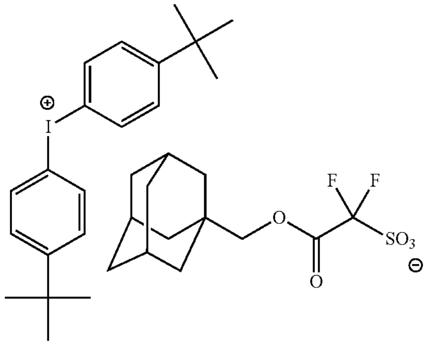
B-7
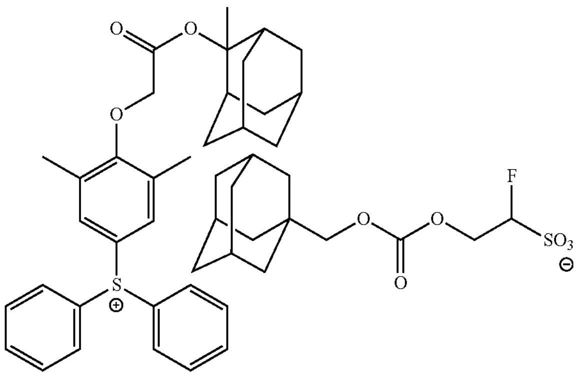
-continued
B-8
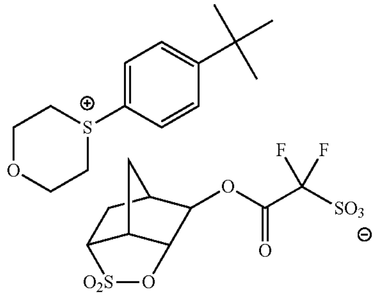
B-9
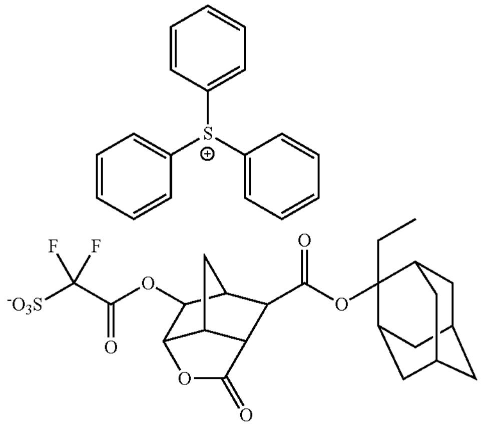
B-10
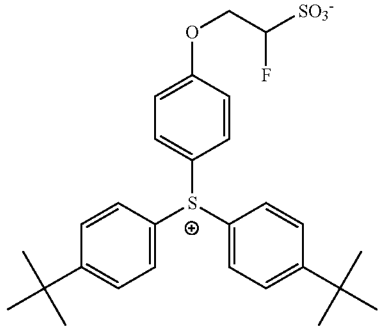
B-11
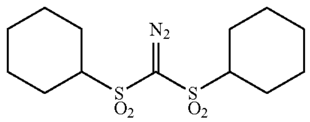
B-12
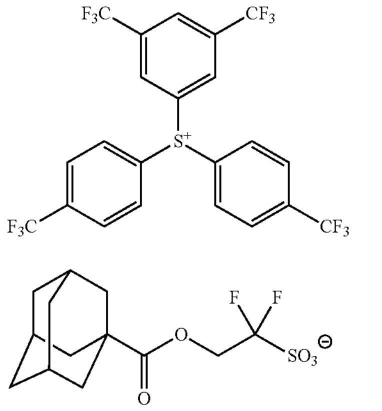

-continued
B-13
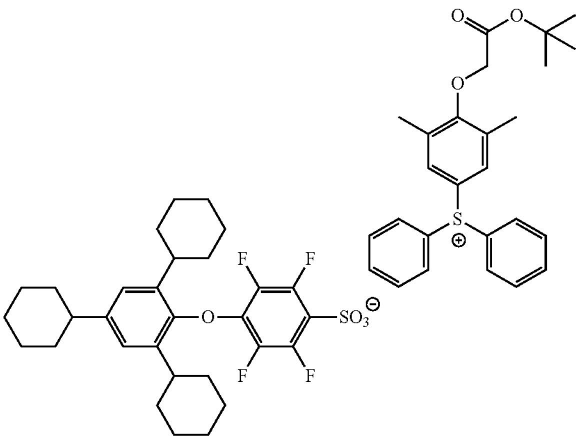
B-14
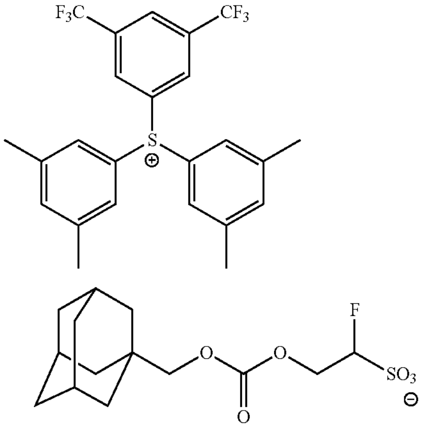
B-15
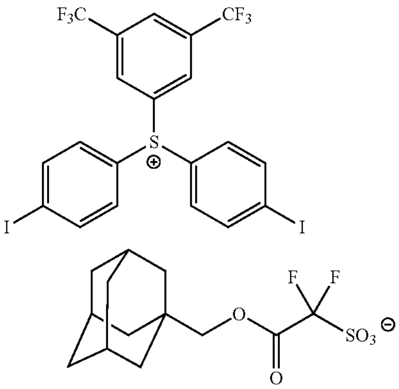
-continued
B-16
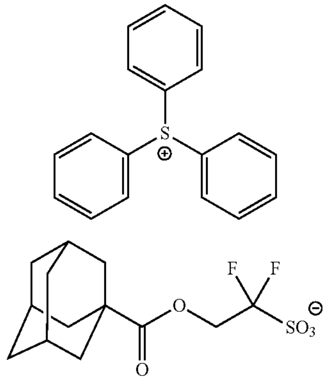
B-17
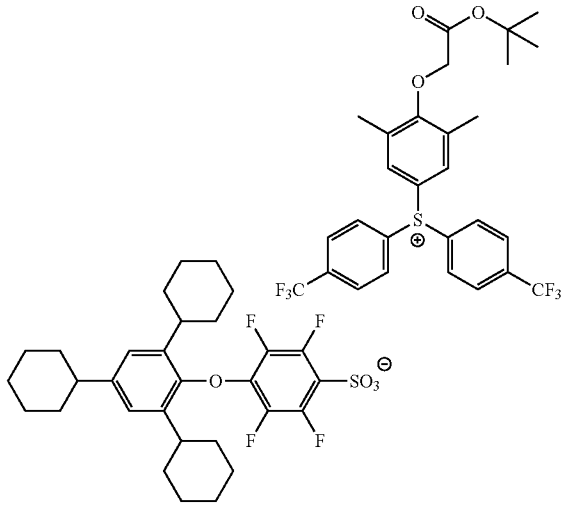
B-18
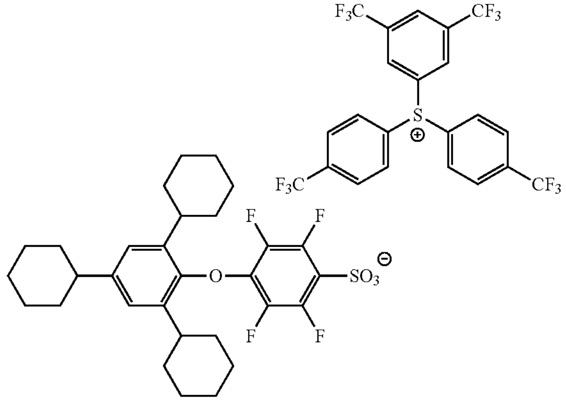

-continued
B-19
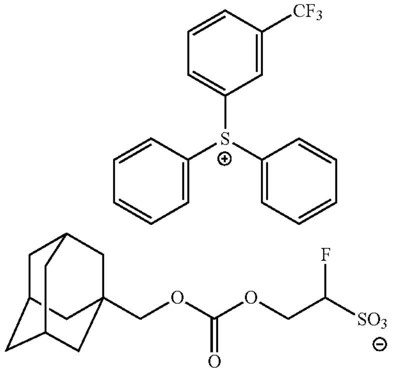
B-20
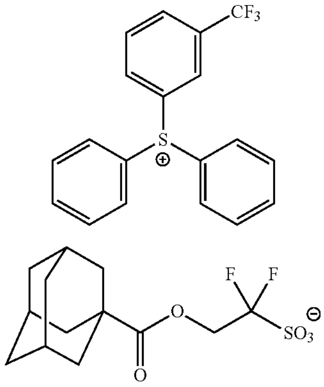
-continued
B-21
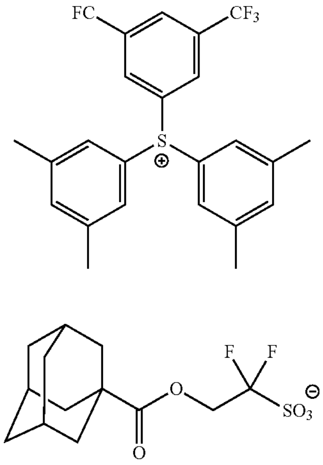
[Acid Diffusion Control Agent]
The structures of acid diffusion control agents C (compounds C-1 to C-7) shown in Table 3 and Table 6 are shown below.
C-1
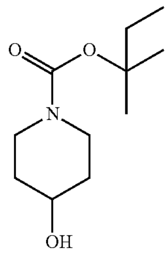
C-2
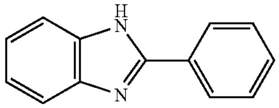
C-3
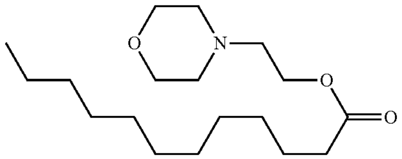
C-4
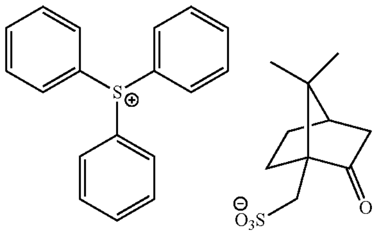

-continued

C-5

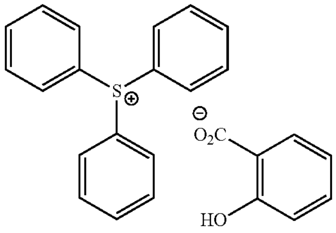

C-6

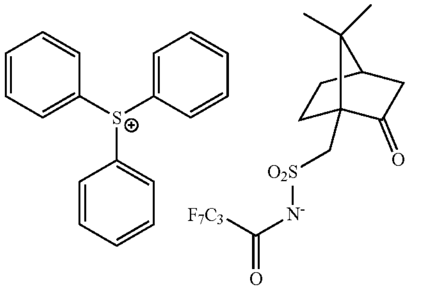

C-7

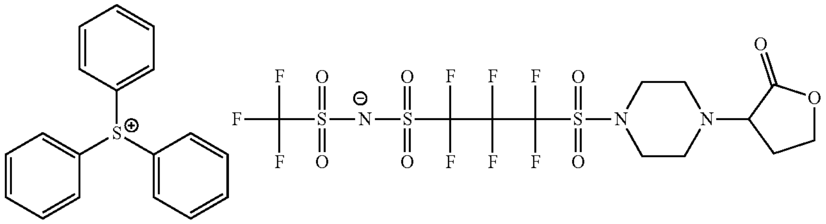

[Hydrophobic Resin and Resin for Topcoat]

As hydrophobic resins (D-1 to D-8) shown in Table 3 and Table 6 and resins (PT-1 to PT-3) for a topcoat shown in Table 7, those synthesized were used.

The molar ratios of the repeating units, the weight-average molecular weights (Mw), and the dispersities (Mw/Mn) in the hydrophobic resins (D-1 to D-8) shown in Table 2, Table 3, and Table 6 and the resins (PT-1 to PT-3) for a topcoat shown in Table 7 are shown.

Furthermore, the weight-average molecular weights (Mw) and the dispersities (Mw/Mn) of the hydrophobic resins D-1 to D-8 and the resins PT-1 to PT-3 for a topcoat were measured by GPC (carrier: tetrahydrofuran (THF)) (an amount expressed in terms of polystyrene). In addition, the compositional ratio (molar ratio) of the resin was measured by $^{13}$C-nuclear magnetic resonance (NMR).

TABLE 3

| | Molar ratio of repeating unit 1 | | Molar ratio of repeating unit 2 | | Molar ratio of repeating unit 3 | | Molar ratio of repeating unit 4 | | Mw | Mw/Mn |
|---|---|---|---|---|---|---|---|---|---|---|
| Resin D-1 | ME-12 | 50 | ME-1 | 50 | — | — | — | — | 12,000 | 1.5 |
| Resin D-2 | ME-2 | 40 | ME-11 | 50 | ME-7 | 5 | ME-14 | 5 | 6,000 | 1.3 |
| Resin D-3 | ME-8 | 50 | ME-2 | 50 | — | — | — | — | 15,000 | 1.5 |
| Resin D-4 | ME-5 | 100 | — | — | — | — | — | — | 23,000 | 1.7 |
| Resin D-5 | ME-11 | 10 | ME-13 | 85 | ME-7 | 5 | — | — | 11,000 | 1.4 |
| Resin D-6 | ME-6 | 80 | ME-9 | 20 | — | — | — | — | 13,000 | 1.4 |
| Resin D-7 | ME-5 | 50 | ME-15 | 50 | — | — | — | — | 12,000 | 1.5 |
| Resin D-8 | ME-2 | 50 | ME-16 | 50 | — | — | — | — | 10,000 | 1.6 |
| Resin PT-1 | ME-2 | 40 | ME-9 | 30 | ME-7 | 30 | — | — | 8,000 | 1.6 |
| Resin PT-2 | ME-2 | 50 | ME-6 | 40 | ME-3 | 10 | — | — | 5,000 | 1.5 |
| Resin PT-3 | ME-3 | 30 | ME-4 | 65 | ME-10 | 5 | — | — | 8,500 | 1.7 |

The monomer structures used in the synthesis of the hydrophobic resins D-1 to D-8 shown in Table 2 and the resins PT-1 to PT-3 for a topcoat shown in Table 7 are shown below.

ME-1

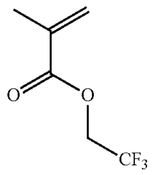

-continued
ME-2
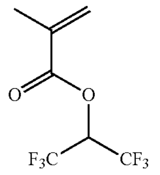
ME-3
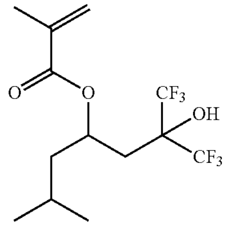
ME-4
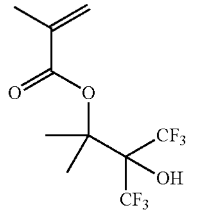
ME-5
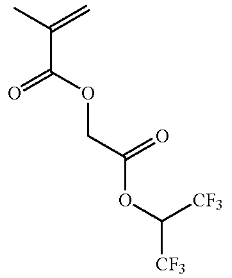
ME-6
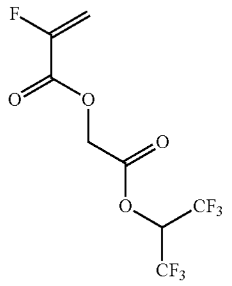
ME-7
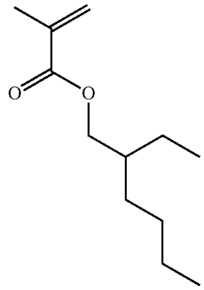
-continued
ME-8
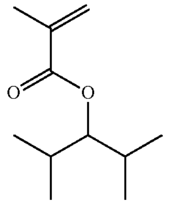
ME-9
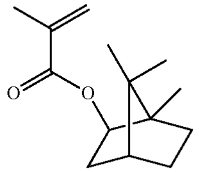
ME-10
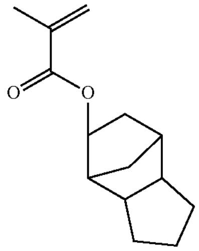
ME-11
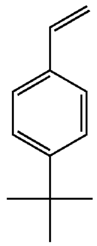
ME-12
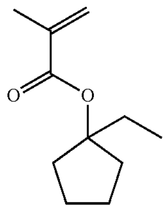
ME-13
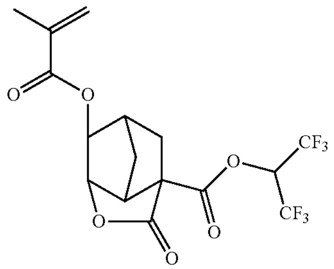
ME-14
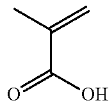

-continued

ME-15

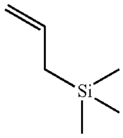

ME-16

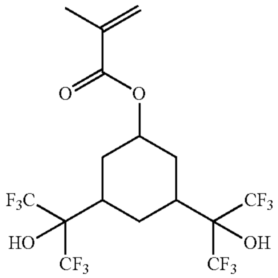

[Surfactant]

Surfactants shown in Table 3 and Table 6 are shown below.

E-1: MEGAFACE F176 (manufactured by DIC Corporation, fluorine-based surfactant)

E-2: MEGAFACE R08 (manufactured by DIC Corporation, fluorine- and silicon-based surfactant)

E-3: PF656 (manufactured by OMNOVA Solutions Inc., fluorine-based surfactant)

[Solvent]

The solvents shown in Table 3 and Table 6 are shown below.

F-1: Propylene glycol monomethyl ether acetate (PGMEA)

F-2: Propylene glycol monomethyl ether (PGME)

F-3: Propylene glycol monoethyl ether (PGEE)

F-4: Cyclohexanone

F-5: Cyclopentanone

F-6: 2-Heptanone

F-7: Ethyl lactate

F-8: γ-Butyrolactone

F-9: Propylene carbonate

[Preparation of Actinic Ray-Sensitive or Radiation-Sensitive Resin Composition and Pattern Formation: EUV Exposure]

[Preparation (1) of Actinic Ray-Sensitive or Radiation-Sensitive Resin Composition]

The respective components shown in Table 3 were mixed so that the concentration of solid contents was 2% by mass. Next, the obtained mixed liquid was filtered initially through a polyethylene-made filter having a pore diameter of 50 nm, then through a nylon-made filter having a pore diameter of 10 nm, and lastly through a polyethylene-made filter having a pore diameter of 5 nm in this order to prepare an actinic ray-sensitive or radiation-sensitive resin composition (hereinafter also referred to as a resin composition). In addition, in the resin composition, the solid content means all components other than the solvent. The obtained resin composition was used in Examples and Comparative Examples.

TABLE 4

(Table 3-1)

| Resist | Compound (I) | | Resin A | | Photoacid generator B | | Acid diffusion control agent C | | Hydrophobic resin D | | Surfactant E | | Solvent F | |
|---|---|---|---|---|---|---|---|---|---|---|---|---|---|---|
| composition | Type | % by mass | Type | % by mass | Type | % by mass | Type | % by mass | Type | % by mass | Type | % by mass | Type | Mixing ratio (mass ratio) |
| Re-C1 | Z-1 | 30.0 | A-5 | 70.0 | — | — | — | — | — | — | — | — | F-1/F-7 | 80/20 |
| Re-1 | X-2 | 21.5 | A-2 | 78.5 | — | — | — | — | — | — | — | — | F-1 | 100 |
| Re-2 | X-3 | 34.5 | A-4 | 65.5 | — | — | — | — | — | — | — | — | F-1/F-2/F-8 | 70/25/5 |
| Re-3 | X-4 | 24.0 | A-3 | 76.0 | — | — | — | — | — | — | — | — | F-1/F-2 | 70/30 |
| Re-4 | X-5 | 20.0 | A-1 | 78.1 | — | — | — | — | D-5 | 1.9 | — | — | F-4 | 100 |
| Re-5 | X-6 | 21.5 | A-12 | 78.5 | — | — | — | — | — | — | — | — | F-4 | 100 |
| Re-6 | X-7 | 34.0 | A-14 | 65.9 | — | — | — | — | — | — | E-3 | 0.1 | F-1 | 100 |
| Re-7 | X-8 | 16.5 | A-3 | 83.5 | — | — | — | — | — | — | — | — | F-1/F-6 | 40/60 |
| Re-8 | X-9 | 21.0 | A-6 | 76.7 | — | — | — | — | D-4 | 2.3 | — | — | F-1/F-9 | 90/10 |
| Re-9 | X-10 | 17.0 | A-7 | 83.0 | — | — | — | — | — | — | — | — | F-1/F-2 | 70/30 |
| Re-10 | X-11 | 28.0 | A-8 | 72.0 | — | — | — | — | — | — | — | — | F-1/F-3 | 90/10 |
| Re-11 | X-12 | 25.5 | A-16 | 74.5 | — | — | — | — | — | — | — | — | F-1 | 100 |
| Re-12 | X-13 | 33.5 | A-10 | 66.4 | — | — | — | — | — | — | E-3 | 0.1 | F-1/F-5 | 50/50 |
| Re-13 | X-14 | 31.0 | A-13 | 69.0 | — | — | — | — | — | — | — | — | F-1 | 100 |
| Re-14 | X-7 | 4.5 | A-9 | 69.1 | B-7 | 23 | — | — | D-6 | 3.4 | — | — | F-1/F-5 | 50/50 |
| Re-15 | X-1 | 23.5 | A-11 | 74.0 | B-11 | 1.4 | — | — | D-2 | 1.1 | — | — | F-1/F-2 | 70/30 |
| Re-16 | X-3 | 30.0 | A-15 | 68.3 | B-8 | 1.7 | — | — | — | — | — | — | F-1/F-2/F-8 | 70/25/5 |
| Re-17 | X-2 | 16.0 | A-2 | 76.3 | B-6 | 7.5 | — | — | — | — | E-1/E-2 | 0.1/0.1 | F-1/F-7 | 80/20 |
| Re-18 | X-12 | 17.0 | A-10 | 77.0 | B-5 | 6 | — | — | — | — | — | — | F-1/F-8 | 85/15 |
| Re-19 | X-7 | 29.0 | A-15 | 66.3 | B-10 | 4.7 | — | — | — | — | — | — | F-1/F-2/F-8 | 70/25/5 |
| Re-20 | X-11 | 16.0 | A-6 | 76.9 | B-3 | 3.6 | — | — | D-3 | 3.5 | | | F-4 | 100 |
| Re-21 | X-6 | 21.5 | A-11 | 70.0 | B-6 | 6.5 | — | — | D-1 | 2 | | | F-1/F-2 | 70/30 |
| Re-22 | X-8 | 14.5 | A-6 | 83.0 | B-9 | 2.3 | — | — | — | — | E-1/E-2 | 0.1/0.1 | F-4 | 100 |
| Re-23 | X-9 | 21.0 | A-13 | 76.8 | B-1 | 2.2 | — | — | — | — | — | — | F-1/F-6 | 40/60 |
| Re-24 | X-2 | 13.0 | A-12 | 81.5 | B-2 | 5.5 | — | — | — | — | — | — | F-1/F-7 | 80/20 |
| Re-25 | X-13 | 4.0 | A-8 | 81.0 | B-4 | 15 | — | — | — | — | — | — | F-4 | 100 |
| Re-26 | X-1 | 31.0 | A-15 | 67.8 | — | — | C-5 | 1.2 | — | — | — | — | F-1/F-7 | 80/20 |
| Re-27 | X-2 | 25.0 | A-14 | 71.0 | — | — | C-2 | 4 | — | — | — | — | F-1/F-7 | 80/20 |
| Re-28 | X-11 | 19.0 | A-7 | 77.4 | — | — | C-4 | 3.6 | — | — | — | — | F-1/F-5 | 50/50 |
| Re-29 | X-10 | 13.0 | A-13 | 85.9 | — | — | C-1 | 1.1 | — | — | — | — | F-1 | 100 |
| Re-30 | X-5 | 20.0 | A-5 | 75.7 | — | — | C-7 | 4.3 | — | — | — | — | F-1/F-7 | 80/20 |
| Re-31 | X-7 | 36.0 | A-12 | 60.5 | — | — | C-6 | 3.5 | — | — | — | — | F-4 | 100 |
| Re-32 | X-4 | 31.0 | A-3 | 66.8 | — | — | C-3 | 2.2 | — | — | — | — | F-1/F-7 | 80/20 |
| Re-33 | X-1/X-3 | 20.0/13.0 | A-1 | 64.5 | — | — | — | — | D-5 | 2.5 | — | — | F-4 | 100 |
| Re-34 | X-7 | 34.0 | A-2/A-5 | 33.0/33.0 | — | — | — | — | — | — | — | — | F-4 | 100 |

TABLE 4-continued (Table 3-1)

| Resist composition | Compound (I) Type | Compound (I) % by mass | Resin A Type | Resin A % by mass | Photoacid generator B Type | Photoacid generator B % by mass | Acid diffusion control agent C Type | Acid diffusion control agent C % by mass | Hydrophobic resin D Type | Hydrophobic resin D % by mass | Surfactant E Type | Surfactant E % by mass | Solvent F Type | Solvent F Mixing ratio (mass ratio) |
|---|---|---|---|---|---|---|---|---|---|---|---|---|---|---|
| Re-35 | X-1 | 22.0 | A-1/A-6 | 35.0/40.0 | B-4 | 3 | — | — | — | — | — | — | F-1/F-2/F-8 | 70/25/5 |
| Re-36 | X-5 | 17.0 | A-1/A-10 | 40.5/40.0 | | | C-6 | 2.5 | — | — | — | — | F-1/F-7 | 80/20 |
| Re-37 | X-2 | 14.0 | A-9 | 76.2 | B-2 | 5.5 | C-7 | 4.3 | — | — | — | — | F-1/F-2 | 70/30 |
| Re-38 | X-7 | 31.0 | A-11 | 63.0 | B-7 | 2 | C-7 | 4 | — | — | — | — | F-1/F-2 | 70/30 |
| Re-39 | X-3 | 28.0 | A-5/A-8 | 39.7/30.0 | — | — | C-4 | 2.3 | — | — | — | — | F-1/F-5 | 50/50 |
| Re-40 | X-22 | 33.0 | A-41 | 67.0 | — | — | — | — | — | — | — | — | F-1/F-8 | 85/15 |
| Re-41 | X-27 | 41.0 | A-46 | 58.9 | — | — | — | — | — | — | E-1 | 0.1 | F-1 | 100 |
| Re-42 | X-29 | 26.5 | A-40 | 73.5 | — | — | — | — | — | — | — | — | F-1/F-5 | 50/50 |
| Re-43 | X-23 | 32.0 | A-34 | 68.0 | — | — | — | — | — | — | — | — | F-1/F-6 | 40/60 |
| Re-44 | X-28 | 48.0 | A-36 | 51.9 | — | — | — | — | — | — | E-2 | 0.1 | F-1/F-7 | 80/20 |
| Re-45 | X-15 | 18.5 | A-43 | 81.5 | — | — | — | — | — | — | — | — | F-1/F-2/F-8 | 70/25/5 |
| Re-46 | X-26 | 34.0 | A-33 | 63.0 | — | — | — | — | D-7 | 3 | — | — | F-1/F-3 | 90/10 |
| Re-47 | X-24 | 27.5 | A-31 | 71.3 | — | — | — | — | D-8 | 1.2 | — | — | F-1/F-2 | 70/30 |

TABLE 5

(Table 3-2)

| Resist composition | Compound (I) Type | Compound (I) % by mass | Resin A Type | Resin A % by mass | Photoacid generator B Type | Photoacid generator B % by mass | Acid difiusion control agent C Type | Acid difiusion control agent C % by mass | Hydrophobic resin D Type | Hydrophobic resin D % by mass | Surfactant E Type | Surfactant E % by mass | Solvent F Type | Solvent F Mixing ratio (mass ratio) |
|---|---|---|---|---|---|---|---|---|---|---|---|---|---|---|
| Re-48 | X-21 | 13.0 | A-44 | 85.0 | — | — | C-6 | 2.0 | — | — | — | — | F-1/F-7 | 80/20 |
| Re-49 | X-25 | 52.5 | A-37 | 47.5 | — | — | — | — | — | — | — | — | F-1/F-2 | 70/30 |
| Re-50 | X-17 | 26.0 | A-39 | 74.0 | — | — | — | — | — | — | — | — | F-4 | 100 |
| Re-51 | X-16 | 32.0 | A-30 | 67.3 | — | — | — | — | D-3 | 0.7 | — | — | F-4 | 100 |
| Re-52 | X-18 | 43.0 | A-42 | 57.0 | — | — | — | — | — | — | — | — | F-1/F-7 | 80/20 |
| Re-53 | X-20 | 5.0 | A-38 | 88.5 | B-1 | 6.5 | — | — | — | — | — | — | F-1/F-2 | 70/30 |
| Re-54 | X-30 | 60.0 | A-35 | 37.9 | — | — | — | — | D-1 | 2.1 | — | — | F-1/F-2/F-8 | 70/25/5 |
| Re-55 | X-19 | 29.5 | A-45 | 70.5 | — | — | — | — | — | — | — | — | F-1/F-7 | 80/20 |
| Re-56 | X-1 | 56.0 | A-32 | 44.0 | — | — | — | — | — | — | — | — | F-1/F-5 | 50/50 |
| Re-57 | X-7 | 40.0 | A-1/A-39 | 30.0/30.0 | — | — | — | — | — | — | — | — | F-1/F-2 | 70/30 |
| Re-58 | X-2 | 36.0 | A-5 | 62.0 | | | — | — | D-4 | 2.0 | — | — | F-1/F-2 | 70/30 |
| Re-59 | X-9 | 21.5 | A-13/A-33 | 38.5/40.0 | — | — | — | — | — | — | — | — | F-1/F-2 | 70/30 |

TABLE 6

(Table 3-3)

| Resist composition | Compound (I) Type | Compound (I) % by mass | Resin A Type | Resin A % by mass | Photoacid generator B Type | Photoacid generator B % by mass | Acid diffusion control agent C Type | Acid diffusion control agent C % by mass | Hydrophobic resin D Type | Hydrophobic resin D % by mass | Surfactant E Type | Surfactant E % by mass | Solvent F Type | Solvent F Mixing ratio (mass ratio) |
|---|---|---|---|---|---|---|---|---|---|---|---|---|---|---|
| Re-100 | X-31 | 23.0 | A-47 | 75.0 | — | — | — | — | D-6 | 2.0 | — | — | F-1/F-2/F-8 | 85/10/5 |
| Re-101 | X-31 | 21.5 | A-48 | 78.5 | — | — | — | — | — | — | — | — | F-1/F-2 | 85/15 |
| Re-102 | X-1 | 15.0 | A-49 | 76.0 | B-12 | 9 | — | — | — | — | — | — | F-1/F-2/F-8 | 80/15/5 |
| Re-103 | X-31 | 24.0 | A-50 | 76.0 | — | — | — | — | — | — | — | — | F-1/F-2 | 70/30 |
| Re-104 | X-32 | 9.0 | A-51 | 69.5 | B-13 | 15.5 | | | D-5 | 6.0 | — | — | F-1/F-2/F-8 | 80/10/10 |
| Re-105 | X-33 | 21.5 | A-52 | 78.5 | — | — | — | — | — | — | — | — | F-1/F-2 | 90/10 |
| Re-106 | X-32 | 20.0 | A-53 | 78.0 | — | — | — | — | D-5 | 2.0 | — | — | F-1/F-2 | 80/20 |
| Re-107 | X-34 | 23.0 | A-53 | 77.0 | — | — | — | — | — | — | — | — | F-1/F-2 | 80/20 |
| Re-108 | X-32 | 15.8 | A-54 | 72.7 | B-13 | 11.5 | — | — | — | — | — | — | F-1/F-2/F-8 | 80/10/10 |
| Re-109 | X-32 | 17.0 | A-55 | 73.5 | B-13 | 9.5 | — | — | — | — | — | — | F-1/F-2/F-8 | 80/10/10 |
| Re-110 | X-32 | 16.0 | A-56 | 74.0 | B-13 | 10 | — | — | — | — | — | — | F-1/F-2/F-8 | 80/10/10 |
| Re-111 | X-31 | 24.0 | A-9 | 76.0 | — | — | — | — | — | — | — | — | F-1/F-2 | 70/30 |
| Re-112 | X-32 | 20.0 | A-9 | 80.0 | — | — | — | — | — | — | — | — | F-1/F-2 | 70/30 |
| Re-113 | X-33 | 21.5 | A-9 | 78.5 | — | — | — | — | D-6 | 4.0 | — | — | F-1/F-2 | 70/30 |
| Re-114 | X-31 | 20.5 | A-16 | 73.5 | B-14 | 6 | — | — | — | — | — | — | F-1/F-2 | 75/25 |
| Re-115 | X-33 | 21.5 | A-16 | 78.5 | — | — | — | — | — | — | — | — | F-1/F-2 | 75/25 |

TABLE 6-continued (Table 3-3)

| | Compound (I) | | Resin A | | Photoacid generator B | | Acid diffusion control agent C | | Hydrophobic resin D | | Surfactant E | | Solvent F | |
|---|---|---|---|---|---|---|---|---|---|---|---|---|---|---|
| Resist composition | Type | % by mass | Type | % by mass | Type | % by mass | Type | % by mass | Type | % by mass | Type | % by mass | Type | Mixing ratio (mass ratio) |
| Re-116 | X-34 | 20.0 | A-16 | 80.0 | — | — | — | — | — | — | — | — | F-1/F-2 | 75/25 |
| Re-117 | X-1 | 21.5 | A-50 | 78.5 | — | — | — | — | — | — | — | — | F-1/F-2 | 80/20 |
| Re-118 | X-33 | 21.5 | A-50 | 77.0 | — | — | — | — | D-1 | 1.5 | — | — | F-1/F-2 | 80/20 |
| Re-119 | X-34 | 20.0 | A-50 | 80.0 | — | — | — | — | — | — | — | — | F-1/F-2 | 80/20 |
| Re-120 | X-31 | 15.0 | A-13 | 75.5 | B-14 | 9.5 | — | — | — | — | — | — | F-1/F-2 | 70/30 |
| Re-121 | X-32 | 25.0 | A-13 | 75.0 | — | — | — | — | — | — | — | — | F-1/F-2 | 70/30 |
| Re-122 | X-33 | 23.0 | A-13 | 75.2 | — | — | — | — | D-4 | 1.8 | — | — | F-1/F-2 | 90/10 |
| Re-123 | X-34 | 22.5 | A-13 | 77.5 | — | — | — | — | — | — | — | — | F-1/F-9 | 90/10 |
| Re-124 | X-35 | 24.0 | A-13 | 76.0 | — | — | — | — | — | — | — | — | F-1/F-2 | 75/25 |
| Re-125 | X-36 | 21.5 | A-13 | 78.5 | — | — | — | — | — | — | — | — | F-1/F-2 | 80/20 |
| Re-126 | X-37 | 26.5 | A-13 | 73.5 | — | — | — | — | — | — | — | — | F-1/F-2 | 80/20 |
| Re-127 | X-38 | 21.0 | A-13 | 79.0 | — | — | — | — | — | — | — | — | F-1/F-2 | 90/10 |
| Re-128 | X-39 | 23.0 | A-13 | 77.0 | — | — | — | — | — | — | — | — | F-1/F-2 | 70/30 |
| Re-129 | X-40 | 21.5 | A-13 | 78.5 | — | — | — | — | — | — | — | — | F-1/F-4 | 70/30 |
| Re-130 | X-34 | 24.0 | A-30 | 76.0 | — | — | — | — | — | — | — | — | F-1/F-2/F-8 | 80/15/5 |
| Re-131 | X-35 | 18.0 | A-30 | 75.0 | B-15 | 4.5 | | | D-7 | 2.5 | — | — | F-1/F-2 | 75/25 |
| Re-132 | X-38 | 20.0 | A-30 | 80.0 | — | — | — | — | — | — | — | — | F-1/F-2 | 75/25 |
| Re-133 | X-39 | 14.5 | A-30 | 74.5 | B-15 | 11 | — | — | — | — | — | — | F-1/F-9 | 90/10 |
| Re-134 | X-33 | 25.0 | A-41 | 75.0 | — | — | — | — | — | — | — | — | F-1/F-2 | 80/20 |
| Re-135 | X-34 | 20.0 | A-41 | 79.2 | — | — | — | — | D-4 | 0.8 | — | — | F-1/F-2/F-8 | 80/15/5 |
| Re-136 | X-36 | 24.0 | A-41 | 76.0 | — | — | — | — | — | — | — | — | F-1/F-2 | 75/25 |
| Re-137 | X-40 | 21.5 | A-41 | 78.5 | — | — | — | — | — | — | — | — | F-1/F-2 | 75/25 |
| Re-138 | X-34 | 18.0 | A-35 | 76.0 | B-12 | 6 | — | — | — | — | — | — | F-1/F-2/F-8 | 80/15/5 |
| Re-139 | X-38 | 20.5 | A-35 | 78.1 | — | — | — | — | D-2 | 1.4 | — | — | F-1/F-2 | 80/20 |
| Re-C2 | Z-1 | 9.0 | A-5 | 91.0 | — | — | — | — | — | — | — | — | F-1/F-7 | 80/20 |

TABLE 7

(Table 3-4)

| | Compound (I) | | Resin A | | Photoacid generator B | | Acid diffusion control agent C | | Hydrophobic resin D | | Surfactant E | | Solvent F | |
|---|---|---|---|---|---|---|---|---|---|---|---|---|---|---|
| Resist composition | Type | % by mass | Type | % by mass | Type | % by mass | Type | % by mass | Type | % by mass | Type | % by mass | Type | Mixing ratio (mass ratio) |
| Re-156 | X-49 | 21.5 | A-13 | 76.5 | — | — | — | — | D-5 | 2.0 | — | — | F-1/F-2/F-8 | 80/10/10 |
| Re-157 | X-49 | 20.0 | A-13 | 80.0 | — | — | — | — | — | — | — | — | F-1/F-2/F-8 | 80/10/10 |
| Re-158 | X-6 | 11.5 | A-52 | 72.5 | B-17 | 16 | — | — | — | — | — | — | F-1/F-2 | 70/30 |
| Re-159 | X-50 | 12.0 | A-13 | 84.0 | — | — | — | — | D-5 | 4.0 | — | — | F-1/F-2/F-8 | 80/10/10 |
| Re-160 | X-51 | 21.0 | A-13 | 79.0 | — | — | — | — | — | — | — | — | F-1/F-2/F-8 | 80/10/10 |
| Re-161 | X-52 | 20.0 | A-13 | 80.0 | — | — | — | — | — | — | — | — | F-1/F-2/F-8 | 80/10/10 |
| Re-162 | X-50 | 15.0 | A-50 | 71.5 | B-16 | 11.5 | — | — | D-1 | 2.0 | — | — | F-1/F-2/F-8 | 80/15/5 |
| Re-163 | X-51 | 17.8 | A-55 | 70.0 | B-13 | 12.2 | — | — | D-6 | 4.0 | — | — | F-1/F-2 | 80/20 |
| Re-164 | X-52 | 18.0 | A-56 | 78.0 | — | — | — | — | D-6 | 4.0 | — | — | F-1/F-2/F-8 | 85/10/5 |
| Re-165 | X-53 | 12.5 | A-47 | 78.0 | B-19 | 5.5 | — | — | D-6 | 4.0 | — | — | F-1/F-2/F-8 | 85/10/5 |
| Re-166 | X-54 | 22.0 | A-36 | 78.0 | | | — | — | — | — | — | — | F-1/F-7 | 80/20 |
| Re-167 | X-50 | 8.0 | A-51 | 84.0 | B-16 | 8 | — | — | — | — | — | — | F-1/F-9 | 90/10 |
| Re-168 | X-51 | 25.0 | A-11 | 75.0 | — | — | — | — | — | — | — | — | F-1/F-2 | 75/25 |
| Re-169 | X-52 | 22.0 | A-11 | 74.0 | — | — | — | — | D-6 | 4.0 | — | — | F-1/F-2 | 80/20 |
| Re-170 | X-2 | 12.0 | A-47 | 77.5 | B-16 | 10.5 | — | — | — | — | — | — | F-1/F-2 | 80/20 |
| Re-171 | X-2 | 11.5 | A-52 | 77.5 | B-16 | 11 | — | — | — | — | — | — | F-1/F-2 | 80/20 |
| Re-172 | X-15 | 6.5 | A-42 | 82.5 | B-16 | 11 | — | — | — | — | — | — | F-1/F-2/F-8 | 80/10/10 |
| Re-173 | X-32 | 9.0 | A-51 | 69.5 | B-17 | 15.5 | — | — | D-5 | 6.0 | — | — | F-1/F-2/F-8 | 80/10/10 |
| Re-174 | X-17 | 11.8 | A-41 | 81.0 | B-18 | 7.2 | — | — | — | — | — | — | F-1/F-2 | 70/30 |
| Re-175 | X-34 | 22.0 | A-41 | 74.0 | B-18 | 4 | — | — | — | — | — | — | F-1/F-2 | 70/30 |
| Re-176 | X-16 | 8.0 | A-51 | 86.5 | B-19 | 5.5 | — | — | — | — | — | — | F-1/F-2/F-8 | 85/10/5 |
| Re-177 | X-16 | 18.0 | A-1 | 69.2 | B-20 | 12.8 | — | — | — | — | — | — | F-1/F-2/F-8 | 80/15/5 |
| Re-178 | X-16 | 22.0 | A-30 | 66.2 | B-20 | 10 | — | — | D-6 | 1.8 | — | — | F-1/F-2 | 90/10 |
| Re-179 | X-24 | 5.5 | A-13 | 77.0 | B-21 | 15 | — | — | D-7 | 2.5 | — | — | F-1/F-9 | 90/10 |
| Re-180 | X-24 | 10.0 | A-49 | 72.0 | B-21 | 15.5 | — | — | D-7 | 2.5 | — | — | F-1/F-2 | 70/30 |
| Re-181 | X-31 | 15.0 | A-49 | 71.8 | B-21 | 11 | — | — | D-7 | 2.2 | — | — | F-1/F-2 | 70/30 |
| Re-182 | X-15 | 15.0 | A-1 | 76.5 | B-16 | 8.5 | — | — | — | — | — | — | F-1/F-2/F-8 | 80/15/5 |
| Re-183 | X-32 | 16.0 | A-56 | 69.0 | B-17 | 13 | — | — | D-5 | 2.0 | — | — | F-1/F-2/F-8 | 85/10/5 |
| Re-184 | X-17 | 20.0 | A-30 | 72.0 | B-18 | 6 | — | — | D-5 | 2.0 | — | — | F-1/F-2/F-8 | 85/10/5 |
| Re-185 | X-53 | 18.8 | A-30 | 68.8 | B-19 | 11.2 | — | — | D-4 | 1.2 | — | — | F-1/F-2 | 80/20 |
| Re-186 | X-15 | 17.5 | A-30 | 72.0 | B-16 | 10.5 | — | — | — | — | — | — | F-1/F-2 | 80/20 |
| Re-187 | X-32 | 16.0 | A-47 | 70.0 | B-17 | 12 | — | — | D-5 | 2.0 | — | — | F-1/F-2/F-8 | 85/10/5 |

TABLE 7-continued (Table 3-4)

| Resist composition | Compound (I) Type | Compound (I) % by mass | Resin A Type | Resin A % by mass | Photoacid generator B Type | Photoacid generator B % by mass | Acid diffusion control agent C Type | Acid diffusion control agent C % by mass | Hydrophobic resin D Type | Hydrophobic resin D % by mass | Surfactant E Type | Surfactant E % by mass | Solvent F Type | Solvent F Mixing ratio (mass ratio) |
|---|---|---|---|---|---|---|---|---|---|---|---|---|---|---|
| Re-188 | X-51 | 24.0 | A-60 | 76.0 | — | — | — | — | — | — | — | — | F-1/F-2/F-8 | 85/10/5 |
| Re-189 | X-52 | 12.0 | A-50 | 80.0 | B-18 | 8 | — | — | — | — | — | — | F-1/F-2/F-8 | 80/10/10 |
| Re-190 | X-53 | 15.5 | A-50 | 69.0 | B-19 | 15.5 | — | — | — | — | — | — | F-1/F-2 | 70/30 |
| Re-191 | X-54 | 22.0 | A-60 | 76.0 | — | — | — | — | D-4 | 2.0 | — | — | F-1/F-2 | 70/30 |
| Re-192 | X-31 | 12.0 | A-20 | 75.5 | B-21 | 12.5 | — | — | | | — | — | F-1/F-2 | 80/20 |
| Re-193 | X-53 | 9.5 | A-6 | 75.5 | B-20 | 11 | — | — | D-6 | 4.0 | — | — | F-1/F-2 | 80/20 |
| Re-194 | X-36 | 15.5 | A-11 | 70.5 | B-19 | 12 | — | — | D-4 | 2.0 | — | — | F-1/F-2/F-8 | 80/10/10 |
| Re-195 | X-52 | 12.0 | A-6 | 74.5 | B-18 | 11.5 | — | — | D-6 | 2.0 | — | — | F-1/F-2 | 80/20 |
| Re-C4 | Z-1 | 15.0 | A-50 | 85.0 | — | — | — | — | — | — | — | — | F-1/F-7 | 80/20 |

[Pattern Formation (1): EUV Exposure and Organic Solvent Development]

A composition for forming an underlayer film, AL412 (manufactured by Brewer Science, Inc.), was applied onto a silicon wafer and baked at 205° C. for 60 seconds to form an underlying film having a film thickness of 20 nm. A resin composition shown in Table 4 was applied thereon and baked at 100° C. for 60 seconds to form a resist film having a film thickness of 30 nm.

The silicon wafer having the obtained resist film was subjected to patternwise irradiation using an EUV exposure device (manufactured by Exitech Ltd., Micro Exposure Tool, NA 0.3, Quadrupol, outer sigma 0.68, inner sigma 0.36). Further, as a reticle, a mask having a line size=20 nm and a line:space=1:1 was used.

The resist film after the exposure was baked at 90° C. for 60 seconds, developed with n-butyl acetate for 30 seconds, and spin-dried to obtain a negative tone pattern.

<Evaluation of Pattern Shape: EUV Exposure and Organic Solvent Development>

A cross-sectional shape of a line pattern having an average line width of 20 nm was observed, a pattern line width Lb at the bottom of the resist pattern and a pattern line width La at the upper part of the resist pattern were measured using a critical dimension scanning electron microscope (S-9380II manufactured by SEM), and a case of $(Lb/La)<1.03$ was evaluated as "excellent", a case of $1.03<(Lb/La)\leq 1.06$ was evaluated as "good", a case of $1.06<(Lb/La)\leq 1.1$ was evaluated as "slightly good", and a case of $1.1<(Lb/La)$ was evaluated as "poor". The results are shown in Table 4.

In Tables 4 and 5 below, "Type of anionic moiety in structural moiety X" in the "Characteristics of compound (I)" column indicates which of the above-described anion functional groups of Formulae (AA-1) to (AA-3) the anionic moiety represented by $A_{11}^-$ in the structural moiety X in the compound (I) corresponds to. Incidentally, "-" represents a case of corresponding to none of those.

In addition, "Type of anionic moiety in structural moiety Y" in the "Characteristics of compound (I)" column indicates which of the above-described anion functional groups of Formulae (BB-1) to (BB-5) the anionic moiety represented by $B_1^-$ in the structural moiety Y in the compound (I) corresponds to. Incidentally, "-" represents a case of corresponding to none of those.

In addition, "Molecular structure" in the "Characteristics of compound (I)" column indicates which of the structures of Formulae (I)-1 to (I)-3 mentioned above the compound (I) corresponds to. "-" represents a case where the compound (1) corresponds to none of the structures of Formulae (I)-1 to (I)-3.

In addition, "Type (1) of anionic functional group" in the "Characteristics of compound (I)" column indicates which of the monovalent or divalent anionic functional groups of Formulae (A-1) to (A-4) mentioned above $A_{11}$ to $A_{16}$ correspond to in a case where the compound (I) corresponds to the structures of Formulae (I)-1 to (I)-3 mentioned above.

In addition, "Type (2) of anionic functional group" in the "Characteristics of compound (I)" column indicates which of the monovalent or divalent anionic functional groups of Formulae (B-1) to (B-11) mentioned above $B_{11}$ to $B_{13}$ correspond to in a case where the compound (I) corresponds to the structures of Formulae (I)-1 to (I)-3 mentioned above. "-" is intended to be a case where the compound (I) corresponds to none of the monovalent or divalent anionic functional groups of Formulae (B-1) to (B-11).

In addition, in "Presence or absence of repeating unit having acid group" in the "Characteristics of resin A" column, "A" indicates a case where the resin (A) includes a repeating unit having an acid group, and "B" indicates a case where the resin (A) does not include a repeating unit having an acid group.

TABLE 8

| Table 4-1 (Organic solvent development) | Type of resist composition | Type of compound (I) or comparative compound | Characteristics of compound (I): Type of anionic moiety in structural moiety X | Type of anionic moiety in structural moiety Y | Molecular structure | Type of anionic functional group (1) | Type of anionic functional group (2) | Characteristics of resin A: Type | Presence or absence of repeating unit having acid group | Evaluation results (pattern shape) |
|---|---|---|---|---|---|---|---|---|---|---|
| Comparative Example 1-1 | Re-C1 | Z-1 | — | — | — | — | — | A-5 | A | Poor |
| Example 1-1 | Re-1 | X 2 | AA-2 | BB-2 | (I)-2 | A-2/A-3 | B-1 | A-2 | B | Good |
| Example 1-2 | Re-2 | X-3 | AA-1 | BB-2 | (I)-3 | A-1 | B-2 | A-4 | B | Good |

TABLE 8-continued

| Table 4-1 (Organic solvent development) | Type of resist composition | Type of compound (I) or comparative compound | Characteristics of compound (I): Type of anionic moiety in structural moiety X | Type of anionic moiety in structural moiety Y | Molecular structure | Type of anionic functional group (1) | Type of anionic functional group (2) | Characteristics of resin A: Type | Presence or absence of repeating unit having acid group | Evaluation results (pattern shape) |
|---|---|---|---|---|---|---|---|---|---|---|
| Example 1-3 | Re-3 | X-4 | AA-1 | BB-3 | (I)-3 | A-1 | B-3 | A-3 | A | Excellent |
| Example 1-4 | Re-4 | X-5 | AA-2 | BB-3 | (I)-2 | A-2/A-3 | B-3 | A-1 | A | Excellent |
| Example 1-5 | Re-5 | X-6 | AA-1 | BB-4 | (I)-1 | A-1 | B-10 | A-12 | B | Good |
| Example 1-6 | Re-6 | X-7 | AA-2 | BB-4 | (I)-3 | A-2 | B-4 | A-14 | B | Good |
| Example 1-7 | Re-7 | X-8 | AA-1 | BB-5 | (I)-1 | A-1 | B-11 | A-3 | A | Excellent |
| Example 1-8 | Re-8 | X-9 | AA-2 | BB-5 | (I)-2 | A-2/A-3 | B-5 | A-6 | A | Excellent |
| Example 1-9 | Re-9 | X-10 | AA-1 | BB-1 | (I)-3 | A-1 | B-7 | A-7 | A | Excellent |
| Example 1-10 | Re-10 | X-11 | AA-2 | BB-1 | (I)-3 | A-2 | B-7 | A-8 | B | Good |
| Example 1-11 | Re-11 | X-12 | AA-1 | — | (I)-3 | A-1 | — | A-16 | B | Slightly good |
| Example 1-12 | Re-12 | X-13 | AA-2 | — | (I)-3 | A-2 | — | A-10 | A | Good |
| Example 1-13 | Re-13 | X-14 | AA-2 | BB-2 | | A-2/A-3 | B-1 | A-13 | A | Good |
| Example 1-14 | Re-14 | X-7 | AA-2 | BB-4 | (I)-3 | A-2 | B-4 | A-9 | A | Excellent |
| Example 1-15 | Re-15 | X-1 | AA-1 | BB-2 | (I)-1 | A-1 | B-8 | A-11 | A | Excellent |
| Example 1-16 | Re-16 | X-3 | AA-1 | BB-2 | (I)-3 | A-1 | B-2 | A-15 | A | Excellent |
| Example 1-17 | Re-17 | X-2 | AA-2 | BB-2 | (I)-2 | A-2/A-3 | B-1 | A-2 | B | Good |
| Example 1-18 | Re-18 | X-12 | AA-1 | — | (I)-3 | A-1 | — | A-10 | A | Good |
| Example 1-19 | Re-19 | X-7 | AA-2 | BB-4 | (I)-3 | A-2 | B-4 | A-15 | A | Excellent |
| Example 1-20 | Re-20 | X-11 | AA-2 | BB-1 | (I)-3 | A-2 | B-7 | A-6 | A | Excellent |
| Example 1-21 | Re-21 | X-6 | AA-1 | BB-4 | (I)-1 | A-1 | B-10 | A-11 | A | Excellent |
| Example 1-22 | Re-22 | X-8 | AA-1 | BB-5 | (I)-1 | A-1 | B-11 | A-6 | A | Excellent |
| Example 1-23 | Re-23 | X-9 | AA-2 | BB-5 | (I)-2 | A-2/A-3 | B-5 | A-13 | A | Excellent |
| Example 1-24 | Re-24 | X-2 | AA-2 | BB-2 | (I)-2 | A-2/A-3 | B-1 | A-12 | B | Good |
| Example 1-25 | Re-25 | X-13 | AA-2 | — | (I)-3 | A-2 | — | A-8 | B | Slightly good |
| Example 1-26 | Re-26 | X-1 | AA-1 | BB-2 | (I)-1 | A-1 | B-8 | A-15 | A | Excellent |
| Example 1-27 | Re-27 | X-2 | AA-2 | BB-2 | (I)-2 | A-2/A-3 | B-1 | A-14 | B | Good |
| Example 1-28 | Re-28 | X-11 | AA-2 | BB-1 | (I)-3 | A-2 | B-7 | A-7 | A | Excellent |
| Example 1-29 | Re-29 | X-10 | AA-1 | BB-1 | (I)-3 | A-1 | B-7 | A-13 | A | Excellent |
| Example 1-30 | Re-30 | X-5 | AA-2 | BB-3 | (I)-2 | A-2/A-3 | B-3 | A-5 | A | Excellent |
| Example 1-31 | Re-31 | X-7 | AA-2 | BB-4 | (I)-3 | A-2 | B-4 | A-12 | B | Good |
| Example 1-32 | Re-32 | X-4 | AA-1 | BB-3 | (I)-3 | A-1 | B-3 | A-3 | A | Excellent |
| Example 1-33 | Re-33 | X-1 | AA-1 | BB-2 | (I)-1 | A-1 | B-8 | A-1 | A | Excellent |
| | | X-3 | AA-1 | BB-2 | (I)-3 | A-1 | B-2 | | | |

TABLE 9

| Table 4-2 (Organic solvent development) | Type of resist composition | Type of compound (I) or comparative compound | Characteristics of compound (I): Type of anionic moiety in structural moiety X | Type of anionic moiety in structural moiety Y | Molecular structure | Type of anionic functional group (1) | Type of anionic functional group (2) | Characteristics of resin A: Type | Presence or absence of repeating unit having acid group | Evaluation results (pattern shape) |
|---|---|---|---|---|---|---|---|---|---|---|
| Example 1-34 | Re-34 | X-7 | AA-2 | BB-4 | (I)-3 | A-2 | B-4 | A-2/A-5 | B/A | Excellent |
| Example 1-35 | Re-35 | X-1 | AA-1 | BB-2 | (I)-1 | A-1 | B-8 | A-1/A-6 | A/A | Excellent |
| Example 1-36 | Re-36 | X-5 | AA-2 | BB-3 | (I)-2 | A-2/A-3 | B-3 | A-1/A-10 | A/A | Excellent |
| Example 1-37 | Re-37 | X-2 | AA-2 | BB-2 | (I)-2 | A-2/A-3 | B-1 | A-9 | A | Excellent |
| Example 1-38 | Re-38 | X-7 | AA-2 | BB-4 | (I)-3 | A-2 | B-4 | A-11 | A | Excellent |
| Example 1-39 | Re-39 | X-3 | AA-1 | BB-2 | (I)-3 | A-1 | B-2 | A-5/A-8 | A/B | Excellent |
| Example 1-40 | Re-40 | X-22 | AA-2 | BB-4 | (I)-2 | A-2/A-3 | B-4 | A-41 | A | Excellent |
| Example 1-41 | Re-41 | X-27 | AA-2 | BB-5 | (I)-3 | A-2 | B-5 | A-46 | A | Excellent |
| Example 1-42 | Re-42 | X-29 | AA-1/AA-2 | BB-2 | (I)-2 | A-1/A-3 | B-1 | A-40 | A | Excellent |
| Example 1-43 | Re-43 | X-23 | AA-2 | BB-1 | (I)-2 | A-2/A-3 | B-7 | A-34 | A | Excellent |
| Example 1-44 | Re-44 | X-28 | AA-1/AA-2 | BB-2 | (I)-1 | A-1/A-2 | B-8 | A-36 | A | Excellent |
| Example 1-45 | Re-45 | X-15 | AA-1 | BB-3 | (I)-1 | A-1 | B-9 | A-43 | A | Excellent |
| Example 1-46 | Re-46 | X-26 | AA-2 | BB-3 | (I)-3 | A-2 | B-3 | A-33 | A | Excellent |
| Example 1-47 | Re-47 | X-24 | AA-2 | — | (I)-2 | A-2/A-3 | — | A-31 | A | Good |
| Example 1-48 | Re-48 | X-21 | AA-2 | BB-5 | (I)-1 | A-2 | B-11 | A-44 | A | Excellent |
| Example 1-49 | Re-49 | X-25 | AA-2 | BB-2 | (I)-3 | A-2 | B-1 | A-37 | B | Good |
| Example 1-50 | Re-50 | X-17 | AA-1 | BB-5 | (I)-3 | A-1 | B-6 | A-39 | A | Excellent |
| Example 1-51 | Re-51 | X-16 | AA-1 | BB-4 | (I)-3 | A-1 | B-4 | A-30 | A | Excellent |
| Example 1-52 | Re-52 | X-18 | AA-2 | BB-2 | (I)-1 | A-2 | B-8 | A-42 | A | Excellent |
| Example 1-53 | Re-53 | X-20 | AA-1 | BB-4 | (I)-1 | A-1 | B-10 | A-38 | A | Excellent |
| Example 1-54 | Re-54 | X-30 | AA-1/AA-2 | BB-2 | (I)-3 | A-1/A-2 | B-2 | A-35 | A | Excellent |
| Example 1-55 | Re-55 | X-19 | AA-2 | BB-3 | (I)-1 | A-2 | B-9 | A-45 | A | Excellent |
| Example 1-56 | Re-56 | X-1 | AA-1 | BB-2 | (I)-1 | A-1 | B-8 | A-32 | B | Good |

TABLE 9-continued

| Table 4-2 (Organic solvent development) | Type of resist composition | Type of compound (I) or comparative compound | Characteristics of compound (I) Type of anionic moiety in structural moiety X | Type of anionic moiety in structural moiety Y | Molecular structure | Type of anionic functional group (1) | Type of anionic functional group (2) | Characteristics of resin A Type | Presence or absence of repeating unit having acid group | Evaluation results (pattern shape) |
|---|---|---|---|---|---|---|---|---|---|---|
| Example 1-57 | Re-57 | X-7 | AA-2 | BB-4 | (I)-3 | A-2 | B-4 | A-1/A-39 | A/A | Excellent |
| Example 1-58 | Re-58 | X-2 | AA-2 | BB-2 | (I)-2 | A-2/A-3 | B-1 | A-5 | A | Excellent |
| Example 1-59 | Re-59 | X-9 | AA-2 | BB-5 | (I)-2 | A-2/A-3 | B-5 | A-13/A-33 | A/A | Excellent |
| Example 1-60 | Re-100 | X-31 | AA-1/AA-2 | BB-2 | (I)-1 | A-1/A-2 | B-8 | A-47 | A | Excellent |
| Example 1-61 | Re-101 | X-31 | AA-1/AA-2 | BB-2 | (I)-1 | A-1/A-2 | B-8 | A-48 | A | Excellent |
| Example 1-62 | Re-102 | X-1 | AA-1 | BB-2 | (I)-1 | A-1 | B-8 | A-49 | A | Excellent |
| Example 1-63 | Re-103 | X-31 | AA-1/AA-2 | BB-2 | (I)-1 | A-1/A-2 | B-8 | A-50 | A | Excellent |
| Example 1-64 | Re-104 | X-32 | AA-1 | BB-2 | (I)-1 | A-1 | B-8 | A-51 | A | Excellent |
| Example 1-65 | Re-105 | X-33 | AA-2 | BB-3 | (I)-2 | A-2/A-3 | B-3 | A-52 | A | Excellent |
| Example 1-66 | Re-106 | X-32 | AA-1 | BB-2 | (I)-1 | A-1 | B-8 | A-53 | A | Excellent |
| Example 1-67 | Re-107 | X-34 | AA-2 | BB-1 | (I)-3 | A-2 | B-7 | A-53 | A | Excellent |
| Example 1-68 | Re-108 | X-32 | AA-1 | BB-2 | (I)-1 | A-1 | B-8 | A-54 | A | Excellent |
| Example 1-69 | Re-109 | X-32 | AA-1 | BB-2 | (I)-1 | A-1 | B-8 | A-55 | A | Excellent |
| Example 1-70 | Re-110 | X-32 | AA-1 | BB-2 | (I)-1 | A-1 | B-8 | A-56 | A | Excellent |

TABLE 10

| Table 4-3 (Organic solvent development) | Type of resist composition | Type of compound (I) or comparative compound | Characteristics of compound (I) Type of anionic moiety in structural moiety X | Type of anionic moiety in structural moiety Y | Molecular structure | Type of anionic functional group (1) | Type of anionic functional group (2) | Characteristics of resin A Type | Presence or absence of repeating unit having acid group | Evaluation results (pattern shape) |
|---|---|---|---|---|---|---|---|---|---|---|
| Example 1-71 | Re-111 | X-31 | AA-1/AA-2 | BB-2 | (I)-1 | A-1/A-2 | B-8 | A-9 | A | Excellent |
| Example 1-72 | Re-112 | X-32 | AA-1 | BB-2 | (I)-1 | A-1 | B-8 | A-9 | A | Excellent |
| Example 1-73 | Re-113 | X-33 | AA-2 | BB-3 | (I)-2 | A-2/A-3 | B-3 | A-9 | A | Excellent |
| Example 1-74 | Re-114 | X-31 | AA-1/AA-2 | BB-2 | (I)-1 | A-1/A-2 | B-8 | A-16 | B | Good |
| Example 1-75 | Re-115 | X-33 | AA-2 | BB-3 | (I)-2 | A-2/A-3 | B-3 | A-16 | B | Good |
| Example 1-76 | Re-116 | X-34 | AA-2 | BB-1 | (I)-3 | A-2 | B-7 | A-16 | B | Good |
| Example 1-77 | Re-117 | X-1 | AA-1 | BB-2 | (I)-1 | A-1 | B-8 | A-50 | A | Excellent |
| Example 1-78 | Re-118 | X-33 | AA-2 | BB-3 | (I)-2 | A-2/A-3 | B-3 | A-50 | A | Excellent |
| Example 1-79 | Re-119 | X-34 | AA-2 | BB-1 | (I)-3 | A-2 | B-7 | A-50 | A | Excellent |
| Example 1-80 | Re-120 | X-31 | AA-1/AA-2 | BB-2 | (I)-1 | A-1/A-2 | B-8 | A-13 | A | Excellent |
| Example 1-81 | Re-121 | X-32 | AA-1 | BB-2 | (I)-1 | A-1 | B-8 | A-13 | A | Excellent |
| Example 1-82 | Re-122 | X-33 | AA-2 | BB-3 | (I)-2 | A-2/A-3 | B-3 | A-13 | A | Excellent |
| Example 1-83 | Re-123 | X-34 | AA-2 | BB-1 | (I)-3 | A-2 | B-7 | A-13 | A | Excellent |
| Example 1-84 | Re-124 | X-35 | AA-2 | BB-2 | (I)-2 | A-2/A-3 | B-1 | A-13 | A | Excellent |
| Example 1-85 | Re-125 | X-36 | AA-2 | BB-3 | (I)-2 | A-2/A-3 | B-3 | A-13 | A | Excellent |
| Example 1-86 | Re-126 | X-37 | AA-2 | BB-5 | (I)-2 | A-2/A-3 | B-5 | A-13 | A | Excellent |
| Example 1-87 | Re-127 | X-38 | M-2 | BB-1 | (I)-3 | A-2 | B-7 | A-13 | A | Excellent |
| Example 1-88 | Re-128 | X-39 | AA-2 | BB-1 | (I)-3 | A-2 | B-7 | A-13 | A | Excellent |
| Example 1-89 | Re-129 | X-40 | AA-2 | BB-2 | (I)-2 | A-2/A-3 | B-1 | A-13 | A | Excellent |
| Example 1-90 | Re-130 | X-34 | AA-2 | BB-1 | (I)-3 | A-2 | B-7 | A-30 | A | Excellent |
| Example 1-91 | Re-131 | X-35 | AA-2 | BB-2 | (I)-2 | A-2/A-3 | B-1 | A-13 | A | Excellent |
| Example 1-92 | Re-132 | X-38 | AA-2 | BB-1 | (I)-3 | A-2 | B-7 | A-30 | A | Excellent |
| Example 1-93 | Re-133 | X-39 | AA-2 | BB-1 | (I)-3 | A-2 | B-7 | A-30 | A | Excellent |
| Example 1-94 | Re-134 | X-33 | AA-2 | BB-3 | (I)-2 | A-2/A-3 | B-3 | A-41 | A | Excellent |
| Example 1-95 | Re-135 | X-34 | AA-2 | BB-1 | (I)-3 | A-2 | B-7 | A-41 | A | Excellent |
| Example 1-96 | Re-136 | X-36 | AA-2 | BB-3 | (I)-2 | A-2/A-3 | B-3 | A-41 | A | Excellent |
| Example 1-97 | Re-137 | X-40 | AA-2 | BB-2 | (I)-2 | A-2/A-3 | B-1 | A-41 | A | Excellent |
| Example 1-98 | Re-138 | X-34 | AA-2 | BB-1 | (I)-3 | A-2 | B-7 | A-35 | A | Excellent |
| Example 1-99 | Re-139 | X-38 | AA-2 | BB-1 | (I)-3 | A-2 | B-7 | A-35 | A | Excellent |
| Comparative Example 1-2 | Re-C2 | Z-1 | — | — | — | — | — | — | — | Poor |

TABLE 11

| | | | Characteristics of compound (I) | | | | | Characteristics of resin A | | |
|---|---|---|---|---|---|---|---|---|---|---|
| Table 4-4 (Organic solvent development) | Type of resist composition | Type of compound (I) or comparative compound | Type of anionic moiety in structural moiety X | Type of anionic moiety in structural moiety Y | Molecular structure | Type of anionic functional group (1) | Type of anionic functional group (2) | Type | Presence or absence of repeating unit having acid group | Evaluation results (pattern shape) |
| Example 1-100 | Re-156 | X-49 | AA-2 | BB-2 | (I)-1 | A-2 | B-8 | A-13 | A | Excellent |
| Example 1-101 | Re-157 | X-49 | AA-2 | BB-2 | (I)-1 | A-2 | B-8 | A-13 | A | Excellent |
| Example 1-102 | Re-158 | X-6 | AA-1 | BB-4 | (I)-1 | A-1 | B-10 | A-52 | A | Excellent |
| Example 1-103 | Re-159 | X-50 | AA-1 | BB-3 | (I)-3 | A-1 | B-3 | A-13 | A | Excellent |
| Example 1-104 | Re-160 | X-51 | AA-2 | BB-1 | (I)-2 | A-2/A-3 | B-7 | A-13 | A | Excellent |
| Example 1-105 | Re-161 | X-52 | AA-2 | BB-5 | (I)-2 | A-2/A-3 | B-5 | A-13 | A | Excellent |
| Example 1-106 | Re-162 | X-50 | AA-1 | BB-3 | (I)-3 | A-1 | B-3 | A-50 | A | Excellent |
| Example 1-107 | Re-163 | X-51 | AA-2 | BB-1 | (I)-2 | A-2/A-3 | B-7 | A-55 | A | Excellent |
| Example 1-108 | Re-164 | X-52 | AA-2 | BB-5 | (I)-2 | A-2/A-3 | B-5 | A-56 | A | Excellent |
| Example 1-109 | Re-165 | X-53 | AA-1/AA-2 | BB-2 | (I)-1 | A-1/A-2 | B-8 | A-47 | A | Excellent |
| Example 1-110 | Re-166 | X-54 | AA-1 | BB-2 | (I)-1 | A-1 | B-8 | A-36 | A | Excellent |
| Example 1-111 | Re-167 | X-50 | AA-1 | BB-3 | (I)-3 | A-1 | B-3 | A-51 | A | Excellent |
| Example 1-112 | Re-168 | X-51 | AA-2 | BB-1 | (I)-2 | A-2/A-3 | B-7 | A-11 | A | Excellent |
| Example 1-113 | Re-169 | X-52 | AA-2 | BB-5 | (I)-2 | A-2/A-3 | B-5 | A-11 | A | Excellent |
| Example 1-114 | Re-170 | X-2 | AA-2 | BB-2 | (I)-2 | A-2/A-3 | B-1 | A-47 | A | Excellent |
| Example 1-115 | Re-171 | X-2 | AA-2 | BB-2 | (I)-2 | A-2/A-3 | B-1 | A-52 | A | Excellent |
| Example 1-116 | Re-172 | X-1 5 | AA-1 | BB-3 | (I)1 | A-1 | B-9 | A-42 | A | Excellent |
| Example 1-117 | Re-173 | X-32 | AA-1 | BB-2 | (I)-1 | A-1 | B-8 | A-51 | A | Excellent |
| Example 1-118 | Re-174 | X-17 | AA-1 | BB-5 | (I)-3 | A-1 | B-6 | A-41 | A | Excellent |
| Example 1-119 | Re-175 | X-34 | AA-2 | BB-1 | (I)-3 | A-2 | B-7 | A-41 | A | Excellent |
| Example 1-120 | Re-176 | X-16 | AA-1 | BB-4 | (I)-3 | A-1 | B-4 | A-51 | A | Excellent |
| Example 1-121 | Re-177 | X-16 | AA-1 | BB-4 | (I)-3 | A-1 | B-4 | A-1 | A | Excellent |
| Example 1-122 | Re-178 | X-16 | AA-1 | BB-4 | (I)-3 | A-1 | B-4 | A-30 | A | Excellent |
| Example 1-123 | Re-179 | X-24 | AA-2 | — | (I)-2 | A-2/A-3 | — | A-13 | A | Good |
| Example 1-124 | Re-180 | X-24 | AA-2 | — | (I)-2 | A-2/A-3 | — | A-49 | A | Good |
| Example 1-125 | Re-181 | X-31 | AA-1/AA-2 | BB-2 | (I)-1 | A-1/A-2 | B-8 | A-49 | A | Excellent |
| Example 1-126 | Re-182 | X-15 | AA-1 | BB-3 | (I)-1 | A-1 | B-9 | A-1 | A | Excellent |
| Example 1-127 | Re-183 | X-32 | AA-1 | BB-2 | (I)-1 | A-1 | B-8 | A-56 | A | Excellent |
| Example 1-128 | Re-184 | X-17 | AA-1 | BB-5 | (I)-3 | A-1 | B-6 | A-30 | A | Excellent |
| Example 1-129 | Re-185 | X-53 | AA-1/AA-2 | BB-2 | (I)-1 | A-1/A-2 | B-8 | A-30 | A | Excellent |
| Example 1-130 | Re-186 | X-15 | AA-1 | BB-3 | (I)-1 | A-1 | B-9 | A-30 | A | Excellent |
| Example 1-131 | Re-187 | X-32 | AA-1 | BB-2 | (I)-1 | A-1 | B-8 | A-47 | A | Excellent |
| Example 1-132 | Re-188 | X-51 | AA-2 | BB-1 | (I)-2 | A-2/A-3 | B-7 | A-60 | B | Good |
| Example 1-133 | Re-189 | X-52 | AA-2 | BB-5 | (I)-2 | A-2/A-3 | B-5 | A-50 | A | Excellent |
| Example 1-134 | Re-190 | X-53 | AA-1/AA-2 | BB-2 | (I)-1 | A-1/A-2 | B-8 | A-50 | A | Excellent |
| Example 1-135 | Re-191 | X-54 | AA-1 | BB-2 | (I)-1 | A-1 | B-8 | A-60 | B | Good |
| Example 1-136 | Re-192 | X-31 | AA-1/AA-2 | BB-2 | (I)-1 | A-1/A-2 | B-8 | A-20 | B | Good |
| Example 1-137 | Re-193 | X-53 | AA-1/AA-2 | BB-2 | (I)-1 | A-1/A-2 | B-8 | A-6 | A | Excellent |
| Example 1-138 | Re-194 | X-36 | AA-2 | BB-3 | (I)-2 | A-2/A-3 | B-3 | A-11 | A | Excellent |
| Example 1-139 | Re-195 | X-52 | AA-2 | BB-5 | (I)-2 | A-2/A-3 | B-5 | A-6 | A | Excellent |
| Comparative Example 1-3 | Re-C4 | Z-1 | — | — | — | — | — | — | — | Poor |

From the results in Table 4, it was confirmed that in a case where the composition satisfies any one of the following condition (X1) or (X2) (preferably all of the conditions), the shape of a pattern thus formed is more excellent.

(X1) The acid-decomposable resin further includes a repeating unit having an acid group.

(X2) The compound (I) is a compound represented by any one of Formula (I)-1, (I)-2, or (I)-3; in Formula (I)-1, $B_{11}^-$ represents a divalent anionic functional group of any one of Formula (B-8), . . . , or (B-11) mentioned above, and $A_{13}^-$ represents any one of Formula (A-1), (A-2), or (A-4) mentioned above; in Formula (I)-2, $B_{12}^-$ represents a monovalent anionic functional group of any one of Formula (B-1), . . . , or (B-7) mentioned above, $A_{13}^-$ represents a monovalent anionic functional group of any one of Formula (A-1), (A-2), or (A-4) mentioned above, and $A_{14}^-$ represents a divalent anionic functional group represented by Formula (A-3) mentioned above; and in Formula (I)-3, $B_{13}^-$ represents a monovalent anionic functional group of any one of Formula (B-1), . . . , or (B-7) mentioned above, and $A_{15}^-$ and $A_{16}^-$ represent monovalent anionic functional groups of any one of Formula (A-1), (A-2), or (A-4) mentioned above.

[Pattern Formation (2): EUV Exposure and Aqueous Alkali Solution Development]

A composition for forming an underlayer film, AL412 (manufactured by Brewer Science, Inc.), was applied onto a silicon wafer and baked at 205° C. for 60 seconds to form an underlying film having a film thickness of 20 nm. A resin composition shown in Table 5 was applied thereon and baked at 100° C. for 60 seconds to form a resist film having a film thickness of 30 nm.

The silicon wafer having the obtained resist film was subjected to patternwise irradiation using an EUV exposure device (manufactured by Exitech Ltd., Micro Exposure Tool, NA 0.3, Quadrupol, outer sigma 0.68, inner sigma 0.36). Further, as a reticle, a mask having a line size=20 nm and a line:space=1:1 was used.

The resist film after the exposure was baked at 90° C. for 60 seconds, developed with an aqueous tetramethylammonium hydroxide solution (2.38% by mass) for 30 seconds, and then rinsed with pure water for 30 seconds. Thereafter, the resist film was spin-dried to obtain a positive tone pattern.

<Evaluation of Pattern Shape: EUV Exposure, Aqueous Alkali Solution Development>

A cross-sectional shape of a line pattern having an average line width of 20 nm was observed, a pattern line width Lb at the bottom of the resist pattern and a pattern line width La at the upper part of the resist pattern were measured using a critical dimension scanning electron microscope (S-9380II manufactured by SEM), and a case of $(La/Lb)\leq 1.03$ was evaluated as “excellent”, a case of $1.03<(La/Lb)\leq 1.06$ was evaluated as “good”, a case of $1.06<(La/Lb)\leq 1.1$ was evaluated as “slightly good”, and a case of $1.1<(La/Lb)$ was evaluated as “poor”. The results are shown in Table 5.

TABLE 12

| | | | Characteristics of compound (I) | | | | | Characteristics of resin A | | |
|---|---|---|---|---|---|---|---|---|---|---|
| Table 5-1 (Alkali development) | Type of resist composition | Type of compound (I) or comparative compound | Type of anionic moiety in structural moiety X | Type of anionic moiety in structural moiety Y | Molecular structure | Type of anionic functional group (1) | Type of anionic functional group (2) | Type | Presence or absence of repeating unit having acid group | Evaluation results (pattern shape) |
| Comparative Example 2-1 | Re-C1 | Z-1 | — | — | — | — | — | A-5 | A | Poor |
| Example 2-1 | Re-1 | X-2 | AA-2 | BB-2 | (I)-2 | A-2/A-3 | B-1 | A-2 | B | Good |
| Example 2-2 | Re-2 | X-3 | AA-1 | BB-2 | (I)-3 | A-1 | B-2 | A-4 | B | Good |
| Example 2-3 | Re-3 | X-4 | AA-1 | BB-3 | (I)-3 | A-1 | B-3 | A-3 | A | Excellent |
| Example 2-4 | Re-4 | X-5 | AA-2 | BB-3 | (I)-2 | A-2/A-3 | B-3 | A-1 | A | Excellent |
| Example 2-5 | Re-5 | X-6 | AA-1 | BB-4 | (I)-1 | A-1 | B-10 | A-12 | B | Good |
| Example 2-6 | Re-6 | X-7 | AA-2 | BB-4 | (I)-3 | A-2 | B-4 | A-14 | B | Good |
| Example 2-7 | Re-7 | X-8 | AA-1 | BB-5 | (I)-1 | A-1 | B-11 | A-3 | A | Excellent |
| Example 2-8 | Re-8 | X-9 | AA-2 | BB-5 | (I)-2 | A-2/A-3 | B-5 | A-6 | A | Excellent |
| Example 2-9 | Re-9 | X-10 | AA-1 | BB-1 | (I)-3 | A-1 | B-7 | A-7 | A | Excellent |
| Example 2-10 | Re-10 | X-11 | AA-2 | BB-1 | (I)-3 | A-2 | B-7 | A-8 | B | Good |
| Example 2-11 | Re-11 | X-12 | AA-1 | — | (I)-3 | A-1 | — | A-16 | B | Slightly good |
| Example 2-12 | Re-12 | X-13 | AA-2 | — | (I)-3 | A-2 | — | A-10 | A | Good |
| Example 2-13 | Re-13 | X-14 | AA-2 | BB-2 | — | A-2/A-3 | B-1 | A-13 | A | Good |
| Example 2-14 | Re-14 | X-7 | AA-2 | BB-4 | (I)-3 | A-2 | B-4 | A-9 | A | Excellent |
| Example 2-15 | Re-15 | X-1 | AA-1 | BB-2 | (I)-1 | A-1 | B-8 | A-11 | A | Excellent |
| Example 2-16 | Re-16 | X-3 | AA-1 | BB-2 | (I)-3 | A-1 | B-2 | A-15 | A | Excellent |
| Example 2-17 | Re-17 | X-2 | AA-2 | BB-2 | (I)-2 | A-2/A-3 | B-1 | A-2 | B | Good |
| Example 2-18 | Re-18 | X-12 | AA-1 | — | (I)-3 | A-1 | — | A-10 | A | Good |
| Example 2-19 | Re-19 | X-7 | AA-2 | BB-4 | (I)-3 | A-2 | B-4 | A-15 | A | Excellent |
| Example 2-20 | Re-20 | X-11 | AA-2 | BB-1 | (I)-3 | A-2 | B-7 | A-6 | A | Excellent |
| Example 2-21 | Re-21 | X-6 | AA-1 | BB-4 | (I)-1 | A-1 | B-10 | A-11 | A | Excellent |
| Example 2-22 | Re-22 | X-8 | AA-1 | BB-5 | (I)-1 | A-1 | B-11 | A-6 | A | Excellent |
| Example 2-23 | Re-23 | X-9 | AA-2 | BB-5 | (I)-2 | A-2/A-3 | B-5 | A-13 | A | Excellent |
| Example 2-24 | Re-24 | X-2 | AA-2 | BB-2 | (I)-2 | A-2/A-3 | B-1 | A-12 | B | Good |
| Example 2-25 | Re-25 | X-13 | AA-2 | — | (I)-3 | A-2 | — | A-8 | B | Slightly good |
| Example 2-26 | Re-26 | X-1 | AA-1 | BB-2 | (I)-1 | A-1 | B-8 | A-15 | A | Excellent |
| Example 2-27 | Re-27 | X-2 | AA-2 | BB-2 | (I)-2 | A-2/A-3 | B-1 | A-14 | B | Good |
| Example 2-28 | Re-28 | X-11 | AA-2 | BB-1 | (I)-3 | A-2 | B-7 | A-7 | A | Excellent |
| Example 2-29 | Re-29 | X-10 | AA-1 | BB-1 | (I)-3 | A-1 | B-7 | A-13 | A | Excellent |
| Example 2-30 | Re-30 | X-5 | AA-2 | BB-3 | (I)-2 | A-2/A-3 | B-3 | A-5 | A | Excellent |
| Example 2-31 | Re-31 | X-7 | AA-2 | BB-4 | (I)-3 | A-2 | B-4 | A-12 | B | Good |
| Example 2-32 | Re-32 | X-4 | AA-1 | BB-3 | (I-3 | A-1 | B-3 | A-3 | A | Excellent |
| Example 2-33 | Re-33 | X-1 | AA-1 | BB-2 | (I)-1 | A-1 | B-8 | A-1 | A | Excellent |
| | | X-3 | AA-1 | BB-2 | (I)-3 | A-1 | B-2 | | | |

TABLE 13

| | | | Characteristics of compound (I) | | | | | Characteristics of resin A | | |
|---|---|---|---|---|---|---|---|---|---|---|
| Table 5-2 (Alkali development) | Type of resist composition | Type of compound (I) or comparative compound | Type of anionic moiety in structural moiety X | Type of anionic moiety in structural moiety Y | Molecular structure | Type of anionic functional group (1) | Type of anionic functional group (2) | Type | Presence or absence of repeating unit having acid group | Evaluation results (pattern shape) |
| Example 2-34 | Re-34 | X-7 | AA-2 | BB-4 | (I)-3 | A-2 | B-4 | A-2/A-5 | B/A | Excellent |
| Example 2-35 | Re-35 | X-1 | AA-1 | BB-2 | (I)-1 | A-1 | B-8 | A-1/A-6 | A/A | Excellent |
| Example 2-36 | Re-36 | X-5 | AA-2 | BB-3 | (I)-2 | A-2/A-3 | B-3 | A-1/A-10 | A/A | Excellent |
| Example 2-37 | Re-37 | X-2 | AA-2 | BB-2 | (I)-2 | A-2/A-3 | B-1 | A-9 | A | Excellent |
| Example 2-38 | Re-38 | X-7 | AA-2 | BB-4 | (I)-3 | A-2 | B-4 | A-11 | A | Excellent |
| Example 2-39 | Re-39 | X-3 | AA-1 | BB-2 | (I)-3 | A-1 | B-2 | A-5/A-8 | A/B | Excellent |
| Example 2-40 | Re-40 | X-22 | AA-2 | BB-4 | (I)-2 | A-2/A-3 | B-4 | A-41 | A | Excellent |
| Example 2-41 | Re-41 | X-27 | AA-2 | BB-5 | (I)-3 | A-2 | B-5 | A-46 | A | Excellent |
| Example 2-42 | Re-42 | X-29 | AA-1/AA-2 | BB-2 | (I)-2 | A-1/A-3 | B-1 | A-40 | A | Excellent |
| Example 2-43 | Re-43 | X-23 | AA-2 | BB-1 | (I)-2 | A-2/A-3 | B-7 | A-34 | A | Excellent |

TABLE 13-continued

| Table 5-2 (Alkali development) | Type of resist composition | Type of compound (I) or comparative compound | Characteristics of compound (I) Type of anionic moiety in structural moiety X | Type of anionic moiety in structural moiety Y | Molecular structure | Type of anionic functional group (1) | Type of anionic functional group (2) | Characteristics of resin A Type | Presence or absence of repeating unit having acid group | Evaluation results (pattern shape) |
|---|---|---|---|---|---|---|---|---|---|---|
| Example 2-44 | Re-44 | X-28 | AA-1/AA-2 | BB-2 | (I)-1 | A-1/A-2 | B-8 | A-36 | A | Excellent |
| Example 2-45 | Re-45 | X-15 | AA-1 | BB-3 | (I)-1 | A-1 | B-9 | A-43 | A | Excellent |
| Example 2-46 | Re-46 | X-26 | AA-2 | BB-3 | (I)-3 | A-2 | B-3 | A-33 | A | Excellent |
| Example 2-47 | Re-47 | X-24 | AA-2 | — | (I)-2 | A-2/A-3 | — | A-31 | A | Good |
| Example 2-48 | Re-48 | X-21 | AA-2 | BB-5 | (I)-1 | A-2 | B-11 | A-44 | A | Excellent |
| Example 2-49 | Re-49 | X-25 | AA-2 | BB-2 | (I)-3 | A-2 | B-1 | A-37 | B | Good |
| Example 2-50 | Re-50 | X-17 | AA-1 | BB-5 | (I)-3 | A-1 | B-6 | A-39 | A | Excellent |
| Example 2-51 | Re-51 | X-16 | AA-1 | BB-4 | (I)-3 | A-1 | B-4 | A-30 | A | Excellent |
| Example 2-52 | Re-52 | X-18 | AA-2 | BB-2 | (I)-1 | A-2 | B-8 | A-42 | A | Excellent |
| Example 2-53 | Re-53 | X-20 | AA-1 | BB-4 | (I)-1 | A-1 | B-10 | A-38 | A | Excellent |
| Example 2-54 | Re-54 | X-30 | AA-1/AA-2 | BB-2 | (I)-3 | A-1/A-2 | B-2 | A-35 | A | Excellent |
| Example 2-55 | Re-55 | X-19 | AA-2 | BB-3 | (I)-1 | A-2 | B-9 | A-45 | A | Excellent |
| Example 2-56 | Re-56 | X-1 | AA-1 | BB-2 | (I)-1 | A-1 | B-8 | A-32 | B | Good |
| Example 2-57 | Re-57 | X-7 | AA-2 | BB-4 | (I)-3 | A-2 | B-4 | A-1/A-39 | A/A | Excellent |
| Example 2-58 | Re-58 | X-2 | AA-2 | BB-2 | (I)-2 | A-2/A-3 | B-1 | A-5 | A | Excellent |
| Example 2-59 | Re-59 | X-9 | AA-2 | BB-5 | (I)-2 | A-2/A-3 | B-5 | A-13/A-33 | A/A | Excellent |
| Example 2-60 | Re-100 | X-31 | AA-1/AA-2 | BB-2 | (I)-1 | A-1/A-2 | B-8 | A-47 | A | Excellent |
| Example 2-61 | Re-101 | X-31 | AA-1/AA-2 | BB-2 | (I)-1 | A-1/A-2 | B-8 | A-48 | A | Excellent |
| Example 2-62 | Re-102 | X-1 | AA-1 | BB-2 | (I)-1 | A-1 | B-8 | A-49 | A | Excellent |
| Example 2-63 | Re-103 | X-31 | AA-1/AA-2 | BB-2 | (I)-1 | A-1/A-2 | B-8 | A-50 | A | Excellent |
| Example 2-64 | Re-104 | X-32 | AA-1 | BB-2 | (I)-1 | A-1 | B-8 | A-51 | A | Excellent |
| Example 2-65 | Re-105 | X-33 | AA-2 | BB-3 | (I)-2 | A-2/A-3 | B-3 | A-52 | A | Excellent |
| Example 2-66 | Re-106 | X-32 | AA-1 | BB-2 | (I)-1 | A-1 | B-8 | A-53 | A | Excellent |
| Example 2-67 | Re-107 | X-34 | AA-2 | BB-1 | (I)-3 | A-2 | B-7 | A-53 | A | Excellent |
| Example 2-68 | Re-108 | X-32 | AA-1 | BB-2 | (I)-1 | A-1 | B-8 | A-54 | A | Excellent |
| Example 2-69 | Re-109 | X-32 | AA-1 | BB-2 | (I)-1 | A-1 | B-8 | A-55 | A | Excellent |
| Example 2-70 | Re-110 | X-32 | AA-1 | BB-2 | (I)-1 | A-1 | B-8 | A-56 | A | Excellent |

TABLE 14

| Table 5-3 (Alkali development) | Type of resist composition | Type of compound (I) or comparative compound | Characteristics of compound (I) Type of anionic moiety in structural moiety X | Type of anionic moiety in structural moiety Y | Molecular structure | Type of anionic functional group (1) | Type of anionic functional group (2) | Characteristics of resin A Type | Presence or absence of repeating unit having acid group | Evaluation results (pattern shape) |
|---|---|---|---|---|---|---|---|---|---|---|
| Example 2-71 | Re-111 | X-31 | AA-1/AA-2 | BB-2 | (I)-1 | A-1/A-2 | B-8 | A-9 | A | Excellent |
| Example 2-72 | Re-112 | X-32 | AA-1 | BB-2 | (I)-1 | A-1 | B-8 | A-9 | A | Excellent |
| Example 2-73 | Re-113 | X-33 | AA-2 | BB-3 | (I)-2 | A-2/A-3 | B-3 | A-9 | A | Excellent |
| Example 2-74 | Re-114 | X-31 | AA-1/AA-2 | BB-2 | (I)-1 | A-1/A-2 | B-8 | A-16 | B | Good |
| Example 2-75 | Re-115 | X-33 | AA-2 | BB-3 | (I)-2 | A-2/A-3 | B-3 | A-16 | B | Good |
| Example 2-76 | Re-116 | X-34 | AA-2 | BB-1 | (I)-3 | A-2 | B-7 | A-16 | B | Good |
| Example 2-77 | Re-117 | X-1 | AA-1 | BB-2 | (I)-1 | A-1 | B-8 | A-50 | A | Excellent |
| Example 2-78 | Re-118 | X-33 | AA-2 | BB-3 | (I)-2 | A-2/A-3 | B-3 | A-50 | A | Excellent |
| Example 2-79 | Re-119 | X-34 | AA-2 | BB-1 | (I)-3 | A-2 | B-7 | A-50 | A | Excellent |
| Example 2-80 | Re-120 | X-31 | AA-1/AA-2 | BB-2 | (I)-1 | A-1/A-2 | B-8 | A-13 | A | Excellent |
| Example 2-81 | Re-121 | X-32 | AA-1 | BB-2 | (I)-1 | A-1 | B-8 | A-13 | A | Excellent |
| Example 2-82 | Re-122 | X-33 | AA-2 | BB-3 | (I)-2 | A-2/A-3 | B-3 | A-13 | A | Excellent |
| Example 2-83 | Re-123 | X-34 | AA-2 | BB-1 | (I)-3 | A-2 | B-7 | A-13 | A | Excellent |
| Example 2-84 | Re-124 | X-35 | AA-2 | BB-2 | (I)-2 | A-2/A-3 | B-1 | A-13 | A | Excellent |
| Example 2-85 | Re-125 | X-36 | AA-2 | BB-3 | (I)-2 | A-2/A-3 | B-3 | A-13 | A | Excellent |
| Example 2-86 | Re-126 | X-37 | AA-2 | BB-5 | (I)-2 | A-2/A-3 | B-5 | A-13 | A | Excellent |
| Example 2-87 | Re-127 | X-38 | AA-2 | BB-1 | (I)-3 | A-2 | B-7 | A-13 | A | Excellent |
| Example 2-88 | Re-128 | X-39 | AA-2 | BB-1 | (I)-3 | A-2 | B-7 | A-13 | A | Excellent |
| Example 2-89 | Re-129 | X-40 | AA-2 | BB-2 | (I)-2 | A-2/A-3 | B-1 | A-13 | A | Excellent |
| Example 2-90 | Re-130 | X-34 | AA-2 | BB-1 | (I)-3 | A-2 | B-7 | A-30 | A | Excellent |
| Example 2-91 | Re-131 | X-35 | AA-2 | BB-2 | (I)-2 | A-2/A-3 | B-1 | A-13 | A | Excellent |
| Example 2-92 | Re-132 | X-38 | AA-2 | BB-1 | (I)-3 | A-2 | B-7 | A-30 | A | Excellent |
| Example 2-93 | Re-133 | X-39 | AA-2 | BB-1 | (I)-3 | A-2 | B-7 | A-30 | A | Excellent |
| Example 2-94 | Re-134 | X-33 | AA-2 | BB-3 | (I)-2 | A-2/A-3 | B-3 | A-41 | A | Excellent |
| Example 2-95 | Re-135 | X-34 | AA-2 | BB-1 | (I)-3 | A-2 | B-7 | A-41 | A | Excellent |
| Example 2-96 | Re-136 | X-36 | AA-2 | BB-3 | (I)-2 | A-2/A-3 | B-3 | A-41 | A | Excellent |
| Example 2-97 | Re-137 | X-40 | AA-2 | BB-2 | (I)-2 | A-2/A-3 | B-1 | A-41 | A | Excellent |

TABLE 14-continued

| Table 5-3 (Alkali development) | Type of resist composition | Type of compound (I) or comparative compound | Characteristics of compound (I): Type of anionic moiety in structural moiety X | Type of anionic moiety in structural moiety Y | Molecular structure | Type of anionic functional group (1) | Type of anionic functional group (2) | Characteristics of resin A: Type | Presence or absence of repeating unit having acid group | Evaluation results (pattern shape) |
|---|---|---|---|---|---|---|---|---|---|---|
| Example 2-98 | Re-138 | X-34 | AA-2 | BB-1 | (I)-3 | A-2 | B-7 | A-35 | A | Excellent |
| Example 2-99 | Re-139 | X-38 | AA-2 | BB-1 | (I)-3 | A-2 | B-7 | A-35 | A | Excellent |
| Comparative Example 2-2 | Re-C2 | Z-1 | — | — | — | — | — | — | — | Poor |

TABLE 15

| Table 5-4 (Alkali development) | Type of resist composition | Type of compound (I) or comparative compound | Characteristics of compound (I): Type of anionic moiety in structural moiety X | Type of anionic moiety in structural moiety Y | Molecular structure | Type of anionic functional group (I) | Type of anionic functional group (2) | Characteristics of resin A: Type | Presence or absence of repeating unit having acid group | Evaluation results (pattern shape) |
|---|---|---|---|---|---|---|---|---|---|---|
| Example 2-100 | Re-156 | X-49 | AA-2 | BB-2 | (I)-1 | A-2 | B-8 | A-13 | A | Excellent |
| Example 2-101 | Re-157 | X-49 | AA-2 | BB-2 | (I)-1 | A-2 | B-8 | A-13 | A | Excellent |
| Example 2-102 | Re-158 | X-6 | AA-1 | BB-4 | (I)-1 | A-1 | B-10 | A-52 | A | Excellent |
| Example 2-103 | Re-159 | X-50 | AA-1 | BB-3 | (I)-3 | A-1 | B-3 | A-13 | A | Excellent |
| Example 2-104 | Re-160 | X-51 | AA-2 | BB-1 | (I)-2 | A-2/A-3 | B-7 | A-13 | A | Excellent |
| Example 2-105 | Re-161 | X-52 | AA-2 | BB-5 | (I)-2 | A-2/A-3 | B-5 | A-13 | A | Excellent |
| Example 2-106 | Re-162 | X-50 | AA-1 | BB-3 | (I)-3 | A-1 | B-3 | A-50 | A | Excellent |
| Example 2-107 | Re-163 | X-51 | AA-2 | BB-1 | (I)-2 | A-2/A-3 | B-7 | A-55 | A | Excellent |
| Example 2-108 | Re-164 | X-52 | AA-2 | BB-5 | (I)-2 | A-2/A-3 | B-5 | A-56 | A | Excellent |
| Example 2-109 | Re-165 | X-53 | AA-1/AA-2 | BB-2 | (I)-1 | A-1/A-2 | B-8 | A-47 | A | Excellent |
| Example 2-110 | Re-166 | X-54 | AA-1 | BB-2 | (I)-1 | A-1 | B-8 | A-36 | A | Excellent |
| Example 2-111 | Re-167 | X-50 | AA-1 | BB-3 | (I)-3 | A-1 | B-3 | A-51 | A | Excellent |
| Example 2-112 | Re-168 | X-51 | AA-2 | BB-1 | (I)-2 | A-2/A-3 | B-7 | A-11 | A | Excellent |
| Example 2-113 | Re-169 | X-52 | AA-2 | BB-5 | (I)-2 | A-2/A-3 | B-5 | A-11 | A | Excellent |
| Example 2-114 | Re-170 | X-2 | AA-2 | BB-2 | (I)-2 | A-2/A-3 | B-1 | A-47 | A | Excellent |
| Example 2-115 | Re-171 | X-2 | AA-2 | BB-2 | (I)-2 | A-2/A-3 | B-1 | A-52 | A | Excellent |
| Example 2-116 | Re-172 | X-15 | AA-1 | BB-3 | (I)-1 | A-1 | B-9 | A-42 | A | Excellent |
| Example 2-117 | Re-173 | X-32 | AA-1 | BB-2 | (I)-1 | A-1 | B-8 | A-51 | A | Excellent |
| Example 2-118 | Re-174 | X-17 | AA-1 | BB-5 | (I)-3 | A-1 | B-6 | A-41 | A | Excellent |
| Example 2-119 | Re-175 | X-34 | AA-2 | BB-1 | (I)-3 | A-2 | B-7 | A-41 | A | Excellent |
| Example 2-120 | Re-176 | X-16 | AA-1 | BB-4 | (I)-3 | A-1 | B-4 | A-51 | A | Excellent |
| Example 2-121 | Re-177 | X-16 | AA-1 | BB-4 | (I)-3 | A-1 | B-4 | A-1 | A | Excellent |
| Example 2-122 | Re-178 | X-16 | AA-1 | BB-4 | (I)-3 | A-1 | B-4 | A-30 | A | Excellent |
| Example 2-123 | Re-179 | X-24 | AA-2 | — | (I)-2 | A-2/A-3 | — | A-13 | A | Good |
| Example 2-124 | Re-180 | X-24 | AA-2 | — | (I)-2 | A-2/A-3 | — | A-49 | A | Good |
| Example 2-125 | Re-181 | X-31 | AA-1/AA-2 | BB-2 | (I)-1 | A-1/A-2 | B-8 | A-49 | A | Excellent |
| Example 2-126 | Re-182 | X-15 | AA-1 | BB-3 | (I)-1 | A-1 | B-9 | A-1 | A | Excellent |
| Example 2-127 | Re-183 | X-32 | AA-1 | BB-2 | (I)-1 | A-1 | B-8 | A-56 | A | Excellent |
| Example 2-128 | Re-184 | X-17 | AA-1 | BB-5 | (I)-3 | A-1 | B-6 | A-30 | A | Excellent |
| Example 2-129 | Re-185 | X-53 | AA-1/AA-2 | BB-2 | (I)-1 | A-1/A-2 | B-8 | A-30 | A | Excellent |
| Example 2-130 | Re-186 | X-15 | AA-1 | BB-3 | (I)-1 | A-1 | B-9 | A-30 | A | Excellent |
| Example 2-131 | Re-187 | X-32 | AA-1 | BB-2 | (I)-1 | A-1 | B-8 | A-47 | A | Excellent |
| Example 2-132 | Re-188 | X-51 | AA-2 | BB-1 | (I)-2 | A-2/A-3 | B-7 | A-60 | B | Good |
| Example 2-133 | Re-189 | X-52 | AA-2 | BB-5 | (I)-2 | A-2/A-3 | B-5 | A-50 | A | Excellent |
| Example 2-134 | Re-190 | X-53 | AA-1/AA-2 | BB-2 | (I)-1 | A-1/A-2 | B-8 | A-50 | A | Excellent |
| Example 2-135 | Re-191 | X-54 | AA-1 | BB-2 | (I)-1 | A-1 | B-8 | A-60 | B | Good |
| Example 2-136 | Re-192 | X-31 | AA-1/AA-2 | BB-2 | (I)-1 | A-1/A-2 | B-8 | A-20 | B | Good |
| Example 2-137 | Re-193 | X-53 | AA-1/AA-2 | BB-2 | (I)-1 | A-1/A-2 | B-8 | A-6 | A | Excellent |
| Example 2-138 | Re-194 | X-36 | AA-2 | BB-3 | (I)-2 | A-2/A-3 | B-3 | A-11 | A | Excellent |
| Example 2-139 | Re-195 | X-52 | AA-2 | BB-5 | (I)-2 | A-2/A-3 | B-5 | A-6 | A | Excellent |
| Comparative Example 2-3 | Re-C4 | Z-1 | — | — | — | — | — | — | — | Poor |

From the results in Table 5, it was confirmed that in a case where the composition satisfies any one of the following condition (X1) or (X2) (preferably all of the conditions), the shape of a pattern thus formed is more excellent.

(X1) The acid-decomposable resin further includes a repeating unit having an acid group.

(X2) The compound (I) is a compound represented by any one of Formula (I)-1, (I)-2, or (I)-3; in Formula (I)-1, $B_{11}^-$ represents a divalent anionic functional group of any one of Formula (B-8), . . . , or (B-11) mentioned above, and $A_{13}^-$ represents any one of Formula (A-1), (A-2), or (A-4) mentioned above; in Formula (I)-2, $B_{12}^-$ represents a monovalent anionic functional group of any one of Formula (B-1), . . . , or (B-7) mentioned above, $A_{13}^-$ represents a monovalent anionic functional group of any one of Formula (A-1), (A-2), or (A-4) mentioned above, and $A_{14}^-$ represents a divalent anionic functional group represented by Formula (A-3) mentioned above; and in Formula (I)-3, $B_{13}^-$ represents a monovalent anionic functional group of any one of Formula (B-1), . . . , or (B-7) mentioned above, and $A_{15}^-$ and $A_{16}^-$ represent monovalent anionic functional groups of any one of Formula (A-1), (A-2), or (A-4) mentioned above.

[Preparation of Actinic Ray-Sensitive or Radiation-Sensitive Resin Composition and Pattern Formation: ArF Liquid Immersion Exposure]

[Preparation (2) of Actinic Ray-Sensitive or Radiation-Sensitive Resin Composition]

The respective components shown in Table 6 were mixed so that the concentration of solid contents was 4% by mass. Next, the obtained mixed liquid was filtered initially through a polyethylene-made filter having a pore diameter of 50 nm, then through a nylon-made filter having a pore diameter of 10 nm, and lastly through a polyethylene-made filter having a pore diameter of 5 nm in this order to prepare an actinic ray-sensitive or radiation-sensitive resin composition (hereinafter also referred to as a resin composition). In addition, in the resin composition, the solid content means all components other than the solvent. The obtained resin composition was used in Examples and Comparative Examples.

TABLE 16

(Table 6-1)

| Resist composition | Compound (I) Type | Compound (I) % by mass | Resin A Type | Resin A % by mass | Photoacid generator B Type | Photoacid generator B % by mass | Acid diffusion control agent C Type | Acid diffusion control agent C % by mass | Hydrophobic resin D Type | Hydrophobic resin D % by mass | Surfactant E Type | Surfactant E % by mass | Solvent F Type | Solvent F Mixing ratio (mass ratio) |
|---|---|---|---|---|---|---|---|---|---|---|---|---|---|---|
| Re-60 | X-1 | 24.0 | A-20 | 71.8 | — | — | — | — | D-1 | 4.2 | — | — | F-1/F-7 | 80/20 |
| Re-61 | X-2 | 18.0 | A-16 | 80.9 | — | — | — | — | D-2 | 1.1 | — | — | F-4 | 100 |
| Re-62 | X-3 | 33.0 | A-22 | 64.9 | — | — | — | — | D-2 | 2.1 | — | — | F-4 | 100 |
| Re-63 | X-4 | 23.5 | A-17 | 75.4 | — | — | — | — | D-3 | 1.1 | — | — | F-1/F-2/F-8 | 70/25/5 |
| Re-64 | X-5 | 19.0 | A-29 | 78.2 | — | — | — | — | D-5 | 2.8 | — | — | F-1/F-7 | 80/20 |
| Re-65 | X-6 | 20.0 | A-28 | 79.1 | — | — | — | — | D-4 | 0.9 | — | — | F-1/F-2 | 70/30 |
| Re-66 | X-7 | 30.5 | A-23 | 68.6 | — | — | — | — | D-6 | 0.9 | — | — | F-1/F-2 | 70/30 |
| Re-67 | X-8 | 16.5 | A-18 | 78.0 | — | — | — | — | D-6 | 5.5 | — | — | F-1/F-5 | 50/50 |
| Re-68 | X-9 | 17.0 | A-27 | 81.5 | — | — | — | — | D-5 | 1.5 | — | — | F-1/F-3 | 90/10 |
| Re-69 | X-10 | 13.5 | A-21 | 82.7 | — | — | — | — | D-2 | 3.8 | — | — | F-1/F-6 | 40/60 |
| Re-70 | X-11 | 19.0 | A-25 | 78.0 | — | — | — | — | D-5 | 2.9 | E-3 | 0.1 | F-1/F-2 | 70/30 |
| Re-71 | X-12 | 17.5 | A-19 | 79.3 | — | — | — | — | D-5 | 3.2 | — | — | F-1/F-2/F-8 | 70/25/5 |
| Re-72 | X-13 | 24.0 | A-26 | 72.9 | — | — | — | — | D-2 | 3.1 | — | — | F-1/F-5 | 50/50 |
| Re-73 | X-14 | 30.5 | A-24 | 68.2 | — | — | — | — | D-5 | 1.3 | — | — | F-1/F-5 | 50/50 |
| Re-74 | X-3 | 24.0 | A-12 | 74.7 | — | — | — | — | D-5 | 1.3 | — | — | F-1/F-8 | 85/15 |
| Re-75 | X-3 | 27.0 | A-22 | 66.4 | B-2 | 5.5 | — | — | D-4 | 0.9 | E-1/E-2 | 0.1/0.1 | F-1/F-6 | 40/60 |
| Re-76 | X-7 | 26.0 | A-18 | 68.9 | B-9 | 2.3 | — | — | D-5 | 2.8 | — | — | F-1/F-8 | 85/15 |
| Re-77 | X-2 | 4.0 | A-17 | 80.1 | B-1 | 15 | — | — | D-4 | 0.9 | — | — | F-1/F-9 | 85/15 |
| Re-78 | X-11 | 3.0 | A-26 | 76.1 | B-7 | 20 | — | — | D-6 | 0.9 | — | — | F-1/F-7 | 80/20 |
| Re-79 | X-9 | 10.0 | A-28 | 78.5 | B-8 | 6 | — | — | D-6 | 5.5 | — | — | F-4 | 100 |
| Re-80 | X-8 | 20.0 | A-21 | 75.7 | B-3 | 2.8 | — | — | D-5 | 1.5 | — | — | F-1/F-7 | 80/20 |
| Re-81 | X-1 | 20.0 | A-29 | 74.2 | B-5 | 2 | — | — | D-2 | 3.8 | — | — | F-1/F-7 | 80/20 |
| Re-82 | X-10 | 13.0 | A-20 | 79.1 | B-6 | 5 | — | — | D-5 | 2.9 | — | — | F-1/F-5 | 50/50 |
| Re-83 | X-12 | 17.5 | A-16 | 79.9 | B-11 | 1.5 | — | — | D-4 | 0.9 | E-1/E-2 | 0.1/0.1 | F-1 | 100 |
| Re-84 | X-2 | 21.0 | A-24 | 77.1 | B-4 | 1 | — | — | D-6 | 0.9 | — | — | F-1/F-7 | 80/20 |
| Re-85 | X-3 | 6.0 | A-25 | 73.5 | B-10 | 15 | — | — | D-6 | 5.5 | — | — | F-4 | 100 |
| Re-86 | X-7 | 28.0 | A-17 | 69.1 | — | — | C-2 | 2 | D-6 | 0.9 | — | — | F-1/F-7 | 80/20 |
| Re-87 | X-6 | 25.0 | A-22 | 63.5 | — | — | C-4 | 6 | D-6 | 5.5 | — | — | F-1/F-7 | 80/20 |
| Re-88 | X-4 | 23.5 | A-23 | 71.4 | — | — | C-3 | 3.5 | D-5 | 1.5 | E-3 | 0.1 | F-1/F-5 | 50/50 |
| Re-89 | X-14 | 21.0 | A-16 | 70.2 | — | — | C-5 | 5 | D-2 | 3.8 | — | — | F-1 | 100 |
| Re-90 | X-13 | 22.0 | A-18 | 73.0 | — | — | C-1 | 2.1 | D-5 | 2.9 | — | — | F-1/F-7 | 80/20 |
| Re-91 | X-5 | 23.0 | A-19 | 71.5 | — | — | C-6 | 2.3 | D-5 | 3.2 | — | — | F-4 | 100 |
| Re-92 | X-4/X-5 | 12.0/12.0 | A-17 | 74.9 | — | — | — | — | D-3 | 1.1 | — | — | F-1/F-2/F-8 | 70/25/5 |
| Re-93 | X-1 | 23.0 | A-24/A-29 | 32.8/40.0 | — | — | — | — | D-1 | 4.2 | — | — | F-1/F-7 | 80/20 |
| Re-94 | X-7 | 24.3 | A-16/A-17 | 40.0/34.6 | — | — | — | — | D-2 | 1.1 | — | — | F-4 | 100 |
| Re-95 | X-4 | 15.0 | A-23 | 73.0 | B-1 | 7 | C-3 | 3.5 | D-5 | 1.5 | — | — | F-1/F-5 | 50/50 |
| Re-96 | X-10 | 13.0 | A-20 | 74.6 | B-6 | 7 | C-7 | 2.5 | D-5 | 2.9 | — | — | F-1/F-5 | 50/50 |
| Re-97 | X-1 | 25.0 | A-20 | 70.8 | — | — | — | — | D-1 | 4.2 | — | — | F-1/F-7 | 80/20 |
| Re-98 | X-2 | 18.0 | A-16 | 80.9 | — | — | — | — | D-2 | 1.1 | — | — | F-4 | 100 |
| Re-99 | X-3 | 32.0 | A-22 | 65.9 | — | — | — | — | D-2 | 2.1 | — | — | F-4 | 100 |

TABLE 17

(Table 6-2)

| Resist composition | Compound (I) Type | Compound (I) % by mass | Resin A Type | Resin A % by mass | Photoacid generator B Type | Photoacid generator B % by mass | Acid diffusion control agent C Type | Acid diffusion control agent C % by mass | Hydrophobic resin D Type | Hydrophobic resin D % by mass | Surfactant E Type | Surfactant E % by mass | Solvent F Type | Solvent F Mixing ratio (mass ratio) |
|---|---|---|---|---|---|---|---|---|---|---|---|---|---|---|
| Re-140 | X-41 | 20.0 | A-57 | 77.2 | — | — | — | — | D-5 | 2.8 | — | — | F-1/F-2/F-8 | 70/25/5 |
| Re-141 | X-41 | 15.0 | A-60 | 83.5 | — | — | — | — | D-4 | 1.5 | — | — | F-1/F-9 | 85/15 |
| Re-142 | X-42 | 20.0 | A-21 | 78.5 | — | — | — | — | D-6 | 1.5 | — | — | F-1/F-2 | 80/20 |
| Re-143 | X-42 | 15.0 | A-61 | 82.8 | — | — | — | — | D-6 | 2.2 | — | — | F-1/F-2 | 70/30 |
| Re-144 | X-43 | 22.0 | A-57 | 76.5 | — | — | — | — | D-5 | 1.5 | — | — | F-1/F-2 | 80/20 |
| Re-145 | X-43 | 22.0 | A-59 | 76.5 | — | — | — | — | D-2 | 1.5 | — | — | F-1/F-2 | 80/20 |
| Re-146 | X-44 | 18.0 | A-8 | 81.1 | — | — | — | — | D-6 | 0.9 | — | — | F-1/F-2/F-8 | 70/25/5 |
| Re-147 | X-44 | 20.0 | A-16 | 77.8 | — | — | — | — | D-6 | 2.2 | — | — | F-1/F-2 | 70/30 |
| Re-148 | X-45 | 19.0 | A-2 | 79.5 | — | — | — | — | D-5 | 1.5 | — | — | F-1/F-7 | 80/20 |
| Re-149 | X-45 | 28.0 | A-29 | 68.2 | — | — | — | — | D-2 | 3.8 | — | — | F-1/F-7 | 80/20 |
| Re-150 | X-46 | 20.0 | A-58 | 78.5 | — | — | — | — | D-5 | 1.5 | — | — | F-1/F-2/F-8 | 70/25/5 |
| Re-151 | X-46 | 17.0 | A-60 | 82.1 | — | — | — | — | D-4 | 0.9 | — | — | F-1/F-2 | 70/30 |
| Re-152 | X-47 | 22.0 | A-58 | 77.1 | — | — | — | — | D-6 | 0.9 | — | — | F-1/F-2/F-8 | 70/25/5 |
| Re-153 | X-47 | 20.0 | A-61 | 77.8 | — | — | — | — | D-6 | 2.2 | — | — | F-1/F-2 | 70/30 |
| Re-154 | X-48 | 20.0 | A-57 | 78.5 | — | — | — | — | D-5 | 1.5 | — | — | F-1/F-2/F-8 | 70/25/5 |
| Re-155 | X-48 | 20.0 | A-60 | 78.5 | — | — | — | — | D-2 | 1.5 | — | — | F-1/F-2 | 80/20 |
| Re-C3 | Z-1 | 9.0 | A-29 | 88.2 | — | — | — | — | D-5 | 2.8 | — | — | F-1/F-7 | 80/20 |

[Preparation of Topcoat Composition]

Various components included in the topcoat composition shown in Table 7 are shown below.

<Resin>

As the resin shown in Table 7, resins PT-1 to PT-3 shown in Table 2 were used.

<Additive>

The structures of the additives shown in Table 7 are shown below.

DT-1

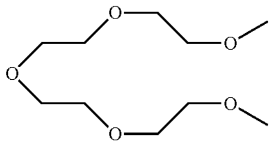

DT-2

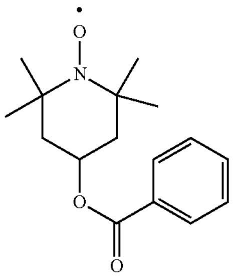

DT-3

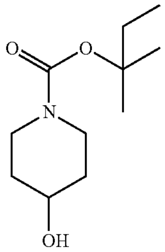

-continued

DT-4

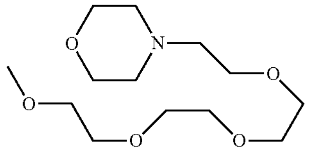

DT-5

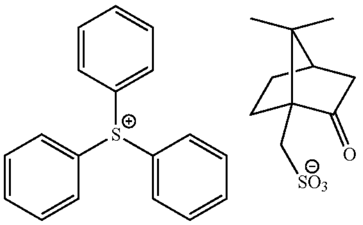

<Surfactant>

Surfactants shown in Table 7 are shown below.

E-3: PF656 (manufactured by OMNOVA Solutions Inc., fluorine-based surfactant)

<Solvent>

Solvents shown in Table 7 are shown below.

FT-1: 4-Methyl-2-pentanol (MIBC)

FT-2: n-Decane

FT-3: Diisoamyl ether

<Preparation of Topcoat Composition>

The respective components shown in Table 7 were mixed so that the concentration of solid contents was 3% by mass, and then the obtained mixed liquid was filtered initially through a polyethylene-made filter having a pore diameter of 50 nm, then through a nylon-made filter having a pore diameter of 10 nm, and lastly through a polyethylene-made filter having a pore diameter of 5 nm in this order to prepare a topcoat composition. Furthermore, the solid content as mentioned herein means all the components other than the solvent. The obtained topcoat composition was used in Examples.

TABLE 18

| | Solid content | | | | | | Solvent | |
|---|---|---|---|---|---|---|---|---|
| | Resin | | Additive | | Surfactant | | | Mixing ratio |
| Table 7 | Type | Mass (g) | Type | Mass (g) | Type | Mass (g) | Type | (mass ratio) |
| TC-1 | PT-1 | 10.0 | DT-1/DT-2 | 1.3/0.06 | — | — | FT-1/FT-2 | 70/30 |
| TC-2 | PT-2 | 10.0 | DT-3/DT-4 | 0.04/0.06 | E-3 | 0.005 | FT-1/FT-3 | 75/25 |
| TC-3 | PT-3 | 10.0 | DT-5 | 0.05 | — | — | FT-1/FT-3 | 10/90 |

[Pattern Formation (3): ArF Liquid Immersion Exposure and Organic Solvent Development]

A composition for forming an organic antireflection film, ARC29SR (manufactured by Brewer Science, Inc.), was applied onto a silicon wafer and baked at 205° C. for 60 seconds to form an antireflection film having a film thickness of 98 nm. The resin composition shown in Table 8 was applied thereon and baked at 100° C. for 60 seconds to form a resist film (actinic ray-sensitive or radiation-sensitive film) having a film thickness of 90 nm. In Examples 3-38 to 3-40, a topcoat film was formed on the upper layer of the resist film (the types of topcoat compositions used are shown in Table 8). The film thickness of the topcoat film was 100 nm in any case.

The resist film was exposed through a 6% halftone mask having a 1:1 line-and-space pattern with a line width of 45 nm, using an ArF excimer laser liquid immersion scanner (XT1700i, manufactured by ASML, NA 1.20, Dipole, outer sigma: 0.950, inner sigma: 0.850, Y deflection). Ultrapure water was used as the immersion liquid.

The resist film after the exposure was baked at 90° C. for 60 seconds, developed with n-butyl acetate for 30 seconds, and then rinsed with 4-methyl-2-pentanol for 30 seconds. Then, the film was spin-dried to obtain a negative tone pattern.

<Evaluation of Pattern Shape: ArF Liquid Immersion Exposure and Organic Solvent Development>

A cross-sectional shape of a line pattern having an average line width of 45 nm was observed, a pattern line width Lb at the bottom of the resist pattern and a pattern line width La at the upper part of the resist pattern were measured using a critical dimension scanning electron microscope (S-9380II manufactured by SEM), and a case of $(Lb/La) \leq 1.03$ was evaluated as "excellent", a case of $1.03 < (Lb/La) \leq 1.06$ was evaluated as "good", a case of $1.06 < (Lb/La) \leq 1.1$ was evaluated as "slightly good", and a case of $1.1 < (Lb/La)$ was evaluated as "poor". The results are shown in Table 8.

In Tables 8 and 9 below, "Type of anionic moiety in structural moiety X" in the "Characteristics of compound (I)" column indicates which of the above-described anion functional groups of Formulae (AA-1) to (AA-3) the anionic moiety represented by $A_1^-$ in the structural moiety X in the compound (I) corresponds to. Incidentally, "-" represents a case of corresponding to none of those.

In addition, "Type of anionic moiety in structural moiety Y" in the "Characteristics of compound (I)" column indicates which of the above-described anion functional groups of Formulae (BB-1) to (BB-5) the anionic moiety represented by $B_1^-$ in the structural moiety Y in the compound (I) corresponds to. Incidentally, "-" represents a case of corresponding to none of those.

In addition, "Molecular structure" in the "Characteristics of compound (I)" column indicates which of the structures of Formulae (I)-1 to (I)-3 mentioned above the compound (I) corresponds to. "-" represents a case where the compound (I) corresponds to none of the structures of Formulae (I)-1 to (I)-3.

In addition, "Type (1) of anionic functional group" in the "Characteristics of compound (I)" column indicates which of the monovalent or divalent anionic functional groups of Formulae (A-1) to (A-4) mentioned above $A_{11}$ to $A_{16}$ correspond to in a case where the compound (I) corresponds to the structures of Formulae (I)-1 to (I)-3 mentioned above. In addition, "Type (2) of anionic functional group" in the "Characteristics of compound (I)" column indicates which of the monovalent or divalent anionic functional groups of Formulae (B-1) to (B-11) mentioned above $B_{11}$ to $B_{13}$ correspond to in a case where the compound (I) corresponds to the structures of Formulae (I)-1 to (I)-3 mentioned above. "-" is intended to be a case where the compound (I) corresponds to none of the monovalent or divalent anionic functional groups of Formulae (B-1) to (B-11).

In addition, in "Presence or absence of repeating unit having acid group" in the "Characteristics of resin A" column, "A" indicates a case where the resin (A) includes a repeating unit having an acid group, and "B" indicates a case where the resin (A) does not include a repeating unit having an acid group.

TABLE 19

| | | | | Characteristics of compound (I) | | | | | Characteristics of resin A | | |
|---|---|---|---|---|---|---|---|---|---|---|---|
| Table 8-1 (Organic solvent development) | Type of resist composition | Type of topcoat composition | Type of compound (I) or comparative compound | Type of anionic moiety in structural moiety X | Type of anionic moiety in structural moiety Y | Molecular structure | Type of anionic functional group (1) | Type of anionic functional group (2) | Type | Presence or absence of repeating unit having acid group | Evaluation results (pattern shape) |
| Example 3-1 | Re-60 | — | X-1 | AA-1 | BB-2 | (I)-1 | A-1 | B-8 | A-20 | B | Good |
| Example 3-2 | Re-61 | — | X-2 | AA-2 | BB-2 | (I)-2 | A-2/A-3 | B-1 | A-16 | B | Good |
| Example 3-3 | Re-62 | — | X-3 | AA-1 | BB-2 | (I)-3 | A-1 | B-2 | A-22 | B | Good |
| Example 3-4 | Re-63 | — | X-4 | AA-1 | BB-3 | (I)-3 | A-1 | B-3 | A-17 | B | Good |
| Example 3-5 | Re-64 | — | X-5 | AA-2 | BB-3 | (I)-2 | A-2/A-3 | B-3 | A-29 | B | Good |
| Example 3-6 | Re-65 | — | X-6 | AA-1 | BB-4 | (I)-1 | A-1 | B-10 | A-28 | A | Excellent |
| Example 3-7 | Re-66 | — | X-7 | AA-2 | BB-4 | (I)-3 | A-2 | B-4 | A-23 | B | Good |
| Example 3-8 | Re-67 | — | X-8 | AA-1 | BB-5 | (I)-1 | A-1 | B-11 | A-18 | B | Good |

TABLE 19-continued

| Table 8-1 (Organic solvent development) | Type of resist composition | Type of topcoat composition | Type of compound (I) or comparative compound | Characteristics of compound (I) | | | | | Characteristics of resin A | | Evaluation results (pattern shape) |
|---|---|---|---|---|---|---|---|---|---|---|---|
| | | | | Type of anionic moiety in structural moiety X | Type of anionic moiety in structural moiety Y | Molecular structure | Type of anionic functional group (1) | Type of anionic functional group (2) | Type | Presence or absence of repeating unit having acid group | |
| Example 3-9 | Re-68 | — | X-9 | AA-2 | BB-5 | (I)-2 | A-2/A-3 | B-5 | A-27 | A | Excellent |
| Example 3-10 | Re-69 | — | X-10 | AA-1 | BB-1 | (I)-3 | A-1 | B-7 | A-21 | B | Good |
| Example 3-11 | Re-70 | — | X-11 | AA-2 | BB-1 | (I)-3 | A-2 | B-7 | A-25 | A | Excellent |
| Example 3-12 | Re-71 | — | X-12 | AA-1 | — | (I)-3 | A-1 | — | A-19 | B | Slightly good |
| Example 3-13 | Re-72 | — | X-13 | AA-2 | — | (I)-3 | A-2 | — | A-26 | B | Slightly good |
| Example 3-14 | Re-73 | — | X-14 | AA-2 | BB-2 | — | A-2/A-3 | B-1 | A-24 | B | Slightly good |
| Example 3-15 | Re-74 | — | X-3 | AA-1 | BB-2 | (I)-3 | A-1 | B←2 | A-12 | B | Good |
| Example 3-16 | Re-75 | — | X-3 | AA-1 | BB-2 | (I)-3 | A-1 | B-2 | A-22 | B | Good |
| Example 3-17 | Re-76 | — | X-7 | AA-2 | BB-4 | (I)-3 | A-2 | B-4 | A-18 | B | Good |
| Example 3-18 | Re-77 | — | X-2 | AA-2 | BB-2 | (I)-2 | A-2/A-3 | B-1 | A-17 | B | Good |
| Example 3-19 | Re-78 | — | X-11 | AA-2 | BB-1 | (I)-3 | A-2 | B-7 | A-26 | B | Good |
| Example 3-20 | Re-79 | — | X-9 | AA-2 | BB-5 | (I)-2 | A-2/A-3 | B-5 | A-28 | A | Excellent |
| Example 3-21 | Re-80 | — | X-8 | AA-1 | BB-5 | (I)-1 | A-1 | B-11 | A-21 | B | Good |
| Example 3-22 | Re-81 | — | X-1 | AA-1 | BB-2 | (I)-1 | A-1 | B-8 | A-29 | B | Good |
| Example 3-23 | Re-82 | — | X-10 | AA-1 | BB-1 | (I)-3 | A-1 | B-7 | A-20 | B | Good |
| Example 3-24 | Re-83 | — | X-12 | AA-1 | — | (I)-3 | A-1 | — | A-16 | B | Slightly good |
| Example 3-25 | Re-84 | — | X-2 | AA-2 | BB-2 | (I)-2 | A-2/A-3 | B-1 | A-24 | B | Good |
| Example 3-26 | Re-85 | — | X-3 | AA-1 | BB-2 | (I)-3 | A-1 | B-2 | A-25 | A | Excellent |
| Example 3-27 | Re-86 | — | X-7 | AA-2 | BB-4 | (I)-3 | A-2 | B-4 | A-17 | B | Good |
| Example 3-28 | Re-87 | — | X-6 | AA-1 | BB-4 | (I)-1 | A-1 | B-10 | A-22 | B | Good |
| Example 3-29 | Re-88 | — | X-4 | AA-1 | BB-3 | (I)-3 | A-1 | B-3 | A-23 | B | Good |
| Example 3-30 | Re-89 | — | X-14 | AA-2 | BB-2 | — | A-2/A-3 | B-1 | A-16 | B | Slightly good |
| Example 3-31 | Re-90 | — | X-13 | AA-2 | — | (I)-3 | A-2 | — | A-18 | B | Slightly good |
| Example 3-32 | Re-91 | — | X-5 | AA-2 | BB-3 | (I)-2 | A-2/A-3 | B-3 | A-19 | B | Good |
| Example 3-33 | Re-92 | — | X-4<br>X-5 | AA-1<br>AA-2 | BB-3<br>BB-3 | (I)-3<br>(I)-2 | A-1<br>A-2/A-3 | B-3<br>B-3 | A-17 | B | Good |
| Example 3-34 | Re-93 | — | X-1 | AA-1 | BB-2 | (I)-1 | A-1 | B-8 | A-24/A-29 | B/B | Good |
| Example 3-35 | Re-94 | — | X-7 | AA-2 | BB-4 | (I)-3 | A-2 | B-4 | A-16/A-17 | B/B | Good |
| Example 3-36 | Re-95 | — | X-4 | AA-1 | BB-3 | (I)-3 | A-1 | B-3 | A-23 | B | Good |
| Example 3-37 | Re-96 | — | X-10 | AA-1 | BB-1 | (I)-3 | A-1 | B-7 | A-20 | B | Good |
| Example 3-38 | Re-97 | TC-1 | X-1 | AA-1 | BB-2 | (I)-1 | A-1 | B-8 | A-20 | B | Good |
| Example 3-39 | Re-98 | TC-2 | X-2 | AA-2 | BB-2 | (I)-2 | A-2/A-3 | B-1 | A-16 | B | Good |
| Example 3-40 | Re-99 | TC-3 | X-3 | AA-1 | BB-2 | (I)-3 | A-1 | B-2 | A-22 | B | Good |

TABLE 20

| Table 8-2 (Organic solvent development) | Type of resist composition | Type of topcoat composition | Type of compound (I) or comparative compound | Characteristics of compound (I) | | | | | Characteristics of resin A | | Evaluation results (pattern shape) |
|---|---|---|---|---|---|---|---|---|---|---|---|
| | | | | Type of anionic moiety in structural moiety X | Type of anionic moiety in structural moiety Y | Molecular structure | Type of anionic functional group (1) | Type of anionic functional group (2) | Type | Presence or absence of repeating unit having acid group | |
| Example 3-41 | Re-140 | — | X-41 | AA-1 | BB-2 | (I)-1 | A-1 | B-8 | A-57 | B | Good |
| Example 3-42 | Re-141 | TC-1 | X-41 | AA-1 | BB-2 | (I)-1 | A-1 | B-8 | A-60 | B | Good |
| Example 3-43 | Re-142 | — | X-42 | AA-1 | BB-2 | (I)-1 | A-1 | B-8 | A-21 | B | Good |
| Example 3-44 | Re-143 | — | X-42 | AA-1 | BB-2 | (I)-1 | A-1 | B-8 | A-61 | B | Good |
| Example 3-45 | Re-144 | — | X-43 | AA-1 | BB-2 | (I)-1 | A-1 | B-8 | A-57 | B | Good |
| Example 3-46 | Re-145 | — | X-43 | AA-1 | BB-2 | (I)-1 | A-1 | B-8 | A-59 | B | Good |
| Example 3-47 | Re-146 | TC-1 | X-44 | AA-2 | BB-2 | (I)-1 | A-2 | B-8 | A-8 | B | Good |
| Example 3-48 | Re-147 | — | X-44 | AA-2 | BB-2 | (I)-1 | A-2 | B-8 | A-16 | B | Good |
| Example 3-49 | Re-148 | — | X-45 | AA-1 | BB-2 | (I)-1 | A-1 | B-8 | A-2 | B | Good |
| Example 3-50 | Re-149 | — | X-45 | AA-1 | BB-2 | (I)-1 | A-1 | B-8 | A-29 | B | Good |
| Example 3-51 | Re-150 | — | X-46 | AA-1 | BB-2 | (I)-1 | A-1 | B-8 | A-58 | B | Good |
| Example 3-52 | Re-151 | TC-2 | X-46 | AA-1 | BB-2 | (I)-1 | A-1 | B-8 | A-60 | B | Good |
| Example 3-53 | Re-152 | — | X-47 | AA-1 | BB-2 | (I)-1 | A-1 | B-8 | A-58 | B | Good |
| Example 3-54 | Re-153 | — | X-47 | AA-1 | BB-2 | (I)-1 | A-1 | B-8 | A-61 | B | Good |
| Example 3-55 | Re-154 | TC-1 | X-48 | AA-1/AA-2 | BB-2 | (I)-2 | A-1/A-3 | B-1 | A-57 | B | Good |
| Example 3-56 | Re-155 | — | X-48 | AA-1/AA-2 | BB-2 | (I)-2 | A-1/A-3 | B-1 | A-60 | B | Good |
| Comparative Example 3-1 | Re-C3 | — | Z-1 | — | — | — | — | — | A-29 | B | Poor |

From the results in Table 8, it was confirmed that in a case where the composition satisfies any one of the following condition (X1) or (X2) (preferably all of the conditions), the shape of a pattern thus formed is more excellent.

(X1) The acid-decomposable resin further includes a repeating unit having an acid group.

(X2) The compound (I) is a compound represented by any one of Formula (I)-1, (I)-2, or (I)-3; in Formula (I)-1, $B_{11}^-$ represents a divalent anionic functional group of any one of Formula (B-8), . . . , or (B-11) mentioned above, and $A_{13}^-$ represents any one of Formula (A-1), (A-2), or (A-4) mentioned above; in Formula (I)-2, $B_{12}^-$ represents a monovalent anionic functional group of any one of Formula (B-1), . . . , or (B-7) mentioned above, $A_{13}^-$ represents a monovalent anionic functional group of any one of Formula (A-1), (A-2), or (A-4) mentioned above, and $A_{14}^-$ represents a divalent anionic functional group represented by Formula (A-3) mentioned above; and in Formula (I)-3, $B_{13}^-$ represents a monovalent anionic functional group of any one of Formula (B-1), . . . , or (B-7) mentioned above, and $A_{15}^-$ and $A_{16}^-$ represent monovalent anionic functional groups of any one of Formula (A-1), (A-2), or (A-4) mentioned above.

[Pattern Formation (4): ArF Liquid Immersion Exposure and Aqueous Alkali Solution Development]

A composition for forming an organic antireflection film, ARC29SR (manufactured by Brewer Science, Inc.), was applied onto a silicon wafer and baked at 205° C. for 60 seconds to form an antireflection film having a film thickness of 98 nm. A resin composition shown in Table 9 was applied thereon and baked at 100° C. for 60 seconds to form a resist film having a film thickness of 90 nm. In Examples 4-38 to 4-40, a topcoat film was formed on the upper layer of the resist film (the types of topcoat compositions used are shown in Table 9). The film thickness of the topcoat film was 100 nm in any case.

The resist film was exposed through a 6% halftone mask having a 1:1 line-and-space pattern with a line width of 45 nm, using an ArF excimer laser liquid immersion scanner (XT1700i, manufactured by ASML, NA 1.20, Dipole, outer sigma: 0.950, inner sigma: 0.890, Y deflection). Ultrapure water was used as the immersion liquid.

The resist film after the exposure was baked at 90° C. for 60 seconds, developed with an aqueous tetramethylammonium hydroxide solution (2.38% by mass) for 30 seconds, and then rinsed with pure water for 30 seconds. Thereafter, the resist film was spin-dried to obtain a positive tone pattern.

<Evaluation of Pattern Shape: ArF Liquid Immersion Exposure, Aqueous Alkali Solution Development>

A cross-sectional shape of a line pattern having an average line width of 45 nm was observed, a pattern line width Lb at the bottom of the resist pattern and a pattern line width La at the upper part of the resist pattern were measured using a critical dimension scanning electron microscope (S-9380II manufactured by SEM), and a case of (La/Lb)≤1.03 was evaluated as "excellent", a case of 1.03<(La/Lb)≤1.06 was evaluated as "good", a case of 1.06<(La/Lb)≤1.1 was evaluated as "slightly good", and a case of 1.1<(La/Lb) was evaluated as "poor". The results are shown in Table 9.

TABLE 21

| | | | | Characteristics of compound (I) | | | | | Characteristics of resin A | | |
|---|---|---|---|---|---|---|---|---|---|---|---|
| Table 9-1 (Alkali development) | Type of resist composition | Type of topcoat composition | Type of compound (I) or comparative compound | Type of anionic moiety in structural moiety X | Type of anionic moiety in structural moiety Y | Molecular structure | Type of anionic functional group (1) | Type of anionic functional group (2) | Type | Presence or absence of repeating unit having acid group | Evaluation results (pattern shape) |
| Example 4-1 | Re-60 | — | X-1 | AA-1 | BB-2 | (I)-1 | A-1 | B-8 | A-20 | B | Good |
| Example 4-2 | Re-61 | — | X-2 | AA-2 | BB-2 | (I)-2 | A-2/A-3 | B-1 | A-16 | B | Good |
| Example 4-3 | Re-62 | — | X-3 | AA-1 | BB-2 | (I)-3 | A-1 | B-2 | A-22 | B | Good |
| Example 4-4 | Re-63 | — | X-4 | AA-1 | BB-3 | (I)-3 | A-1 | B-3 | A-17 | B | Good |
| Example 4-5 | Re-64 | — | X-5 | AA-2 | BB-3 | (I)-2 | A-2/A-3 | B-3 | A-29 | B | Good |
| Example 4-6 | Re-65 | — | X-6 | AA-1 | BB-4 | (I)-1 | A-1 | B-10 | A-28 | A | Excellent |
| Example 4-7 | Re-66 | — | X-7 | AA-2 | BB-4 | (I)-3 | A-2 | B-4 | A-23 | B | Good |
| Example 4-8 | Re-67 | — | X-8 | AA-1 | BB-5 | (I)-1 | A-1 | B-11 | A-18 | B | Good |
| Example 4-9 | Re-68 | — | X-9 | AA-2 | BB-5 | (I)-2 | A-2/A-3 | B-5 | A-27 | A | Excellent |
| Example 4-10 | Re-69 | — | X-10 | AA-1 | BB-1 | (I)-3 | A-1 | B-7 | A-21 | B | Good |
| Example 4-11 | Re-70 | — | X-11 | AA-2 | BB-1 | (I)-3 | A-2 | B-7 | A-25 | A | Excellent |
| Example 4-12 | Re-71 | — | X-12 | AA-1 | — | (I)-3 | A-1 | — | A-19 | B | Slightly good |
| Example 4-13 | Re-72 | — | X-13 | AA-2 | — | (I)-3 | A-2 | — | A-26 | B | Slightly good |
| Example 4-14 | Re-73 | — | X-14 | AA-2 | BB-2 | | A-2/A-3 | B-1 | A-24 | B | Slightly good |
| Example 4-15 | Re-74 | — | X-3 | AA-1 | BB-2 | (I)-3 | A-1 | B-2 | A-12 | B | Good |
| Example 4-16 | Re-75 | — | X-3 | AA-1 | BB-2 | (I)-3 | A-1 | B-2 | A-22 | B | Good |
| Example 4-17 | Re-76 | — | X-7 | AA-2 | BB-4 | (I)-3 | A-2 | B-4 | A-18 | B | Good |
| Example 4-18 | Re-77 | — | X-2 | AA-2 | BB-2 | (I)-2 | A-2/A-3 | B-1 | A-17 | B | Good |
| Example 4-19 | Re-78 | — | X-11 | AA-2 | BB-1 | (I)-3 | A-2 | B-7 | A-26 | B | Good |
| Example 4-20 | Re-79 | — | X-9 | AA-2 | BB-5 | (I)-2 | A-2/A-3 | B-5 | A-28 | A | Excellent |
| Example 4-21 | Re-80 | — | X-8 | AA-1 | BB-5 | (I)-1 | A-1 | B-11 | A-21 | B | Good |
| Example 4-22 | Re-81 | — | X-1 | AA-1 | BB-2 | (I)-1 | A-1 | B-8 | A-29 | B | Good |
| Example 4-23 | Re-82 | — | X-10 | AA-1 | BB-1 | (I)-3 | A-1 | B-7 | A-20 | B | Good |
| Example 4-24 | Re-83 | — | X-12 | AA-1 | — | (I)-3 | A-1 | — | A-16 | B | Slightly good |
| Example 4-25 | Re-84 | — | X-2 | AA-2 | BB-2 | (I)-2 | A-2/A-3 | B-1 | A-24 | B | Good |
| Example 4-26 | Re-85 | — | X-3 | AA-1 | BB-2 | (I)-3 | A-1 | B-2 | A-25 | A | Excellent |
| Example 4-27 | Re-86 | — | X-7 | AA-2 | BB-4 | (I)-3 | A-2 | B-4 | A-17 | B | Good |
| Example 4-28 | Re-87 | — | X-6 | AA-1 | BB-4 | (I)-1 | A-1 | B-10 | A-22 | B | Good |
| Example 4-29 | Re-88 | — | X-4 | AA-1 | BB-3 | (I)-3 | A-1 | B-3 | A-23 | B | Good |

TABLE 21-continued

| Table 9-1 (Alkali develop-ment) | Type of resist composi-tion | Type of topcoat composi-tion | Type of compound (I) or comparative compound | Characteristics of compound (I): Type of anionic moiety in structural moiety X | Type of anionic moiety in structural moiety Y | Molec-ular struc-ture | Type of anionic functional group (1) | Type of anionic functional group (2) | Characteristics of resin A: Type | Presence or absence of repeating unit having acid group | Evalua-tion results (pattern shape) |
|---|---|---|---|---|---|---|---|---|---|---|---|
| Example 4-30 | Re-89 | — | X-14 | AA-2 | BB-2 | — | A-2/A-3 | B-1 | A-16 | B | Slightly good |
| Example 4-31 | Re-90 | — | X-13 | AA-2 | — | (I)-3 | A-2 | — | A-18 | B | Slightly good |
| Example 4-32 | Re-91 | — | X-5 | AA-2 | BB-3 | (I)-2 | A-2/A-3 | B-3 | A-19 | B | Good |
| Example 4-33 | Re-92 | — | X-4<br>X-5 | AA-1<br>AA-2 | BB-3<br>BB-3 | (I)-3<br>(I)-2 | A-1<br>A-2/A-3 | B-3<br>B-3 | A-17 | B | Good |
| Example 4-34 | Re-93 | — | X-1 | AA-1 | BB-2 | (I)-1 | A-1 | B-8 | A-24/A-29 | B/B | Good |
| Example 4-35 | Re-94 | — | X-7 | AA-2 | BB-4 | (I)-3 | A-2 | B-4 | A-16/A-17 | B/B | Good |
| Example 4-36 | Re-95 | — | X-4 | AA-1 | BB-3 | (I)-3 | A-1 | B-3 | A-23 | B | Good |
| Example 4-37 | Re-96 | — | X-10 | AA-1 | BB-1 | (I)-3 | A-1 | B-7 | A-20 | B | Good |
| Example 4-38 | Re-97 | TC-1 | X-1 | AA-1 | BB-2 | (I)-1 | A-1 | B-8 | A-20 | B | Good |
| Example 4-39 | Re-98 | TC-2 | X-2 | AA-2 | BB-2 | (I)-2 | A-2/A-3 | B-1 | A-16 | B | Good |
| Example 4-40 | Re-99 | TC-3 | X-3 | AA-1 | BB-2 | (I)-3 | A-1 | B-2 | A-22 | B | Good |

TABLE 22

| Table 9-2 (Alkali develop-ment) | Type of resist composi-tion | Type of topcoat composi-tion | Type of compound (I) or comparative compound | Characteristics of compound (I): Type of anionic moiety in structural moiety X | Type of anionic moiety in structural moiety Y | Molec-ular struc-ture | Type of anionic functional group (1) | Type of anionic functional group (2) | Characteristics of resin A: Type | Presence or absence of repeating unit having acid group | Evalua-tion results (pattern shape) |
|---|---|---|---|---|---|---|---|---|---|---|---|
| Example 4-41 | Re-140 | — | X-41 | AA-1 | BB-2 | (I)-1 | A-1 | B-8 | A-57 | B | Good |
| Example 4-42 | Re-141 | TC-1 | X-41 | AA-1 | BB-2 | (I)-1 | A-1 | B-8 | A-60 | B | Good |
| Example 4-43 | Re-142 | — | X-42 | AA-1 | BB-2 | (I)-1 | A-1 | B-8 | A-21 | B | Good |
| Example 4-44 | Re-143 | — | X-42 | AA-1 | BB-2 | (I)-1 | A-1 | B-8 | A-61 | B | Good |
| Example 4-45 | Re-144 | — | X-43 | AA-1 | BB-2 | (I)-1 | A-1 | B-8 | A-57 | B | Good |
| Example 4-46 | Re-145 | — | X-43 | AA-1 | BB-2 | (I)-1 | A-1 | B-8 | A-59 | B | Good |
| Example 4-47 | Re-146 | TC-1 | X-44 | AA-2 | BB-2 | (I)-1 | A-2 | B-8 | A-8 | B | Good |
| Example 4-48 | Re-147 | — | X-44 | AA-2 | BB-2 | (I)-1 | A-2 | B-8 | A-16 | B | Good |
| Example 4-49 | Re-148 | — | X-45 | AA-1 | BB-2 | (I)-1 | A-1 | B-8 | A-2 | B | Good |
| Example 4-50 | Re-149 | — | X-45 | AA-1 | BB-2 | (I)-1 | A-1 | B-8 | A-29 | B | Good |
| Example 4-51 | Re-150 | — | X-46 | AA-1 | BB-2 | (I)-1 | A-1 | B-8 | A-58 | B | Good |
| Example 4-52 | Re-151 | TC-2 | X-46 | AA-1 | BB-2 | (I)-1 | A-1 | B-8 | A-60 | B | Good |
| Example 4-53 | Re-152 | — | X-47 | AA-1 | BB-2 | (I)-1 | A-1 | B-8 | A-58 | B | Good |
| Example 4-54 | Re-153 | — | X-47 | AA-1 | BB-2 | (I)-1 | A-1 | B-8 | A-61 | B | Good |
| Example 4-55 | Re-154 | TC-1 | X-48 | AA-1/AA-2 | BB-2 | (I)-2 | A-1/A-3 | B-1 | A-57 | B | Good |
| Example 4-56 | Re-155 | — | X-48 | AA-1/AA-2 | BB-2 | (I)-2 | A-1/A-3 | B-1 | A-60 | B | Good |
| Comparative Example 4-1 | Re-C3 | — | Z-1 | — | — | — | — | — | A-29 | B | Poor |

From the results in Table 9, it was confirmed that in a case where the composition satisfies any one of the following condition (X1) or (X2) (preferably all of the conditions), the shape of a pattern thus formed is more excellent.

(X1) The acid-decomposable resin further includes a repeating unit having an acid group.

(X2) The compound (I) is a compound represented by any one of Formula (I)-1, (I)-2, or (I)-3; in Formula (I)-1, $B_{11}^-$ represents a divalent anionic functional group of any one of Formula (B-8), . . . , or (B-11) mentioned above, and $A_{13}^-$ represents any one of Formula (A-1), (A-2), or (A-4) mentioned above; in Formula (I)-2, $B_{12}^-$ represents a monovalent anionic functional group of any one of Formula (B-1), . . . , or (B-7) mentioned above, $A_{13}^-$ represents a monovalent anionic functional group of any one of Formula (A-1), (A-2), or (A-4) mentioned above, and $A_{14}^-$ represents a divalent anionic functional group represented by Formula (A-3) mentioned above; and in Formula (I)-3, $B_{13}^-$ represents a monovalent anionic functional group of any one of Formula (B-1), . . . , or (B-7) mentioned above, and $A_{15}^-$ and $A_{16}^-$ represent monovalent anionic functional groups of any one of Formula (A-1), (A-2), or (A-4) mentioned above.

What is claimed is:

1. An actinic ray-sensitive or radiation-sensitive resin composition comprising:

a compound that generates an acid upon irradiation with actinic rays or radiation, and a resin of which polarity increases through decomposition by an action of an acid, having a weight-average molecular weight of 30,000 or less, wherein the compound that generates an acid upon irradiation with actinic rays or radiation includes the following compound (I), Compound (I): a compound having two or more of the following structural moieties X and one of the following structural moiety Y Structural moiety X: a structural moiety which consists of an anionic moiety $A_1^-$ and a cationic moiety $C_1^+$, and forms a first acidic moiety represented by $HA_1$ upon irradiation with actinic rays or radiation, Structural moiety Y: a structural moiety which consists of an anionic moiety $B_1^-$ and a cationic moiety $C_2^+$, and forms a second acidic moiety represented by $HB_1$ upon irradiation with actinic rays or radiation, the compound generating an acid including the two or more of the first acidic moieties derived from the structural moieties X and the second acidic moiety derived from the structural moiety Y upon irradiation with actinic rays or radiation, provided that the compound (I) satisfies the following condition I, Condition I: a compound PI formed by substituting the cationic moiety $C_1^+$ in the structural moiety X and the cationic moiety $C_2^+$ in the structural moiety Y with $H^+$ in the compound (I) has an acid dissociation constant a derived from an acidic moiety represented by $HA_1$, formed by substituting the cationic moiety $C_1^+$ in the structural moiety X with $H^+$, and an acid dissociation constant b derived from an acidic moiety represented by $HB_1$, formed by substituting the cationic moiety $C_2^+$ in the structural moiety Y with $H^+$, and the acid dissociation constant b is larger than the acid dissociation constant a.

2. The actinic ray-sensitive or radiation-sensitive resin composition according to claim 1, wherein the compound (I) is a compound having two of the structural moieties X and one of the structural moiety Y.

3. The actinic ray-sensitive or radiation-sensitive resin composition according to claim 2, wherein the compound (I) is a compound represented by any one of Formula (I)-1, (I)-2, or (I)-3,

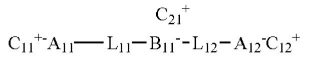

(I)-1

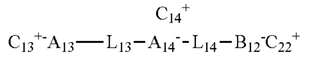

(I)-2

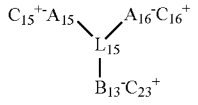

(I)-3 in Formula (I)-1, $A_{11}^-$ and $A_{12}^-$ each independently represent a monovalent anionic functional group, $B_{11}^-$ represents a divalent anionic functional group, $C_{11}^+$, $C_{12}^+$, and $C_{21}^+$ each independently represent an organic cation, and $L_{11}$ and $L_{12}$ each independently represent a divalent organic group, provided that in a compound PI-1 formed by substituting organic cations represented by $C_{11}^+$, $C_{12}^+$, and $C_{21}^+$ with $H^+$ in Formula (I)-1, an acid dissociation constant b1 derived from an acidic moiety represented by $B_{11}H$ is larger than an acid dissociation constant a1 derived from an acidic moiety represented by $HA_{11}$ and an acid dissociation constant a2 derived from the acidic moiety represented by $HA_{12}$, in Formula (I)-2, $A_{13}^-$ and $B_{12}^-$ each independently represent a monovalent anionic functional group, $A_{14}^-$ represents a divalent anionic functional group, $C_{13}^+$, $C_{14}^+$, and $C_{22}^+$ each independently represent an organic cation, and $L_{13}$ and $L_{14}$ each independently represent a divalent organic group, provided that in a compound PI-2 formed by substituting organic cations represented by $C_{13}^+$, $C_{14}^+$, and $C_{22}^+$ with $H^+$ in Formula (I)-2, an acid dissociation constant b2 derived from an acidic moiety represented by $B_{12}H$ is larger than an acid dissociation constant a3 derived from an acidic moiety represented by $HA_{13}$ and an acid dissociation constant a4 derived from an acidic moiety represented by $HA_{14}$, in Formula (I)-3, $A_{15}^-$, $A_{16}^-$, and $B_{13}^-$ each independently represent a monovalent anionic functional group, $C_{15}^+$, $C_{16}^+$, and $C_{23}^+$ each independently represent an organic cation, and $L_{15}$ represents a trivalent organic group, provided that in a compound PI-3 formed by substituting organic cations represented by $C_{15}^+$, $C_{16}^+$, and $C_{23}^+$ with $H^+$ in Formula (I)-3, an acid dissociation constant b3 derived from an acidic moiety represented by $B_{13}H$ is larger than an acid dissociation constant a5 derived from an acidic moiety represented by $HA_{15}$ and an acid dissociation constant a6 derived from an acidic moiety represented by $HA_{16}$.

4. The actinic ray-sensitive or radiation-sensitive resin composition according to claim 3, wherein $A_{11}^-$ and $A_{12}^-$ in Formula (I)-1, $A_{13}^-$ in Formula (I)-2, and $A_{15}^-$ and $A_{16}^-$ in Formula (I)-3 each represent a monovalent anionic functional group of any one of Formula (A-1), (A-2), or (A-4), and $A_{14}^-$ in Formula (I)-2 represents a divalent anionic functional group represented by Formula (A-3),

A-1

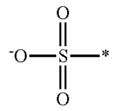

A-2

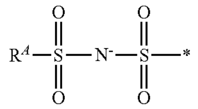

A-3

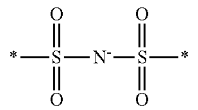

A-4

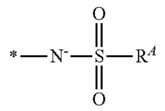

in Formulae (A-2) and (A-4), $R^A$ represents a monovalent organic group, and in Formulae (A-1) to (A-4), * represents a bonding position.

5. The actinic ray-sensitive or radiation-sensitive resin composition according to claim 4, wherein $B_{11}^-$ in Formula (I)-1 represents a divalent anionic functional group of any one of Formula (B-8) to (B-11), and $B_{12}^-$ in Formula (I)-2 and $B_{13}^-$ in Formula (I)-3 each represent a monovalent anionic functional group of any one of Formula (B-1) to (B-7),

B-1

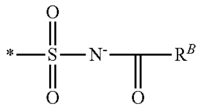

B-2

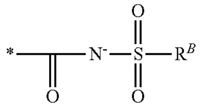

B-3

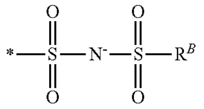

B-4

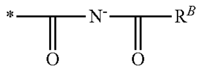

B-5

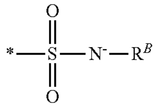

B-6

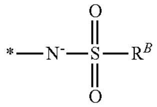

B-7

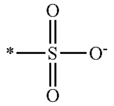

B-8

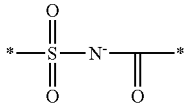

B-9

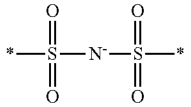

B-10

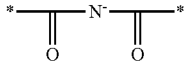

B-11

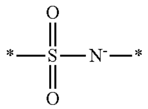

in Formulae (B-1) to (B-6), $R^B$ represents a monovalent organic group, and in Formulae (B-1) to (B-11), * represents a bonding position.

6. The actinic ray-sensitive or radiation-sensitive resin composition according to claim 3, wherein $B_{11}^-$ in Formula (I)-1 represents a divalent anionic functional group of any one of Formula (B-8) to (B-11), and $B_{12}^-$ in Formula (I)-2 and $B_{13}^-$ in Formula (I)-3 each represent a monovalent anionic functional group of any one of Formula (B-1) to (B-7),

B-1

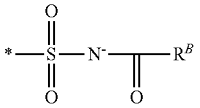

B-2

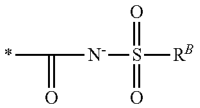

B-3

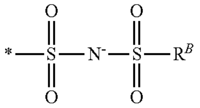

B-4

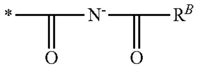

B-5

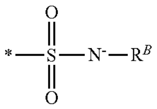

B-6

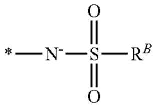

B-7

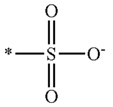

B-8

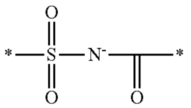

B-9

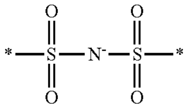

B-10

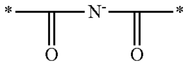

B-11

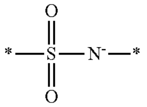

in Formulae (B-1) to (B-6), $R^B$ represents a monovalent organic group, and in Formulae (B-1) to (B-11), * represents a bonding position.

7. The actinic ray-sensitive or radiation-sensitive resin composition according to claim 2, wherein the resin of which polarity increases through decomposition by an action of an acid includes an acid group.

8. The actinic ray-sensitive or radiation-sensitive resin composition according to claim 2, wherein the resin of which polarity increases through decomposition by an action of an acid includes a repeating unit having an acid group.

9. The actinic ray-sensitive or radiation-sensitive resin composition according to claim 1, wherein the anionic moiety $A_1^-$ in the compound (I) represents any one of Formula (AA-1), (AA-2), or (AA-3),

AA-1

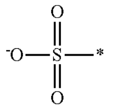

AA-2

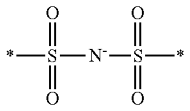

AA-3

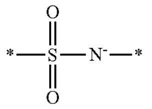

in Formulae (AA-1) to (AA-3), * represents a bonding position.

10. The actinic ray-sensitive or radiation-sensitive resin composition according to claim 9, wherein the anionic moiety $B_1^-$ in the compound (I) represents any one of Formula (BB-1) to (BB-5),

BB-1

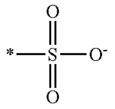

BB-2

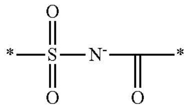

BB-3

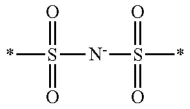

BB-4

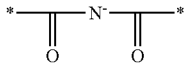

BB-5

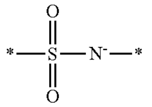

in Formulae (BB-1) to (BB-5), * represents a bonding position.

11. The actinic ray-sensitive or radiation-sensitive resin composition according to claim 1, wherein the anionic moiety $B_1^-$ in the compound (I) represents any one of Formula (BB-1) to (BB-5),

BB-1

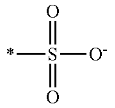

-continued

BB-2

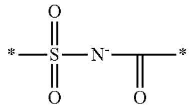

BB-3

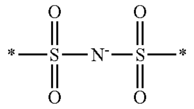

BB-4

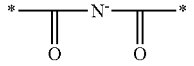

BB-5

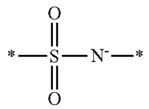

in Formulae (BB-1) to (BB-5), * represents a bonding position.

12. The actinic ray-sensitive or radiation-sensitive resin composition according to claim 1, wherein the resin of which polarity increases through decomposition by an action of an acid includes an acid group.

13. The actinic ray-sensitive or radiation-sensitive resin composition according to claim 1, wherein the resin of which polarity increases through decomposition by an action of an acid includes a repeating unit having an acid group.

14. The actinic ray-sensitive or radiation-sensitive resin composition according to claim 1, further comprising a solvent.

15. A resist film formed of the actinic ray-sensitive or radiation-sensitive resin composition according to claim 1.

16. A pattern forming method comprising:

a step of forming a resist film on a substrate using the actinic ray-sensitive or radiation-sensitive resin composition according to claim 1;

a step of exposing the resist film; and a step of developing the exposed resist film, using a developer.

17. A method for manufacturing an electronic device, comprising the pattern forming method according to claim 16.

18. A compound represented by any one of Formula (I)-1, (I)-2, or (I)-3, (I)-1

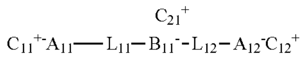

(I)-2

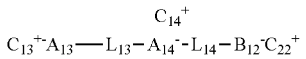

(I)-3

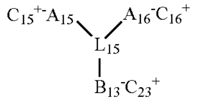

in Formula (I)-1, $A_{11}^-$ and $A_{12}^-$ each independently represent a monovalent anionic functional group, $B_{11}^-$ represents a divalent anionic functional group, $C_{11}^+$, $C_{12}^+$, and $C_{21}^+$ each independently represent an organic cation, and $L_{11}$ and $L_{12}$ each independently represent a divalent organic group, provided that in a compound PI-1 formed by substituting organic cations represented by $C_{11}^+$, $C_{12}^+$, and $C_{21}^+$ with $H^+$ in Formula (I)-1, an acid dissociation constant b1 derived from an acidic moiety represented by $B_{11}H$ is larger than an acid dissociation constant a1 derived from an acidic moiety represented by $HA_{11}$ and an acid dissociation constant a2 derived from the acidic moiety represented by $HA_{12}$, in Formula (I)-2, $A_{13}^-$ and $B_{12}^-$ each independently represent a monovalent anionic functional group, $A_{14}^-$ represents a divalent anionic functional group, $C_{13}^+$, $C_{14}^+$, and $C_{22}^+$ each independently represent an organic cation, and $L_{13}$ and $L_{14}$ each independently represent a divalent organic group, provided that in a compound PI-2 formed by substituting organic cations represented by $C_{13}^+$, $C_{14}^+$, and $C_{22}^+$ with $H^+$ in Formula (I)-2, an acid dissociation constant b2 derived from an acidic moiety represented by $B_{12}H$ is larger than an acid dissociation constant a3 derived from an acidic moiety represented by $HA_{13}$ and an acid dissociation constant a4 derived from an acidic moiety represented by $HA_{14}$, in Formula (I)-3, $A_{15}^-$, $A_{16}^-$, and $B_{13}^-$ each independently represent a monovalent anionic functional group, $C_{15}^+$, $C_{16}^+$, and $C_{23}^+$ each independently represent an organic cation, and $L_{15}$ represents a trivalent organic group, provided that in a compound PI-3 formed by substituting organic cations represented by $C_{15}^+$, $C_{16}^+$, and $C_{23}^+$ with $H^+$ in Formula (I)-3, an acid dissociation constant b3 derived from an acidic moiety represented by $B_{13}H$ is larger than an acid dissociation constant a5 derived from an acidic moiety represented by $HA_{15}$ and an acid dissociation constant a6 derived from an acidic moiety represented by $HA_{16}$.

19. The compound according to claim 18, wherein $A_{11}^-$ and $A_{12}^-$ in Formula (I)-1, $A_{13}^-$ in Formula (I)-2, and $A_{15}^-$ and $A_{16}^-$ in Formula (I)-3 each represent a monovalent anionic functional group of any one of Formula (A-1), (A-2), or (A-4), and $A_{14}^-$ in Formula (I)-2 represents a divalent anionic functional group represented by Formula (A-3),

A-1

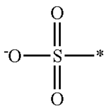

A-2

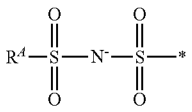

A-3

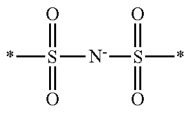

A-4

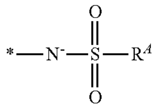

in Formulae (A-2) and (A-4), $R^A$ represents a monovalent organic group, and in Formulae (A-1) to (A-4), * represents a bonding position.

20. The compound according to claim 18, wherein $B_{11}^-$ in Formula (I)-1 represents a divalent anionic functional group of any one of Formula (B-8) to (B-11), and $B_{12}^-$ in Formula (I)-2 and $B_{13}^-$ in Formula (I)-3 each represent a monovalent anionic functional group of any one of Formula (B-1) to (B-7),

B-1

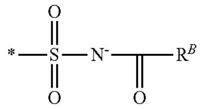

B-2

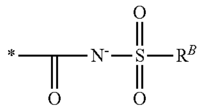

B-3

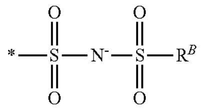

B-4

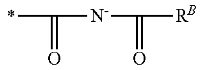

B-5

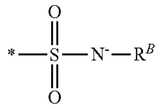

B-6

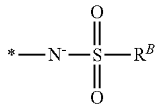

B-7

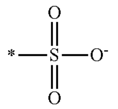

B-8

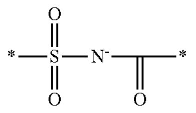

B-9

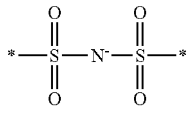

B-10

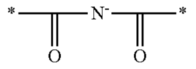

B-11

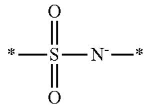

in Formulae (B-1) to (B-6), $R^B$ represents a monovalent organic group, and in Formulae (B-1) to (B-11), * represents a bonding position.

* * * * *